US012660127B2

(12) United States Patent
Ota et al.

(10) Patent No.:  US 12,660,127 B2
(45) Date of Patent:     Jun. 16, 2026

(54) VAPOR CHAMBER BODY SHEET, VAPOR CHAMBER, AND ELECTRONIC APPARATUS

(71) Applicant: DAI NIPPON PRINTING CO., LTD., Tokyo-to (JP)

(72) Inventors: Takayuki Ota, Tokyo-to (JP); Toshihiko Takeda, Tokyo-to (JP); Kazunori Oda, Tokyo-to (JP); Makoto Yamaki, Tokyo-to (JP); Shinya Kiura, Tokyo-to (JP); Masashi Inagaki, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 18/852,633

(22) PCT Filed: Mar. 30, 2023

(86) PCT No.: PCT/JP2023/013416
§ 371 (c)(1),
(2) Date: Nov. 15, 2024

(87) PCT Pub. No.: WO2023/191000
PCT Pub. Date: Oct. 5, 2023

(65) Prior Publication Data
US 2025/0169041 A1      May 22, 2025

(30) Foreign Application Priority Data

Mar. 31, 2022   (JP) ................................. 2022-061290
Mar. 31, 2022   (JP) ................................. 2022-061295

(51) Int. Cl.
*H05K 7/20*          (2006.01)
(52) U.S. Cl.
CPC ..... *H05K 7/20336* (2013.01); *H05K 7/20327* (2013.01)

(58) Field of Classification Search
CPC .............. F28D 15/046; F28D 15/0266; F28D 15/0233; H05K 7/20336
See application file for complete search history.

(56) References Cited

U.S. PATENT DOCUMENTS

2019/0285357 A1*   9/2019   Sheng ................. F28D 15/0233

FOREIGN PATENT DOCUMENTS

JP        H09-184696 A      7/1997
JP        2019-039662 A     3/2019
(Continued)

OTHER PUBLICATIONS

Aug. 30, 2024 Office Action issued in Japanese Application No. 2024-131215.
(Continued)

*Primary Examiner* — Jianying C Atkisson
*Assistant Examiner* — Khaled Ahmed Ali Al Samiri
(74) *Attorney, Agent, or Firm* — Oliff PLC

(57)          ABSTRACT

A vapor chamber body sheet includes a first land portion that extends in a first direction, a second land portion that extends in a second direction that differs from the first direction, and a land intersection portion at which the first land portion and the second land portion intersect with each other. A first main flow groove that is located at the first land portion and a second main flow groove that is located at the second land portion are in communication with each other at the land intersection portion. A first space division portion is located on both sides of the second land portion in the second direction. A second land recessed portion that connects the first space division portion that is located on both sides is located on the second body surface at the second land portion.

20 Claims, 89 Drawing Sheets

(56)         References Cited

FOREIGN PATENT DOCUMENTS

| JP | 2020-3194 A | 1/2020 |
| JP | 2021-188800 A | 12/2021 |
| WO | 2018/221369 A1 | 12/2018 |
| WO | 2019/088301 A1 | 5/2019 |
| WO | WO-2020184620 A1 * | 9/2020 | ......... F28D 15/0233 |

OTHER PUBLICATIONS

May 23, 2023 International Search Report issued in International Patent Application No. PCT/JP2023/013416.
Sep. 24, 2024 International Preliminary Report on Patentability issued in International Patent Application No. PCT/JP2023/013416.
Oct. 1, 2024 Office Action issued in Japanese Patent Application No. 2024-131215.

* cited by examiner 104     103

104

103

108  104     107  101

103                              40

Y

X 103    103

103

108X    108Y    107

VAPOR CHAMBER BODY SHEET, VAPOR CHAMBER, AND ELECTRONIC APPARATUS

TECHNICAL FIELD

The present disclosure relates to a vapor chamber body sheet, a vapor chamber, and an electronic apparatus.

BACKGROUND ART

An electronic device that involves heat generation is used for an electronic apparatus such as a mobile terminal. Examples of the electronic device include a central processing unit (CPU), a light-emitting diode (LED), and a power semiconductor. Examples of the mobile terminal include a portable terminal and a tablet terminal.

Such an electronic device is cooled by a heat dissipation device such as a heat pipe (see, for example, PTL 1). In recent years, there has been a need to decrease the thickness of the heat dissipation device for decreasing the thickness of the electronic apparatus. A vapor chamber that can be thinner than the heat pipe has been developed as the heat dissipation device. As for the vapor chamber, an encapsulated working fluid absorbs the heat of the electronic device and is dispersed therein, and consequently, the electronic device is cooled.

More specifically, the working liquid in the vapor chamber is heated by the electronic device at a portion (a vaporization portion) close to the electronic device. The working liquid that is heated vaporizes into a working vapor. The working vapor disperses in a direction away from the vaporization portion in a vapor flow path portion that is formed in the vapor chamber. The working vapor that disperses is cooled and is condensed into the working liquid. A liquid flow path portion is provided as a capillary structure (a wick) in the vapor chamber. The working liquid flows through the liquid flow path portion and is transported toward the vaporization portion. The working liquid that is transported to the vaporization portion is heated again and vaporizes at the vaporization portion. In this way, the working fluid circulates in the vapor chamber while repeating phase changes, that is, vaporization and condensation, and the heat of the electronic device is dispersed and is dissipated. The vapor chamber thus configured needs to improve heat dissipation performance.

CITATION LIST

Patent Literature

PTL 1: International Publication No. 2018/221369

SUMMARY OF INVENTION

Technical Problem

It is an object of the present disclosure to provide a vapor chamber body sheet, a vapor chamber, and an electronic apparatus that enable heat dissipation performance to be improved.

Solution to Problem

[1] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

a first main flow groove that is located on the first body surface at the first land portion, that is in communication with the space portion, and that extends in the first direction;

a second land portion around which the space portion is located, the second land portion extending from the first body surface to the second body surface and extending in a second direction that differs from the first direction in plan view;

a second main flow groove that is located on the first body surface at the second land portion, that is in communication with the space portion, and that extends in the second direction; and a land intersection portion at which the first land portion and the second land portion intersect with each other, in which the first main flow groove and the second main flow groove are in communication with each other at the land intersection portion, in which the space portion includes a first space division portion that is located on both sides of the second land portion in the second direction, and in which a second land recessed portion that connects the first space division portion that is located on both sides is be located on the second body surface at the second land portion.

[2] According to the present disclosure, there may be provided the vapor chamber body sheet according to Item [1], in which the first land portion extends in the first direction across the land intersection portion, and in which the second land portion extends in the second direction across the land intersection portion.

[3] According to the present disclosure, there may be provided the vapor chamber body sheet according to Item [1] or [2], in which the land intersection portion extends from the first body surface to the second body surface.

[4] According to the present disclosure, there may be provided the vapor chamber body sheet according to Item [3], in which the second land recessed portion is located on both sides of the land intersection portion in the second direction.

[5] According to the present disclosure, there may be provided the vapor chamber body sheet according to Item [1] or [2], in which the second land recessed portion extends through the land intersection portion from a portion that is located on a first side of the land intersection portion to a portion that is located on a second side in the second direction.

[6] According to the present disclosure, there may be provided the vapor chamber body sheet according to any one of Items [1] to [5], in which a second protrusion that extends in the first direction and that projects toward the second body surface is located on a bottom surface of the second land recessed portion.

3

[7] According to the present disclosure, there may be provided the vapor chamber body sheet according to Item [6], in which the second protrusion is separated inward from an extension surface of the second body surface.

[8] According to the present disclosure, there may be provided the vapor chamber body sheet according to Item [3] or [4], in which the space portion includes a second space division portion that is located on both sides of the first land portion in the first direction, and in which a first land recessed portion that connects the second space division portion that is located on both sides is located on the second body surface at the first land portion.

[9] According to the present disclosure, there may be provided the vapor chamber body sheet according to Item [8], in which the first land recessed portion is located on both sides of the land intersection portion in the first direction.

[10] According to the present disclosure, there may be provided the vapor chamber body sheet according to any one of Items [1], [2], [5] and [6], in which the space portion includes a second space division portion that is located on both sides of the first land portion in the first direction, in which a first land recessed portion that connects the second space division portion that is located on both sides is located on the second body surface at the first land portion, and in which the first land recessed portion extends through the land intersection portion from a portion that is located on a first side of the land intersection portion to a portion that is located on a second side in the first direction.

[11] According to the present disclosure, there may be provided the vapor chamber body sheet according to any one of Items [8] to [10], in which a first protrusion that extends in the second direction and that projects toward the second body surface is located on a bottom surface of the first land recessed portion.

[12] According to the present disclosure, there may be provided the vapor chamber body sheet according to Item [11], in which the first protrusion is separated inward from an extension surface of the second body surface.

[13] According to the present disclosure, there may be provided the vapor chamber body sheet according to Item [1], includes:

a third land portion around which the space portion is located, the third land portion being located from the first body surface to the second body surface and extending in a third direction that differs from the first direction and the second direction in plan view; and a third main flow groove that is located on the first body surface at the third land portion, that is in communication with the space portion, and that extends in the third direction, in which the first land portion, the second land portion, and the third land portion intersect with the land intersection portion, in which the first main flow groove, the second main flow groove, and the third main flow groove are in communication with each other at the land intersection portion,

in which the space portion includes a third space division portion that is located on both sides of the third land portion in the third direction, and in which a third land recessed portion that connects the third space division portion that is located on both sides is located on the second body surface at the third land portion.

[14] According to the present disclosure, there may be provided the vapor chamber body sheet according to Item [13], regarding the vapor chamber body sheet as a first solution described above, in which the space portion includes a second space division portion that is located on both sides of the first land portion in the first direction, and in which a first land recessed portion that connects the second space division portion that is located on both sides is located on the second body surface at the first land portion.

[15] According to the present disclosure, there may be provided the vapor chamber body sheet according to Item [13] or [14], in which the first land portion, the second land portion, and the third land portion terminate at the land intersection portion.

[16] According to the present disclosure, there may be provided a vapor chamber body sheet in which a working fluid is encapsulated, includes:

a first body surface;

a second body surface opposite the first body surface;

a space portion that extends from the first body surface to the second body surface;

first land portions around which the space portion is located, the first land portions extending from the first body surface to the second body surface and extending in a first direction in plan view;

a first main flow groove that is located on the first body surface at the first land portions, that is in communication with the space portion, and that extends in the first direction;

multiple second land portions around which the space portion is located, the multiple second land portions extending from the first body surface to the second body surface and extending in a second direction that differs from the first direction in plan view;

a second main flow groove that is located on the first body surface at the second land portions, that is in communication with the space portion, and that extends in the second direction; and multiple land intersection portions at which the first land portions and the second land portions intersect with each other, in which the first land portions are arranged in the second direction and extend in the first direction across the land intersection portions corresponding thereto, in which the second land portions are arranged in the first direction and extend in the second direction across the land intersection portions corresponding thereto, and in which the first main flow groove that is located at the first land portions corresponding thereto and the second main flow groove that is located at the second land portions corresponding thereto are in communication with each other at the land intersection portions.

[17] According to the present disclosure, there may be provided the vapor chamber body sheet according to Item [16], in which the second direction is perpendicular to the first direction.

[18] According to the present disclosure, there may be provided the vapor chamber body sheet according to Item [16] or [17], in which the multiple land intersection portions are located in a vaporization region in which the liquid of the working fluid vaporizes.

[19] According to the present disclosure, there may be provided the vapor chamber body sheet according to any one of Items [16] to [18], in which the multiple land intersection portions are located in a condensation region in which the vapor of the working fluid condenses.

[20] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

a second land portion around which the space portion is located, the second land portion extending from the first body surface to the second body surface and extending in a second direction that differs from the first direction in plan view;

multiple second main flow grooves that are located on the first body surface at the second land portion, that are in communication with the space portion, and that extend in the second direction; and a land intersection portion at which the first land portion and the second land portion intersect with each other, in which the first land portion extends in the first direction across the land intersection portion, in which the second land portion extends in the second direction across the land intersection portion, and in which a groove connection portion that is connected to the first main flow grooves on both sides in the first direction and that is connected to the second main flow grooves on both sides in the second direction is located at the land intersection portion.

[21] According to the present disclosure, there may be provided the vapor chamber body sheet according to Item [20], in which the groove connection portion includes multiple first intersection grooves that extend along extension lines from the first main flow grooves corresponding thereto and multiple second intersection grooves that extend along extension lines from the second main flow grooves corresponding thereto, and in which the first intersection grooves and the second intersection grooves intersect with each other.

[22] According to the present disclosure, there may be provided the vapor chamber body sheet according to Item [20], in which the groove connection portion includes an intersection recessed portion that is located on the first body surface, that is connected to the first main flow grooves, and that is connected to the second main flow grooves.

[23] According to the present disclosure, there may be provided the vapor chamber body sheet according to Item [22], in which multiple intersection protrusions that are arranged in the first direction, that are arranged in the second direction, and that project toward the first body surface are located on a bottom surface of the intersection recessed portion.

[24] According to the present disclosure, there may be provided the vapor chamber body sheet according to Item [23], in which the intersection protrusions are separated inward from an extension surface of the first body surface.

[25] According to the present disclosure, there may be provided the vapor chamber body sheet according to Item [20], in which the groove connection portion includes multiple first intersection grooves that extend in the first direction and multiple second intersection grooves that extend in the second direction, in which a width of each of the first intersection grooves is more than a width of each of the first main flow grooves, and in which a width of each of the second intersection grooves is more than a width of each of the second main flow grooves.

[26] According to the present disclosure, there may be provided the vapor chamber body sheet according to Item [25], in which the number of the first intersection grooves is smaller than the number of the first main flow grooves that are located at the first land portion, and in which the number of the second intersection grooves is smaller than the number of the second main flow grooves that are located at the second land portion.

[27] According to the present disclosure, there may be provided the vapor chamber body sheet according to Item [20], in which the groove connection portion includes a first divided groove that is located on a first side in the first direction, a second divided groove that is located on a second side in the first direction and that is located along an extension line from the first divided groove, a third divided groove that is located on a first side in the second direction, and a fourth divided groove that is located on a second side in the second direction and that is located along an extension line from the third divided groove, in which the first divided groove and the third divided groove are connected at a groove intersection portion, and in which the second divided groove is not connected to the groove intersection portion.

[28] According to the present disclosure, there may be provided the vapor chamber body sheet according to Item [27], in which the fourth divided groove is not connected to the groove intersection portion.

[29] According to the present disclosure, there may be provided the vapor chamber body sheet according to Item [20], in which multiple edge communication grooves and multiple intermediate communication grooves are located on the first body surface at the first land portion, in which the edge communication grooves connect the space portion and the first main flow grooves adjacent to the space portion to each other, in which the edge communication grooves extend in the second direction and are arranged in the first direction, in which the intermediate communication grooves connect two of the first main flow grooves adjacent to each other, in which the intermediate communication grooves extend in the second direction and are arranged in the first direction, and in which an interval between two of the edge communication grooves adjacent to each other is shorter than an interval between two of the intermediate communication grooves adjacent to each other.

[30] According to the present disclosure, there may be provided the vapor chamber body sheet according to Item [20] or [21], in which multiple first communication grooves are located on the first body surface at the first land portion, and in which the first communication grooves extend in the second direction across the first main flow grooves.

[31] According to the present disclosure, there may be provided a vapor chamber body sheet in which a working fluid is encapsulated, includes:

a first body surface, a second body surface opposite the first body surface;

a space portion that extends from the first body surface to the second body surface;

a first land portion around which the space portion is located, the first land portion extending from the first body surface to the second body surface and extending in a first direction in plan view; and a land connection region that is connected to the first land portion, the land connection region includes:

multiple first intersection land portions that extend from the first body surface to the second body surface and that extend in the first direction in plan view;

multiple first main flow grooves that are located on the first body surface at the first intersection land portions, that are in communication with the space portion, and that extend in the first direction;

multiple second intersection land portions that extend from the first body surface to the second body surface and that extend in a second direction that differs from the first direction in plan view;

multiple second main flow grooves that are located on the first body surface at the second intersection land portions, that are in communication with the space portion, and that extend in the second direction; and multiple land intersection portions at which the first intersection land portions and the second intersection land portions intersect with each other, in which at least one of the first intersection land portions of the multiple first intersection land portions is connected to the first land portion, and in which the first main flow grooves and the second main flow grooves are in communication with each other at the land intersection portions.

[32] According to the present disclosure, there may be provided the vapor chamber body sheet according to Item [31], in which a width of each of the first intersection land portions differs from a width of the first land portion.

[33] According to the present disclosure, there may be provided the vapor chamber body sheet according to Item [31] or [32], in which the space portion includes a first space division portion that is located on both sides of the second intersection land portions in the second direction, and in which a second land recessed portion that connects the first space division portion that is located on both sides is located on the second body surface at the second intersection land portions.

[34] According to the present disclosure, there may be provided the vapor chamber body sheet according to Item [31] or [32], in which a dimension in the second direction of the first space division portion that is located in the land connection region is less than a dimension in the second direction of the first space division portion that is located outside the land connection region.

[35] According to the present disclosure, there may be provided the vapor chamber body sheet according to any one of Items [31] to [34], in which a first through-hole that is in communication with the second land recessed portion is provided in the land connection region, and in which the first through-hole is located at a position that differs from that of the first space division portion in plan view.

[36] According to the present disclosure, there may be provided the vapor chamber body sheet according to any one of Items [31] to [35], in which a land intersection space that forms the space portion is formed opposite the first body surface at the land intersection portions, in which the land intersection space is in communication with the second land recessed portion, and in which the first through-hole is formed at the land intersection portions and is in communication with the land intersection space.

[37] According to the present disclosure, there may be provided the vapor chamber body sheet according to any one of Items [31] to [36], in which the first through-hole is formed at the second intersection land portions.

[38] According to the present disclosure, there may be provided the vapor chamber body sheet according to any one of Items [31] to [37], in which a block portion is provided between two of the first intersection land portions adjacent to each other and between two of the second intersection land portions adjacent to each other, and a block space that forms the space portion is opposite the first body surface at the block portion.

[39] According to the present disclosure, there may be provided the vapor chamber body sheet according to any one of Items [31] to [38], in which a pillar portion that extends to the second body surface is located between two of the land intersection portions adjacent to each other in a region of a circumferential portion of the land connection region.

[40] According to the present disclosure, there may be provided the vapor chamber body sheet according to any one of Items [31] to [39], in which the space portion includes a second space division portion that is located on both sides of the first intersection land portion in the first direction, in which a second land recessed portion that connects the second space division portion that is located on both sides is located on the second body surface at the first intersection land portion, and in which a depth of the first land recessed portion differs from a depth of the second land recessed portion.

[41] According to the present disclosure, there may be provided the vapor chamber body sheet according to any one of Items [31] to [40], in which the land intersection portions extend from the first body surface toward the second body surface, and in which a liquid reservoir is provided on the second body surface at the land intersection portions.

[42] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion;

multiple second through-holes that extend through the land connector, that are in communication with the first main flow grooves, and that are in communication with the land connection space; and a pillar portion that extends from the land connector to the second body surface.

[43] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view, multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion; and multiple second through-holes that extend through the land connector, that are in communication with the first main flow grooves, and that are in communication with the land connection space, in which the land connector includes a first hole region that includes some of the multiple second through-holes that are formed with a first unit circumferential length and a second hole region that includes some of the multiple second through-holes that are formed with a second unit circumferential length, in which the first unit circumferential length is equal to a total value of circumferential lengths of the second through-holes that are located in the first hole region per unit area, in which the second unit circumferential length is equal to a total value of circumferential lengths of the second through-holes that are located in the second hole region per unit area, and in which the second unit circumferential length is more than the first unit circumferential length.

[44] According to the present disclosure, there may be provided the vapor chamber body sheet according to Item [43], in which the second hole region is located inside the first hole region.

[45] According to the present disclosure, there may be provided the vapor chamber body sheet according to Item [43] or [44], further includes a pillar portion that extends from the land connector to the second body surface.

[46] According to the present disclosure, there may be provided the vapor chamber body sheet according to any one of Items [43] to [45], in which a groove connection portion that is connected to the first main flow grooves and the second main flow groove and that is in communication with the second through-holes is located on the first body surface at the land connector.

[47] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view, multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion; and multiple second through-holes that extend through the land connector, that are in communication with the first main flow grooves, and that are in communication with the land connection space, in which the land connector includes a first hole region that includes some of the multiple second through-holes that are formed with a first unit longitudinal dimension and a second hole region that includes some of the multiple second through-holes that are formed in a second unit longitudinal dimension, in which the first unit longitudinal dimension is equal to a total value of longitudinal dimensions of the second through-holes that are located in the first hole region per unit area, in which the second unit longitudinal dimension is equal to a total value of longitudinal dimensions of the second through-holes that are located in the second hole region per unit area, and in which the second unit longitudinal dimension is more than the first unit longitudinal dimension.

[48] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view, multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion; and multiple second through-holes that extend through the land connector, that are in communication with the first main flow grooves, and that are in communication with the land connection space, in which the land connector includes a first hole region that includes some of the multiple second through-holes that are formed at a first occupancy ratio and the second hole region that includes some of the multiple second through-holes that are formed at a second occupancy ratio, and in which the second occupancy ratio is higher than the first occupancy ratio.

[49] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view, multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion; and multiple second through-holes that extend through the land connector, that are in communication with the first main flow grooves and the second main flow grooves, and that are in communication with the land connection space, in which the land connector includes a first hole region that includes some of the multiple second through-holes that are formed with a first unit number and a second hole region that includes some of the multiple second through-holes that are formed with a second unit number, in which the first unit number is the number of the second through-holes that are located in the first hole region per unit area, in which the second unit number is the number of the second through-holes that are located in the second hole region per unit area, and in which the second unit number is larger than the first unit number.

[50] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

multiple second land portions around which the space portion is located, the multiple second land portions extending from the first body surface to the second body surface and extending in a second direction that differs from the first direction in plan view;

multiple second main flow grooves that are located on the first body surface at the second land portions, that are in communication with the space portion, and that extend in the second direction; and a land connection region that is connected to the first land portion and the second land portions, in which the land connection region includes a land connector that is located on the first body surface and that is connected to the first land portion and the second land portions, a land connection space that is opposite the first body surface at the land connector and that forms the space portion, multiple second through-holes that extend through the land connector and that are in communication with the land connection space, multiple intersection grooves that are located on the first body surface at the land connector and that cause the first main flow grooves and the second main flow grooves to be in communication with the second through-holes, in which the first main flow grooves are connected to the intersection grooves at first connection positions, in which the second main flow grooves are connected to the intersection grooves at second connection positions, in which the multiple intersection grooves are connected to the second through-holes at third connection positions, and in which a total main flow groove sectional area obtained by adding a total value of flow path sectional areas of the first main flow grooves at the first connection positions and a total value of flow path sectional areas of the second main flow grooves at the second connection positions is more than a total value of flow path sectional areas of the intersection grooves at the third connection positions.

[51] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion;

multiple second through-holes that extend through the land connector, that are in communication with the first main flow grooves, and that are in communication with the land connection space; and multiple intersection grooves that are located on the first body surface at the land connector and that cause the first main flow grooves to be in communication with the second through-holes, in which the multiple intersection grooves are connected to one of the second through-holes, and in which a plane area of the one of the second through-holes is equal to or larger than a total value of flow path sectional areas of the multiple intersection grooves that are connected to the one of the second through-holes.

[52] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

a land connector that is located on the first body surface and that is connected to the first land portion; a land connection space that is opposite the first body surface at the land connector and that forms the space portion;

multiple second through-holes that extend through the land connector, that are in communication with the first main flow grooves, and that are in communication with the land connection space; and multiple intersection grooves that are located on the first body surface at the land connector and that cause the first main flow grooves to be in communication with the second through-holes, and in which a total value of plane areas of the second through-holes is 3% to 30% of a plane area of the land connector.

[53] According to the present disclosure, there may be provided a vapor chamber body sheet in which a working fluid is encapsulated, includes:

a first body surface;

a second body surface opposite the first body surface;

a space portion that extends from the first body surface to the second body surface;

a first land portion around which the space portion is located, the first land portion extending from the first body surface to the second body surface and extending in a first direction in plan view;

multiple first main flow grooves that are located on the first body surface at the first land portion, that are in communication with the space portion, and that extend in the first direction;

a land connector that is located on the first body surface and that is connected to the first land portion;

a land connection space that is opposite the first body surface at the land connector and that forms the space portion;

multiple second through-holes that extend through the land connector, that are in communication with the first main flow grooves, and that are in communication with the land connection space; and multiple intersection grooves that are located on the first body surface at the land connector and that cause the first main flow grooves to be in communication with the second through-holes, and in which a total value of plane areas of the second through-holes that overlap a region in which a device to be cooled by the vapor chamber comes into contact is 3% to 30% of a plane area of the region in which the device comes into contact.

[54] According to the present disclosure, there may be provided a vapor chamber includes:

a first sheet;

a second sheet; and the vapor chamber body sheet according to any one of Items [1] to [51] that is located between the first sheet and the second sheet.

[55] According to the present disclosure, there may be provided an electronic apparatus includes:

a housing;

an electronic device that is contained in the housing; and the vapor chamber according to Item [54] that is thermally in contact with the electronic device.

[56] According to the present disclosure, there may be provided a vapor chamber body sheet in which a working fluid is encapsulated, includes:

a first body surface;

a second body surface opposite the first body surface;

a space portion that is located on the first body surface;

a first land portion around which the space portion is located, the first land portion containing the first body surface and extending in a first direction in plan view;

a first groove flow path portion that is located on the first body surface at the first land portion and that includes a first main flow groove in communication with the space portion, the first main flow groove extending in the first direction;

a storage flow path portion that is located on the first body surface and that is connected to the first main flow groove, and a flow path sectional area of the storage flow path portion perpendicular to the first direction is larger than a flow path sectional area of the first groove flow path portion perpendicular to the first direction.

[57] According to the present disclosure, there may be provided the vapor chamber body sheet according to Item [56], in which the storage flow path portion includes a storage main flow groove, and in which the storage main flow groove has a width more than a width of the first main flow groove or a depth more than a depth of the first main flow groove.

[58] According to the present disclosure, there may be provided the vapor chamber body sheet according to Item [56], in which a plurality of the first main flow grooves is located on the first body surface at the first land portion, and in which the storage flow path portion includes a storage recessed portion that is located on the first body surface and that is connected to the first main flow grooves.

[59] According to the present disclosure, there may be provided the vapor chamber body sheet according to Item [58], in which a protrusion that projects toward the first body surface is located on a bottom surface of the storage recessed portion.

[60] According to the present disclosure, there may be provided the vapor chamber body sheet according to Item [58] or [59], in which the storage recessed portion has an outer edge that curves in plan view.

[61] According to the present disclosure, there may be provided the vapor chamber body sheet according to any one of Items [58] to [60], in which the plurality of the first main flow grooves projects into the storage recessed portion in plan view.

[62] According to the present disclosure, there may be provided the vapor chamber body sheet according to any one of Items [58] to [61], in which a second partition wall that demarcates the storage recessed portion from the space portion is located on the first body surface.

[63] According to the present disclosure, there may be provided the vapor chamber body sheet according to Item [62], in which a partition wall groove that connects the space portion and the storage recessed portion to each other is located at the second partition wall.

[64] According to the present disclosure, there may be provided the vapor chamber body sheet according to Item [62] or [63], in which the first land portion includes a land body portion and a land wide portion that has a width more than a width of the land body portion, and in which the storage flow path portion is located on the first body surface at the land wide portion.

[65] According to the present disclosure, there may be provided the vapor chamber body sheet according to Item [56], in which the first land portion extends from the first body surface to the second body surface, in which the storage flow path portion includes a through-space that extends from the first body surface to the second body surface, and in which a second partition wall that demarcates the through-space from the space portion is located on the first body surface.

[66] According to the present disclosure, there may be provided the vapor chamber body sheet according to any one of Items [56] to [65], in which the storage flow path portion is in contact with the first groove flow path portion on a first side in the first direction and is in contact with a first partition wall on a second side in the first direction, and in which the first partition wall extends over an entire width of the storage flow path portion in a direction perpendicular to the first direction.

[67] According to the present disclosure, there may be provided the vapor chamber body sheet according to Item [66], further includes a frame portion that defines the space portion, an end portion of the first land portion in the first direction is connected to the frame portion, and the first partition wall is located at the frame portion.

[68] According to the present disclosure, there may be provided the vapor chamber body sheet according to any one of Items [56] to [65], in which the storage flow path portion is in contact with the first groove flow path portion on both sides in the first direction.

[69] According to the present disclosure, there may be provided the vapor chamber body sheet according to any one of Items [56] to [65], includes:

a second land portion around which the space portion is located, the second land portion containing the first body surface and extending in a second direction that differs from the first direction in plan view;

a second groove flow path portion that is located on the first body surface at the second land portion and that includes a second main flow groove in communication with the space portion, the second main flow groove extending in the second direction; and a land intersection portion at which the first land portion and the second land portion intersect with each other, in which the storage flow path portion is located on the first body surface at the land intersection portion, and in which the first main flow groove is connected to the storage flow path portion, and the second main flow groove is connected to the storage flow path portion.

[70] According to the present disclosure, there may be provided the vapor chamber body sheet according to Item [69], in which a flow path sectional area of the storage flow path portion perpendicular to the second direction is larger than a flow path sectional area of the second groove flow path portion perpendicular to the second direction.

[71] According to the present disclosure, there may be provided a vapor chamber body sheet in which a working fluid is encapsulated, includes:

a first body surface;

a second body surface opposite the first body surface;

a space portion that is located on the first body surface;

a first land portion around which the space portion is located, the first land portion containing the first body surface and extending in a first direction in plan view;

a first groove flow path portion including multiple first main flow grooves that are located on the first body surface at the first land portion, that are in communication with the space portion, and that extend in the first direction;

a storage flow path portion that is located on the first body surface, that is connected to the first main flow grooves, that is in contact with the first groove flow path portion on a first side in the first direction, and that is not in contact with the space portion on a second side in the first direction, and a first surface residual ratio that represents an area ratio at which the first body surface remains at the storage flow path portion is lower than a second surface residual ratio that represents an area ratio at which the first body surface remains at the first groove flow path portion.

[72] According to the present disclosure, there may be provided the vapor chamber body sheet according to Item [71], in which the storage flow path portion includes multiple storage main flow grooves that extend along extension lines from the first main flow grooves corresponding thereto and multiple storage communication grooves, and in which the storage communication grooves intersect with the storage main flow grooves and extend in a direction perpendicular to the first direction across the storage main flow grooves.

[73] According to the present disclosure, there may be provided the vapor chamber body sheet according to Item [71], in which the storage flow path portion includes a storage recessed portion that is located on the first body surface and that is connected to the first main flow grooves.

[74] According to the present disclosure, there may be provided the vapor chamber body sheet according to Item [72], in which a protrusion that projects toward the first body surface are located on a bottom surface of the storage recessed portion.

[75] According to the present disclosure, there may be provided the vapor chamber body sheet according to Item [73] or [74], in which a second partition wall that demarcates the storage recessed portion from the space portion is located on the first body surface.

[76] According to the present disclosure, there may be provided the vapor chamber body sheet according to Item [75], in which the first land portion includes a land body portion and a land wide portion that has a width more than a width of the land body portion, and in which the storage flow path portion is located on the first body surface at the land wide portion.

[77] According to the present disclosure, there may be provided the vapor chamber body sheet according to any one of Items [71] to [76], in which the storage flow path portion is in contact with a first partition wall opposite the first groove flow path portion, and in which the first partition wall extends over an entire width of the storage flow path portion in a direction perpendicular to the first direction.

[78] According to the present disclosure, there may be provided the vapor chamber body sheet according to any one of Items [71] to [76], in which the storage flow path portion is in contact with the first groove flow path portion on both sides in the first direction.

[79] According to the present disclosure, there may be provided the vapor chamber body sheet according to any one of Items [71] to [74] includes:

a second land portion around which the space portion is located, the second land portion containing the first body surface and extending in a second direction that differs from the first direction in plan view;

a second groove flow path portion including a second main flow groove that is located on the first body surface at the second land portion, that is in communication with the space portion, and that extends in the second direction; and a land intersection portion at which the first land portion and the second land portion intersect with each other, in which the storage flow path portion is located on the first body surface at the land intersection portion, and in which the first main flow grooves are connected to the storage flow path portion, and the second main flow groove is connected to the storage flow path portion.

[80] According to the present disclosure, there may be provided the vapor chamber body sheet according to Item [79], in which a first surface residual ratio that represents an area ratio at which the first body surface remains at the storage flow path portion is lower than a second surface residual ratio that represents an area ratio at which the first body surface remains at the second groove flow path portion.

[81] According to the present disclosure, there may be provided a vapor chamber body sheet in which a working fluid is encapsulated, includes:

a first body surface;

a second body surface opposite the first body surface;

a space portion that is located on the first body surface;

a first land portion around which the space portion is located, the first land portion containing the first body surface and extending in a first direction in plan view;

a first groove flow path portion including a first main flow groove that is located on the first body surface at the first land portion, that is in communication with the space portion, and that extends in the first direction; and a storage flow path portion that is located on the first body surface and that is connected to the first main flow groove, in which a first surface residual ratio that represents an area ratio at which the first body surface remains at the storage flow path portion is lower than a second surface residual ratio that represents an area ratio at which the first body surface remains at the first groove flow path portion.

in which the storage flow path portion includes a storage recessed portion that is located on the first body surface and that is connected to the first main flow groove, and in which a second partition wall that demarcates the storage recessed portion from the space portion is located on the first body surface.

[82] According to the present disclosure, there may be provided the vapor chamber body sheet according to Item [81], in which the first land portion includes a land body portion and a land wide portion that has a width more than a width of the land body portion, and in which the storage flow path portion is located on the first body surface at the land wide portion.

[83] According to the present disclosure, there may be provided a vapor chamber includes:

a first sheet;

a second sheet; and the vapor chamber body sheet according to any one of Items [56] to [82] that is located between the first sheet and the second sheet.

[84] According to the present disclosure, there may be provided a vapor chamber in which a working fluid is encapsulated, includes:

a vapor chamber body sheet that has a first body surface and a second body surface opposite the first body surface;

a first sheet that is located on the first body surface; and a storage flow path portion, the body sheet includes:

a space portion that is located on the first body surface;

a first land portion around which the space portion is located, the first land portion containing the first body surface and extending in a first direction in plan view; and a first groove flow path portion that is located on the first body surface at the first land portion and that includes a first main flow groove in communication with the space portion, the first main flow groove extending in the first direction, in which the storage flow path portion is located on a surface of the first sheet facing the body sheet, in which the storage flow path portion is connected to the first main flow groove and overlaps the first main flow groove in plan view, and in which a flow path sectional area of the storage flow path portion perpendicular to the first direction is larger than a flow path sectional area of the first groove flow path portion perpendicular to the first direction.

[85] According to the present disclosure, there may be provided a vapor chamber in which a working fluid is encapsulated, includes:

vapor chamber body sheets each of which has a first body surface and a second body surface opposite the first body surface;

a first sheet that is located on the first body surface;

a second sheet that is located on the second body surface; and a storage flow path portion, the body sheet includes:

a space portion that extends from the first body surface to the second body surface;

a first land portion around which the space portion is located, the first land portion extending from the first body surface to the second body surface and extending in a first direction in plan view; and a first groove flow path portion that is located on the first body surface at the first land portion and that includes a first main flow groove in communication with the space portion, the first main flow groove extending in the first direction, in which two of the body sheets are located between the first sheet and the second sheet, in which the two of the body sheets include a first body sheet and a second body sheet that are stacked, in which the first sheet is located on the first body surface of the first body sheet, in which the second sheet is located on the second body surface of the second body sheet, in which the storage flow path portion is located on the second body surface of the first body sheet, in which the storage flow path portion is connected to the first main flow groove of the second sheet, and in which a flow path sectional area of the storage flow path portion perpendicular to the first direction is larger than a flow path sectional area of the first groove flow path portion of the second sheet perpendicular to the first direction.

[86] According to the present disclosure, there may be provided an electronic apparatus includes:

a housing;

an electronic device that is contained in the housing; and the vapor chamber described in any one of [83] to [85] that is thermally in contact with the electronic device.

Advantageous Effects of Invention

According to the present disclosure, heat dissipation performance can be improved.

BRIEF DESCRIPTION OF DRAWINGS

FIG. 113 is a sectional view of the storage flow path portion illustrated in FIG. 112 in the Y direction.

FIG. 114 is a plan view of the first body surface of the wick sheet according to a third embodiment of the present disclosure.

FIG. 115 is a partial enlarged plan view of the storage flow path portion illustrated in FIG. 114.

FIG. 116 is a sectional view of the storage flow path portion taken along a line U-U in FIG. 115.

FIG. 117 is a partial enlarged plan view of a modification to the storage flow path portion illustrated in FIG. 115.

FIG. 118 is a sectional view of the storage flow path portion taken along a line V-V in FIG. 117.

FIG. 119 is a partial enlarged plan view of another modification to the storage flow path portion illustrated in FIG. 115.

DESCRIPTION OF EMBODIMENTS

Figure 1:
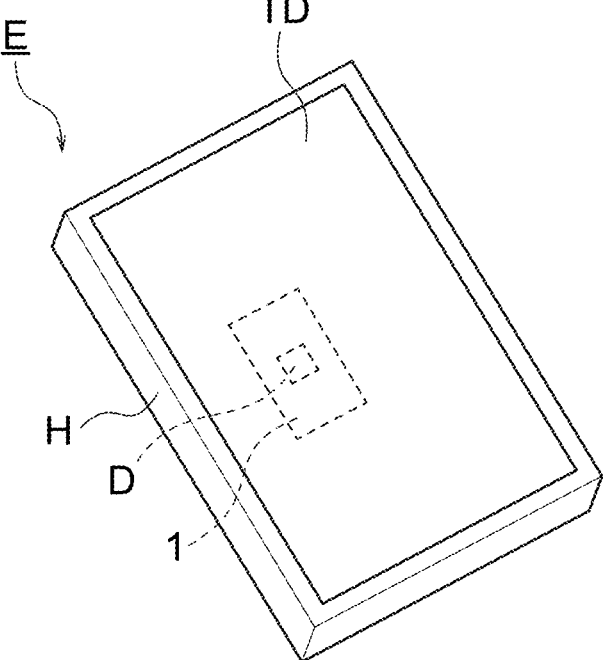
FIG. 1 is a schematic perspective view of an electronic apparatus according to a first embodiment of the present disclosure.

Embodiments of the present disclosure will hereinafter be described with reference to the drawings. In the drawings attached to the present specification, scales and ratios of vertical and horizontal dimensions, for example, are appropriately changed from the actual ones and are exaggerated for convenience of ease of illustration and understanding.

Geometric conditions, physical properties, words that specify the degrees of the geometric conditions or the physical properties, and numerical values that represent the geometric conditions or the physical properties used in the present specification, for example, may be interpreted without being limited by strict meaning. The geometric conditions, the physical properties, the words, and the numerical values, for example, may be interpreted to such an extent that the same function can be expected. Examples of the words that specify the geometric conditions include a "length", an "angle", a "shape", "parallel", "perpendicular" and the "same". The shapes of multiple portions from which the same function can be expected are regularly illustrated for the clarity of the drawings. However, the shapes of the portions may differ from each other without being limited by strict meaning within a range in which the function can be expected. In the drawings, a boundary line that represents bonding surfaces of members, for example, is illustrated by simply using a straight line for convenience, but the shape of the boundary line is freely determined without being limited to a straight line in a strict sense within a range in which desired bonding performance can be expected.

First Embodiment

Figure 71:
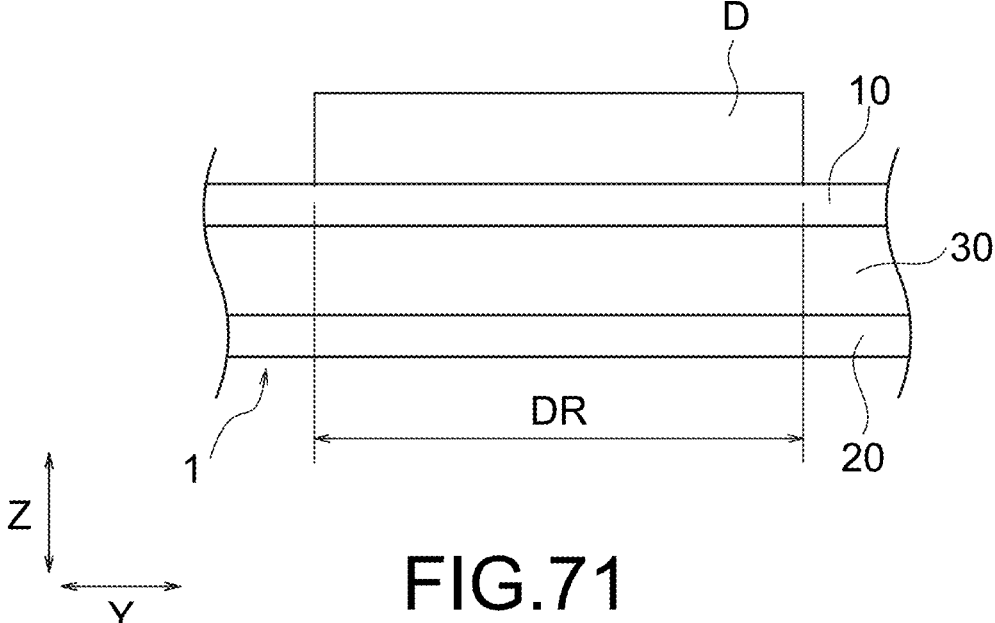
FIG. 71 is a diagram for describing a contact region of an electronic device.

A vapor chamber body sheet, a vapor chamber, and an electronic apparatus according to an embodiment of the present disclosure will be described with reference to FIG. 1 to FIG. 71. A vapor chamber 1 according to the present embodiment is contained in a housing H of an electronic apparatus E together with an electronic device D that involves heat generation and is a device for cooling the electronic device D. Examples of the electronic apparatus E include mobile terminals such as a portable terminal and a tablet terminal. Examples of the electronic device D include a central processing unit (CPU), a light-emitting diode (LED), and a power semiconductor. The electronic device D is also referred to as a device to be cooled in some cases.

In the description herein, a tablet terminal is taken as an example of the electronic apparatus E to which the vapor chamber 1 according to the present embodiment is mounted. As illustrated in FIG. 1, the electronic apparatus E may include the housing H, the electronic device D that is contained in the housing H, and the vapor chamber 1. As for the electronic apparatus E illustrated in FIG. 1, a touch screen display TD is provided on a front surface of the housing H. The vapor chamber 1 is contained in the housing H and is in thermal contact with the electronic device D. The vapor chamber 1 is heated by the electronic device D when the electronic apparatus E is used. The heat of the vapor chamber 1 dissipates to a location outside the vapor chamber 1 via working fluids 2a and 2b described later, and the electronic device D is effectively cooled. In the case where the electronic apparatus E is a tablet terminal, the electronic device D corresponds to, for example, a central processing unit.

The vapor chamber 1 according to the present embodiment will now be described.

Figure 2:
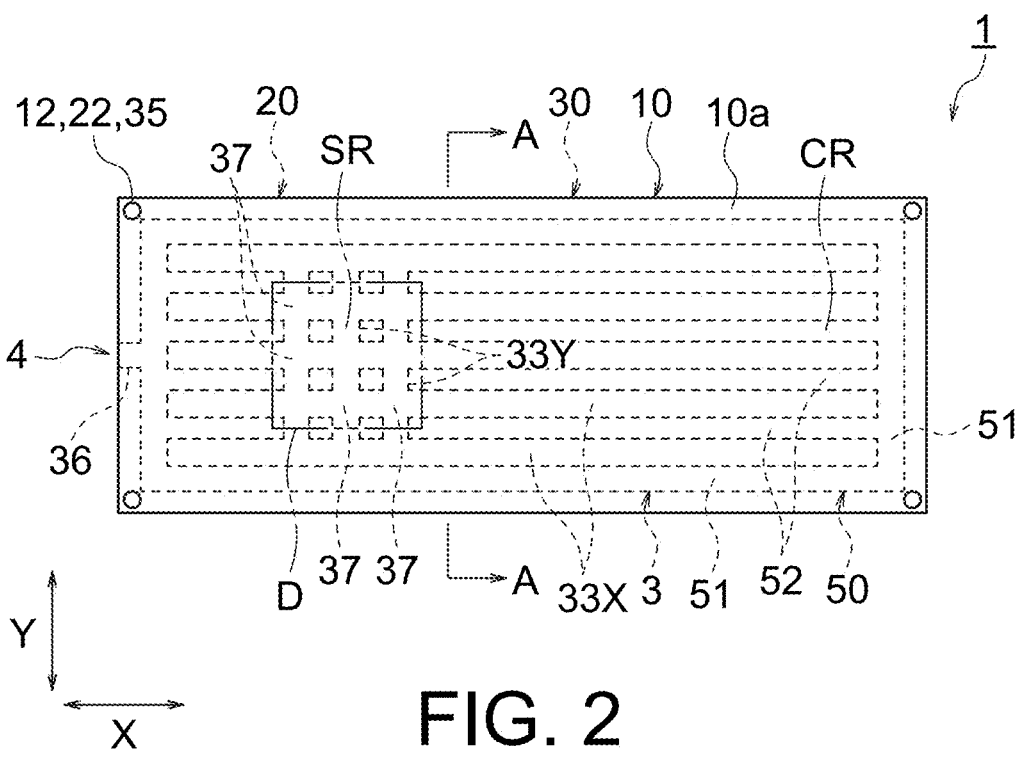
FIG. 2 is a plan view of a vapor chamber illustrated in FIG. 1.
Figure 3:
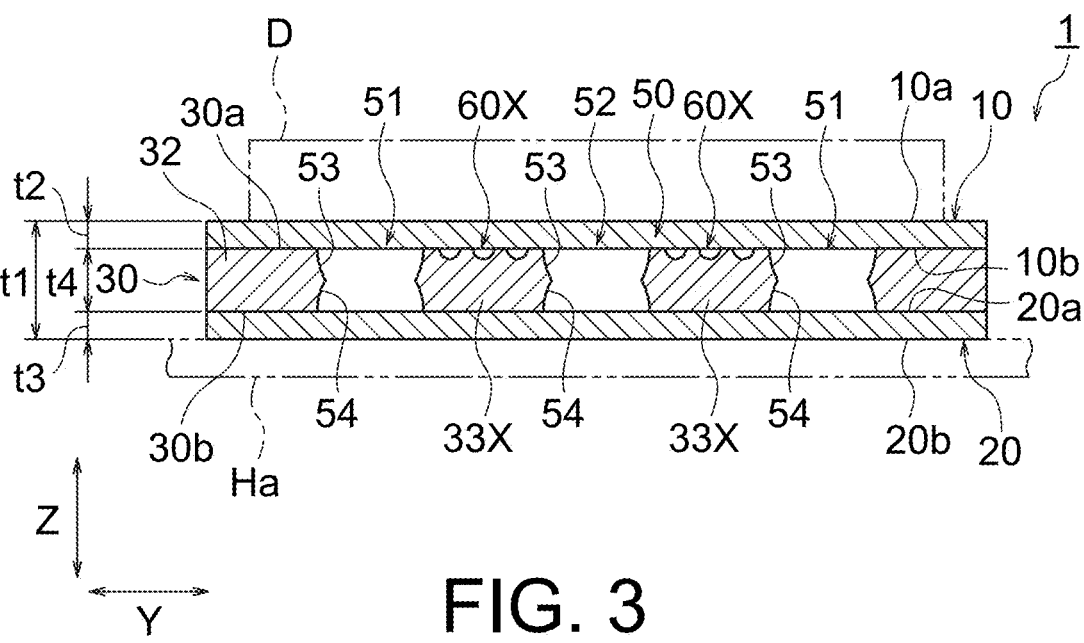
FIG. 3 is a sectional view of FIG. 2 taken along a line A-A.
Figure 4:
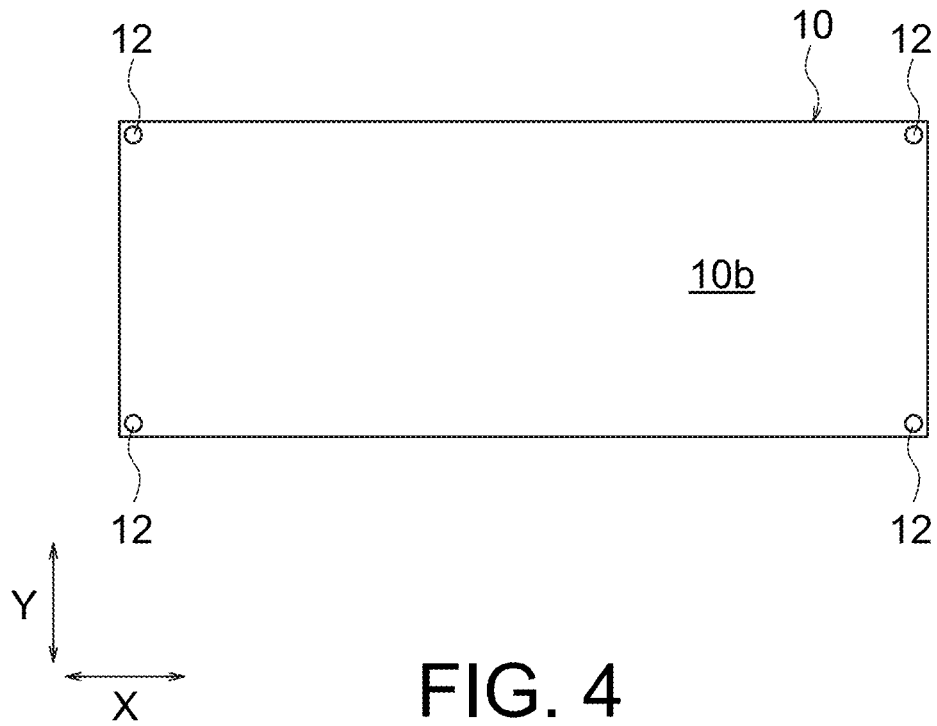
FIG. 4 is a plan view of an inner surface of a first sheet illustrated in FIG. 3.
Figure 5:
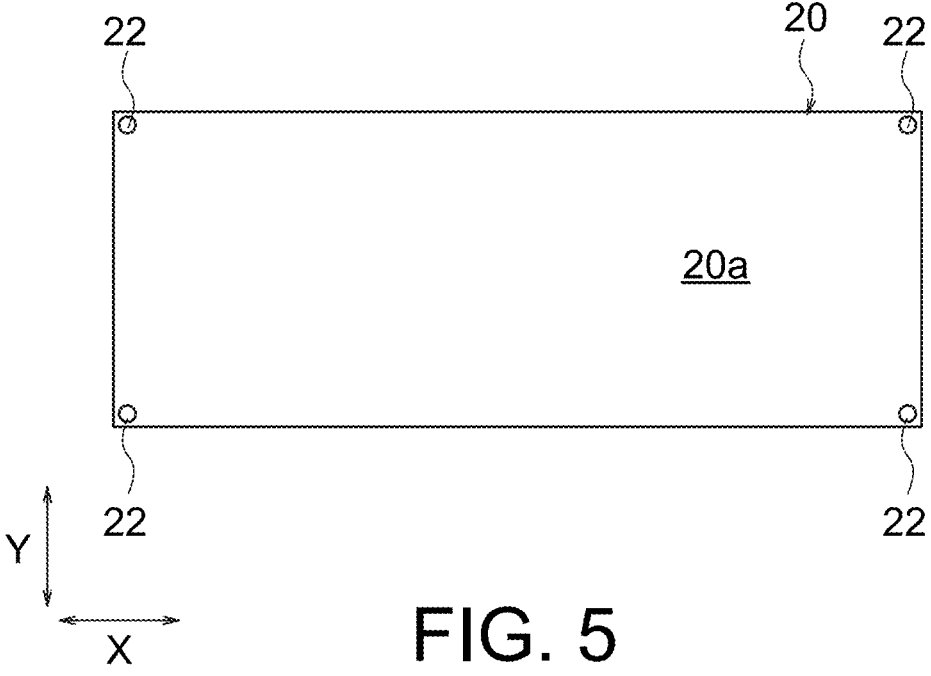
FIG. 5 is a plan view of an inner surface of a second sheet illustrated in FIG. 3.

As illustrated in FIG. 2 and FIG. 3, the vapor chamber 1 has an enclosure space 3 in which the working fluids 2a and 2b (see FIG. 6) are encapsulated. The working fluids 2a and 2b in the enclosure space 3 repeat phase changes, and consequently, the electronic device D described above is cooled. The working fluids 2a and 2b contain water. Examples of the working fluids 2a and 2b include pure water and a liquid mixture thereof.

The vapor chamber 1 according to the present embodiment includes three layers. More specifically, the vapor chamber 1 according to the present embodiment includes a first sheet 10, a second sheet 20, a wick sheet 30, a vapor flow path portion 50, and liquid flow path portions 60X and 60Y The second sheet 20 is opposite the first sheet 10 with respect to the wick sheet 30. The wick sheet 30 is an example of a body sheet and is located between the first sheet 10 and the second sheet 20. As for the vapor chamber 1 according to the present embodiment, the second sheet 20, the wick sheet 30, and the first sheet 10 are stacked in this order.

The vapor chamber 1 illustrated in FIG. 2 is generally formed in a thin plate shape. The planar shape of the vapor chamber 1 is freely determined and may be a rectangular shape as illustrated in FIG. 2. For example, the planar shape of the vapor chamber 1 may be a rectangle that has sides with a length of 1 cm and other sides with a length of 3 cm or a square that has sides with a length of 15 cm. The planar dimensions of the vapor chamber 1 are freely determined. In an example described according to the present embodiment, the planar shape of the vapor chamber 1 is a rectangular shape the longitudinal direction of which is an X direction described later. In this case, as illustrated in FIG. 4 to FIG. 7, the first sheet 10, the second sheet 20, and the wick sheet 30 may have the same planar shape as that of the vapor chamber 1. The planar shape of the vapor chamber 1 is not limited to a rectangular shape but may be a freely determined shape such as a circular shape, an elliptic shape, an L-shape, or a T-shape.

As illustrated in FIG. 2, the vapor chamber 1 has a vaporization region SR in which the working liquid 2b vaporizes and a condensation region CR in which the working vapor 2a condenses. The working vapor 2a is a working fluid in a gas state, and the working liquid 2b is a working fluid in a liquid state.

The vaporization region SR overlaps the electronic device D in plan view and comes into contact with the electronic device D. The position of the vaporization region SR is freely determined. According to the present embodiment, the vaporization region SR is formed at a position relatively near an end portion (a left-hand end portion in FIG. 2) in the X direction of the vapor chamber 1. Heat is transferred from the electronic device D to the vaporization region SR, the working liquid 2b vaporizes due to the heat, and the working vapor 2a is generated. The heat from the electronic device D can be transferred to not only the region that overlaps the electronic device D in plan view but also the vicinity of the region that overlaps the electronic device D. For this reason, the vaporization region SR may include the region that overlaps the electronic device D in plan view and the vicinity thereof.

The condensation region CR does not overlap the electronic device D in plan view and is a region in which the working vapor 2a mainly dissipates and condenses heat. The condensation region CR according to the present embodiment may be mainly formed at a position relatively near the other end portion (a right-hand end portion in FIG. 2) in the X direction of the vapor chamber 1. In addition, the condensation region CR may be formed at a position on the left of the vaporization region SR, a position above the vaporization region SR, or a position below the vaporization region SR in FIG. 2. The condensation region CR may be a region around the vaporization region SR. In the condensation region CR, the heat from the working vapor 2a is dissipated. The working vapor 2a is cooled and condenses, and the working liquid 2b is generated.

The state of plan view is a state of view in a direction perpendicular to a surface of the vapor chamber 1 that is heated by the electronic device D and a surface from which the heat dissipates. The surface that is heated corresponds to a first sheet outer surface 10a of the first sheet 10 described later. The surface from which the heat dissipates corresponds to a second sheet outer surface 20b of the second sheet 20 described later. In the case where the vapor chamber 1 is placed such that the first sheet 10 is located at an upper position, and the second sheet 20 is located at a lower position, as illustrated in FIG. 2, a state in which the vapor chamber 1 is viewed from the upper position or the lower position corresponds to the state of plan view.

As illustrated in FIG. 3, the first sheet 10 has the first sheet outer surface 10a that is opposite the wick sheet 30 and a first sheet inner surface 10b that faces the wick sheet 30. The electronic device D described above may come into contact with the first sheet outer surface 10a. A first body surface 30a of the wick sheet 30 described later is in contact with the first sheet inner surface 10b. The first sheet 10 may be substantially flat. The first sheet 10 may have a substantially constant thickness.

As illustrated in FIG. 3, the second sheet 20 includes a second sheet inner surface 20a that faces the wick sheet 30 and the second sheet outer surface 20b that is opposite the wick sheet 30. A housing member Ha may come into contact with the second sheet outer surface 20b. The housing member Ha is a member that is included in the housing H. A second body surface 30b of the wick sheet 30 described later is in contact with the second sheet inner surface 20a. The second sheet 20 may be substantially flat. The second sheet 20 may have a substantially constant thickness.

The wick sheet 30 will now be described. In an example described according to the present embodiment, a single piece of the wick sheet 30 is located between the first sheet 10 and the second sheet 20. However, multiple pieces of the wick sheets 30 may be located between the first sheet 10 and the second sheet 20.

As illustrated in FIG. 3, the wick sheet 30 has the first body surface 30a and the second body surface 30b that is opposite the first body surface 30a. The first sheet inner surface 10b of the first sheet 10 is in contact with the first body surface 30a. The second sheet inner surface 20a of the second sheet 20 is in contact with the second body surface 30b. The first sheet inner surface 10b of the first sheet 10 and the first body surface 30a of the wick sheet 30 may be bonded to each other by diffusion bonding. The first sheet inner surface 10b and the first body surface 30a may be permanently bonded to each other. Similarly, the second sheet inner surface 20a of the second sheet 20 and the second body surface 30b of the wick sheet 30 may be bonded to each other by diffusion bonding. The second sheet inner surface 20a and the second body surface 30b may be permanently bonded to each other. The words "permanently bonded" are not limited by strict meaning but are used as words that mean these are bonded to an extent that the degree of enclosure of the enclosure space 3 can be maintained when the vapor chamber 1 operates.

Figure 6:
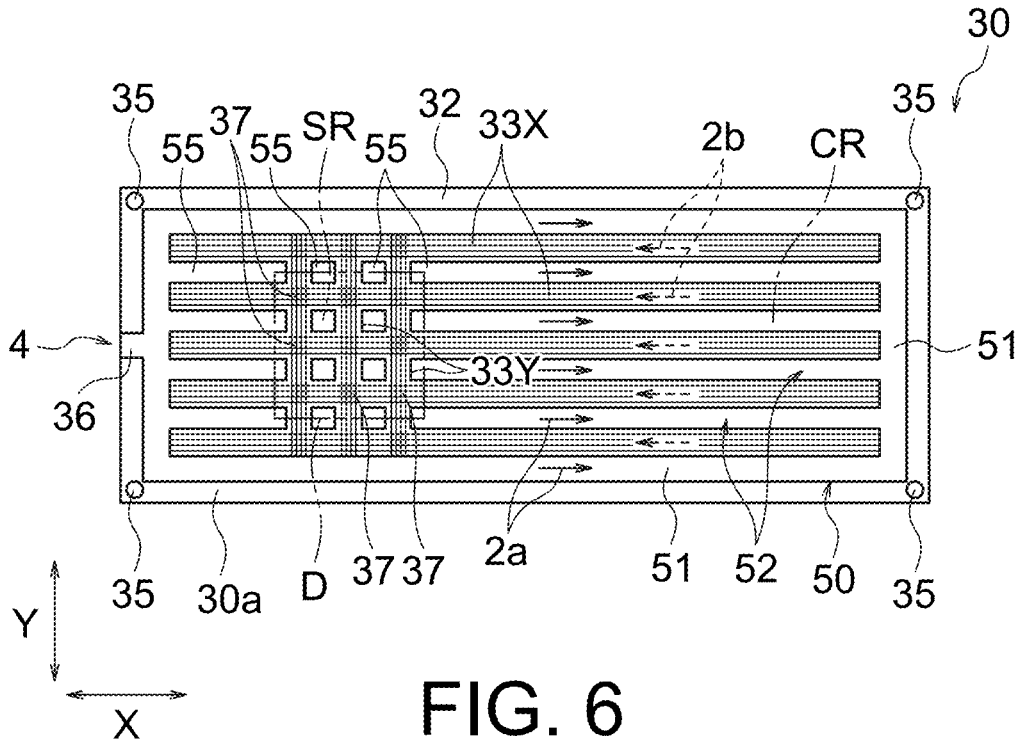
FIG. 6 is a plan view of a first body surface of a wick sheet illustrated in FIG. 3.
Figure 7:
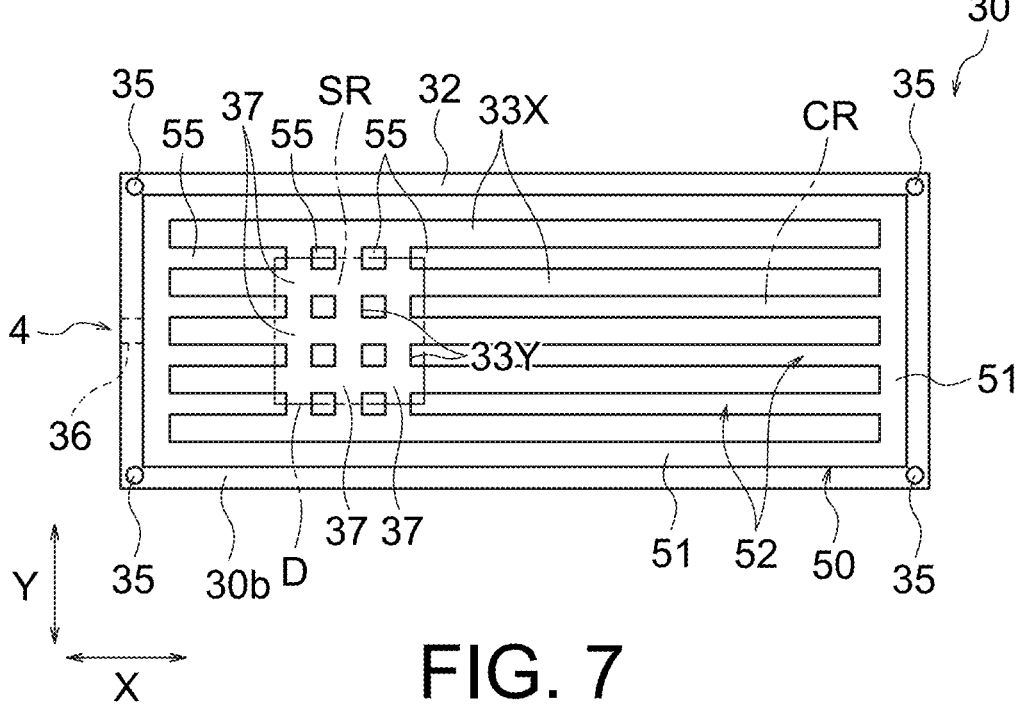
FIG. 7 is a plan view of a second body surface of the wick sheet illustrated in FIG. 3.

The wick sheet 30 defines the vapor flow path portion 50 described later. More specifically, the wick sheet 30 includes a frame portion 32, at least one first land portion 33X, and at least one second land portion 33Y As illustrated in FIG. 3, FIG. 6, and FIG. 7, the wick sheet 30 may include multiple first land portions 33X and multiple second land portions 33Y.

The frame portion 32 is formed in a rectangular frame shape in the X direction and the Y direction in plan view. The land portions 33X and 33Y are located inside the frame portion 32 in plan view. The vapor flow path portion 50 is located around the first land portions 33X and around the second land portions 33Y The frame portion 32 and the land portions 33X and 33Y are not etched in an etching process described later, and the material of the wick sheet 30 remains at the portions. The frame portion 32 and land portions 33X and 33Y contain the first body surface 30a and the second body surface 30b and extend from the first body surface 30a to the second body surface 30b. A first vapor passage 51 described later through which the working vapor 2a flows is formed between the frame portion 32 and the first land portions 33X adjacent thereto. Vapor passages 52 described later through which the working vapor 2a flows are formed between the first land portions 33X adjacent to each other.

The first land portions 33X may be elongated such that the X direction is the longitudinal direction in plan view. The second land portions 33Y may be elongated such that the Y direction is the longitudinal direction in plan view. The planar shapes of the land portions 33X and 33Y may be elongated rectangular shapes. The first land portions 33X may be parallel with each other. The second land portions 33Y may be parallel with each other. As illustrated in FIG. 6 and FIG. 7, the first land portions 33X and the second land portions 33Y may be separated from the frame portion 32 or may be connected to the frame portion 32. The X direction is an example of a first direction and corresponds to a left-right direction in FIG. 6 and FIG. 7. The Y direction is an example of a second direction and is perpendicular to the X direction in plan view. The Y direction corresponds to an up-down direction in FIG. 6 and FIG. 7. A direction perpendicular to the X direction and the Y direction is a Z direction. The Z direction corresponds to an up-down direction in FIG. 3 and corresponds to a thickness direction. According to the present embodiment, the first land portions 33X and the second land portions 33Y are perpendicular to each other. However, the first land portions 33X and the second land portions 33Y may not be perpendicular to each other, and angles that are formed between the first land portions 33X and the second land portions 33Y are freely determined.

Figure 8:
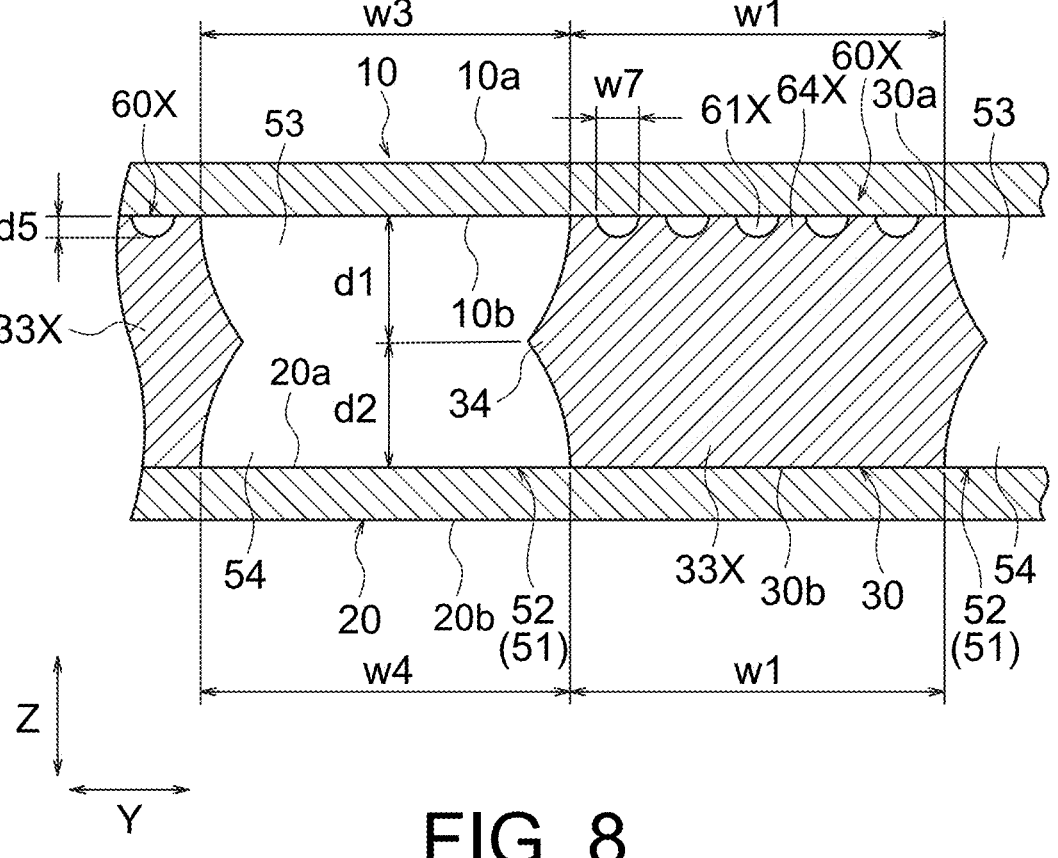
FIG. 8 is a partial enlarged sectional view of FIG. 3.

As illustrated in FIG. 8, for example, the width w1 of each first land portion 33X may be 100 μm to 1500 μm. The width w1 of each first land portion 33X described herein is the dimension in the Y direction of the first land portion 33X.

The width w1 is the dimension of each first land portion 33X at the first body surface 30a and the second body surface 30b. The width w2 of each second land portion 33Y may be equal to the width w1 of each first land portion 33X or may differ from the width w1. The width w2 (see FIG. 13) of each second land portion 33Y is the dimension in the X direction of the second land portion 33Y The width w2 is the dimension of each second land portion 33Y at the first body surface 30a and the second body surface 30b.

The frame portion 32 and the land portions 33X and 33Y may be bonded to the first sheet 10 by diffusion bonding or may be bonded to the second sheet 20 by diffusion bonding. Consequently, the mechanical strength of the vapor chamber 1 is improved. The first body surface 30a and the second body surface 30b of the wick sheet 30 may be flat over the frame portion 32 and the land portions 33X and 33Y.

The vapor flow path portion 50 will now be described.

As illustrated in FIG. 3, the vapor flow path portion 50 may be provided on the first body surface 30a of the wick sheet 30. The vapor flow path portion 50 is an example of a space portion at which the working fluids 2a and 2b are encapsulated. The vapor flow path portion 50 may mainly be a flow path through which the working vapor 2a passes. The working liquid 2b may also pass through the vapor flow path portion 50. According to the present embodiment, the vapor flow path portion 50 may extend from the first body surface 30a to the second body surface 30b and may extend through the wick sheet 30. The vapor flow path portion 50 may be covered by the first sheet 10 at the first body surface 30a or may be covered by the second sheet 20 at the second body surface 30b. The second sheet 20 covers the vapor flow path portion 50 from a location opposite the first sheet 10.

As illustrated in FIG. 6 and FIG. 7, the vapor flow path portion 50 according to the present embodiment may include the first vapor passage 51 and the multiple second vapor passages 52. The first vapor passage 51 is formed between the first land portions 33X and the frame portion 32 adjacent to each other. The planar shape of the first vapor passage 51 may be a rectangular frame shape in the X direction and the Y direction. The second vapor passages 52 are formed between the first land portions 33X adjacent to each other. The second vapor passages 52 may be arranged in the Y direction. The planar shapes of the second vapor passages 52 may be elongated rectangular shapes.

As illustrated in FIG. 3, the vapor passages 51 and 52 may include first vapor flow path recessed portions 53 that are provided at the first body surface 30a and second vapor flow path recessed portions 54 that are provided at the second body surface 30b. The first vapor flow path recessed portions 53 and the second vapor flow path recessed portions 54 are connected and in communication with each other.

The first vapor flow path recessed portions 53 may be formed by being etched from the first body surface 30a of the wick sheet 30 in the etching process described later. The first vapor flow path recessed portions 53 are formed in a recessed shape at the first body surface 30a. Wall surfaces of the first vapor flow path recessed portions 53 may curve. As illustrated in FIG. 8, for example, the width w3 of each first vapor flow path recessed portion 53 may be 100 μm to 5000 μm. The width w3 is a dimension in the Y direction and is the dimension of each first vapor flow path recessed portion 53 at the first body surface 30a.

The second vapor flow path recessed portions 54 may be formed by being etched from the second body surface 30b of the wick sheet 30 in the etching process described later. The second vapor flow path recessed portions 54 are formed in a recessed shape at the second body surface 30b. Wall surfaces of the second vapor flow path recessed portions 54 may curve. As illustrated in FIG. 8, for example, the width w4 of each second vapor flow path recessed portion 54 may be 100 μm to 5000 μm as in the width w3 of each first vapor flow path recessed portion 53 described above. The width w4 is a dimension in the Y direction and is the dimension of each second vapor flow path recessed portion 54 at the second body surface 30b.

According to the present embodiment, as illustrated in FIG. 8, the sectional shapes of the vapor passages 51 and 52 include through-portions 34. The through-portions 34 are defined by ridge lines that are formed such that wall surfaces of the vapor flow path recessed portions 53 and 54 extend inward. A depth d1 from the first body surface 30a to an end of each through-portion 34 may be equal to or may differ from a depth d2 from the second body surface 30b to an end of each through-portion 34. The sectional shapes of the vapor passages 51 and 52 are not limited thereto. For example, the sectional shapes of the vapor passages 51 and 52 may be trapezoidal shapes, parallelogram shapes, or barrel shapes. The vapor flow path portion 50 that includes the vapor passages 51 and 52 thus configured forms a portion of the enclosure space 3 described above. The vapor passages 51 and 52 have relatively large flow path sectional areas such that the working vapor 2a passes. FIG. 8 illustrates an enlarged view of the first vapor passage 51 and the second vapor passages 52 for the clarity of the figure. The number and positions of the vapor passages 51 and 52 and first main flow grooves 61X described later, for example, differ from those in FIG. 3, FIG. 6, and FIG. 7.

Multiple support portions that support the land portions 33X and 33Y on the frame portion 32 may be provided in the vapor passages 51 and 52 although this is not illustrated. A support portion that supports two first land portions 33X adjacent to each other may be provided, and a support portion that supports two second land portions 33Y adjacent to each other may be provided. These support portions may be formed so as not to impede the flow of the working vapor 2a that disperses at the vapor flow path portion 50.

As illustrated in FIG. 2, the vapor chamber 1 may include an injection portion 4 that injects the working liquid 2b into the enclosure space 3. The injection portion 4 includes an injection flow path 36 in communication with the first vapor passage 51. The position of the injection portion 4 is freely determined. As illustrated in FIG. 6 and FIG. 7, the injection flow path 36 may be formed in a recessed shape on the first body surface 30a. Alternatively, the injection flow path 36 may be formed in a recessed shape on the second body surface 30b. In the case where the same liquid flow path portion as the first liquid flow path portions 60X described later is formed at the frame portion 32, the injection flow path 36 may be connected and in communication with the liquid flow path portion.

Figure 9:
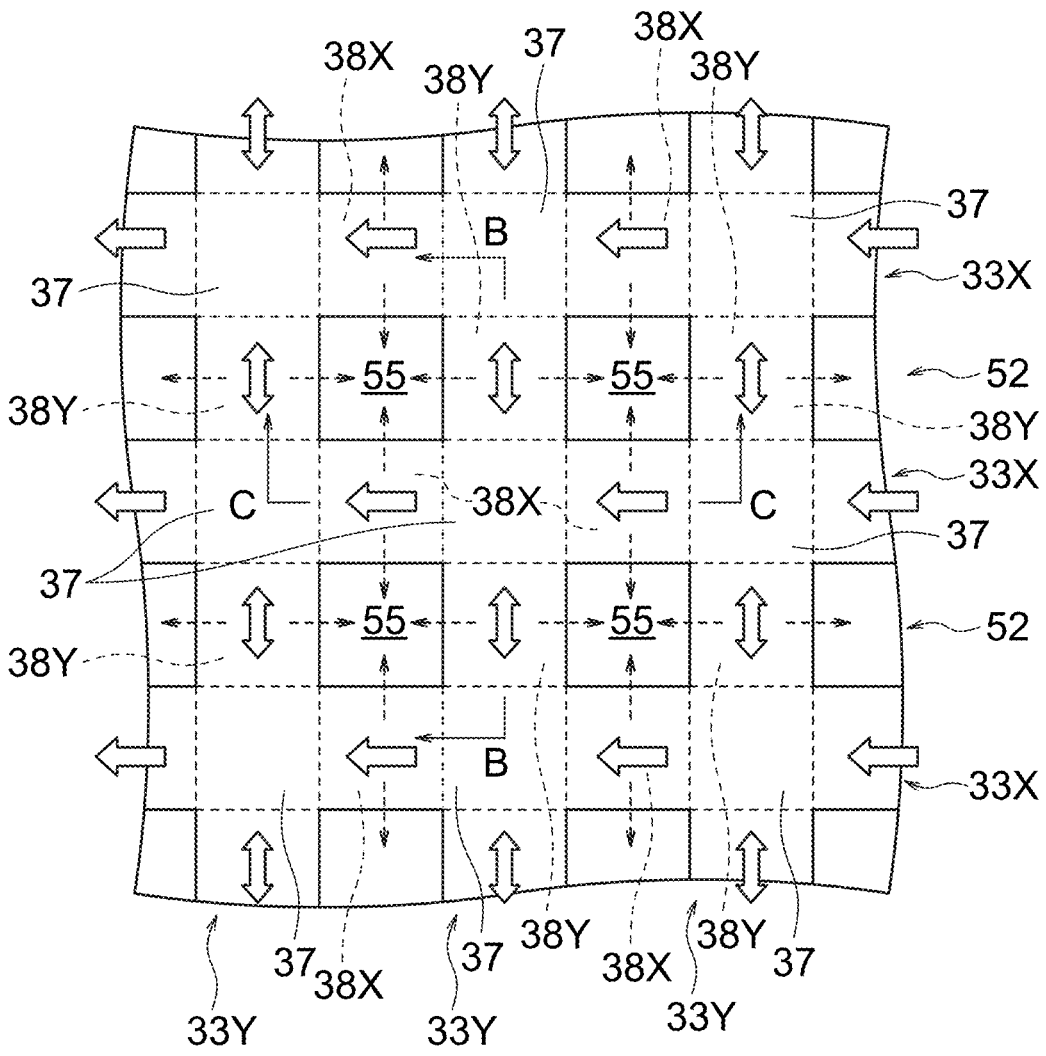
FIG. 9 is a plan view of land intersection portions illustrated in FIG. 6.
Figure 9:
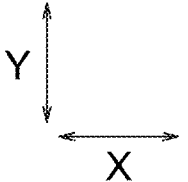

In plan view, as illustrated in FIG. 6 and FIG. 9, the first land portions 33X extend in the X direction, and the second land portions 33Y extend in the Y direction that differs from the X direction. The first land portions 33X are arranged in the Y direction, and the second land portions 33Y are arranged in the X direction. The first land portions 33X and the second land portions 33Y may intersect with each other at land intersection portions 37. More specifically, the first land portions 33X and the second land portions 33Y may intersect with each other, and the multiple land intersection portions 37 may be formed. One of the first land portions 33X and one of the second land portions 33Y intersect with each other at one of the land intersection portions 37. The multiple first land portions 33X and the multiple second land portions 33Y may be at least partly formed in a lattice pattern. As illustrated in FIG. 6 and FIG. 7, the multiple first land portions 33X and the second land portions 33Y may be partly formed in a lattice pattern. In this case, as illustrated in FIG. 6 and FIG. 7, the multiple land intersection portions 37 may be located in the vaporization region SR described above. Alternatively, the multiple first land portions 33X and the second land portions 33Y may be entirely formed in a lattice pattern.

As illustrated in FIG. 9, the first land portions 33X may extend in the X direction across the land intersection portions 37, and the second land portions 33Y extend in the Y direction across the land intersection portions 37. In this case, the first land portions 33X and the second land portions 33Y may intersect with each other in a cross shape. As for all of the land intersection portions 37, the first land portions 33X and the second land portions 33Y may intersect with each other in a cross shape. As for some of the land intersection portions 37, as illustrated in FIG. 6 and FIG. 7, the first land portions 33X and the second land portions 33Y may intersect with each other in a T-shape. In FIG. 9, the liquid flow path portions 60X and 60Y are omitted for clarity of the figure.

The land intersection portions 37 may extend from the first body surface 30a to the second body surface 30b. The first body surface 30a at the land intersection portions 37 may be bonded to the first sheet inner surface 10b of the first sheet 10. The second body surface 30b at the land intersection portions 37 may be bonded to the second sheet inner surface 20a of the second sheet 20.

As illustrated in FIG. 9, the second vapor passages 52 may include passage division portions 55 that are located on both sides of the second land portions 33Y in the Y direction. The passage division portions 55 are located on both sides of the second land portions 33Y in the X direction. The passage division portions 55 are examples of a first space division portion and examples of a second space division portion. According to the present embodiment, the second vapor passages 52 include the multiple passage division portions 55. More specifically, the multiple second land portions 33Y cross the second vapor passages 52, and the second land portions 33Y form the multiple passage division portions 55. The passage division portions 55 may be located on both sides of the first land portions 33X with respect to the X direction. The passage division portions 55 are located on both sides of the first land portions 33X in the Y direction. Also, the passage division portions 55 are examples of the first space division portion and examples of the second space division portion. In this way, the passage division portions 55 are arranged in the X direction and are arranged in the Y direction. The passage division portions 55 that are located on the first sides of the first land portions 33X may be the passage division portions 55 that are located on the first sides of the second land portions 33Y Four passage division portions 55 may be formed around each land intersection portion 37. The passage division portions 55 may extend from the first body surface 30a to the second body surface 30b and may extend through the wick sheet 30.

Figure 10:
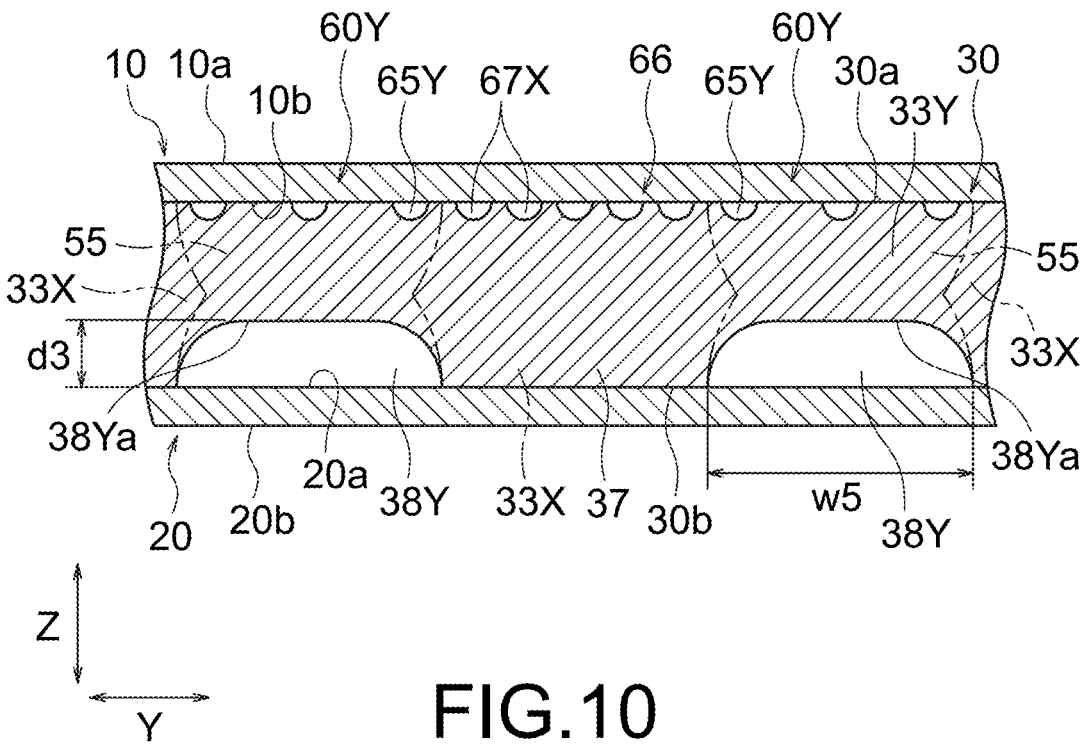
FIG. 10 is a sectional view of second land recessed portions taken along a line B-B in FIG. 9.

As illustrated in FIG. 10, second land recessed portions 38Y may be located on the second body surface 30b at the second land portions 33Y As illustrated in FIG. 9, the second land recessed portions 38Y may connect the passage division portions 55 that are located on both sides of the second land recessed portions 38Y in the X direction. FIG. 10 illustrates a section of each second land portion 33Y in the Y direction. The second land recessed portions 38Y are formed at the second land portions 33Y, and the multiple passage division portions 55 that are arranged in the X direction may be continuously in communication with each other in the X direction with the second land recessed portions 38Y interposed therebetween.

As illustrated in FIG. 9, the second land recessed portions 38Y may be located on both sides of the land intersection portions 37 in the Y direction. Each second land recessed portion 38Y may be formed between two land intersection portions 37 adjacent to each other in the Y direction.

The second land recessed portions 38Y may be formed by being etched from the second body surface 30b of the wick sheet 30 in the etching process described later. As illustrated in FIG. 10, the second land recessed portions 38Y are formed in a recessed shape on the second body surface 30b. The width w5 of each second land recessed portion 38Y may be equal to the width w4 (see FIG. 8) of each second vapor flow path recessed portion 54 described above or may be less than the width w4. The width w5 is a dimension in the Y direction and is the dimension of each second land recessed portion 38Y at the second body surface 30b. The second land recessed portions 38Y may have second bottom surfaces 38Ya. The second bottom surfaces 38Ya may be substantially flat. The second bottom surfaces 38Ya may be located at positions near the first body surface 30a at the second land recessed portions 38Y The depth d3 of each second land recessed portion 38Y may be less than the depth d2 (see FIG. 8) from the second body surface 30b to each through-portion 34 or may be equal to the depth d2. The depth d3 may be equal to distances from the second body surface 30b to the second bottom surfaces 38Ya.

Figure 11:
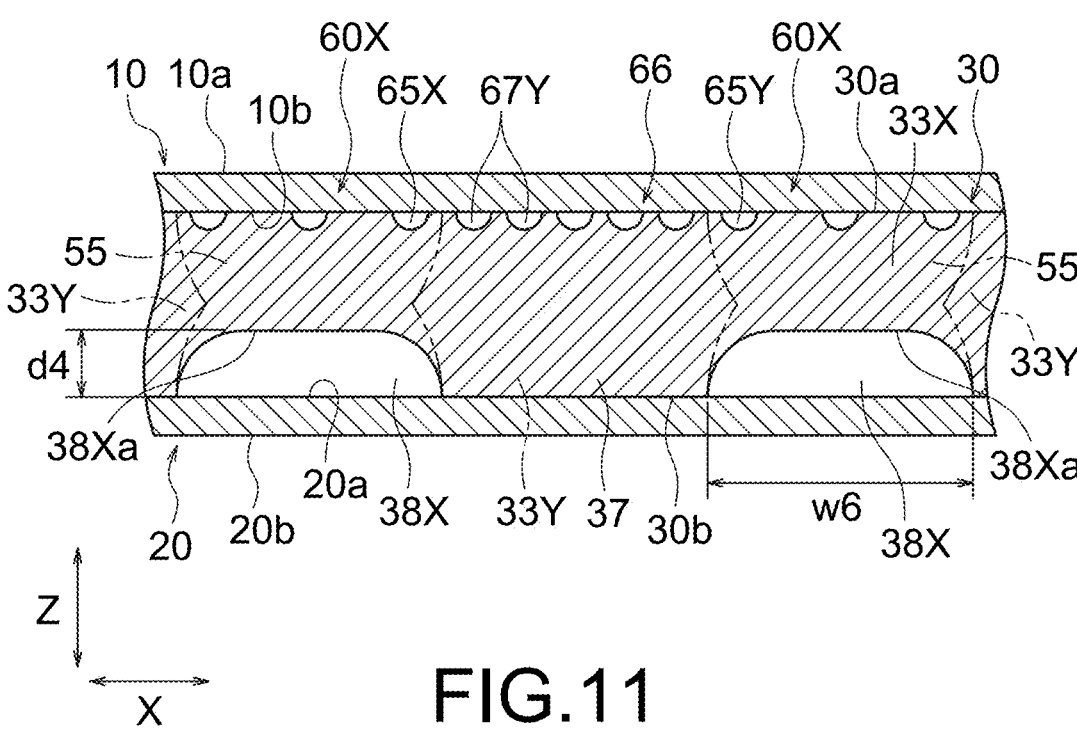
FIG. 11 is a sectional view of first land recessed portions taken along a line C-C in FIG. 9.

As illustrated in FIG. 11, first land recessed portions 38X may be located on the second body surface 30b at the first land portions 33X. As illustrated in FIG. 9, the first land recessed portions 38X may connect the passage division portions 55 that are located on both sides of the first land recessed portions 38X in the Y direction. FIG. 11 illustrates a section of each land portion 33X in the X direction. The first land recessed portions 38X are formed at the first land portions 33X, the multiple passage division portions 55 that are arranged in the Y direction may be continuously in communication with each other in the Y direction with the first land recessed portions 38X interposed therebetween.

As illustrated in FIG. 9, the first land recessed portions 38X may be located on both sides of the land intersection portions 37 in the X direction. Each first land recessed portion 38X may be formed between two land intersection portions 37 adjacent to each other in the X direction.

The first land recessed portions 38X may be formed by being etched from the second body surface 30b of the wick sheet 30 in the etching process described later. As illustrated in FIG. 11, the first land recessed portions 38X are formed in a recessed shape on the second body surface 30b. The width w6 of each first land recessed portion 38X may be equal to the width w4 (see FIG. 8) of each second vapor flow path recessed portion 54 described above or may be less than the width w4. The width w6 is a dimension in the X direction and is the dimension of each first land recessed portion 38X at the second body surface 30b. The first land recessed portions 38X may have first bottom surfaces 38Xa. The first bottom surfaces 38Xa may be substantially flat. The first bottom surfaces 38Xa may be located at positions near the first body surface 30a at the first land recessed portions 38X. The depth d4 of each first land recessed portion 38X may be less than the depth d2 (see FIG. 8) from the second body surface 30b to each through-portion 34 or may be equal to the depth d2. The depth d4 may be equal to distances from the second body surface 30b to the first bottom surfaces 38Xa. The depth d4 may be equal to the depth d3.

The first liquid flow path portions 60X and the second liquid flow path portions 60Y will now be described.

As illustrated in FIG. 3 and FIG. 8, the first liquid flow path portions 60X and the second liquid flow path portions 60Y may be formed between the first sheet 10 and the wick sheet 30. The first liquid flow path portions 60X are formed on the first body surface 30a at the first land portions 33X. The second liquid flow path portions 60Y are formed on the first body surface 30a at the second land portions 33Y The liquid flow path portions 60X and 60Y may include a flow path through which the working liquid 2b mainly passes. The working vapor 2a described above may pass through the flow paths of the liquid flow path portions 60X and 60Y The liquid flow path portions 60X and 60Y form a portion of the enclosure space 3 described above and are in communication with the vapor flow path portion 50. The liquid flow path portions 60X and 60Y are formed as a capillary structure for transporting the working liquid 2b to the vaporization region SR. The liquid flow path portions 60X and 60Y are also referred to as a wick in some cases. The first liquid flow path portions 60X may be formed over the whole of the first body surface 30a at the first land portions 33X. In this case, the dimension in the Y direction of each first liquid flow path portion 60X may be equal to the width w1 of each first land portion 33X. The second liquid flow path portions 60Y may be formed over the whole of the first body surface 30a at the second land portions 33Y In this case, the dimension in the X direction of each second liquid flow path portion 60Y may be equal to the width w2 of each second land portion 33Y The same liquid flow path portion as the liquid flow path portions 60X and 60Y may be formed at an inner portion of the first body surface 30a at the frame portion 32 although this is not illustrated in, for example, FIG. 6. A liquid flow path portion may be formed on the second body surface 30b at the land portions 33X and 33Y, and a liquid flow path portion may be formed on the second body surface 30b at the frame portion 32 although this is not illustrated.

The first liquid flow path portions 60X will be described.

Figure 12:
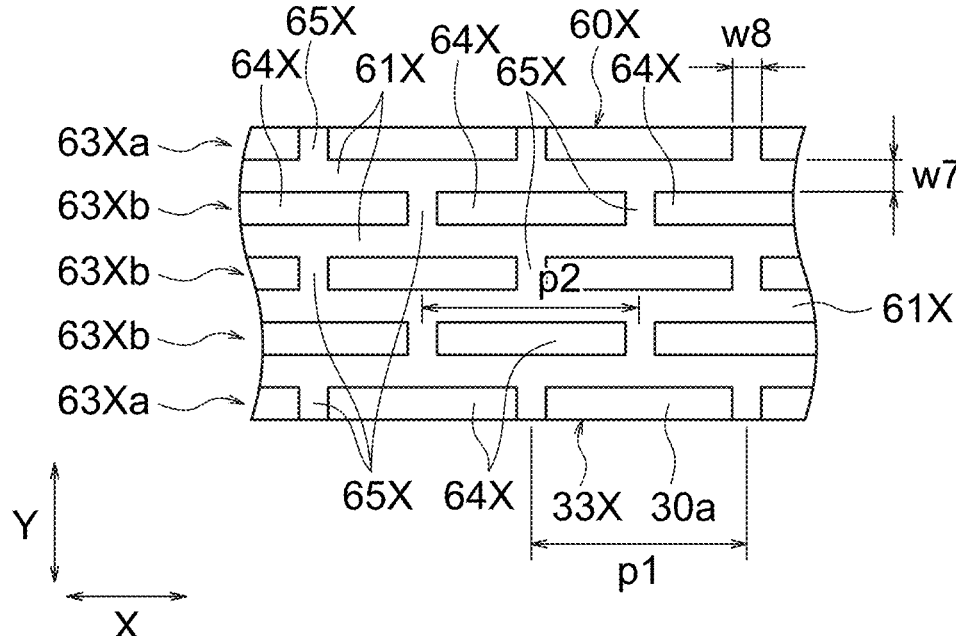
FIG. 12 is a partial enlarged plan view of a liquid flow path portion illustrated in FIG. 6.
Figure 13:
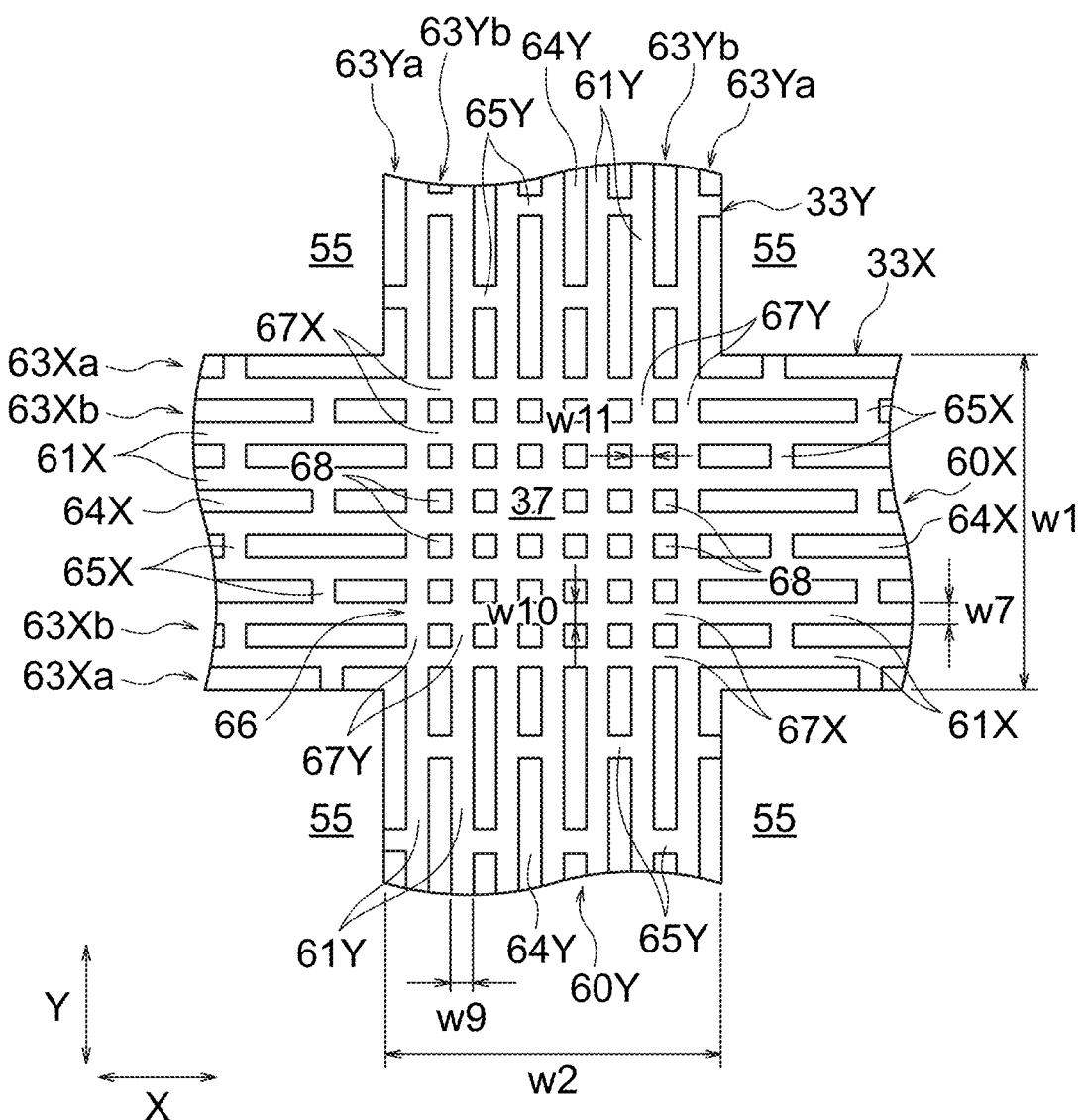
FIG. 13 is a plan view of one of the land intersection portions illustrated in FIG. 6.

As illustrated in FIG. 12 and FIG. 13, the first liquid flow path portions 60X may include the multiple first main flow grooves 61X and multiple first communication grooves 65X. The first main flow grooves 61X and the first communication grooves 65X are flow paths through which the working liquid 2b passes. The first communication grooves 65X are connected and in communication with the first main flow grooves 61X.

The first main flow grooves 61X and the first communication grooves 65X may be located on the first body surface 30a at the first land portions 33X. The first main flow grooves 61X and the first communication grooves 65X may be in communication with the vapor passages 51 and 52.

As illustrated in FIG. 12 and FIG. 13, the first main flow grooves 61X extend in the X direction. The first main flow grooves 61X are arranged in the Y direction. The first main flow grooves 61X have small flow path sectional areas such that the working liquid 2b mainly flows due to capillary action. The flow path sectional areas of the first main flow grooves 61X are smaller than the flow path sectional areas of the vapor passages 51 and 52. The first main flow grooves 61X are configured to transport the working liquid 2b that condenses from the working vapor 2a to the vaporization region SR.

The first main flow grooves 61X may be formed by being etched from the first body surface 30a of the wick sheet 30 in the etching process described later. As illustrated in FIG. 8 and FIG. 12, the width w7 of each first main flow groove 61X may be less than the width w3 of each first vapor flow path recessed portion 53. For example, the width w7 may be 5 μm to 400 μm. The width w7 means the dimension of each first main flow groove 61X at the first body surface 30a. The width w7 corresponds to the dimension in the Y direction of each first main flow groove 61X. For example, the depth d5 of each first main flow groove 61X may be 3 μm to 300 μm. The depth d5 corresponds to the dimension in the Z direction of each first main flow groove 61X.

As illustrated in FIG. 12 and FIG. 13, the first communication grooves 65X extend in a direction that differs from the X direction. According to the present embodiment, the first communication grooves 65X extend in the Y direction and are perpendicular to the first main flow grooves 61X. The first communication grooves 65X have small flow path sectional areas such that the working liquid 2b mainly flows due to the capillary action. The flow path sectional areas of the first communication grooves 65X are smaller than the flow path sectional areas of the vapor passages 51 and 52.

The first communication grooves 65X may be formed by being etched from the first body surface 30a of the wick sheet 30 in the etching process described later as in the first main flow grooves 61X. As illustrated in FIG. 8 and FIG. 12, the width w8 of each first communication groove 65X may be less than the width w3 of each first vapor flow path recessed portion 53. The width w8 may be equal to or may differ from the width w7 of each first main flow groove 61X. The width w8 means the dimension of each first communication groove 65X at the first body surface 30a. The width w8 corresponds to the dimension in the X direction of each first communication groove 65X. The depth of each first communication groove 65X may be equal to the depth d5 of each first main flow groove 61X. The depth of each first communication groove 65X corresponds to the dimension in the Z direction of each first communication groove 65X.

The multiple first communication grooves 65X form edge communication groove columns 63Xa and intermediate communication groove columns 63Xb. The edge communication groove columns 63Xa are formed by the multiple first communication grooves 65X that connect the vapor passages 51 and 52 and the first main flow grooves 61X and that are arranged in the X direction. The intermediate communication groove columns 63Xb are formed by each of the multiple first communication grooves 65X that connects two first main flow grooves 61X adjacent to each other and that is arranged in the Y direction. The edge communication groove columns 63Xa are located between the vapor passages 51 and 52 and the intermediate communication groove columns 63Xb. The multiple intermediate communication groove columns 63Xb are located at the first land portions 33X and are arranged in the Y direction.

An interval p1 in the X direction between the first communication grooves 65X that form the edge communication groove columns 63Xa may be equal to an interval p2 in the X direction between the first communication grooves 65X that form the intermediate communication groove columns 63Xb. The positions in the X direction of the first communication grooves 65X that form the edge communication groove columns 63Xa may be shifted from the positions in the X direction of the first communication grooves 65X that form the intermediate communication groove columns 63Xb adjacent to the edge communication groove columns 63Xa. The amounts of the shift may be half of the intervals p1 and p2 between the first communication grooves 65X in the X direction. Similarly, the positions in the X direction of the first communication grooves 65X that form one of two intermediate communication groove columns 63Xb adjacent to each other may be shifted from the positions in the X direction of the first communication grooves 65X that form the other intermediate communication groove column 63Xb.

As illustrated in FIG. 12 and FIG. 13, the first liquid flow path portions 60X may include multiple first projecting portions 64X that are located on the first body surface 30a at the first land portions 33X. The first projecting portions 64X may be defined by the first main flow grooves 61X and the first communication grooves 65X or may be defined by the first main flow grooves 61X, the first communication grooves 65X, and the vapor passages 51 and 52. The first projecting portions 64X may be formed in a rectangular shape such that the X direction is the longitudinal direction in plan view or may be formed in a rounded rectangular shape. The first projecting portions 64X are not etched in the etching process described later, and the material of the wick sheet 30 remains at the portions. The first projecting portions 64X may be bonded to the first sheet inner surface 10b of the first sheet 10. The first projecting portions 64X may be in staggered arrangement. More specifically, the first projecting portions 64X adjacent to each other in the Y direction may be shifted from each other in the X direction. The amounts of the shift may be half of a pitch at which the first projecting portions 64X are arranged in the X direction. The width of each first projecting portion 64X may be equal to or may differ from the width w7 of each first main flow groove 61X. The width of each first projecting portion 64X corresponds to a dimension in the Y direction at the first body surface 30a.

The second liquid flow path portions 60Y will now be described.

As illustrated in FIG. 13, the second liquid flow path portions 60Y may include multiple second main flow grooves 61Y and multiple second communication grooves 65Y The second main flow grooves 61Y and the second communication grooves 65Y are grooves through which the working liquid 2b passes. The second communication grooves 65Y are connected and in communication with the second main flow grooves 61Y.

The second main flow grooves 61Y and the second communication grooves 65Y may be located on the first body surface 30a at the second land portions 33Y The second main flow grooves 61Y and the second communication grooves 65Y may be in communication with the vapor passages 51 and 52.

As illustrated in FIG. 13, the second main flow grooves 61Y extend in the Y direction. The second main flow grooves 61Y are arranged in the X direction. The second main flow grooves 61Y have small flow path sectional areas such that the working liquid 2b mainly flows due to the capillary action. The flow path sectional areas of the second main flow grooves 61Y are smaller than the flow path sectional areas of the vapor passages 51 and 52. The second main flow grooves 61Y are configured to transport the working liquid 2b that condenses from the working vapor 2a to the vaporization region SR. The second main flow grooves 61Y may be formed by being etched as in the first main flow grooves 61X described above. The width w9 of each second main flow groove 61Y may be equal to the width w7 of each first main flow groove 61X. The width w9 means the dimension of each second main flow groove 61Y at the first body surface 30a. The width w9 corresponds to the dimension in the X direction of each second main flow groove 61Y The depth of each second main flow groove 61Y may be equal to the depth d5 of each first main flow groove 61X. The depth of each second main flow groove 61Y corresponds to the dimension in the Z direction of each second main flow groove 61Y.

As illustrated in FIG. 13, the second communication grooves 65Y extend in a direction that differs from the Y direction. According to the present embodiment, the second communication grooves 65Y extend in the X direction and are perpendicular to the second main flow grooves 61Y The second communication grooves 65Y have small flow path sectional areas such that the working liquid 2b mainly flows due to the capillary action. The flow path sectional areas of the second communication grooves 65Y are smaller than the flow path sectional areas of the vapor passages 51 and 52. The second communication grooves 65Y may be formed by being etched as in the first communication grooves 65X described above. The width of each second communication groove 65Y may be equal to the width of each first communication groove 65X. The width of each second communication groove 65Y means the dimension of each second communication groove 65Y at the first body surface 30a and corresponds to the dimension in the Y direction of each second communication groove 65Y The depth of each second communication groove 65Y may be equal to the depth of each first communication groove 65X. The depth of each second communication groove 65Y corresponds to the dimension in the Z direction of each second communication groove 65Y.

The multiple second communication grooves 65Y form edge communication groove columns 63Ya and intermediate communication groove columns 63Yb. The edge communication groove columns 63Ya are formed by the multiple second communication grooves 65Y that connect the vapor passages 51 and 52 and the second main flow grooves 61Y and that are arranged in the Y direction. The intermediate communication groove columns 63Yb are formed by each of the multiple second communication grooves 65Y that connects two second main flow grooves 61Y adjacent to each other and that is arranged in the X direction. The edge communication groove columns 63Ya are located between the vapor passages 51 and 52 and the intermediate communication groove columns 63Yb. The multiple intermediate communication groove columns 63Yb are located at the second land portions 33Y and are arranged in the X direction.

An interval in the Y direction between the second communication grooves 65Y that form the edge communication groove columns 63Ya may be equal to an interval in the Y direction between the second communication grooves 65Y that form the intermediate communication groove columns 63Yb as in the first communication grooves 65X described above. The positions in the Y direction of the second communication grooves 65Y that form the edge communication groove columns 63Ya may be shifted from the positions in the Y direction of the second communication grooves 65Y that form the intermediate communication groove columns 63Yb adjacent to the edge communication groove columns 63Ya. The amounts of the shift may be half of the interval between the second communication grooves 65Y in the Y direction. Similarly, the positions in the Y direction of the second communication grooves 65Y that form one of two intermediate communication groove columns 63Yb adjacent to each other may be shifted from the positions in the Y direction of the second communication grooves 65Y that form the other intermediate communication groove column 63Yb.

As illustrated in FIG. 13, the second liquid flow path portions 60Y may include multiple second projecting portions 64Y that are located on the first body surface 30a at the second land portions 33Y. The second projecting portions 64Y may be defined by the second main flow grooves 61Y and the second communication grooves 65Y or may be defined by the second main flow grooves 61Y, the second communication grooves 65Y, and the vapor passages 51 and 52. The second projecting portions 64Y may be formed in a rectangular shape such that the Y direction is the longitudinal direction in plan view or may be formed in a rounded rectangular shape. The second projecting portions 64Y are not etched in the etching process described later, and the material of the wick sheet 30 remains at the portions. The second projecting portions 64Y may be bonded to the first sheet inner surface 10b of the first sheet 10. The second projecting portions 64Y may be in staggered arrangement. More specifically, the second projecting portions 64Y adjacent to each other in the X direction may be shifted from each other in the Y direction. The amounts of the shift may be half of a pitch at which the second projecting portions 64Y are arranged in the Y direction.

As illustrated in FIG. 13, groove connection portions 66 may be located at the land intersection portions 37 described above. The groove connection portions 66 are connected to the first main flow grooves 61X on both sides in the X direction and are connected to the second main flow grooves 61Y on both sides in the Y direction. Consequently, the first main flow grooves 61X that are located at the first land portions 33X corresponding thereto and the second main flow grooves 61Y that are located at the second land portions 33Y corresponding thereto are in communication with each other at the land intersection portions 37.

The groove connection portions 66 may include multiple first intersection grooves 67X and multiple second intersection grooves 67Y. The first intersection grooves 67X and the second intersection grooves 67Y may be located on the first body surface 30a at the land intersection portions 37. The first intersection grooves 67X and the second intersection grooves 67Y may have small flow path sectional areas such that the working liquid 2b mainly flows due to the capillary action. The flow path sectional areas of the first intersection grooves 67X are smaller than the flow path sectional areas of the vapor passages 51 and 52. The width w10 of each first intersection groove 67X may be equal to the width w7 of each first main flow groove 61X. The width w10 corresponds to the dimension in the Y direction of each first intersection groove 67X at the first body surface 30a. The depth of each first intersection groove 67X may be equal to the depth d5 of each first main flow groove 61X. The depth of each first intersection groove 67X corresponds to the dimension in the Z direction of each first intersection groove 67X. The width w11 of each second intersection groove 67Y may be equal to the width w9 of each second main flow groove 61Y The width w11 corresponds to the dimension in the X direction of each second intersection groove 67Y at the first body surface 30a. The depth of each second intersection groove 67Y may be equal to the depth of each second main flow groove 61Y The depth of each second intersection groove 67Y corresponds to the dimension in the Z direction of each second intersection groove 67Y The first intersection grooves 67X and the second intersection grooves 67Y may be formed by being etched as in the main flow grooves 61X and 61Y described above.

The first intersection grooves 67X extend in the X direction along extension lines from the first main flow grooves 61X corresponding thereto. The second intersection grooves 67Y extend in the Y direction along extension lines from the second main flow grooves 61Y corresponding thereto. The first intersection grooves 67X are arranged in the Y direction, and the second intersection grooves 67Y are arranged in the X direction. The first intersection grooves 67X and the second intersection grooves 67Y intersect with each other. The first intersection grooves 67X and the second intersection grooves 67Y may intersect with each other in a cross shape. In this case, the multiple first intersection grooves 67X and the multiple second intersection grooves 67Y may be at least partly formed in a lattice pattern. As illustrated in FIG. 13, the multiple first intersection grooves 67X and the multiple second intersection grooves 67Y may be entirely formed in a lattice pattern or may be partly formed in a lattice pattern. The first intersection grooves 67X and the second intersection grooves 67Y are connected to each other such that the working liquid 2*b* can move forward and backward.

The groove connection portions 66 may include multiple intersection projecting portions 68 that are provided on the first body surface 30*a* at the land intersection portions 37. The intersection projecting portions 68 are defined by the first intersection grooves 67X and two second intersection grooves 67Y The intersection projecting portions 68 may be formed in a rectangular shape or a square shape in the X direction and the Y direction in plan view. Corner portions of the intersection projecting portions 68 may be rounded. The intersection projecting portions 68 are not etched in the etching process described later, and the material of the wick sheet 30 remains at the portions. The intersection projecting portions 68 may be bonded to the first sheet inner surface 10*b* of the first sheet 10. The intersection projecting portions 68 may be arranged in the X direction and may be arranged in the Y direction.

The materials of the first sheet 10, the second sheet 20, and the wick sheet 30 are not particularly limited, provided that the materials have excellent thermal conductivity to such an extent that the heat dissipation performance of the vapor chamber 1 can be ensured. For example, the sheets 10, 20, and 30 may be composed of a metal material. For example, the sheets 10, 20, and 30 may contain copper or a copper alloy. The copper and the copper alloy have excellent thermal conductivity and corrosion resistance in the case where pure water is used as the working fluid. Examples of the copper include pure copper and oxygen-free copper (C1020). Examples of the copper alloy include a copper alloy that contains tin, a copper alloy (such as C1990) that contains titanium, and a Corson copper alloy (such as C7025) that is a copper alloy that contains nickel, silicon, and magnesium. An example of the copper alloy that contains tin is phosphor bronze (such as C5210).

For example, the thickness t1 of the vapor chamber 1 illustrated in FIG. 3 may be 100 µm to 500 µm. When the thickness t1 is 100 µm or more, the vapor flow path portion 50 can be appropriately maintained. For this reason, the vapor chamber 1 can appropriately function. When the thickness t1 is 500 µm or less, the thickness t1 can be inhibited from increasing. For this reason, the vapor chamber 1 can be thin.

The thickness of the wick sheet 30 may be more than the thickness of the first sheet 10. Similarly, the thickness of the wick sheet 30 may be more than the thickness of the second sheet 20. In an example described according to the present embodiment, the thickness of the first sheet 10 and the thickness of the second sheet 20 are equal to each other. The present disclosure, however, is not limited thereto, and the thickness of the first sheet 10 and the thickness of the second sheet 20 may differ from each other.

For example, the thickness t2 of the first sheet 10 may be 6 µm to 100 µm. When the thickness t2 of the first sheet 10 is 6 µm or more, the mechanical strength and long-term reliability of the first sheet 10 can be ensured. When the thickness t2 of the first sheet 10 is 100 µm or less, the thickness t1 of the vapor chamber 1 can be inhibited from increasing. The thickness t3 of the second sheet 20 may be equal to or may differ from the thickness t2 of the first sheet 10.

For example, the thickness t4 of the wick sheet 30 may be 50 µm to 400 µm. When the thickness t4 of the wick sheet 30 is 50 µm or more, the vapor flow path portion 50 can be appropriately maintained. In this case, the vapor chamber 1 can appropriately function. When the thickness t4 is 400 µm or less, the thickness t1 of the vapor chamber 1 can be inhibited from increasing. For this reason, the vapor chamber 1 can be thin. The thickness t4 of the wick sheet 30 may be equal to a distance between the first body surface 30*a* and the second body surface 30*b*.

A method of manufacturing the vapor chamber 1 that is thus configured according to the present embodiment will now be described.

In a preparation process, the first sheet 10, the second sheet 20, and the wick sheet 30 are prepared. The preparation process may include the etching process in which the wick sheet 30 is formed by being etched. In the etching process, the wick sheet 30 may be formed by being etched with a patterned resist film (not illustrated) based on a photolithography technique.

In a temporary fixation process, the first sheet 10, the wick sheet 30, and the second sheet 20 are temporarily fixed. For example, the sheets 10, 20, and 30 are temporarily fixed by spot welding or laser welding. At this time, the positions of the sheets 10, 20, and 30 may be adjusted by using alignment holes 12, 22, and 35 described above.

In a subsequent bonding process, the first sheet 10, the wick sheet 30, and the second sheet 20 are permanently bonded to each other. The sheets 10, 20, and 30 may be bonded by diffusion bonding.

In an injection process after the bonding process, the enclosure space 3 is evacuated, and the working liquid 2*b* is injected from the injection portion 4 (see FIG. 3) into the enclosure space 3.

In a sealing process after the injection process, the injection flow path 36 described above is sealed. Consequently, communication between the enclosure space 3 and the outside is intercepted, and the enclosure space 3 is enclosed. The enclosure space 3 in which the working liquid 2*b* is encapsulated is obtained, and the working liquid 2*b* in the enclosure space 3 is prevented from leaking to the outside.

In the above manner, the vapor chamber 1 according to the present embodiment is obtained.

A method of operating the vapor chamber 1, that is, a method of cooling the electronic device D will now be described.

The vapor chamber 1 that is obtained in the above manner is installed in the housing H such as a mobile terminal. When the electronic device D generates heat, the working liquid 2*b* that is located in the vaporization region SR is heated by the electronic device D. The heat is absorbed as latent heat, the working liquid 2*b* vaporizes, and the working vapor 2*a* is generated. As illustrated by using solid arrows in FIG. 6, the working vapor 2*a* generated disperses in the second vapor passages 52 and the first vapor passage 51 forming the enclosure space 3. More specifically, the working vapor 2*a* that is generated at the land portions 33X and 33Y moves to the passage division portions 55 adjacent thereto. The working vapor 2a moves toward the condensation region CR via the first land recessed portions 38X that are located at the first land portions 33X and the second land recessed portions 38Y that are located at the second land portions 33Y in the direction of any one of dashed arrows illustrated in FIG. 9.

In this way, the working vapor 2a in the vapor passages 51 and 52 is separated from the vaporization region SR and disperses in the condensation region CR that has a relatively low temperature. In the condensation region CR, the working vapor 2a mainly dissipates heat to the second sheet 20 and is cooled. The heat that is transferred from the working vapor 2a to the second sheet 20 is transferred to outside air via the housing member Ha (see FIG. 3). In an example illustrated in FIG. 6 and FIG. 7, a region on the right of the vaporization region SR acts as the condensation region CR, but a region on the left of the vaporization region SR can also act as the condensation region CR.

The working vapor 2a dissipates the heat to the second sheet 20 in the condensation region CR and consequently loses the latent heat that is absorbed in the vaporization region SR. Consequently, the working vapor 2a condenses, and the working liquid 2b is generated. In the vaporization region SR, the working liquid 2b continues vaporizing. For this reason, as illustrated by using dashed arrows in FIG. 6, the working liquid 2b that condenses is transported toward the vaporization region SR due to the capillary action of the main flow grooves 61X and 61Y More specifically, the working liquid 2b moves from the vapor passages 51 and 52 to the main flow grooves 61X and 61Y via the communication grooves 65X and 65Y of the edge communication groove columns 63Xa. The working liquid 2b is filled in the main flow grooves 61X and 61Y and the communication grooves 65X and 65Y The working liquid 2b filled obtains propulsive force toward the vaporization region SR due to the capillary action of the main flow grooves 61X and 61Y and is smoothly transported toward the vaporization region SR.

At the liquid flow path portions 60X and 60Y, the main flow grooves 61X and 61Y are in communication with the other main flow grooves 61X and 61Y adjacent thereto with the communication grooves 65X and 65Y of the intermediate communication groove columns 63Xb and 63Yb interposed therebetween. This enables the working liquid 2b to move forward and backward between two main flow grooves 61X and 61Y adjacent to each other. For this reason, the capillary action is applied to the working liquid 2b in the main flow grooves 61X and 61Y, and the working liquid 2b is smoothly transported toward the vaporization region SR.

The working liquid 2b that reaches the vaporization region SR is heated again by the electronic device D and vaporizes.

A case that is considered herein is that the amount of vaporization of the working liquid 2b in the vaporization region SR is not uniform. In this case, the amount of vaporization of the working liquid 2b increases at some first land portions 33X of the multiple first land portions 33X. In the case where none of the second land portions 33Y extends in the Y direction, the amount of the working liquid 2b is likely to decrease at the first liquid flow path portions 60X that are located at the first land portion 33X at which the amount of vaporization is large. The working liquid 2b is likely to be surplus at the first liquid flow path portions 60X that are located at the other first land portions 33X.

According to the present embodiment, however, the second land portions 33Y extend in the Y direction, and the second land portions 33Y intersect with the first land portions 33X at the land intersection portions 37. At the land intersection portions 37, the first main flow grooves 61X at the first land portions 33X and the second main flow grooves 61Y at the second land portions 33Y are in communication with each other. The capillary action acts such that the working liquid 2b is transported to a position at which the amount of the working liquid 2b is small. Consequently, the working liquid 2b in the first main flow grooves 61X that are located at the other first land portions 33X is transported toward the first main flow groove 61X that is located at the first land portion 33X at which the vaporization is activated. At this time, the working liquid 2b that is located at the first main flow grooves 61X moves to the second main flow grooves 61Y at the second land portions 33Y via each of the groove connection portions 66 that are located at the land intersection portions 37. The working liquid 2b moves to the first main flow grooves 61X at the first land portion 33X at which the vaporization is activated via the other groove connection portions 66. In this way, the working liquid 2b is transported to the first land portion 33X at which the vaporization is activated, and the amount of vaporization of the working liquid 2b increases. In this case, absorbing the heat from the electronic device D is facilitated, and the absorbing efficiency of the heat of the electronic device D is improved.

The working vapor 2a into which the working liquid 2b vaporizes in the main flow grooves 61X and 61Y moves to the vapor passages 51 and 52 via the communication grooves 65X and 65Y of the edge communication groove columns 63Xa and 63Ya. The working vapor 2a disperses in the vapor passages 51 and 52. In this way, the working fluids 2a and 2b circulate in the enclosure space 3 while repeating the phase changes, that is, the vaporization and the condensation. Consequently, the heat of the electronic device D is dispersed and is dissipated. As a result, the electronic device D is cooled.

According to the present embodiment, the first land portions 33X that extend in the X direction and the second land portions 33Y that extend in the Y direction thus intersect with each other at the land intersection portions 37. At the land intersection portions 37, the first main flow grooves 61X that are located at the first land portions 33X and the second main flow grooves 61Y that are located at the second land portions 33Y are in communication with each other. This enables the working liquid 2b that flows through the first main flow groove 61X at each first land portion 33X to move to the first main flow grooves 61X at the other first land portions 33X via the second main flow grooves 61Y at the second land portions 33Y. For this reason, the working liquid 2b can be transported to the first land portion 33X at which the amount of the working liquid 2b is small, and the transport efficiency of the working liquid 2b can be improved. As a result, the heat dissipation performance of the vapor chamber 1 can be improved.

According to the present embodiment, each second vapor passage 52 that is located between two first land portions 33X adjacent to each other includes the passage division portions 55 that are located on both sides of the second land portions 33Y in the Y direction. The second land recessed portions 38Y that connect the passage division portions 55 that are located on both sides in the X direction are located on the second body surface 30b at the second land portions 33Y The working vapor 2a that vaporizes in the vaporization region SR moves from the land portions 33X and 33Y to the passage division portions 55 of the second vapor passages 52 adjacent thereto. This enables the working vapor 2a to move in the X direction from the passage division portions 55 via the second land recessed portions 38Y and to disperse toward the condensation region CR. For this reason, the flow paths for the working vapor 2a can be inhibited from being divided by the second land portions 33Y, and the transport efficiency of the working vapor 2a can be improved. As a result, the heat dissipation performance of the vapor chamber 1 can be improved.

According to the present embodiment, each of the first land portions 33X extends in the X direction across the land intersection portions 37, and each of the second land portions 33Y extends in the Y direction across the land intersection portions 37. This enables the first main flow grooves 61X that are located on both sides of the land intersection portions 37 in the X direction to extend in the X direction. For this reason, in the case where the amount of vaporization of the working liquid 2b at the other first land portions 33X is small, the working liquid 2b can continuously move in the X direction via the land intersection portions 37. Similarly, the second main flow grooves 61Y that are located on both sides of the land intersection portions 37 in the Y direction can extend in the Y direction. For this reason, in the case where the amount of vaporization of the working liquid 2b at the first land portion 33X that is relatively far is large, the working liquid 2b can continuously move in the Y direction via the land intersection portions 37, and the working liquid 2b can move to the first land portion 33X that is relatively far. In this way, the working liquid 2b can be transported to the first land portion 33X at which the amount of the working liquid 2b is small, and the transport efficiency of the working liquid 2b can be improved. As a result, the heat dissipation performance of the vapor chamber 1 can be improved.

According to the present embodiment, the land intersection portions 37 extend from the first body surface 30a to the second body surface 30b. This enables the first body surface 30a at the land intersection portions 37 to be bonded to the first sheet 10 and enables the second body surface 30b at the land intersection portions 37 to be bonded to the second sheet 20. For this reason, the mechanical strength of the vapor chamber 1 can be improved.

According to the present embodiment, the second land recessed portions 38Y are located on both sides of the land intersection portions 37 in the Y direction. This can avoid forming the second land recessed portions 38Y on the second body surface 30b at the land intersection portions 37. For this reason, the second body surface 30b at the land intersection portions 37 can be bonded to the second sheet 20, and the mechanical strength of the vapor chamber 1 can be improved.

According to the present embodiment, the first land recessed portions 38X that connect the passage division portions 55 that are located on both sides in the Y direction are located on the second body surface 30b at the first land portions 33X. The working vapor 2a that vaporizes in the vaporization region SR moves from the land portions 33X and 33Y to the passage division portions 55 of the second vapor passages 52 adjacent thereto. This enables the working vapor 2a to move in the Y direction from the passage division portions 55 via the first land recessed portions 38X and to disperse toward the condensation region CR. For this reason, the flow paths for the working vapor 2a can be inhibited from being divided by the first land portions 33X, and the transport efficiency of the working vapor 2a can be improved. As a result, the heat dissipation performance of the vapor chamber 1 can be improved.

According to the present embodiment, the first land recessed portions 38X are located on both sides of the land intersection portions 37 in the X direction. This can avoid forming the first land recessed portions 38X on the second body surface 30b at the land intersection portions 37. For this reason, the second body surface 30b at the land intersection portions 37 can be bonded to the second sheet 20, and the mechanical strength of the vapor chamber 1 can be improved.

According to the present embodiment, the multiple first land portions 33X and the multiple second land portions 33Y are located in the vapor flow path portion 50, and the first land portions 33X and the second land portions 33Y intersect with each other at the multiple land intersection portions 37. At the land intersection portions 37, the first main flow grooves 61X that are located at the first land portions 33X corresponding thereto and the second main flow grooves 61Y that are located at the second land portions 33Y corresponding thereto are in communication with each other. This enables the working liquid 2b that moves through the first main flow groove 61X at each first land portion 33X to move to the first main flow grooves 61X at the other first land portions 33X via the second main flow grooves 61Y at the second land portions 33Y. For this reason, the amount of the working liquid 2b transported to the first land portion 33X at which the amount of the working liquid 2b is small can be increased, and the transport efficiency of the working liquid 2b can be improved. As a result, the heat dissipation performance of the vapor chamber 1 can be improved.

According to the present embodiment, the multiple land intersection portions 37 are located in the vaporization region SR in which the working liquid 2b vaporizes. This enables the working liquid 2b to be uniformly transported to the land portions 33X and the land portions 33Y in the vaporization region SR. For this reason, the transport efficiency of the working liquid 2b can be improved.

According to the present embodiment, the groove connection portions 66 that are located at the land intersection portions 37 are connected to the first main flow grooves 61X on both sides in the X direction and are connected to the second main flow grooves 61Y on both sides in the Y direction. This enables a direction in which the working liquid 2b that reaches the groove connection portions 66 from the first main flow grooves 61X that are located on first sides in the X direction is transported to be changed into either the X direction or the Y direction. In this case, the direction in which the working liquid 2b is transported can be changed into the direction toward the first land portion 33X at which the amount of the working liquid 2b is small. For this reason, the working liquid 2b can be transported to the first land portion 33X at which the amount of the working liquid 2b is small, and the transport efficiency of the working liquid 2b can be improved.

According to the present embodiment, the groove connection portions 66 include the multiple first intersection grooves 67X that extend along the extension lines from the first main flow grooves 61X corresponding thereto and the multiple second intersection grooves 67Y that extend along the extension lines from the second main flow grooves 61Y corresponding thereto. The first intersection grooves 67X and the second intersection grooves 67Y intersect with each other. This enables the working liquid 2b that reaches the groove connection portions 66 from the first main flow grooves 61X that are located on the first sides in the X direction to move to the first main flow grooves 61X that are located on second sides in the X direction and to move to the second main flow grooves 61Y that are located on both sides in the Y direction. For this reason, the direction in which the working liquid 2*b* is transported can be changed into the direction toward the first land portion 33X at which the amount of the working liquid 2*b* is small.

Modifications to the present embodiment described above will now be described.

A first modification will be described.

Figure 14:
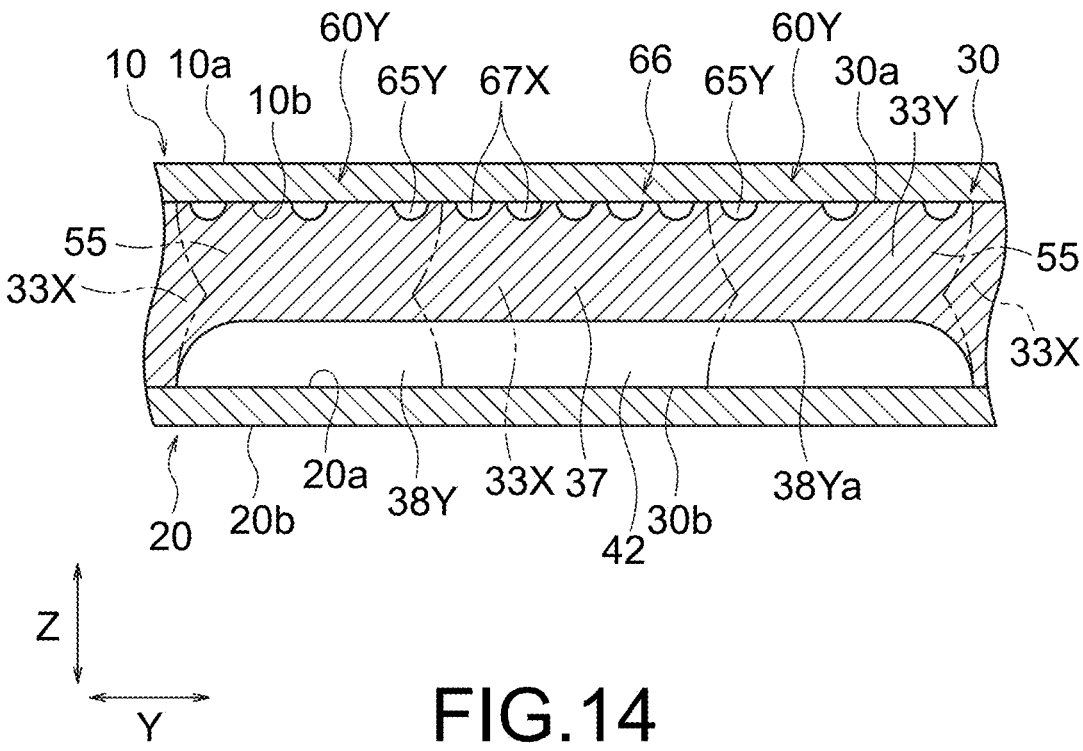
FIG. 14 is a sectional view of a modification to the second land recessed portions illustrated in FIG. 10.
Figure 42:
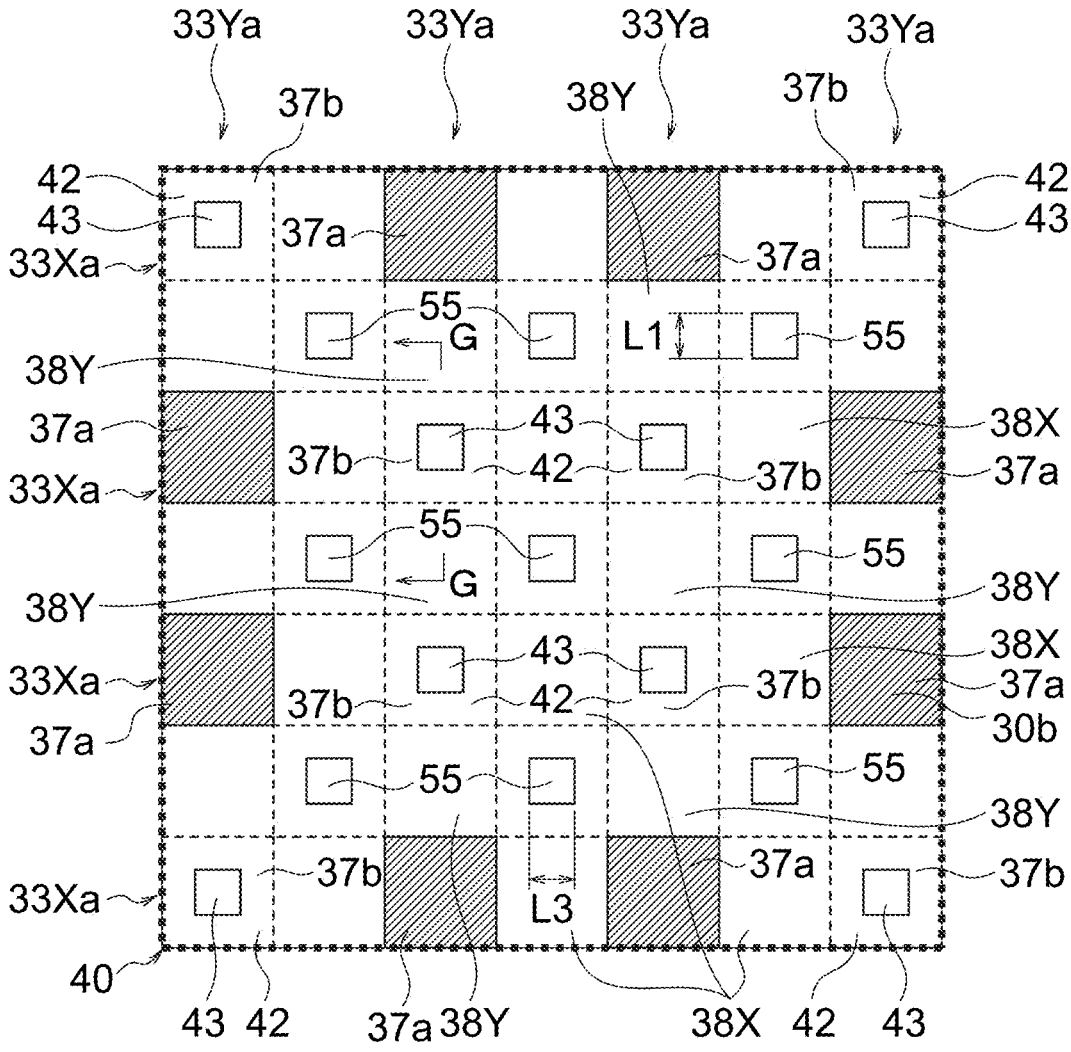
FIG. 42 is a plan view of another modification to the land connection region illustrated in FIG. 33.
Figure 42:
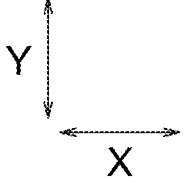
Figure 43:
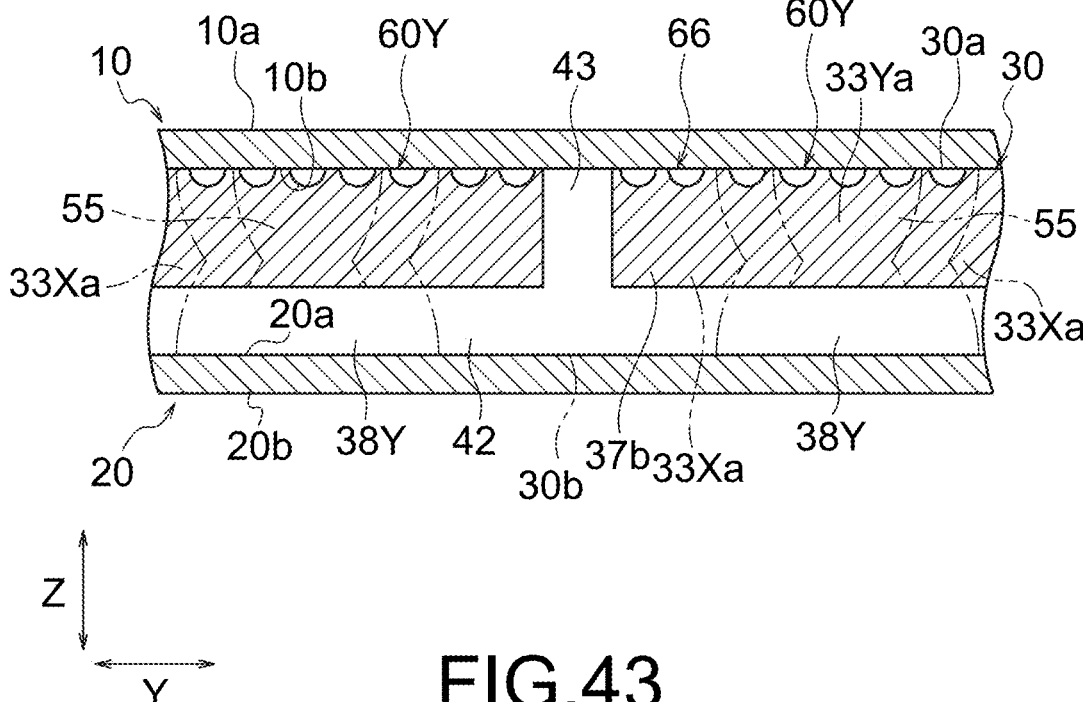
FIG. 43 is a sectional view of a first through-hole taken along a line G-G in FIG. 42.

In an example described according to a first embodiment described above, the land intersection portions 37 extend from the first body surface 30*a* to the second body surface 30*b*, and the second land recessed portions 38Y are located on both sides of the land intersection portions 37. The present disclosure, however, is not limited thereto. For example, as illustrated in FIG. 14, the second land recessed portions 38Y may extend through the land intersection portions 37 in the Y direction from portions that are located on the first sides of the land intersection portions 37 in the Y direction to portions that are located on the second sides thereof. In an example illustrated in FIG. 14, the second land recessed portions 38Y may be continuous in the Y direction from parts of the first land portions 33X on the left of the land intersection portions 37 to parts thereof on the right. In this case, the land intersection portions 37 do not extend to the second body surface 30*b*. Land intersection spaces 42 that are illustrated in FIG. 42 and FIG. 43 described later are formed at the land intersection portions 37. In the example illustrated in FIG. 14, the flow path sectional areas of the second land recessed portions 38Y can be increased, and the flow path resistance of the working vapor 2*a* can be decreased. For this reason, the transport efficiency of the working vapor 2*a* can be improved. In the example illustrated in FIG. 14, the second land recessed portions 38Y can be connected to two second vapor passages 52 adjacent to each other in the Y direction. For this reason, the working vapor 2*a* can be directly moved from one of the second vapor passages 52 to the other second vapor passage 52, and the transport efficiency of the working vapor 2*a* can be improved.

In the example illustrated in FIG. 14, another land intersection portion 37 adjacent to one of the land intersection portions 37 that overlap the second land recessed portions 38Y may extend from the first body surface 30*a* to the second body surface 30*b* as illustrated in FIG. 10. The land intersection portions 37 that overlap the second land recessed portions 38Y illustrated in FIG. 14 and the land intersection portions 37 illustrated in FIG. 10 may alternate in the Y direction.

Figure 15:
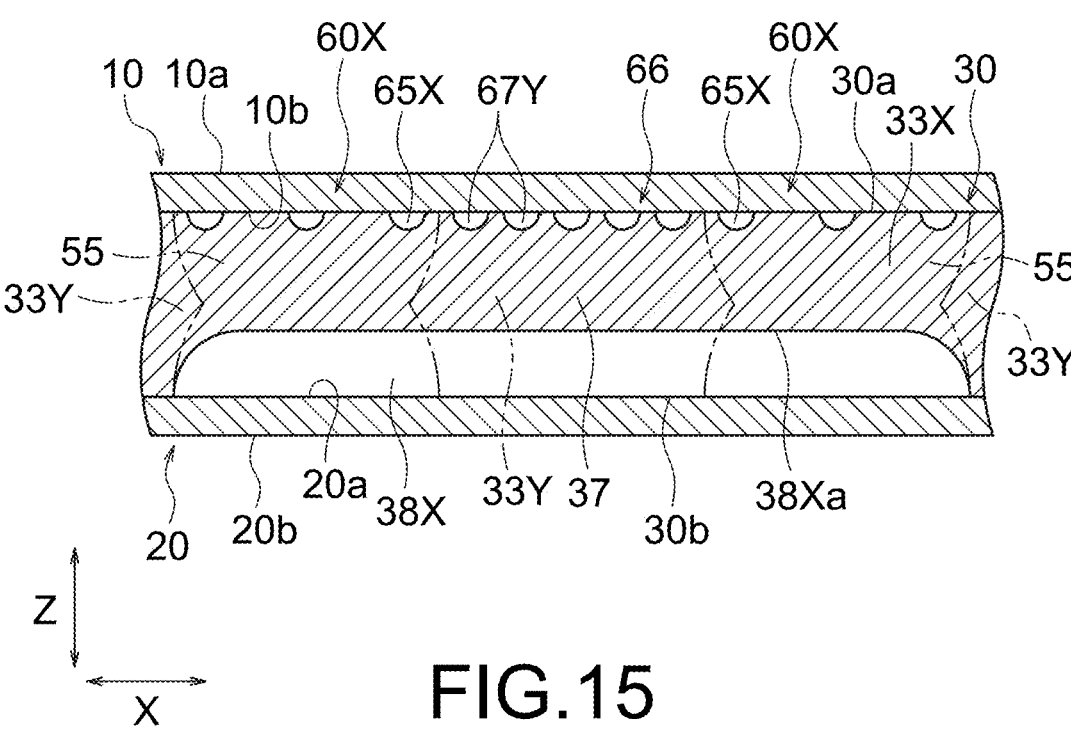
FIG. 15 is a sectional view of a modification to the first land recessed portions illustrated in FIG. 11.

As illustrated in FIG. 15, the first land recessed portions 38X may extend through the land intersection portions 37 in the X direction from portions that are located on the first sides of the land intersection portions 37 in the X direction to portions that are located on the second sides thereof as in the second land recessed portions 38Y described above. In an example illustrated in FIG. 15, the first land recessed portions 38X may be continuous in the X direction from parts of the second land portions 33Y on the left of the land intersection portions 37 to parts thereof on the right. In this case, the land intersection portions 37 do not extend to the second body surface 30*b*. In the example illustrated in FIG. 15, the flow path sectional areas of the first land recessed portions 38X can be increased, and the flow path resistance of the working vapor 2*a* can be decreased. For this reason, the transport efficiency of the working vapor 2*a* can be improved.

In the example illustrated in FIG. 15, another land intersection portions 37 adjacent to one of the land intersection portions 37 that overlap the first land recessed portions 38X may extend from the first body surface 30*a* to the second body surface 30*b* as illustrated in FIG. 11. The land intersection portions 37 that overlap the first land recessed portions 38X illustrated in FIG. 15 and the land intersection portions 37 illustrated in FIG. 11 may alternate in the X direction.

The second land recessed portions 38Y illustrated in FIG. 14 and the first land recessed portions 38X illustrated in FIG. 15 may overlap the land intersection portions 37 that are common. The second land recessed portions 38Y and the first land recessed portions 38X may intersect with each other in a cross shape in plan view. Also, in this case, the land intersection portions 37 that overlap the second land recessed portions 38Y and the first land recessed portions 38X and the land intersection portions 37 illustrated in FIG. 10 and FIG. 11 may alternate in the X direction and the Y direction.

A second modification will be described.

Figure 16:
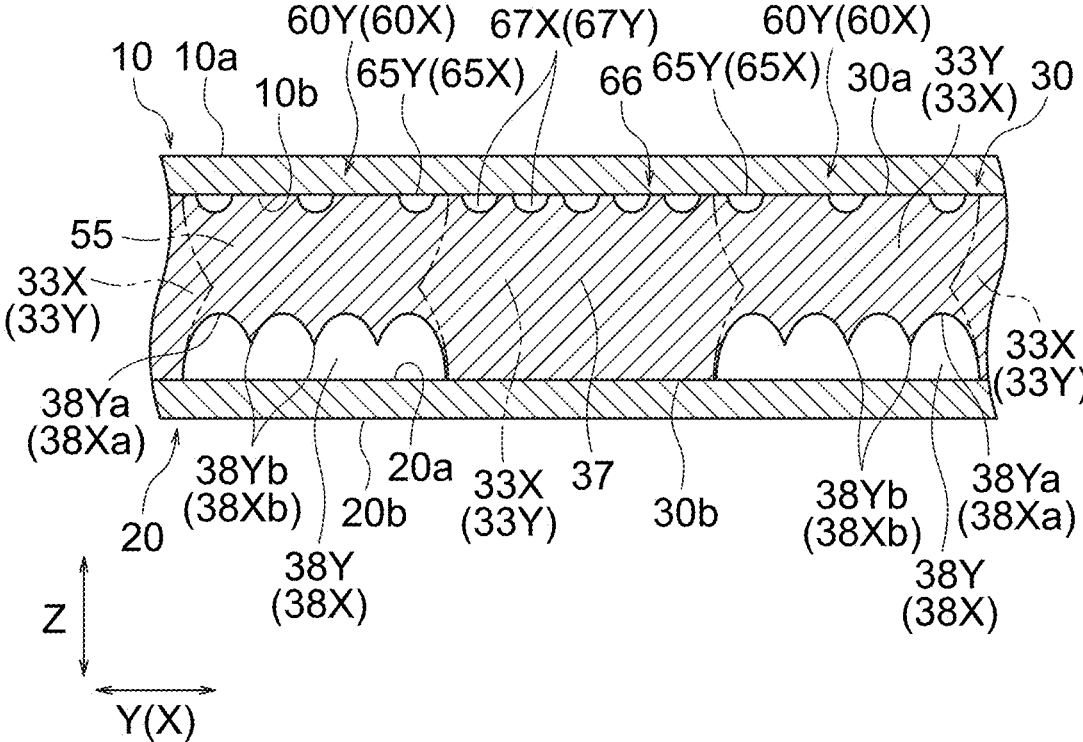
FIG. 16 is a sectional view of another modification to the second land recessed portions illustrated in FIG. 10.

In an example described according to the first embodiment described above, the second bottom surfaces 38Ya of the second land recessed portions 38Y are flat. The present disclosure, however, is not limited thereto. For example, as illustrated in FIG. 16, second protrusions 38Yb that extend in the X direction and that project toward the second body surface 30*b* may be located on the second bottom surfaces 38Ya of the second land recessed portions 38Y The second protrusions 38Yb may be formed so as to taper and project toward the second body surface 30*b* when viewed in the X direction. The second protrusions 38Yb may be separated inward from an extension surface of the second body surface 30*b*. In this case, the second protrusions 38Yb may be separated from the second sheet inner surface 20*a* of the second sheet 20. The multiple second protrusions 38Yb may be located at the second land recessed portions 38Y The sectional shapes of the second protrusions 38Yb when viewed in the X direction are freely determined. The second protrusions 38Yb may be formed by being etched from the second body surface 30*b*. The second protrusions 38Yb enable the working vapor 2*a* that flows through the second land recessed portions 38Y to flow in the X direction. For this reason, the flow path resistance of the working vapor 2*a* can be decreased, and the dispersion efficiency of the working vapor 2*a* can be improved. The second protrusions 37Yb are separated from the second sheet inner surface 20*a*, the flow path resistance of the working vapor 2*a* can be consequently decreased, and the transport efficiency of the working vapor 2*a* can be improved.

Also as for the first land recessed portions 38X, as illustrated in FIG. 16, first protrusions 38Xb that extend in the Y direction and that project toward the second body surface 30*b* may be located on the first bottom surfaces 38Xa of the first land recessed portions 38X. The first protrusions 38Xb may be separated inward from the extension surface of the second body surface 30*b*. In this case, the first protrusions 38Xb may be separated from the second sheet inner surface 20*a* of the second sheet 20. The first protrusions 38Xb enable the working vapor 2*a* that flows through the first land recessed portions 38X to flow in the Y direction. For this reason, the flow path resistance of the working vapor 2*a* can be decreased, and the dispersion efficiency of the working vapor 2*a* can be improved. The first protrusions 38Xb are separated from the second sheet inner surface 20*a*, the flow path resistance of the working vapor 2*a* can be consequently decreased, and the transport efficiency of the working vapor 2*a* can be improved.

In an example illustrated in FIG. 16, the first protrusions 38Xb extend in the Y direction, and the second protrusions 38Yb extend in the X direction. The first protrusions 38Xb, however, may extend in the X direction. The second protrusions 38Yb may extend in the Y direction. Alternatively, the first protrusions 38Xb and the second protrusions 38Yb may extend in the X direction or may extend in the Y direction.

A third modification will be described.

Figure 17:
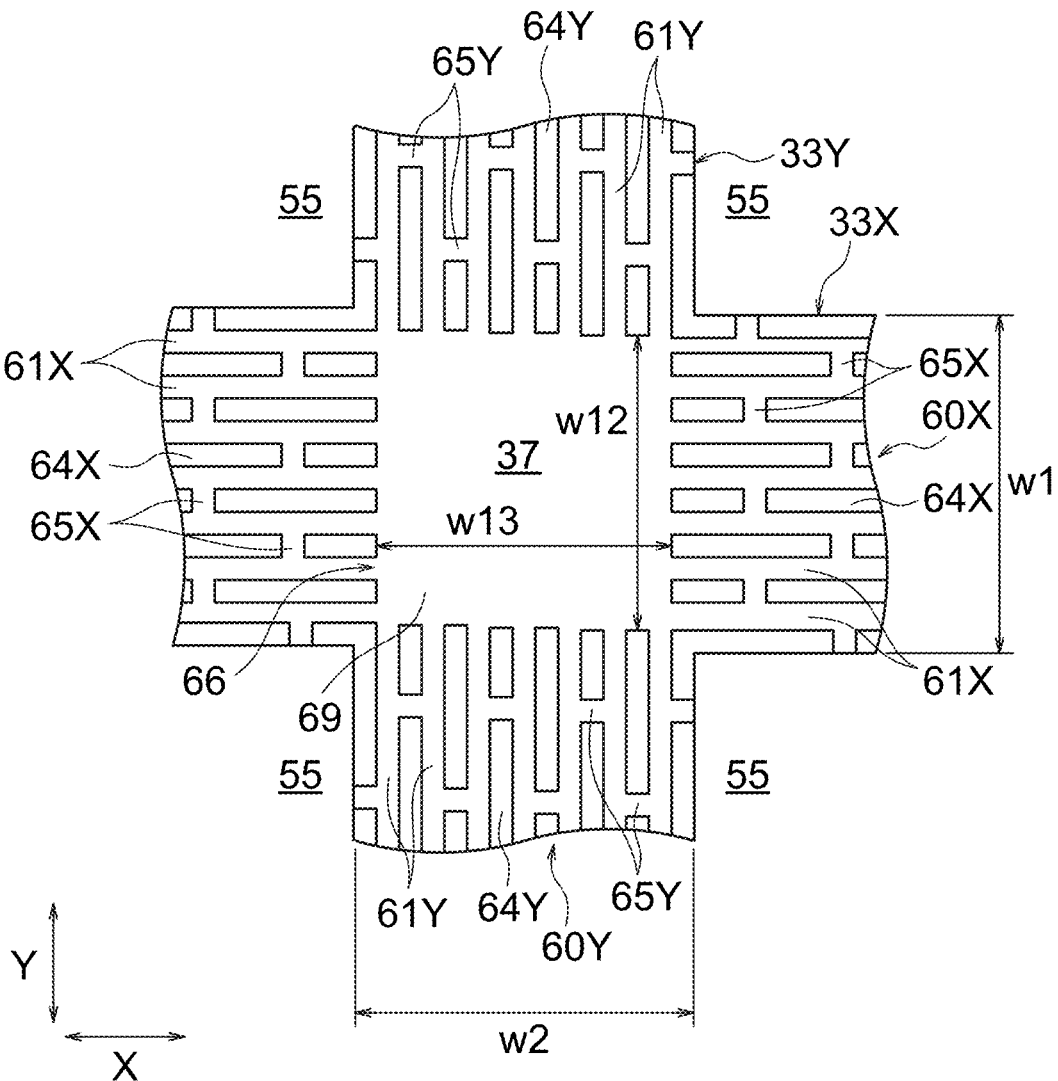
FIG. 17 is a plan view of a modification to a groove connection portion illustrated in FIG. 13.
Figure 18:
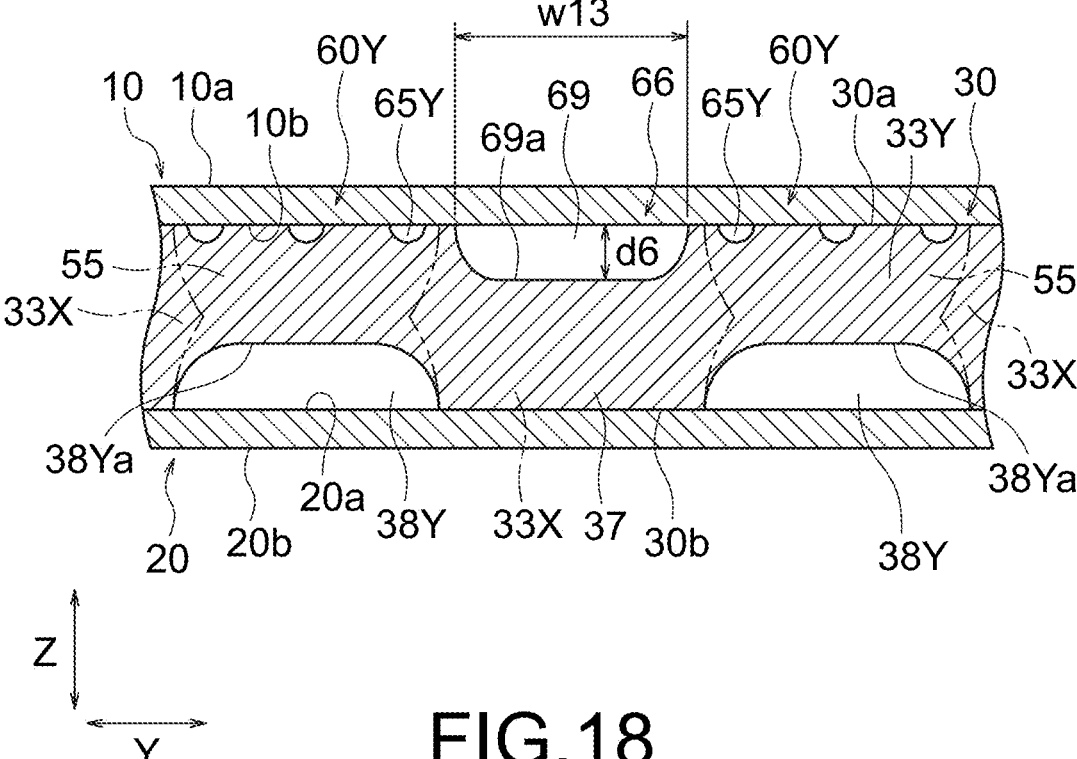
FIG. 18 is a sectional view of the groove connection portion illustrated in FIG. 17.

In an example described according to the first embodiment described above, the groove connection portions 66 include the multiple first intersection grooves 67X that extend in the X direction and the multiple second intersection grooves 67Y that extend in the Y direction. The present disclosure, however, is not limited thereto. For example, as illustrated in FIG. 17 and FIG. 18, the groove connection portions 66 may include intersection recessed portions 69. The intersection recessed portions 69 may be located on the first body surface 30a at the land intersection portions 37. The intersection recessed portions 69 are connected to the first main flow grooves 61X and are connected to the second main flow grooves 61Y. This enables the working liquid 2b to be received by the intersection recessed portions 69 from the first main flow grooves 61X that are located on first sides in the X direction. The working liquid 2b in the intersection recessed portions 69 can move to the first main flow grooves 61X that are located on second sides in the X direction and can move to the second main flow grooves 61Y that are located on both sides in the Y direction. For this reason, the working liquid 2b can be uniformly transported to the main flow grooves 61X and 61Y.

As illustrated in FIG. 17, the intersection recessed portions 69 are formed across the multiple first main flow grooves 61X that are located at the first land portions 33X in the Y direction. The intersection recessed portions 69 overlap the multiple first main flow grooves 61X when viewed in the X direction. The intersection recessed portions 69 are formed across the multiple second main flow grooves 61Y that are located at the second land portions 33Y in the X direction. The intersection recessed portions 69 overlap the multiple second main flow grooves 61Y when viewed in the Y direction. The intersection recessed portions 69 are thus configured, the working liquid 2b can be consequently uniformly transported to the first main flow grooves 61X, and the working liquid 2b can be consequently uniformly transported to the second main flow grooves 61Y The flow path sectional areas of the intersection recessed portions 69 in the Y direction can be larger than the sum of the flow path sectional areas of the first main flow grooves 61X. The flow path sectional areas of the intersection recessed portions 69 in the X direction can be larger than the sum of the flow path sectional areas of the second main flow grooves 61Y This enables the volumes of the intersection recessed portions 69 to be increased and enables the amount of the working liquid 2b stored to be increased. The width w12 of each intersection recessed portion 69 in the Y direction may be less than the width w1 (see FIG. 8) of each first land portion 33X. In this case, the first body surface 30a can remain at the land intersection portions 37 and can be bonded to the first sheet 10. The present disclosure, however, is not limited thereto, and the width w12 may be equal to the width w1. The width w12 corresponds to the dimension in the Y direction of each intersection recessed portion 69 at the first body surface 30a. Similarly, the width w13 of each intersection recessed portion 69 in the X direction may be less than or equal to the width w2 of each second land portion 33Y The width w13 corresponds to the dimension in the X direction of each intersection recessed portion 69 at the first body surface 30a.

As illustrated in FIG. 18, the intersection recessed portions 69 may have intersection bottom surfaces 69a. The intersection bottom surfaces 69a may be substantially flat. The intersection bottom surfaces 69a may be located at positions near the second body surface 30b at the intersection recessed portions 69. The depth d6 of each intersection recessed portion 69 may be less than the depth d1 (see FIG. 8) from the first body surface 30a to each through-portion 34 or may be equal to the depth d1. The depth d6 may be equal to distances from the first body surface 30a to the intersection bottom surfaces 69a.

A fourth modification will be described.

Figure 19:
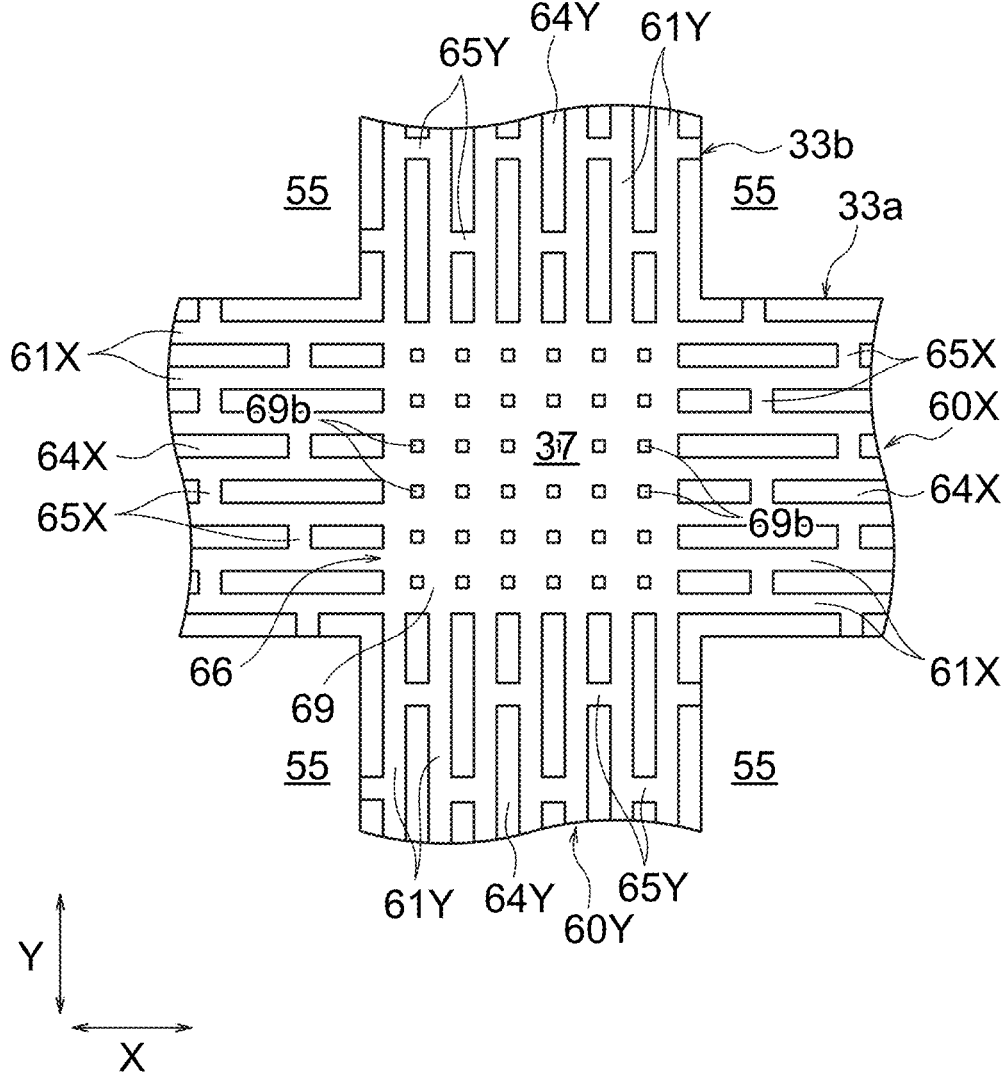
FIG. 19 is a plan view of another modification to the groove connection portion illustrated in FIG. 13.
Figure 20:
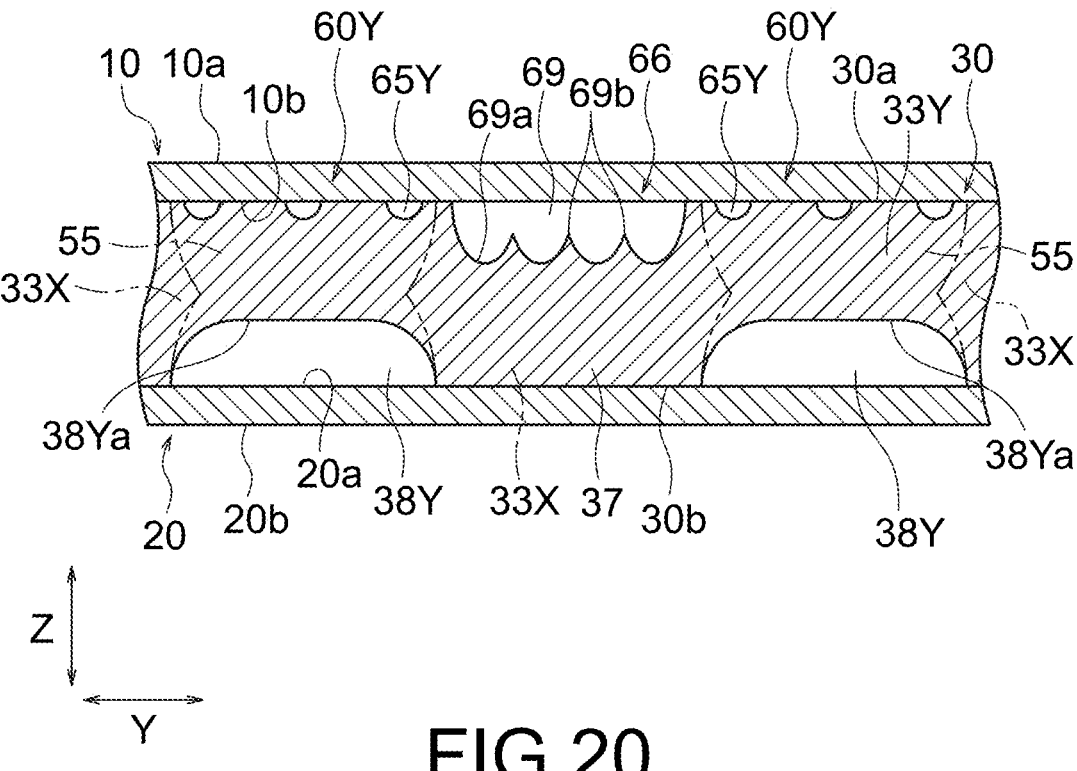
FIG. 20 is a sectional view of the groove connection portion illustrated in FIG. 19.

In an example described according to the third modification described above, the intersection bottom surfaces 69a of the intersection recessed portions 69 are flat. The present disclosure, however, is not limited thereto. For example, as illustrated in FIG. 19 and FIG. 20, multiple intersection protrusions 69b that project toward the first body surface 30a may be located on the intersection bottom surfaces 69a of the intersection recessed portions 69. The intersection protrusions 69b may be arranged in the X direction and may be arranged in the Y direction. The intersection protrusions 69b may be formed so as to taper and project toward the first body surface 30a when viewed in the X direction and the Y direction. The intersection protrusions 69b may be separated inward from the first body surface 30a. In this case, the intersection protrusions 69b may be separated from the first sheet inner surface 10b of the first sheet 10. Height dimensions from the intersection bottom surfaces 69a of the intersection protrusions 69b may be less than the depth dimensions of the intersection recessed portions 69. The height dimensions correspond to dimensions in the Z direction from the intersection bottom surfaces 69a to ends of the intersection protrusions 69b. The sectional shapes of the intersection protrusions 69b are freely determined. The intersection protrusions 69b may be formed by being etched from the first body surface 30a. According to the modification illustrated in FIG. 19 and FIG. 20, the amount of the working liquid 2b stored can be increased as in the modification illustrated in FIG. 17 and FIG. 18. The intersection protrusions 69b enable the capillary action to be applied to the working liquid 2b. The intersection protrusions 69b are separated from the first sheet inner surface 10b, the capillary action can be consequently applied between the intersection protrusions 69b and the first sheet inner surface 10b, and the working liquid 2b is likely to be drawn into the intersection recessed portions 69. Storage spaces for the working liquid 2b can be formed between the intersection protrusions 69b and the first sheet inner surface 10b, and the amount thereof to be stored can be increased.

A fifth modification will be described.

Figure 21:
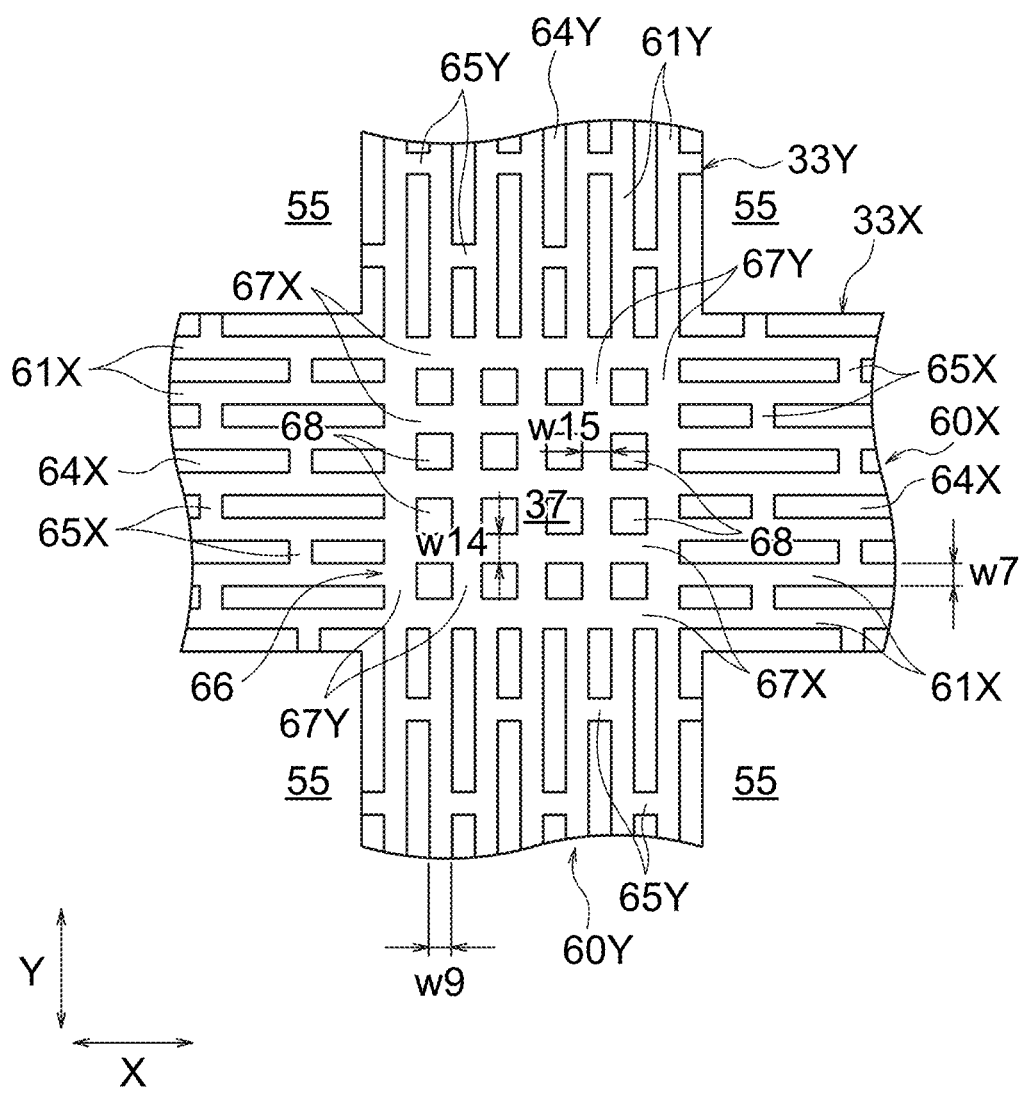
FIG. 21 is a plan view of another modification to the groove connection portion illustrated in FIG. 13.

In an example described according to the first embodiment described above, the width w10 of each first intersection groove 67X is equal to the width w7 of each first main flow groove 61X, and the width w11 of each second intersection groove 67Y is equal to the width w9 of each second main flow groove 61Y The present disclosure, however, is not limited thereto. For example, as illustrated in FIG. 21, the width w14 of each first intersection groove 67X may be more than the width w7 of each first main flow groove 61X. The width w15 of each second intersection groove 67Y may be more than the width w9 of each second main flow groove 61Y In an example illustrated in FIG. 21, the flow path sectional areas of the first intersection grooves 67X can be larger than the flow path sectional areas of the first main flow grooves 61X. The flow path sectional areas of the second intersection grooves 67Y can be larger than the flow path sectional areas of the second main flow grooves 61Y This enables the volumes of the first intersection grooves 67X and the volumes of the second intersection grooves 67Y to be increased and enables the amount of the working liquid 2b stored to be increased. The flow path resistance of the working liquid 2b in the intersection grooves 67X and 67Y can be decreased. The first intersection grooves 67X enable the capillary action in the X direction to be applied to the working liquid 2b, and the second intersection grooves 67Y enable the capillary action in the Y direction to be applied to the working liquid 2b.

In the example illustrated in FIG. 21, the number of the first intersection grooves 67X may be smaller than the number of the first main flow grooves 61X that are located at the first land portions 33X. The number of the second intersection grooves 67Y may be smaller than the number of the second main flow grooves 61Y that are located at the second land portions 33Y This enables the planar shapes of the intersection projecting portions 68 to be increased and enables bonding strength between the intersection projecting portions 68 and the first sheet 10 to be improved. For this reason, the mechanical strength of the vapor chamber 1 can be improved. In the example illustrated in FIG. 21, the number of the first intersection grooves 67X is five, and the number of the first main flow grooves 61X is seven. However, the number of the first main flow grooves 61X and the number of the first intersection grooves 67X are freely determined. In the example illustrated in FIG. 21, the number of the second intersection grooves 67Y is five, and the number of the second main flow grooves 61Y is seven. However, the number of the second main flow grooves 61Y and the number of the second intersection grooves 67Y are freely determined.

A sixth modification will be described.

Figure 22:
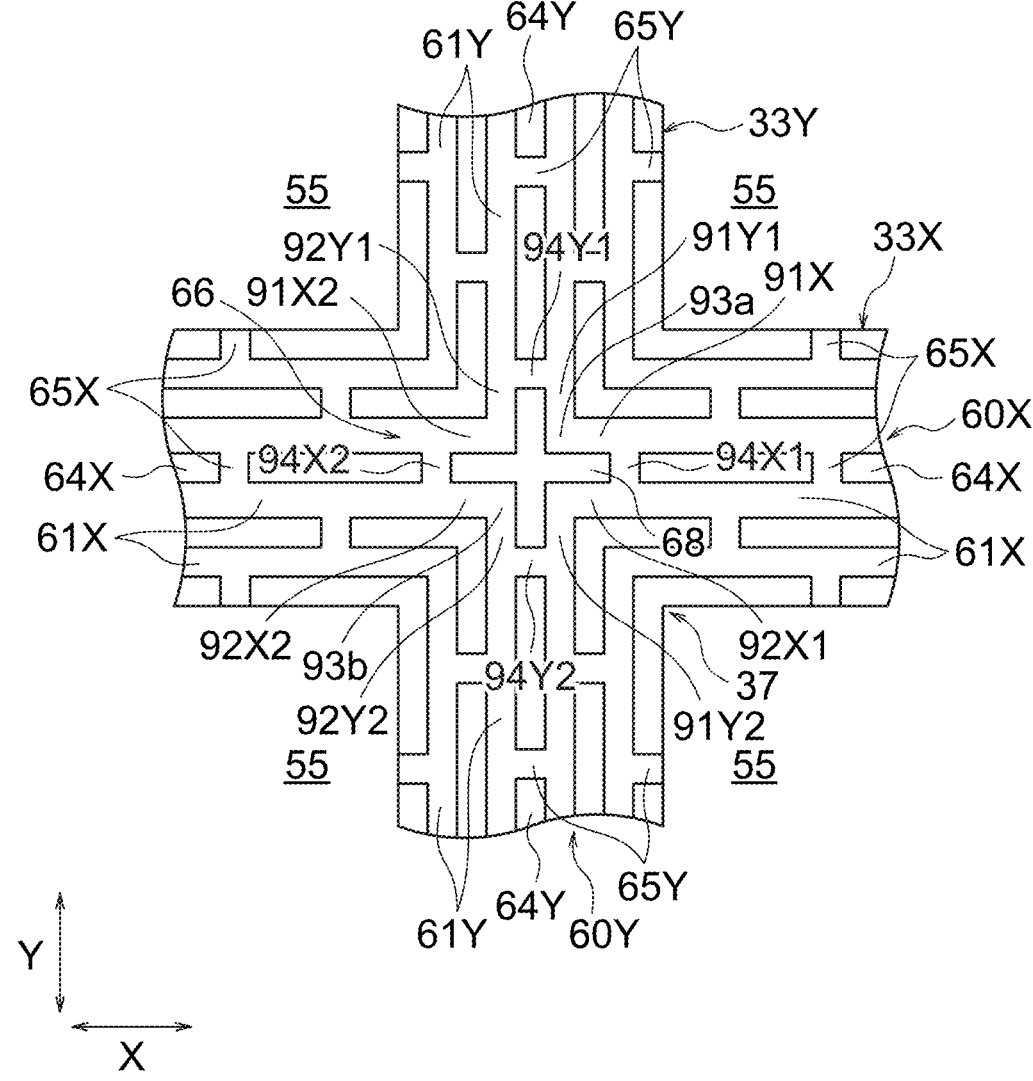
FIG. 22 is a plan view of another modification to the groove connection portion illustrated in FIG. 13.

In an example described according to the first embodiment described above, the first intersection grooves 67X and the second intersection grooves 67Y are formed in a lattice pattern. The present disclosure, however, is not limited thereto. For example, as illustrated in FIG. 22, the groove connection portions 66 may be formed.

Each groove connection portion 66 may include a first divided groove 91X1, a second divided groove 91X2, a third divided groove 91Y1, and a fourth divided groove 91Y2. The first divided groove 91X1 may be located on the first side in the X direction. The second divided groove 91X2 may be located on the second side in the X direction. The second divided groove 91X2 may be located along an extension line from the first divided groove 91X1. The first divided groove 91X1 and the second divided groove 91X2 may be connected to the first main flow groove 61X corresponding thereto. The third divided groove 91Y1 may be located on a first side in the Y direction. The fourth divided groove 91Y2 may be located on a second side in the Y direction. The fourth divided groove 91Y2 may be located along an extension line from the third divided groove 91Y1. The third divided groove 91Y1 and the fourth divided groove 91Y2 may be connected to the second main flow groove 61Y corresponding thereto.

The first divided groove 91X1 and the third divided groove 91Y1 may be connected at a first groove intersection portion 93a. The second divided groove 91X2 may not be connected to the first groove intersection portion 93a. The intersection projecting portion 68 may be located between the first groove intersection portion 93a and the second divided groove 91X2. The fourth divided groove 91Y2 may not be connected to the first groove intersection portion 93a. The intersection projecting portion 68 may be located between the first groove intersection portion 93a and the fourth divided groove 91Y2. In an example illustrated in FIG. 22, the first divided groove 91X1 and the third divided groove 91Y1 may form an L-shaped flow path at the first groove intersection portion 93a.

Each groove connection portion 66 may include another first divided groove 92X1, another second divided groove 92X2, another third divided groove 92Y1, and another fourth divided groove 92Y2. The first divided groove 92X1 may be located on the first side in the X direction. The second divided groove 92X2 may be located on the second side in the X direction. The second divided groove 92X2 may be located along an extension line from the first divided groove 92X1. The first divided groove 92X1 and the second divided groove 92X2 may be connected to the first main flow groove 61X corresponding thereto. The third divided groove 92Y1 may be located on the first side in the Y direction. The fourth divided groove 92Y2 may be located on the second side in the Y direction. The fourth divided groove 92Y2 may be located along an extension line from the third divided groove 92Y1. The third divided groove 92Y1 and the fourth divided groove 92Y2 may be connected to the second main flow groove 61Y corresponding thereto.

The second divided groove 92X2 and the fourth divided groove 92Y2 may be connected at a second groove intersection portion 93b. The first divided groove 92X1 may not be connected to the second groove intersection portion 93b. The intersection projecting portion 68 may be located between the second groove intersection portion 93b and the first divided groove 92X1. The third divided groove 92Y1 may not be connected to the second groove intersection portion 93b. The intersection projecting portion 68 may be located between the second groove intersection portion 93b and the third divided groove 92Y1. In this case, the second divided groove 92X2 and the fourth divided groove 92Y2 may form an L-shaped flow path at the second groove intersection portion 93b. As illustrated in FIG. 22, the intersection projecting portion 68 may be formed in a cross shape in plan view and may divide some of the divided grooves as described above.

In an example illustrated in FIG. 22, the second divided groove 91X2 is not connected to the first groove intersection portion 93a, and the fourth divided groove 91Y2 is not connected to the first groove intersection portion 93a as described above. This enables the capillary action to be inhibited from decreasing at the first groove intersection portion 93a and enables the transport efficiency of the working liquid 2b between the first main flow grooves 61X that are located at the first land portions 33X and the second main flow grooves 61Y that are located at the second land portions 33Y to be improved. Similarly, at the second groove intersection portion 93b, the transport efficiency of the working liquid 2b can be improved.

It is not a limitation that neither the second divided groove 91X2 nor the fourth divided groove 91Y2 is connected to the first groove intersection portion 93a. For example, if the second divided groove 91X2 or the fourth divided groove 91Y2 is not connected to the first groove intersection portion 93a, the other may be connected thereto. Also, in this case, the capillary action at the first groove intersection portion 93a can be inhibited from decreasing, and the transport efficiency of the working liquid 2b can be improved. The same is true for the second groove intersection portion 93b.

The first divided groove 91X1 and the first divided groove 92X1 may be connected by a first connection groove 94X1. The first connection groove 94X1 may extend in the Y direction. This enables the working liquid 2b to move forward and backward between the first divided groove 91X1 and the first divided groove 92X1 and enables the working liquid 2b to be transported from the first main flow grooves 61X to the second main flow grooves 61Y that are located on both sides in the Y direction. The second divided groove 91X2 and the second divided groove 92X2 may be connected by a second connection groove 94X2 as in the first connection groove 94X1. Similarly, the third divided groove 91Y1 and the third divided groove 92Y1 may be connected by a third connection groove 94Y1, and the fourth divided groove 91Y2 and the fourth divided groove 92Y2 may be connected by a fourth connection groove 94Y2.

The widths of the divided grooves 91X1, 91X2, 92X1, and 92X2 and the widths of the connection grooves 94Y1 and 94Y2 illustrated in FIG. 22 may be equal to the width w7 of each first main flow groove 61X. The depths of the divided grooves 91X1, 91X2, 92X1, and 92X2 and the depths of the connection grooves 94Y1 and 94Y2 may be equal to the depth d5 of each first main flow groove 61X. The widths of the divided grooves 91Y1, 91Y2, 92Y1, and 92Y2 and the widths of the connection grooves 94X1 and 94X2 may be equal to the width w9 of each second main flow groove 61Y The depths of the divided grooves 91Y1, 91Y2, 92Y1, and 92Y2 and the depths of the connection grooves 94X1 and 94X2 may be equal to the depth of each second main flow groove 61Y The divided grooves and the connection grooves may be formed by being etched as in the first main flow grooves 61X and the second main flow grooves 61Y.

A seventh modification will be described.

In an example according to the first embodiment described above, the interval p1 (see FIG. 12) in the X direction between the first communication grooves 65X that form the edge communication groove columns 63Xa is equal to the interval p2 (see FIG. 12) in the X direction between the first communication grooves 65X that form the intermediate communication groove columns 63Xb. The present disclosure, however, is not limited thereto. For example, as illustrated in FIG. 23, an interval p3 in the X direction between the first communication grooves 65X of the edge communication groove columns 63Xa may be shorter than an interval p4 in the X direction between the first communication grooves 65X of the intermediate communication groove columns 63Xb.

Figure 23:
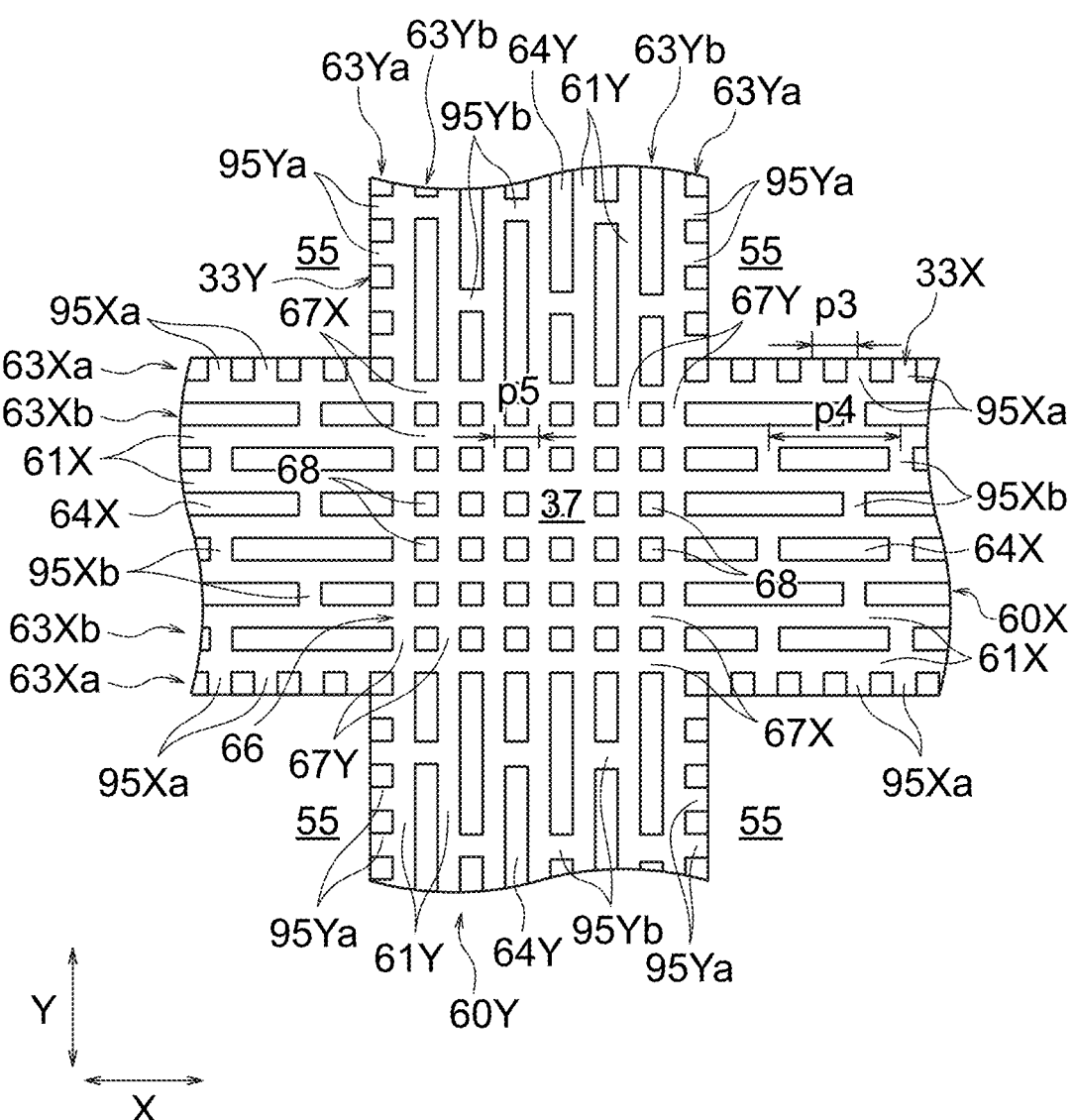
FIG. 23 is a plan view of another modification to the groove connection portion illustrated in FIG. 13.

In an example illustrated in FIG. 23, multiple edge communication grooves 95Xa and multiple intermediate communication grooves 95Xb may be located on the first body surface 30a at the first land portions 33X. The edge communication grooves 95Xa form the edge communication groove columns 63Xa, and the intermediate communication grooves 95Xb form the intermediate communication groove columns 63Xb. The edge communication grooves 95Xa connect the vapor passages 51 and 52 and the first main flow grooves 61X adjacent to the vapor passages 51 and 52 to each other. The edge communication grooves 95Xa extend in the Y direction and are arranged in the X direction. Each intermediate communication groove 95Xb connects two first main flow grooves 61X adjacent to each other. The intermediate communication grooves 95Xb extend in the Y direction and are arranged in the X direction.

As illustrated in FIG. 23, the interval p3 in the X direction between two edge communication grooves 95Xa adjacent to each other may be shorter than the interval p4 in the X direction between two intermediate communication grooves 95Xb adjacent to each other. The interval p3 between the two edge communication grooves 95Xa adjacent to each other may be equal to an interval p5 between two second intersection grooves 67Y adjacent to each other. Decreasing the interval p3 between the edge communication grooves 95Xa enables the number of the edge communication grooves 95Xa to be increased and enables the flow path resistance between the first liquid flow path portions 60X and the vapor passages 51 and 52 to be decreased. For this reason, in the case where the land intersection portions 37 are located in the vaporization region SR, the flow path resistance of the working vapor 2a from the first liquid flow path portions 60X to the vapor passages 51 and 52 can be decreased, and the transport efficiency of the working vapor 2a can be improved. In the case where the land intersection portions 37 are located in the condensation region CR, the flow path resistance of the working liquid 2b from the vapor passages 51 and 52 to the first liquid flow path portions 60X can be decreased, and the transport efficiency of the working liquid 2b can be improved.

For example, as illustrated in FIG. 23, the interval in the Y direction between the second communication grooves 65Y of the edge communication groove columns 63Ya may be shorter than the interval in the Y direction between the second communication grooves 65Y of the intermediate communication groove columns 63Yb as in the first communication grooves 65X.

Multiple edge communication grooves 95Ya and multiple intermediate communication grooves 95Yb may be located on the first body surface 30a at the second land portions 33Y as in the first land portions 33X. The edge communication grooves 95Ya form the edge communication groove columns 63Ya, and the intermediate communication grooves 95Yb form the intermediate communication groove columns 63Yb. The edge communication grooves 95Ya connect the vapor passages 51 and 52 and the second main flow grooves 61Y adjacent to the vapor passages 51 and 52. The edge communication grooves 95Ya extend in the X direction and are arranged in the Y direction. Each intermediate communication groove 95Yb connects two second main flow grooves 61Y adjacent to each other. The intermediate communication grooves 95Yb extend in the X direction and are arranged in the Y direction.

As illustrated in FIG. 23, the interval in the Y direction between two edge communication grooves 95Ya adjacent to each other may be shorter than the interval in the Y direction between two intermediate communication grooves 95Yb adjacent to each other. The interval between the two edge communication grooves 95Ya adjacent to each other may be equal to the interval between the two first intersection grooves 67X adjacent to each other. Decreasing the interval between the edge communication grooves 95Ya enables the number of the edge communication grooves 95Ya to be increased and enables the flow path resistance between the second liquid flow path portions 60Y and the vapor passages 51 and 52 to be decreased. For this reason, in the case where the land intersection portions 37 are located in the vaporization region SR, the flow path resistance of the working vapor 2a from the second liquid flow path portions 60Y to the vapor passages 51 and 52 can be decreased, and the transport efficiency of the working vapor 2a can be improved. In the case where the land intersection portions 37 are located in the condensation region CR, the flow path resistance of the working liquid 2b from the vapor passages 51 and 52 to the second liquid flow path portions 60Y can be decreased, and the transport efficiency of the working liquid 2b can be improved.

The interval p3 between the edge communication grooves 95Xa may not be shorter than the interval p4 between the intermediate communication grooves 96Xb in a region other than the vicinity of the land intersection portions 37 at the first land portions 33X. In this case, as illustrated in FIG. 12, the interval p1 between the first communication grooves 65X that form the edge communication groove columns 63Xa may be equal to the interval p2 between the first communication grooves 65X that form the intermediate communication groove columns 63Xb. The same is true for the interval between the edge communication grooves 95Ya and the interval between the intermediate communication grooves 95Yb at the second land portions 33Y.

An eighth modification will be described.

In an example according to the first embodiment described above, the position in the X direction of the first communication groove 65X that forms the communication groove column 63Xa or 63Xb of two communication groove columns 63Xa and 63Xb adjacent to each other in the Y direction is shifted from the position in the X direction of the first communication groove 65X that forms the other communication groove column 63Xa or 63Xb. The present disclosure, however, is not limited thereto.

Figure 24:
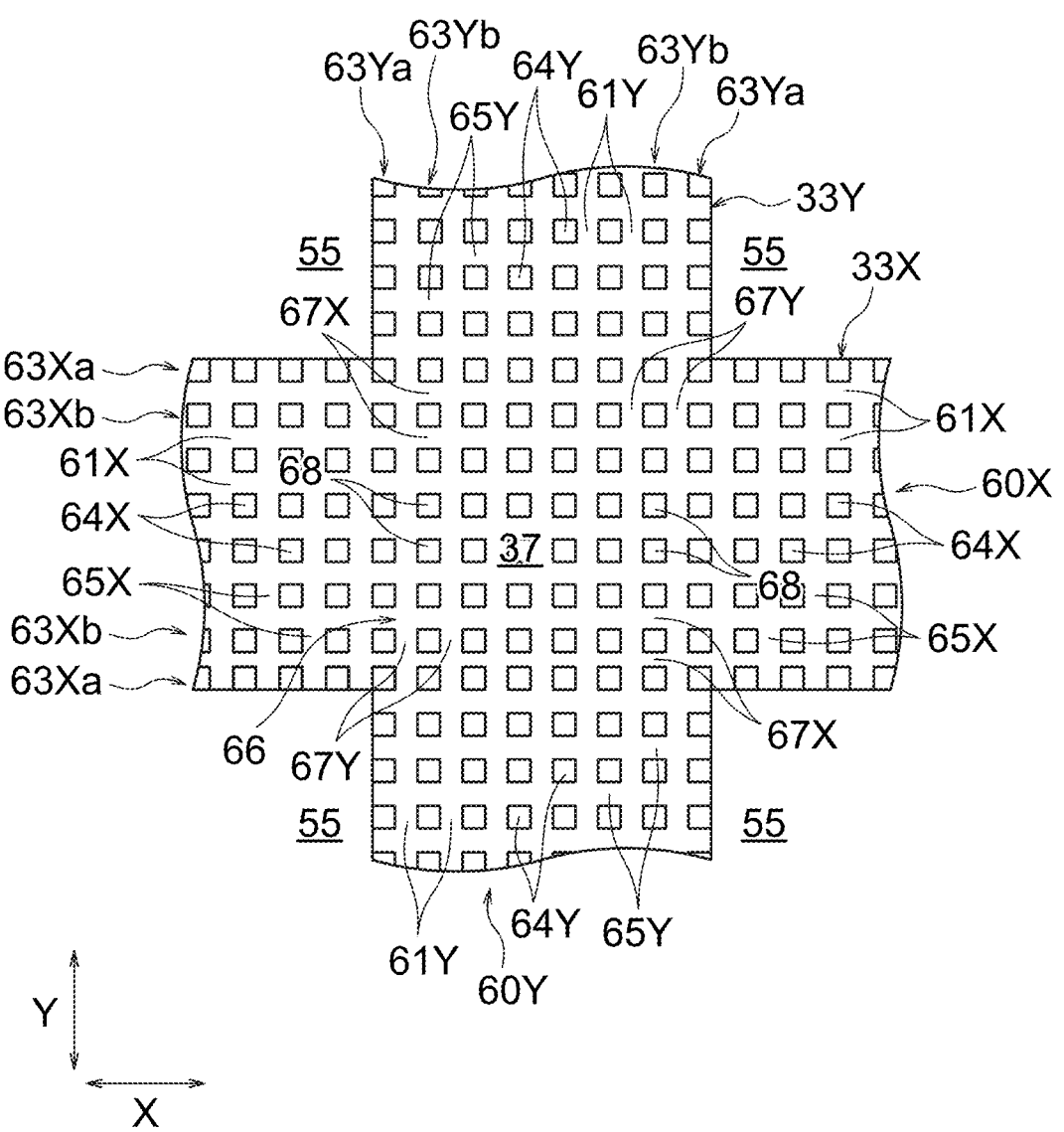
FIG. 24 is a plan view of another modification to the groove connection portion illustrated in FIG. 13.

For example, as illustrated in FIG. 24, the first communication grooves 65X may extend in the Y direction across the first main flow grooves 61X. In this case, the first main flow grooves 61X and the first communication grooves 65X may intersect with each other in a cross shape. The first communication grooves 65X may extend in the Y direction over the entire width of each first land portion 33X in the Y direction. More specifically, the first communication grooves 65X may be connected to the passage division portions 55 that are located on the first sides of the first land portions 33X in the Y direction and may be connected to the passage division portions 55 that are located on the second sides thereof. In an example illustrated in FIG. 24, the multiple first main flow grooves 61X and the multiple first communication grooves 65X may be formed in a lattice pattern. The first main flow grooves 61X and the first communication grooves 65X are connected to each other such that the working liquid 2b can move forward and backward. In the example illustrated in FIG. 24, the amount of the working liquid 2b transported can be uniform at the first main flow grooves 61X.

Similarly, in an example described according to the first embodiment described above, the position in the Y direction of the second communication groove 65Y that forms the communication groove column 63Ya or 63Yb of two communication groove columns 63Ya and 63Yb adjacent to each other in the X direction is shifted from the position in the Y direction of the second communication groove 65Y that forms the other communication groove column 63Ya or 63Yb. The present disclosure, however, is not limited thereto.

For example, as illustrated in FIG. 24, the second communication grooves 65Y may extend in the X direction across the second main flow grooves 61Y In this case, the second main flow grooves 61Y and the second communication grooves 65Y may intersect with each other in a cross shape. The second communication grooves 65Y may extend in the X direction over the entire width of each second land portion 33Y in the X direction. More specifically the second communication grooves 65Y may be connected to the passage division portions 55 that are located on the first sides of the second land portions 33Y in the X direction and may be connected to the passage division portions 55 that are located on the second sides thereof. In the example illustrated in FIG. 24, the multiple second main flow grooves 61Y and the multiple second communication grooves 65Y may be formed in a lattice pattern. The second main flow grooves 61Y and the second communication grooves 65Y are connected to each other such that the working liquid 2b can move forward and backward. In the example illustrated in FIG. 24, the amount of the working liquid 2b transported can be uniform at the second main flow grooves 61Y.

The first main flow grooves 61X and the first communication grooves 65X may not intersect with each other in a cross shape in a region other than the vicinity of the land intersection portions 37 at the first land portions 33X but may be formed as illustrated in FIG. 12. The same is true for the second main flow grooves 61Y and the second communication grooves 65Y at the second land portions 33Y.

A ninth modification will be described.

In an example described according to the first embodiment described above, the multiple land intersection portions 37 are located in the vaporization region SR. The present disclosure, however, is not limited thereto. For example, the multiple land intersection portions 37 may be located in the condensation region CR. This enables the working liquid 2b that moves to the first main flow groove 61X at each first land portion 33X to be transported to the other first land portions 33X that are located in the condensation region CR via the second main flow grooves 61Y at the second land portions 33Y For this reason, the working liquid 2b that condenses can be inhibited from being non-uniform in the condensation region CR, and the transport efficiency of the working liquid 2b can be improved.

A tenth modification will be described.

Figure 25:
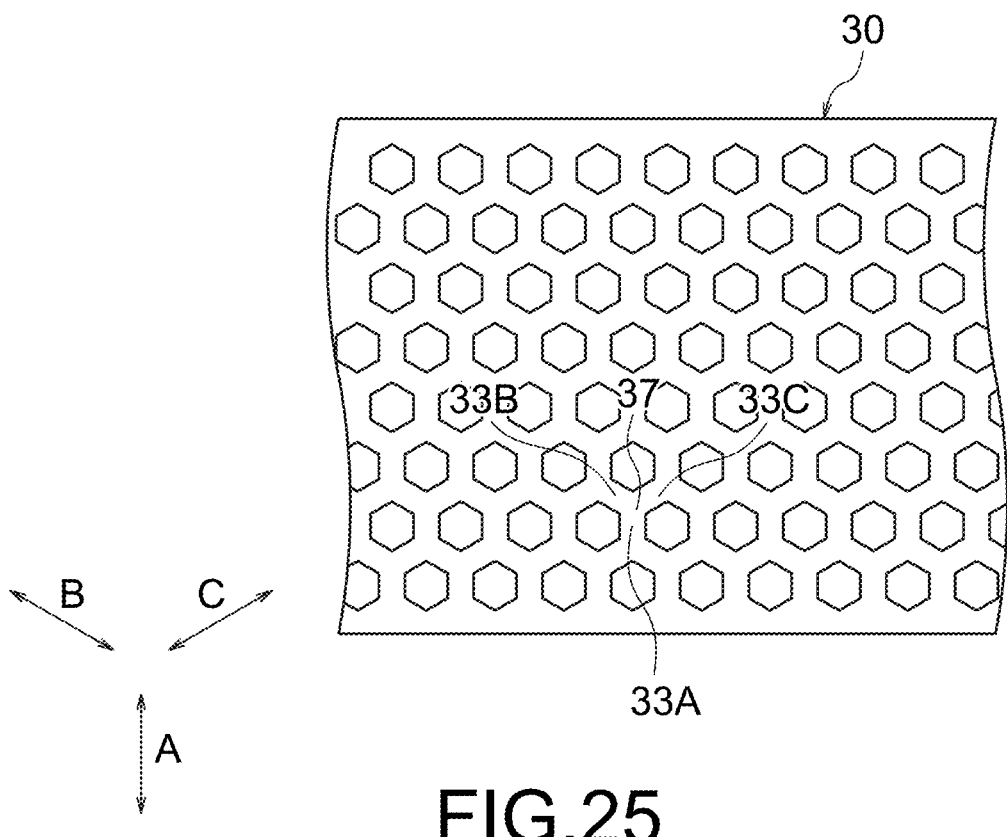
FIG. 25 is a plan view of a modification to a land portion illustrated in FIG. 6.
Figure 26:
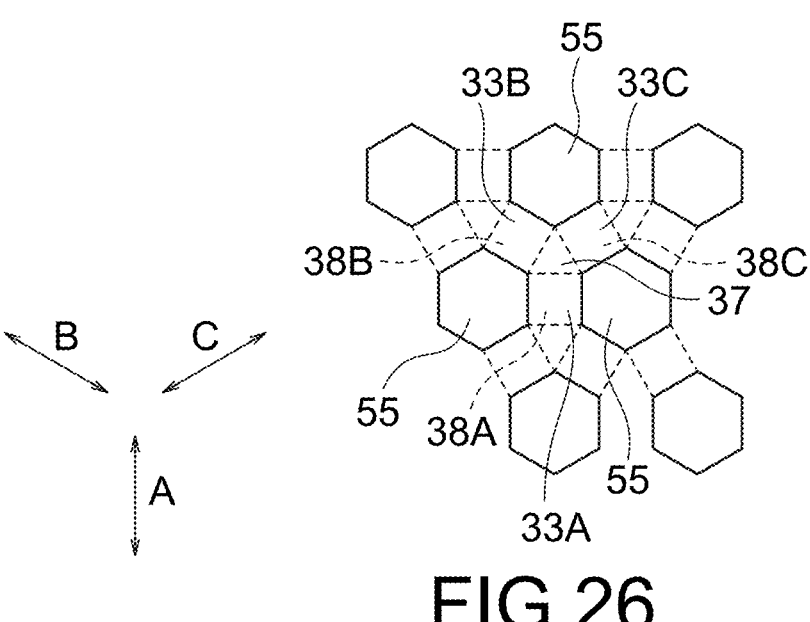
FIG. 26 is a partial enlarged plan view of FIG. 25.

In an example described according to the first embodiment described above, the wick sheet 30 includes the first land portions 33X that extend in the X direction and the second land portions 33Y that extend in the Y direction. The present disclosure, however, is not limited thereto. For example, as illustrated in FIG. 25 and FIG. 26, the wick sheet 30 may include first land portions 33A that extend in a first direction A, second land portions 33B that extend in a second direction B, and third land portions 33C that extend in a third direction C. The third direction C differs from the first direction A and differs from the second direction B. An angle that is formed between the first direction A and the second direction B may be 120°, an angle that is formed between the second direction B and the third direction C may be 120°, and an angle that is formed between the third direction C and the first direction A is 120°.

The first land portions 33A, the second land portions 33B, and the third land portions 33C may intersect with each other at the land intersection portions 37. The first land portions 33A may terminate at the land intersection portions 37 without crossing the land intersection portions 37. The second land portions 33B may terminate at the land intersection portions 37 without crossing the land intersection portions 37. The third land portions 33C may terminate at the land intersection portions 37 without crossing the land intersection portions 37. The first land portions 33A, the second land portions 33B, and the third land portions 33C may be formed as in the first land portions 33X and the second land portions 33Y according to the first embodiment described above.

In an example illustrated in FIG. 26, the vapor flow path portion 50 may be formed by the multiple passage division portions 55. The passage division portions 55 may be demarcated by the first land portions 33A, the second land portions 33B, and the third land portions 33C.

More specifically, as illustrated in FIG. 26, the passage division portions 55 are located on both sides of the first land portions 33A in the first direction A. The passage division portions 55 are located on both sides of the first land portions 33A in the direction perpendicular to the first direction A. The passage division portions 55 are located on both sides of the second land portions 33B in the second direction B. The passage division portions 55 are located on both sides of the second land portions 33B in the direction perpendicular to the second direction B. The passage division portions 55 are located on both sides of the third land portions 33C in the third direction C. The passage division portions 55 are located on both sides of the third land portions 33C in the direction perpendicular to the third direction C. In this way, three passage division portions 55 are formed around each land intersection portion 37. The passage division portions 55 are examples of the first space division portion, are examples of the second space division portion, and are examples of a third space division portion. The passage division portions 55 may be formed in a hexagonal shape in the first direction A, the second direction B, and the third direction C in plan view.

First land recessed portions 38A that connect the passage division portions 55 that are located on both sides may be located on the second body surface 30b at the first land portions 33A. Second land recessed portions 38B that connect the passage division portions 55 that are located on both sides may be located on the second body surface 30b at the second land portions 33B. Third land recessed portions 38C that connect the passage division portions 55 that are located on both sides may be located on the second body surface 30b at the third land portions 33C. The first land recessed portions 38A, the second land recessed portions 38B, and the third land recessed portions 38C may be formed as in the first land recessed portions 38X and the second land recessed portions 38Y according to the first embodiment described above.

Figure 27:
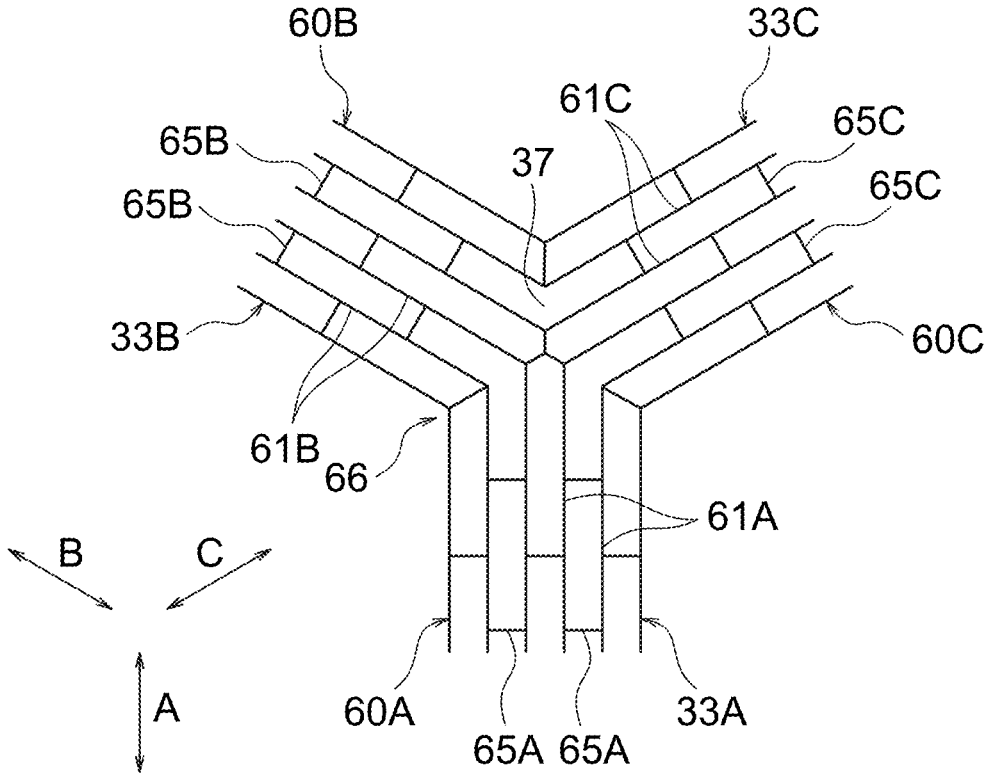
FIG. 27 is a schematic plan view of the liquid flow path portion illustrated in FIG. 26.

As illustrated in FIG. 27, first liquid flow path portions 60A may be formed on the first body surface 30a at the first land portions 33A. The first liquid flow path portions 60A may include multiple first main flow grooves 61A that extend in the first direction A and multiple first communication grooves 65A that extend in the direction perpendicular to the first direction A. The first main flow grooves 61A and the first communication grooves 65A may be formed as in the first main flow grooves 61X and the first communication grooves 65X according to the first embodiment described above. In FIG. 27, each of the first main flow grooves 61A and the first communication grooves 65A is illustrated by using a straight line for simplicity of the figure. The same is true for main flow grooves 61B and 61C and communication grooves 65B and 65C described later.

Second liquid flow path portions 60B may be formed on the first body surface 30a at the second land portions 33B. The second liquid flow path portions 60B may include the multiple second main flow grooves 61B that extend in the second direction B and the multiple second communication grooves 65B that extend in the direction perpendicular to the second direction B. The second main flow grooves 61B and the second communication grooves 65B may be formed as in the first main flow grooves 61X and the first communication grooves 65X according to the first embodiment described above.

Third liquid flow path portions 60C may be formed on the first body surface 30a at the third land portions 33C. The third liquid flow path portions 60C may include the multiple third main flow grooves 61C that extend in the third direction C and the multiple third communication grooves 65C that extend in the direction perpendicular to the third direction C. The third main flow grooves 61C and the third communication grooves 65C may be formed as in the first main flow grooves 61X and the first communication grooves 65X according to the first embodiment described above.

The first main flow grooves 61A, the second main flow grooves 61B, and the third main flow grooves 61C may be connected to the groove connection portions 66 that are located at the land intersection portions 37.

Also, according to the modification, the transport efficiency of the working liquid 2b can be improved, and the transport efficiency of the working vapor 2a can be improved as in the first embodiment described above. For this reason, the heat dissipation performance of the vapor chamber 1 can be improved.

An eleventh modification will be described.

Figure 28:
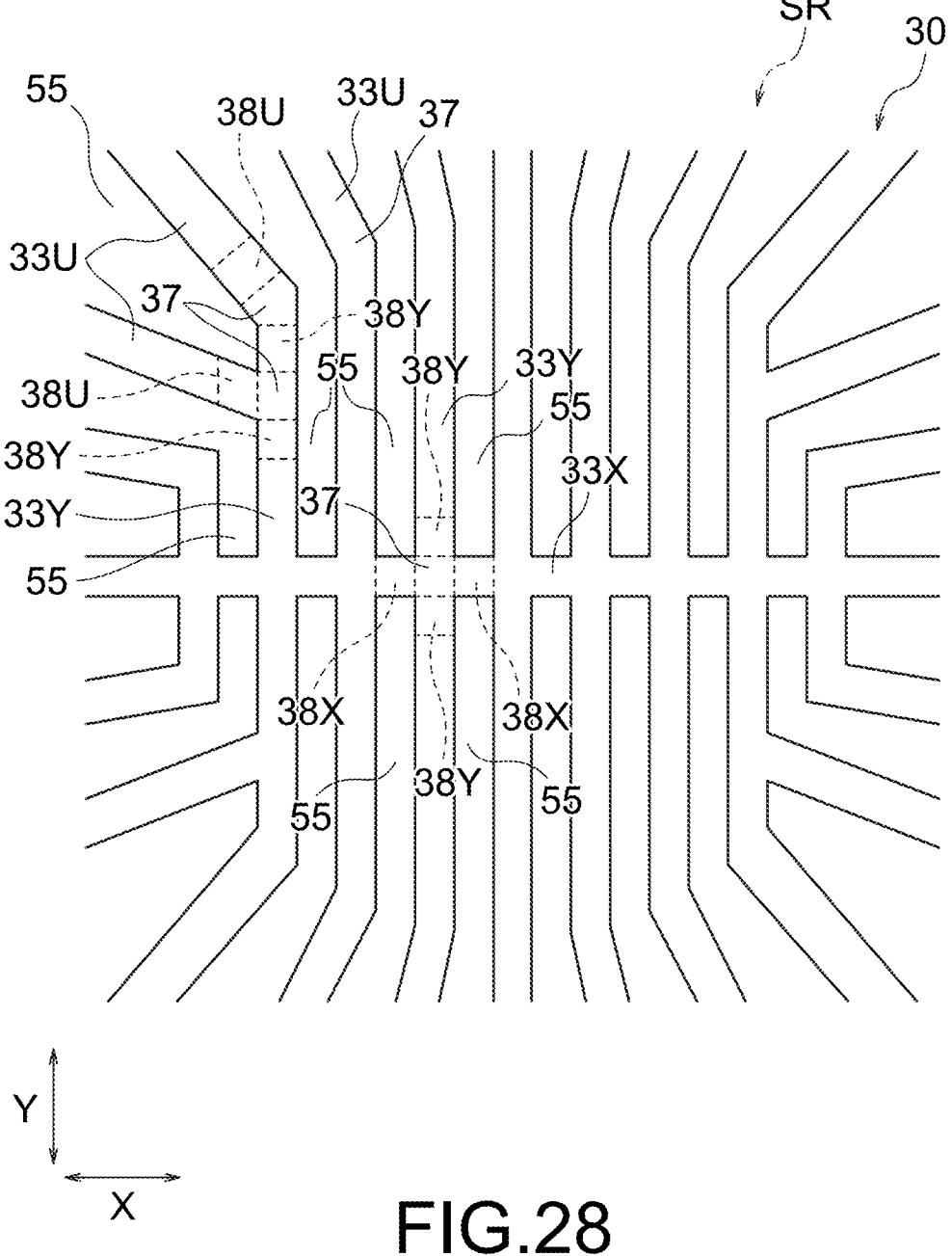
FIG. 28 is a plan view of another modification to the land portion illustrated in FIG. 6.

For example, the wick sheet 30 may be formed as illustrated in FIG. 28. In an example illustrated in FIG. 28, the multiple second land portions 33Y intersect with the single first land portion 33X and extend in the Y direction across the land intersection portions 37. A region in which the second land portions 33Y extend in the Y direction may be located in the vaporization region SR. Third land portions 33U that extend in different directions from the X direction and the Y direction may be located outside the region in which the second land portions 33Y extend in the Y direction. One of the third land portions 33U may intersect with one of the second land portions 33Y at one of the land intersection portions 37, and at the one of the land intersection portions 37, the one of the second land portions 33Y may terminate, and the one of the third land portions 33U may terminate. In this case, the one of the second land portions 33Y and the one of the third land portions 33U are formed in a planar shape so as to bend. At the other land intersection portions 37, the second land portions 33Y may extend in the Y direction across the land intersection portions 37, and the third land portions 33U may terminate at the land intersection portions 37.

In the example illustrated in FIG. 28, the vapor flow path portion 50 may be formed by the multiple passage division portions 55. The passage division portions 55 may be demarcated by the first land portion 33X, the second land portions 33Y, and the third land portions 33U.

More specifically, as illustrated in FIG. 28, the passage division portions 55 are located on both sides of the first land portion 33X in the X direction. Two passage division portions 55 are located on both sides of the first land portion 33X in the Y direction. The passage division portions 55 are located on both sides of the second land portions 33Y in the Y direction. Two passage division portions 55 are located on both sides of each second land portion 33Y in the X direction. The passage division portions 55 are located on both sides of the third land portions 33U. Two passage division portions 55 are located on both sides of each third land portion 33U in the direction perpendicular to the direction in which the third land portion 33U extends.

Also, in the example illustrated in FIG. 28, the first land recessed portion 38X that connects the passage division portions 55 that are located on both sides may be located on the second body surface 30b at the first land portion 33X. The second land recessed portions 38Y that connect the passage division portions 55 that are located on both sides may be located on the second body surface 30b at the second land portions 33Y The groove connection portions 66 that are located at the land intersection portions 37 may connect the first main flow grooves 61X and the second main flow grooves 61Y to each other.

Similarly, the second land recessed portions 38Y may be located also at the land intersection portions 37 at which the second land portions 33Y and the third land portions 33U intersect with each other. Third land recessed portions 38U that connect the passage division portions 55 that are located on both sides of the third land portions 33U may be located on the second body surface 30b at the third land portions 33U. The third land recessed portions 38U may be formed as in the first land recessed portions 38X and the second land recessed portions 38Y according to the first embodiment described above.

Also, according to the modification, the transport efficiency of the working liquid 2b can be improved, and the transport efficiency of the working vapor 2a can be improved as in the first embodiment described above. For this reason, the heat dissipation performance of the vapor chamber 1 can be improved.

A twelfth modification will be described.

Figure 29:
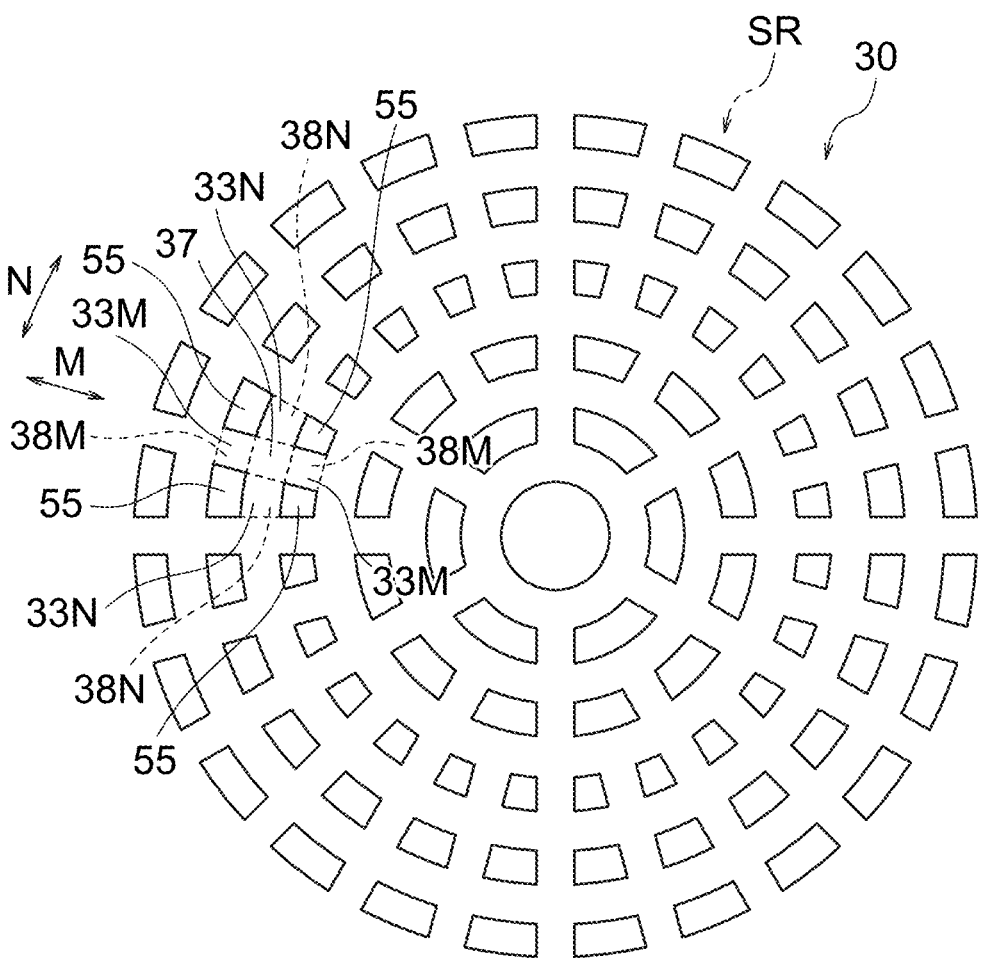
FIG. 29 is a plan view of another modification to the land portion illustrated in FIG. 6.

For example, the wick sheet 30 may be formed as illustrated in FIG. 29. In an example illustrated in FIG. 29, the wick sheet 30 may include first land portions 33M that extend in a first direction M and second land portions 33N that extend in a second direction N. In an example illustrated in FIG. 29, the first land portions 33M radially extend, and the first direction M is a radial direction. The second land portions 33N extend in a circumferential direction, and the second direction N is the circumferential direction that differs from the first direction M. The first land portions 33M and the second land portions 33N may intersect at the land intersection portions 37. The first land portions 33M may extend in the first direction M across the land intersection portions 37. The second land portions 33N may extend in the second direction N across the land intersection portions 37. The first land portions 33M and the second land portions 33N may be formed as in the first land portions 33X and the second land portions 33Y according to the first embodiment described above. A region illustrated in FIG. 29 may be located in the vaporization region SR.

In an example illustrated in FIG. 29, the vapor flow path portion 50 may be formed by the multiple passage division portions 55. The passage division portions 55 may be demarcated by the first land portions 33M and the second land portions 33N.

More specifically, as illustrated in FIG. 29, the passage division portions 55 are located on both sides of the first land portions 33M in the first direction M. The passage division portions 55 are located on both sides of the first land portions 33M in the direction perpendicular to the first direction M. The passage division portions 55 are located on both sides of the second land portions 33N in the second direction N. The passage division portions 55 are located on both sides of the second land portions 33N in the direction perpendicular to the second direction N. In this way, four passage division portions 55 are formed around each land intersection portion 37.

First land recessed portions 38M that connect the passage division portions 55 that are located on both sides may be located on the second body surface 30b at the first land portions 33M. Second land recessed portions 38N that connect the passage division portions 55 that are located on both sides may be located on the second body surface 30b at the second land portions 33N. The first land recessed portions 38M and the second land recessed portions 38N may be formed as in the first land recessed portions 38X and the second land recessed portions 38Y according to the first embodiment described above.

Figure 30:
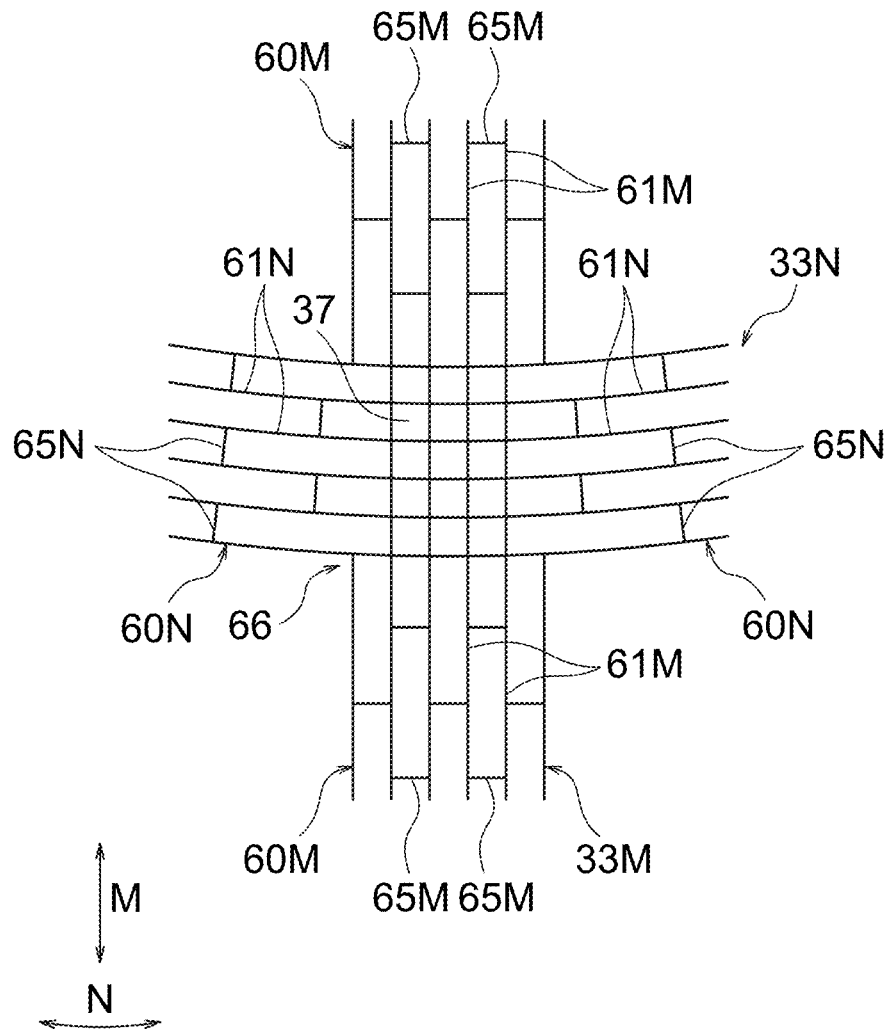
FIG. 30 is a schematic plan view of the liquid flow path portion illustrated in FIG. 29.

As illustrated in FIG. 30, first liquid flow path portions 60M may be formed on the first body surface 30a at the first land portions 33M. The first liquid flow path portions 60M may include multiple first main flow grooves 61M that extend in the first direction M and multiple first communication grooves 65M that extend in the direction perpendicular to the first direction M. The first main flow grooves 61M and the first communication grooves 65M may be formed as in the first main flow grooves 61X and the first communication grooves 65X according to the first embodiment described above. In FIG. 30, each of the first main flow grooves 61M and the first communication grooves 65M is illustrated by using a straight line for simplicity of the figure. The same is true for main flow grooves 61N and communication grooves 65N described later.

Second liquid flow path portions 60N may be formed on the first body surface 30a at the second land portions 33N. The second liquid flow path portions 60N may include multiple second main flow grooves 61N that extend in the second direction N and multiple second communication grooves 65N that extend in the direction perpendicular to the second direction N. The second main flow grooves 61N and the second communication grooves 65N may be formed as in the first main flow grooves 61X and the first communication grooves 65X according to the first embodiment described above. The first main flow grooves 61M and the second main flow grooves 61N may be connected to the groove connection portions 66 that are located at the land intersection portions 37.

Also, according to the modification, the transport efficiency of the working liquid 2b can be improved, and the transport efficiency of the working vapor 2a can be improved as in the first embodiment described above. For this reason, the heat dissipation performance of the vapor chamber 1 can be improved.

A thirteenth modification will be described.

Figure 31:
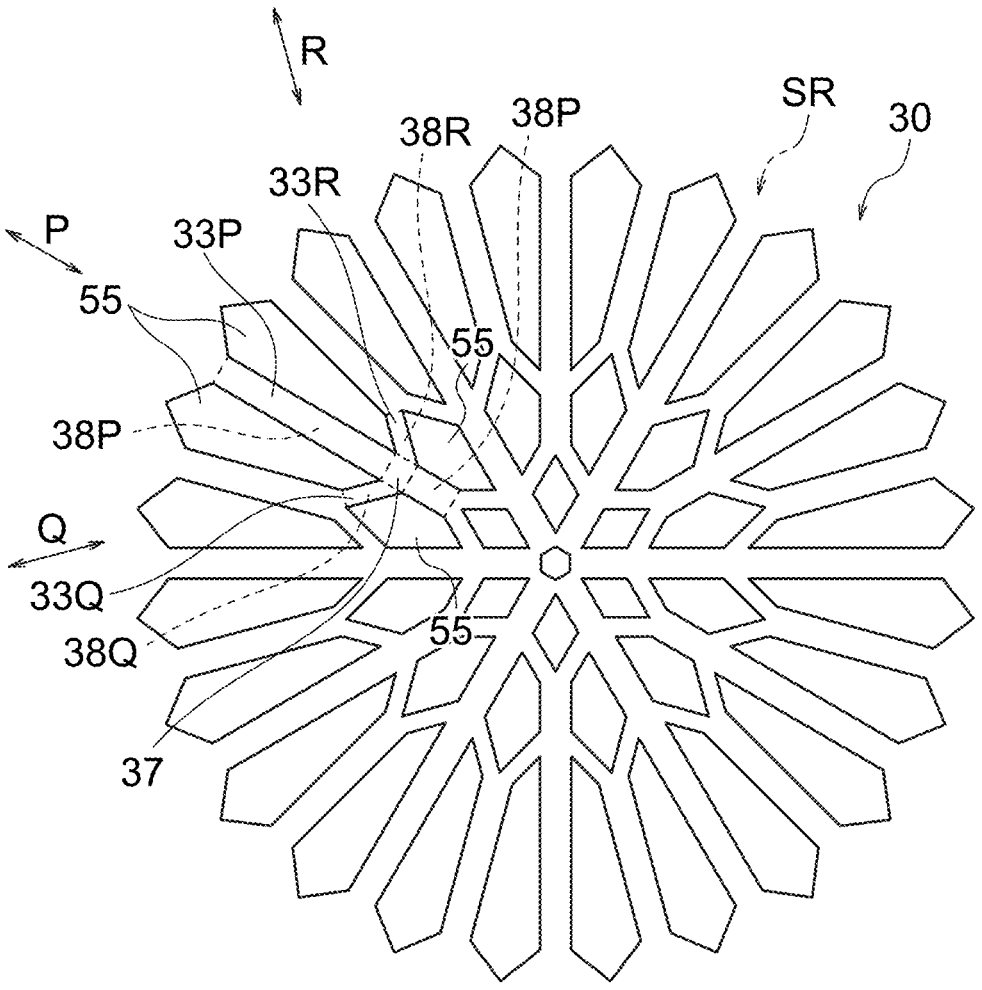
FIG. 31 is a plan view of another modification to the land portion illustrated in FIG. 6.

For example, the wick sheet 30 may be formed as illustrated in FIG. 31. In an example illustrated in FIG. 31, the wick sheet 30 may include first land portions 33P that extend in a first direction P and second land portions 33Q that extend in a second direction Q, third land portions 33R that extend in a third direction R. The first direction P, the second direction Q, and the third direction R differ from each other. Schematically, the first land portions 33P radially extend, and the first direction P is a radial direction. The second land portions 33Q and the third land portions 33R intersect with a respective one of the first land portions 33P. The first land portions 33P extend in the first direction P across the land intersection portions 37. The second land portions 33Q and the third land portions 33R may terminate at the land intersection portions 37. A region illustrated in FIG. 31 may be located in the vaporization region SR. One of the land intersection portions 37 illustrated in FIG. 31 will be representatively described. The first direction P, the second direction Q, and the third direction R illustrated in FIG. 31 represent directions related to one of the first land portions 33P, one of the second land portions 33Q, and one of the third land portions 33R that intersect at the land intersection portion 37. For this reason, directions related to land portions that intersect with a different one of the land intersection portions 37 may differ from the first direction P, the second direction Q, and the third direction R illustrated in FIG. 31.

In an example illustrated in FIG. 31, the vapor flow path portion 50 may be formed by the multiple passage division portions 55. The passage division portions 55 may be demarcated by the first land portions 33P, the second land portions 33Q, and the third land portions 33R.

More specifically, as illustrated in FIG. 31, the passage division portions 55 are located on both sides of the first land portions 33P in the first direction P. The passage division portions 55 are located on both sides of the first land portions 33P in the direction perpendicular to the first direction P. The passage division portions 55 are located on both sides of the second land portions 33Q in the second direction Q. The passage division portions 55 are located on both sides of the second land portions 33Q in the direction perpendicular to the second direction Q. The passage division portions 55 are located on both sides of the third land portions 33R in the third direction R. The passage division portions 55 are located on both sides of the third land portions 33R in the direction perpendicular to the third direction R. In this way, four passage division portions 55 are formed around each land intersection portion 37.

Also, in an example illustrated in FIG. 31, first land recessed portions 38P that connect the passage division portions 55 that are located on both sides may be located on the second body surface 30b at the first land portions 33P. Second land recessed portions 38Q that connect the passage division portions 55 that are located on both sides may be located on the second body surface 30b at the second land portions 33Q. Third land recessed portions 38R that connect the passage division portions 55 that are located on both sides may be located on the second body surface 30b at the third land portions 33R.

The same first liquid flow path portion as the first liquid flow path portions 60X may be formed on the first body surface 30a at the first land portions 33P. The same second liquid flow path portion as the first liquid flow path portions 60X may be formed on the first body surface 30a at the second land portions 33Q. The same third liquid flow path portion as the first liquid flow path portions 60X may be formed on the first body surface 30a at the third land portions 33R. Main flow grooves of the liquid flow path portions may be connected to the groove connection portions 66 that are located at the land intersection portions 37.

Also, according to the modification, the transport efficiency of the working liquid 2b can be improved, and the transport efficiency of the working vapor 2a can be improved as in the first embodiment described above. For this reason, the heat dissipation performance of the vapor chamber 1 can be improved.

A fourteenth modification will be described.

Figure 32:
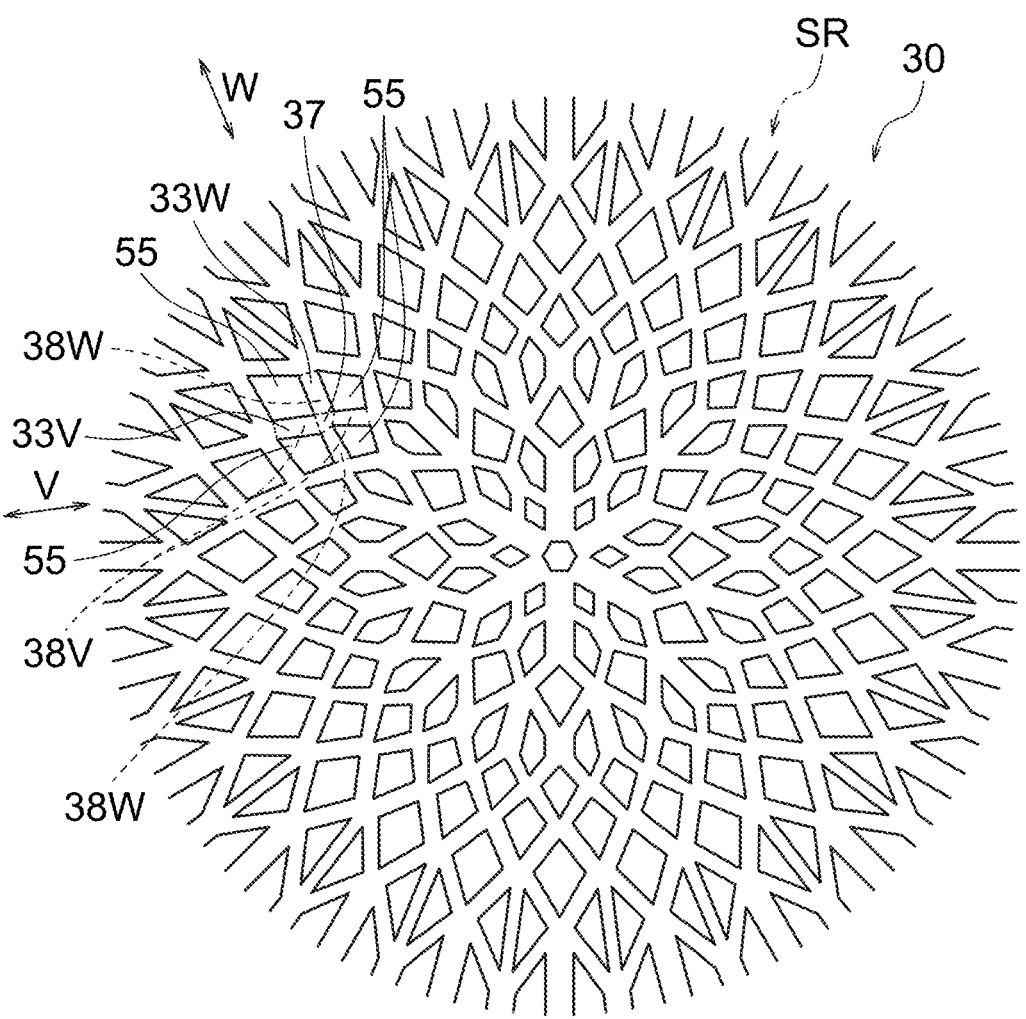
FIG. 32 is a plan view of another modification to the land portion illustrated in FIG. 6.

For example, the wick sheet 30 may be formed as illustrated in FIG. 32. In an example illustrated in FIG. 32, the wick sheet 30 may include first land portions 33V that extend in a first direction V and second land portions 33W that extend in a second direction W. The first direction V and the second direction W differ from each other. The second land portions 33W intersect with the first land portions 33V. The first land portions 33V may extend in the first direction V across the land intersection portions 37. However, directions in which two first land portions 33V that are located on both sides of each land intersection portion 37 extend may differ from each other. In this case, the first land portions 33V may terminate at the land intersection portions 37. The second land portions 33W may extend in the second direction W across the land intersection portions 37. However, directions in which two second land portions 33W that are located on both sides of each land intersection portion 37 extend may differ from each other. In this case, the second land portions 33W may terminate at the land intersection portions 37. A region illustrated in FIG. 32 may be located in the vaporization region SR. One of the land intersection portions 37 illustrated in FIG. 32 will be representatively described. The first direction V and the second direction W illustrated in FIG. 32 represent directions related to one of the first land portions 33V and one of the second land portions 33W that intersect at the land intersection portion 37. For this reason, directions related to land portions that intersect with a different one of the land intersection portions 37 may differ from the first direction V and the second direction W illustrated in FIG. 32.

In an example illustrated in FIG. 32, the vapor flow path portion 50 may be formed by the multiple passage division portions 55. The passage division portions 55 may be demarcated by the first land portions 33V and the second land portions 33W.

More specifically, as illustrated in FIG. 32, the passage division portions 55 are located on both sides of the first land portions 33V in the first direction V. The passage division portions 55 are located on both sides of the first land portions 33V in the direction perpendicular to the first direction V. The passage division portions 55 are located on both sides of the second land portions 33W in the second direction W. The passage division portions 55 are located on both sides of the second land portions 33W in the direction perpendicular to the second direction W. In this way, four passage division portions 55 are formed around each land intersection portion 37.

Also, in an example illustrated in FIG. 32, first land recessed portions 38V that connect the passage division portions 55 that are located on both sides may be located on the second body surface 30b at the first land portions 33V. Second land recessed portions 38W that connect the passage division portions 55 that are located on both sides may be located on the second body surface 30b at the second land portions 33W.

The same first liquid flow path portion as the first liquid flow path portions 60X may be formed on the first body surface 30a at the first land portions 33V. The same second liquid flow path portion as the second liquid flow path portions 60Y may be formed on the first body surface 30a at the second land portions 33W. Main flow grooves of the liquid flow path portions may be connected to the groove connection portions 66 that are located at the land intersection portions 37.

According to the modification, the transport efficiency of the working liquid 2b can be improved, and the transport efficiency of the working vapor 2a can be improved as in the first embodiment described above. For this reason, the heat dissipation performance of the vapor chamber 1 can be improved.

A fifteenth modification will be described.

The structure of each land intersection portion illustrated in FIG. 9 to FIG. 11 will be described prior to the description for a specific structure according to the fifteenth modification. The multiple first land portions 33X that extend in the X direction and the multiple second land portions 33Y that extend in the Y direction intersect with each other, and consequently, the multiple land intersection portions 37 are formed as described above. The multiple land intersection portions 37 form a land connection region 40. The structure of the land connection region 40 will now be described with reference to FIG. 33 to FIG. 35 by using first intersection land portions 33Xa and second intersection land portions 33Ya.

Figure 33:
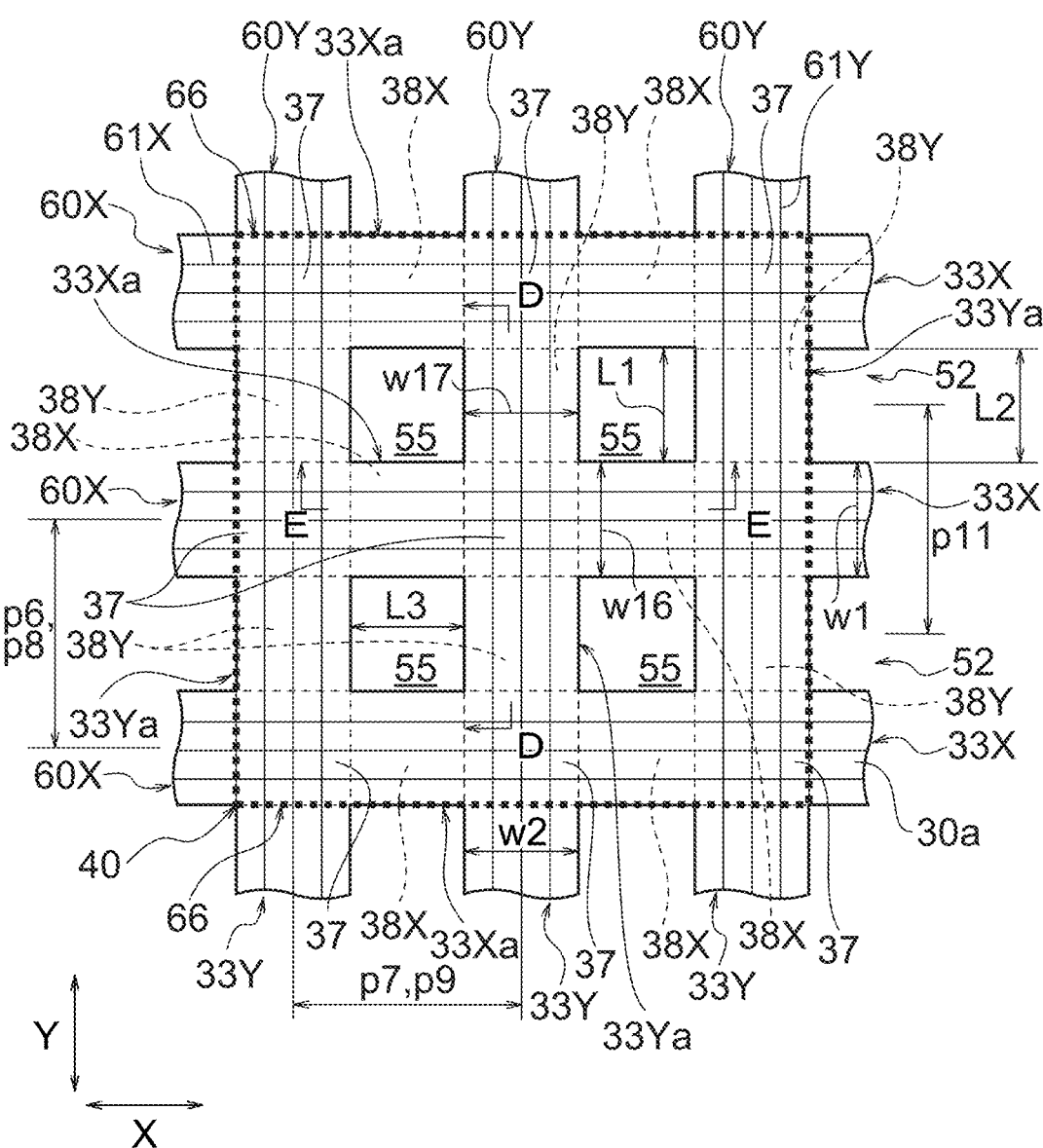
FIG. 33 is a plan view of a land connection region that includes the land intersection portions illustrated in FIG. 9.

As illustrated in FIG. 33, the land connection region 40 may include the multiple first intersection land portions 33Xa, the multiple second intersection land portions 33Ya, and the multiple land intersection portions 37.

The first intersection land portions 33Xa and the second intersection land portions 33Ya contain the first body surface 30a and the second body surface 30b and extend from the first body surface 30a to the second body surface 30b. The vapor flow path portion 50 is located around the first intersection land portions 33Xa and around the second intersection land portions 33Ya.

The first intersection land portions 33Xa may be elongated such that the X direction is the longitudinal direction in plan view. The second intersection land portions 33Ya may extend in a direction that differs from the X direction in plan view and may be elongated such that the Y direction is the longitudinal direction. The planar shapes of the first intersection land portions 33Xa and the planar shapes of the second intersection land portions 33Ya may be elongated rectangular shapes. The first intersection land portions 33Xa may be parallel with each other. The second intersection land portions 33Ya may be parallel with each other.

At least one of the first intersection land portions 33Xa may be connected to the first land portions 33X. In an example illustrated in FIG. 33, the first intersection land portions 33Xa are connected to the first land portions 33X corresponding thereto. Each first intersection land portion 33Xa is connected a respective one of the first intersection land portions 33Xa. The first intersection land portions 33Xa may be located along extension lines from the first land portions 33X. The width w16 of each first intersection land portion 33Xa may be equal to the width w1 of each first land portion 33X. In this case, the land portions that extend in the X direction are continuously formed. A pitch p8 at which the first intersection land portions 33Xa are arranged in the Y direction may be equal to a pitch p6 at which the first land portions 33X are arranged. The first intersection land portions 33Xa may be formed as in the first land portions 33X. In the example illustrated in FIG. 33, the land connection region 40 may be located at intermediate positions on the first land portions 33X in the X direction. In this case, the first land portions 33X are divided by the first intersection land portions 33Xa corresponding thereto.

At least one of the second intersection land portions 33Ya may be connected to the second land portions 33Y In the example illustrated in FIG. 33, the second intersection land portions 33Ya are connected to the second land portions 33Y corresponding thereto. Each second intersection land portion 33Ya is connected to a respective one of the second land portions 33Y The second intersection land portions 33Ya may be located along extension lines from the second land portions 33Y The width w17 of each second intersection land portion 33Ya may be equal to the width w2 of each second land portion 33Y In this case, the land portions that extend in the Y direction are continuously formed. A pitch p9 at which the second intersection land portions 33Ya are arranged in the X direction may be equal to a pitch p7 at which the second land portions 33Y are arranged. The second intersection land portions 33Ya may be formed as in the second land portions 33Y As illustrated in FIG. 33, the land connection region 40 may be located at intermediate positions on the second land portions 33Y in the Y direction. In this case, the second land portions 33Y are divided by the second intersection land portions 33Ya corresponding thereto.

At least one of the first land portions 33X is connected to the land connection region 40, and at least one of the second land portions 33Y is connected to the land connection region 40. As illustrated in FIG. 33, the multiple first land portions 33X may be connected to the land connection region 40, and the multiple second land portions 33Y may be connected to the land connection region 40. However, the second land portions 33Y may not be connected to the land connection region 40. In this case, the wick sheet 30 may not include the second land portions 33Y.

As illustrated in FIG. 33, the first intersection land portions 33Xa and the second intersection land portions 33Ya may intersect at the land intersection portions 37. More specifically, the first intersection land portions 33Xa and the second intersection land portions 33Ya may intersect with each other, and the multiple land intersection portions 37 may be formed. The multiple land intersection portions 37 may form the land connection region 40. One of the first intersection land portions 33Xa and one of the second intersection land portions 33Ya intersect with each other at one of the land intersection portions 37. The multiple first intersection land portions 33Xa and the multiple second intersection land portions 33Ya may be at least partly formed in a lattice pattern.

The first intersection land portions 33Xa may extend in the X direction across the land intersection portions 37. In the example illustrated in FIG. 33, the first intersection land portions 33Xa may terminate at the land intersection portions 37 that form outer circumferential portions of the land connection region 40. The second intersection land portions 33Ya may extend in the Y direction across the land intersection portions 37. In the example illustrated in FIG. 33, the second intersection land portions 33Ya may terminate at the land intersection portions 37 that form the outer circumferential portions of the land connection region 40. The first intersection land portions 33Xa and the second intersection land portions 33Ya may intersect with each other in a cross shape.

According to the fifteenth modification, the first intersection land portions 33Xa and the second intersection land portions 33Ya are perpendicular to each other. However, the first intersection land portions 33Xa and the second intersection land portions 33Ya may not be perpendicular to each other, and angles at which the first intersection land portions 33Xa and the second intersection land portions 33Ya intersect with each other are freely determined.

The land connection region 40 may be a region in which the multiple land intersection portions 37 are located. The land connection region 40 may be defined by the land intersection portions 37 that form the outer circumferential portions among the multiple land intersection portions 37. For example, as illustrated by using thick dashed lines in FIG. 33, a region that is defined by lines that pass through the outer edges of the land intersection portions 37 that form the outer circumferential portions in plan view may be acceptable. The outer edges of the land connection region 40 may be defined at the first body surface 30a.

The vapor flow path portion 50 is located around the first intersection land portions 33Xa and around the second intersection land portions 33Ya. Each passage division portion 55 may be formed between two first intersection land portions 33Xa adjacent to each other in the Y direction. The passage division portions 55 are located on both sides of the second intersection land portions 33Ya in the X direction. Each passage division portion 55 may be formed between two second intersection land portions 33Ya adjacent to each other in the X direction. The passage division portions 55 are located on both sides of the first intersection land portions 33Xa in the Y direction. Four passage division portions 55 may be formed around each land intersection portion 37. The dimension L1 in the Y direction of each passage division portion 55 that is located inside the land connection region 40 may be equal to the dimension L2 in the Y direction of each passage division portion 55 that is located outside the land connection region 40. The dimension L3 in the X direction of each passage division portion 55 that is located inside the land connection region 40 may be equal to the dimension L1 in the Y direction. The dimension L3 in the X direction and the dimension L1 in the Y direction of each passage division portion 55 are dimensions at the first body surface 30*a*. The dimension L1 in the Y direction of each second vapor passage 52 is a dimension at the first body surface 30*a*.

Figure 34:
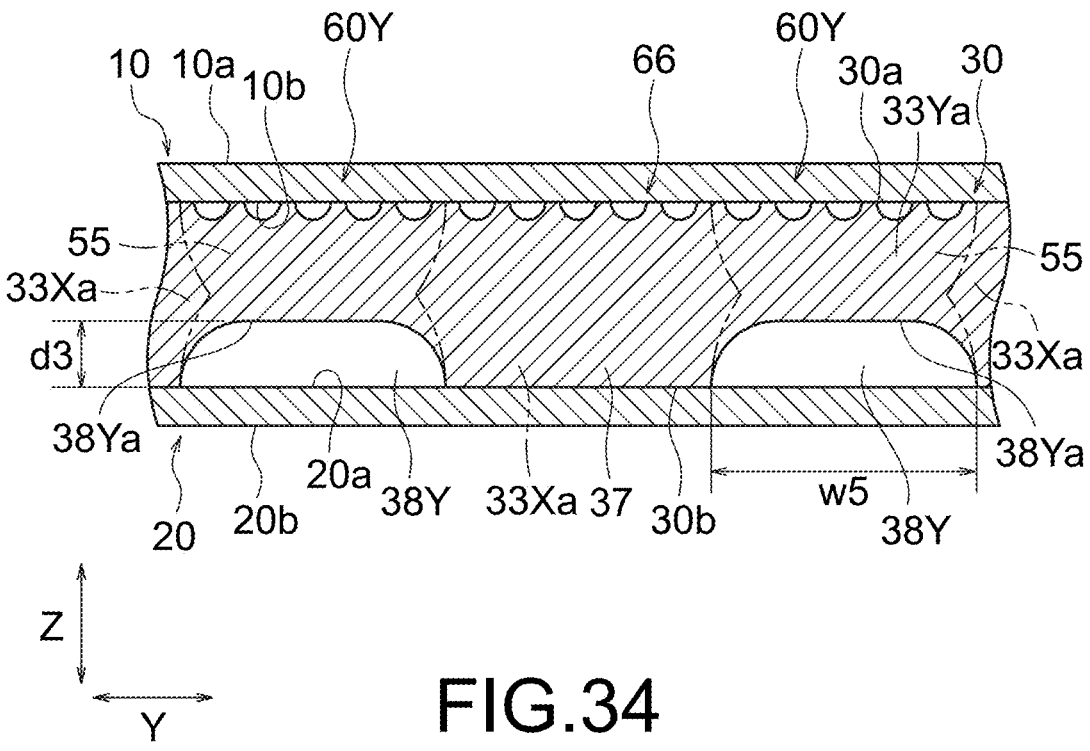
FIG. 34 is a sectional view of the second land recessed portions taken along a line D-D in FIG. 33.
Figure 35:
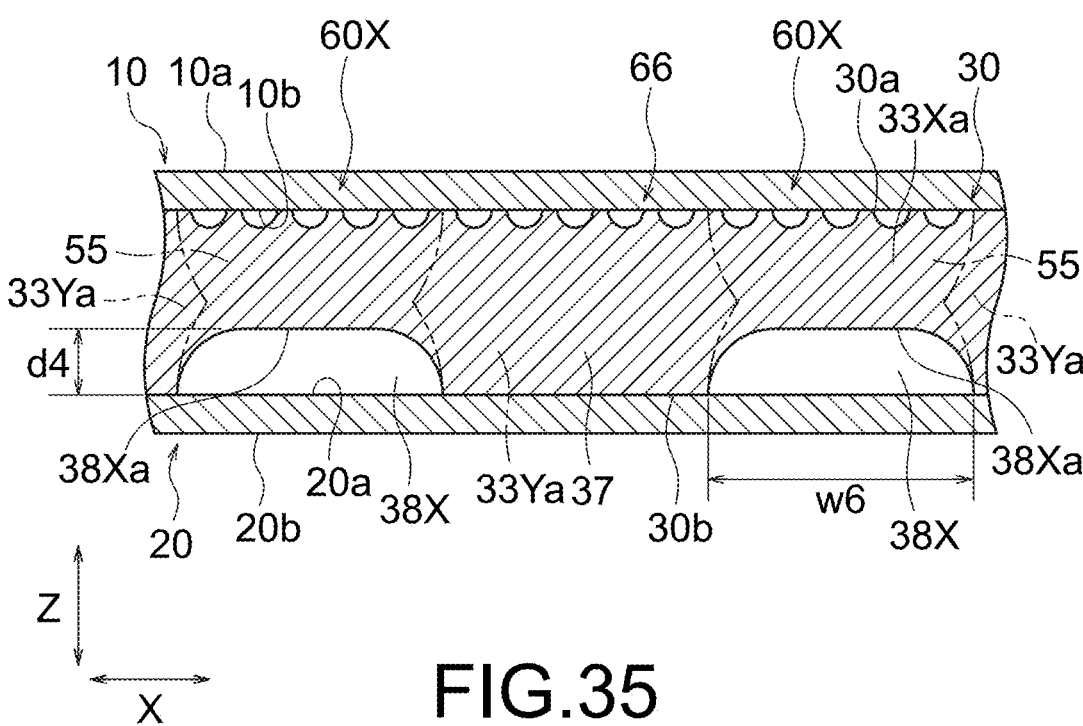
FIG. 35 is a sectional view of the first land recessed portions taken along a line E-E in FIG. 33.

As illustrated in FIG. 34, the second land recessed portions 38Y may be located on the second body surface 30*b* at the second intersection land portions 33Ya. As illustrated in FIG. 33, the second land recessed portions 38Y may connect the passage division portions 55 that are located on both sides in the X direction with respect to the second land recessed portions 38Y FIG. 34 illustrates a section of one of the second intersection land portions 33Ya in the Y direction. As illustrated in FIG. 35, the first land recessed portions 38X may be located on the second body surface 30*b* at the first intersection land portions 33Xa. As illustrated in FIG. 33, the first land recessed portions 38X may connect the passage division portions 55 that are located on both sides in the Y direction with respect to the first land recessed portions 38X.

In the example illustrated in FIG. 33 to FIG. 35, the first intersection land portions 33Xa and the second intersection land portions 33Ya thus intersect with each other at the land intersection portions 37. In an example illustrated in FIG. 9 to FIG. 11, the first land portions 33X and the second land portions 33Y intersect with each other at the land intersection portions 37. The two examples differ from each other in this point. However, the difference is made because the names of the land portions that intersect at the land intersection portions 37 are changed, and the structure of the land connection region 40 is not substantially changed. In the land connection region 40 illustrated in FIG. 33, the passage division portions 55, the first land recessed portions 38X, and the second land recessed portions 38Y are formed as described above, and the land connection region 40 is formed as in the example illustrated in FIG. 9 to FIG. 11. For this reason, a detailed description is omitted.

As illustrated in FIG. 33, the first liquid flow path portions 60X may be formed on the first body surface 30*a* at the first intersection land portions 33Xa. More specifically, the first main flow grooves 61X of the first liquid flow path portions 60X may extend from the first body surface 30*a* at the first land portions 33X to the first body surface 30*a* at the first intersection land portions 33Xa. The first communication grooves 65X that form the first liquid flow path portions 60X may be located on the first body surface 30*a* at the first intersection land portions 33Xa as in the first body surface 30*a* at the first land portions 33X. In FIG. 33, each of the main flow grooves 61X and 61Y is illustrated by using a single line, and the first communication grooves 65X are omitted for the clarity of the figures. The same is true for FIG. 36 and other figures.

The second liquid flow path portions 60Y may be formed on the first body surface 30*a* at the second intersection land portions 33Ya. More specifically, the second main flow grooves 61Y of the second liquid flow path portions 60Y may extend from the first body surface 30*a* at the second land portions 33Y to the first body surface 30*a* at the second intersection land portions 33Ya. The second communication grooves 65Y that form the second liquid flow path portions 60Y may be located on the first body surface 30*a* at the second intersection land portions 33Ya as in the first body surface 30*a* at the second land portions 33Y In FIG. 33, the second communication grooves 65Y are omitted for the clarity of the figures.

The first main flow grooves 61X and the second main flow grooves 61Y may be in communication with each other at the land intersection portions 37. The first main flow grooves 61X may be connected to the groove connection portions 66 that are located at the land intersection portions 37 and that are described above. The second main flow grooves 61Y may be connected to the groove connection portions 66 that are located at the land intersection portions 37 and that are described above.

The specific structure according to the fifteenth modification will now be described with reference to FIG. 36. In the example illustrated in FIG. 33 to FIG. 35, the width w16 of each first intersection land portion 33Xa is equal to the width w1 of each first land portion 33X, and the width w17 of each second intersection land portion 33Ya is equal to the width w2 of each second land portion 33Y According to the fifteenth modification, the width w16 of each first intersection land portion 33Xa is less than the width w1 of each first land portion 33X, and the width w17 of each second intersection land portion 33Ya is less than the width w2 of each second land portion 33Y.

The width w16 of each first intersection land portion 33Xa may be less than the width w1 of each first land portion 33X. The pitch p8 at which the first intersection land portions 33Xa are arranged in the Y direction may be smaller than the pitch p6 at which the first land portions 33X are arranged. The pitch p8 at which the first intersection land portions 33Xa are arranged is freely determined.

The land connection region 40 may be a region illustrated by using a thick dashed line as in the example illustrated in FIG. 33 and may be defined by the land intersection portions 37 that form the outer circumferential portions. The land connection region 40 may be located in the vaporization region SR described above or may be located in the condensation region CR.

At least some first intersection land portions 33Xa of the multiple first intersection land portions 33Xa that form the land connection region 40 may be connected to the first land portions 33X. In an example illustrated in FIG. 36, some first intersection land portions 33Xa may be connected to the first land portions 33X, and the other first intersection land portions 33Xa may not be connected to the first land portions 33X. The lengths of the first intersection land portions 33Xa that are not connected to the first land portions 33X may be equal to the lengths of the first intersection land portions 33Xa that are connected to the first land portions 33X.

The width w17 of each second intersection land portion 33Ya may be less than the width w2 of each second land portion 33Y The pitch p9 at which the second intersection land portions 33Ya are arranged in the X direction may be smaller than the pitch p7 at which the second land portions 33Y are arranged. The pitch p9 at which the second intersection land portions 33Ya are arranged is freely determined.

Figure 36:
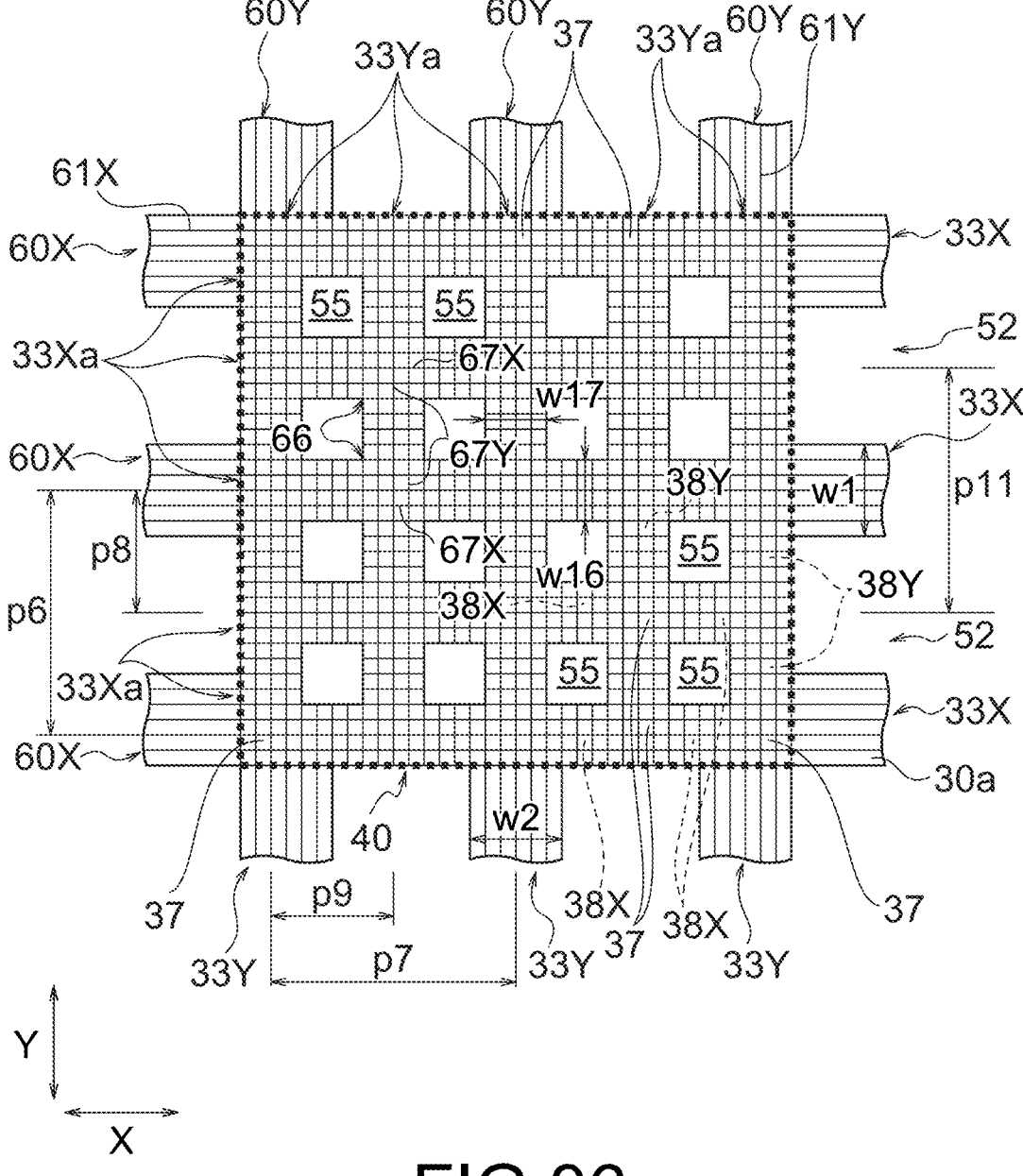
FIG. 36 is a plan view of a modification to the land connection region illustrated in FIG. 33.

At least some second intersection land portions 33Ya of the multiple second intersection land portions 33Ya that form the land connection region 40 may be connected to the second land portions 33Y In the example illustrated in FIG. 36, some second intersection land portions 33Ya may be connected to the second land portions 33Y, and the other second intersection land portions 33Ya may not be connected to the second land portions 33Y The lengths of the second intersection land portions 33Ya that are not connected to the second land portions 33Y may be equal to the lengths of the second intersection land portions 33Ya that are connected to the second land portions 33Y.

As illustrated in FIG. 36, the first main flow grooves 61X of the first liquid flow path portions 60X may extend from the first body surface 30*a* at the first land portions 33X to the first body surface 30*a* at the first intersection land portions 33Xa. The first liquid flow path portions 60X that are formed at the first intersection land portions 33Xa may be formed as in the example illustrated in FIG. 24. The multiple first main flow grooves 61X and the multiple first communication grooves 65X that are formed at the first intersection land portions 33Xa may be formed in a lattice pattern. In FIG. 36, the first communication grooves 65X that are located at the first land portions 33X are omitted for the clarity of the figures.

The second main flow grooves 61Y of the second liquid flow path portions 60Y may extend from the first body surface 30a at the second land portions 33Y to the first body surface 30a at the second intersection land portions 33Ya. The second liquid flow path portions 60Y that are formed at the second intersection land portions 33Ya may be formed as in the example illustrated in FIG. 24. The multiple second main flow grooves 61Y and the multiple second communication grooves 65Y that are formed at the second intersection land portions 33Ya may be formed in a lattice pattern. In FIG. 36, the second communication grooves 65Y that are located at the second land portions 33Y are omitted for the clarity of the figures.

The groove connection portions 66 that are located at the land intersection portions 37 are connected to the first main flow grooves 61X on both sides in the X direction and are connected to the second main flow grooves 61Y on both sides in the Y direction. Consequently, at the land intersection portions 37, the first main flow grooves 61X that are located at the first intersection land portions 33Xa corresponding thereto and the second main flow grooves 61Y that are located at the second intersection land portions 33Ya corresponding thereto are in communication with each other. The groove connection portions 66 may include the multiple first intersection grooves 67X and the multiple second intersection grooves 67Y as in the example illustrated in FIG. 24. The first intersection grooves 67X and the second intersection grooves 67Y may intersect with each other in a cross shape or may be formed in a lattice pattern.

According to the fifteenth modification, the sizes of the passage division portions 55 in plan view can be decreased, and the number of the passage division portions 55 can be increased. This enables the number of the intersection grooves 67X and 67Y that are in communication with the passage division portions 55 to be increased and enables the length of a gas-liquid interface in the land connection region 40 to be increased. For this reason, in the case where the land connection region 40 is located in the vaporization region SR, the amount of vaporization of the working vapor 2a can be increased. In the case where the land connection region 40 is located in the condensation region CR, the amount of the working liquid 2b that is collected and that condenses from the working vapor 2a can be increased. The length of the gas-liquid interface means the length of the interface between the working liquid 2b and the working vapor 2a. In the case where the land connection region 40 is located in the vaporization region SR, the interface between the working liquid 2b and the working vapor 2a is typically formed near the passage division portions 55 in the intersection grooves 67X and 67Y In this case, the length of the gas-liquid interface corresponds to the total value of the length of the gas-liquid interface that is formed at the intersection grooves 67X and 67Y In the case where the land connection region 40 is located in the condensation region CR, the interface between the working liquid 2b and the working vapor 2a is typically formed near the intersection grooves 67X and 67Y at the passage division portions 55. In this case, the length of the gas-liquid interface corresponds to the total value of the length of the gas-liquid interface that is formed at the passage division portions 55.

According to the fifteenth modification, the sizes of the land intersection portions 37 in plan view can be decreased, and the densities of the land intersection portions 37 can be increased. This enables the mechanical strength of the vapor chamber 1 to be improved and enables the flow path resistance of the working vapor 2a to be decreased.

Figure 37:
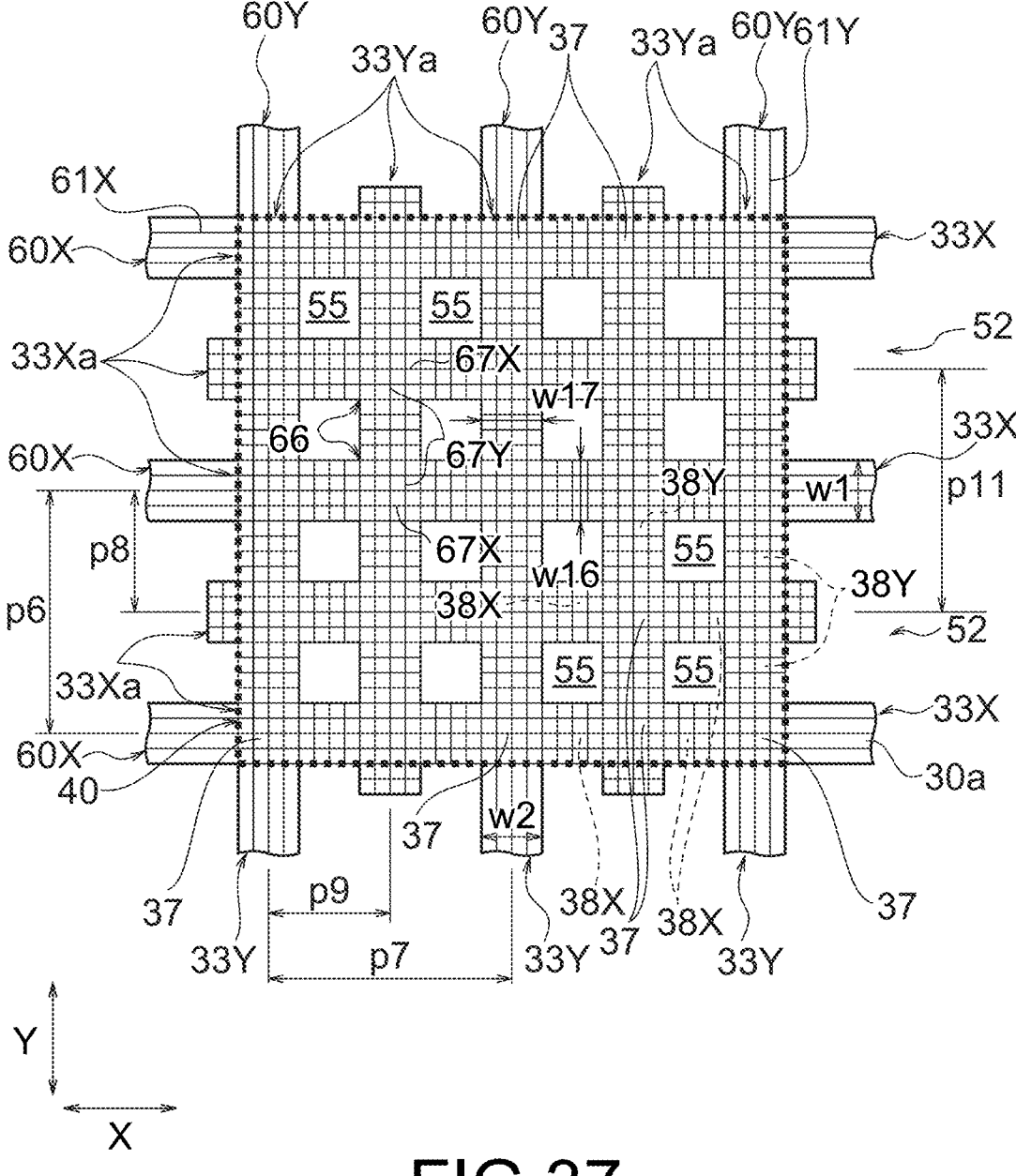
FIG. 37 is a plan view of a modification to passage division portions illustrated in FIG. 36.

In an example illustrated in FIG. 36, the first intersection land portions 33Xa that are not connected to the first land portions 33X and the second intersection land portions 33Ya that are not connected to the second land portions 33Y do not project from the land connection region 40. As illustrated in FIG. 37, however, the first intersection land portions 33Xa that are not connected to the first land portions 33X may project from the land connection region 40. Similarly, the second intersection land portions 33Ya that are not connected to the second land portions 33Y may project from the land connection region 40.

In an example illustrated in FIG. 37, the width w16 of each first intersection land portion 33Xa may be equal to the width w1 of each first land portion 33X. The pitch p8 at which the first intersection land portions 33Xa are arranged in the Y direction may be half of the pitch p6 at which the first land portions 33X are arranged but is not limited to the half and is freely determined. The width w17 of each second intersection land portion 33Ya may be equal to the width w2 of each second land portion 33Y. The pitch p9 at which the second intersection land portions 33Ya are arranged in the X direction may be half of the pitch p7 at which the second land portions 33Y are arranged but is not limited to the half and is freely determined.

A sixteenth modification to a thirty-first modification described below may be used for the wick sheet 30 in which the widths of the intersection land portions 33Xa and 33Ya are equal to the widths of the land portions 33X and 33Y as in the example illustrated in FIG. 33 described above. Alternatively, the sixteenth modification to the thirty-first modification may be used for the wick sheet 30 in which the widths of the intersection land portions 33Xa and 33Ya are less than the widths of the land portions 33X and 33Y as in the example illustrated in FIG. 36 described above.

The sixteenth modification will be described.

Figure 38:
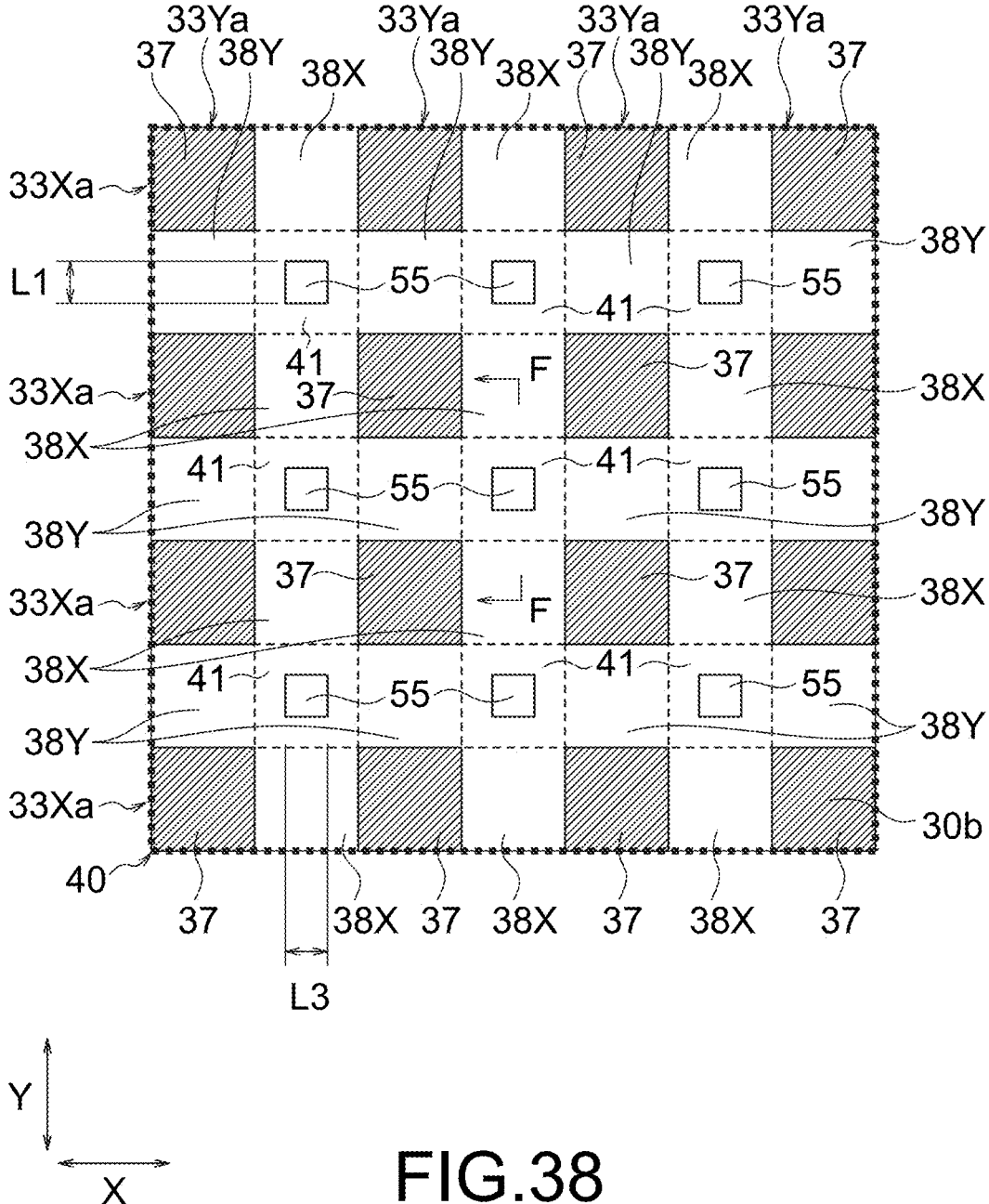
FIG. 38 is a plan view of another modification to the land connection region illustrated in FIG. 33.

According to the fifteenth modification described above, the dimension L1 in the Y direction of each passage division portion 55 that is located inside the land connection region 40 is equal to the dimension L2 in the Y direction of each passage division portion 55 that is located outside the land connection region 40. According to the fifteenth modification, the dimension L3 in the X direction of each passage division portion 55 that is located inside the land connection region 40 is equal to the dimension L1 in the Y direction of each passage division portion 55. The present disclosure, however, is not limited thereto. For example, as illustrated in FIG. 38, the dimension L1 in the Y direction of each passage division portion 55 that is located inside the land connection region 40 may be less than the dimension L2 in the Y direction (see FIG. 33) of each passage division portion 55 that is located outside the land connection region 40. FIG. 38 illustrates the land connection region 40 at the second body surface 30b. Oblique hatching used for the land connection region 40 represents these surfaces may form the second body surface 30b. In FIG. 38, the first land portions 33X and the second land portions 33Y that are located outside the land connection region 40 are omitted. The same is true for subsequent figures.

The dimension L3 in the X direction of each passage division portion 55 may be equal to the dimension L1 in the Y direction. The sizes of the passage division portions 55 in plan view can be decreased. The dimension L3 in the X direction and the dimension L1 in the Y direction of each passage division portion 55 are dimensions at the first body surface 30a. The dimension L2 in the Y direction of each second vapor passage 52 is a dimension at the first body surface 30a. The passage division portions 55 may be in communication with the first land recessed portions 38X adjacent thereto and may be in communication with the second land portions 33Y adjacent thereto.

Figure 39:
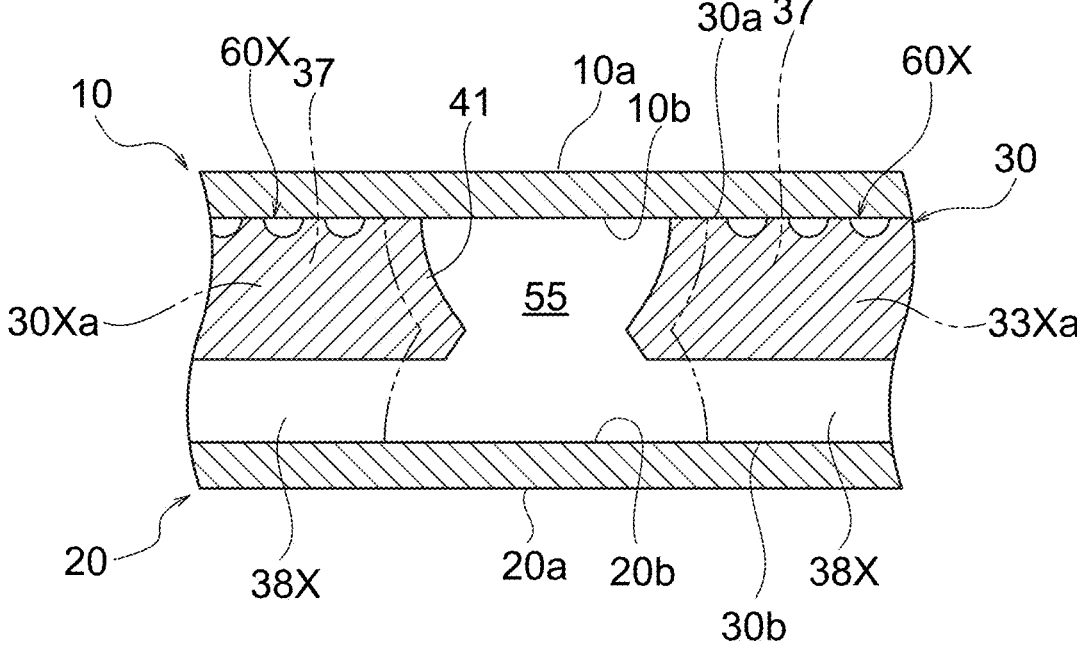
FIG. 39 is a sectional view of a space division portion taken along a line F-F in FIG. 38.
Figure 39:

As illustrated in FIG. 38 and FIG. 39, the passage division portions 55 may be defined by overhanging portions 41. The flange portions 41 project from the first intersection land portions 33Xa and the second intersection land portions 33Ya adjacent thereto toward the passage division portions 55, and the sizes of the passage division portions 55 in plan view are decreased. The flange portions 41 may be connected to the first intersection land portions 33Xa and the second intersection land portions 33Ya and may be formed continuously with the first intersection land portions 33Xa and the second intersection land portions 33Ya. As illustrated in FIG. 39, the passage division portions 55 are in communication with the first land recessed portions 38X and the second land recessed portions 38Y adjacent thereto at positions opposite the first body surface 30a at the flange portions 41. In an example illustrated in FIG. 39, the flange portions 41 have the same sectional shape as those of the through-portions 34 illustrated in FIG. 8, but the sectional shapes of the flange portions 41 are freely determined. The first communication grooves 65X of the first liquid flow path portions 60X may extend to the first body surface 30a at the flange portions 41, and the first main flow grooves 61X may be formed thereon. The second communication grooves 65Y of the second liquid flow path portions 60Y may extend to the first body surface 30a at the flange portions 41, and the second main flow grooves 61Y may be formed. The first communication grooves 65X and the second communication grooves 65Y may be in communication with the passage division portions 55 that are surrounded by the flange portions 41.

According to the sixteenth modification, the sizes of the passage division portions 55 can be decreased in plan view. This enables the plane areas of the first liquid flow path portions 60X and the second liquid flow path portions 60Y in the land connection region 40 to be increased. For this reason, in the case where the land connection region 40 is located in the vaporization region SR, the amount of the working vapor 2a transported to the vaporization region SR can be increased, and the amount of the working vapor 2a transported toward the center of the vaporization region SR can be increased.

The seventeenth modification will be described.

Figure 40A:
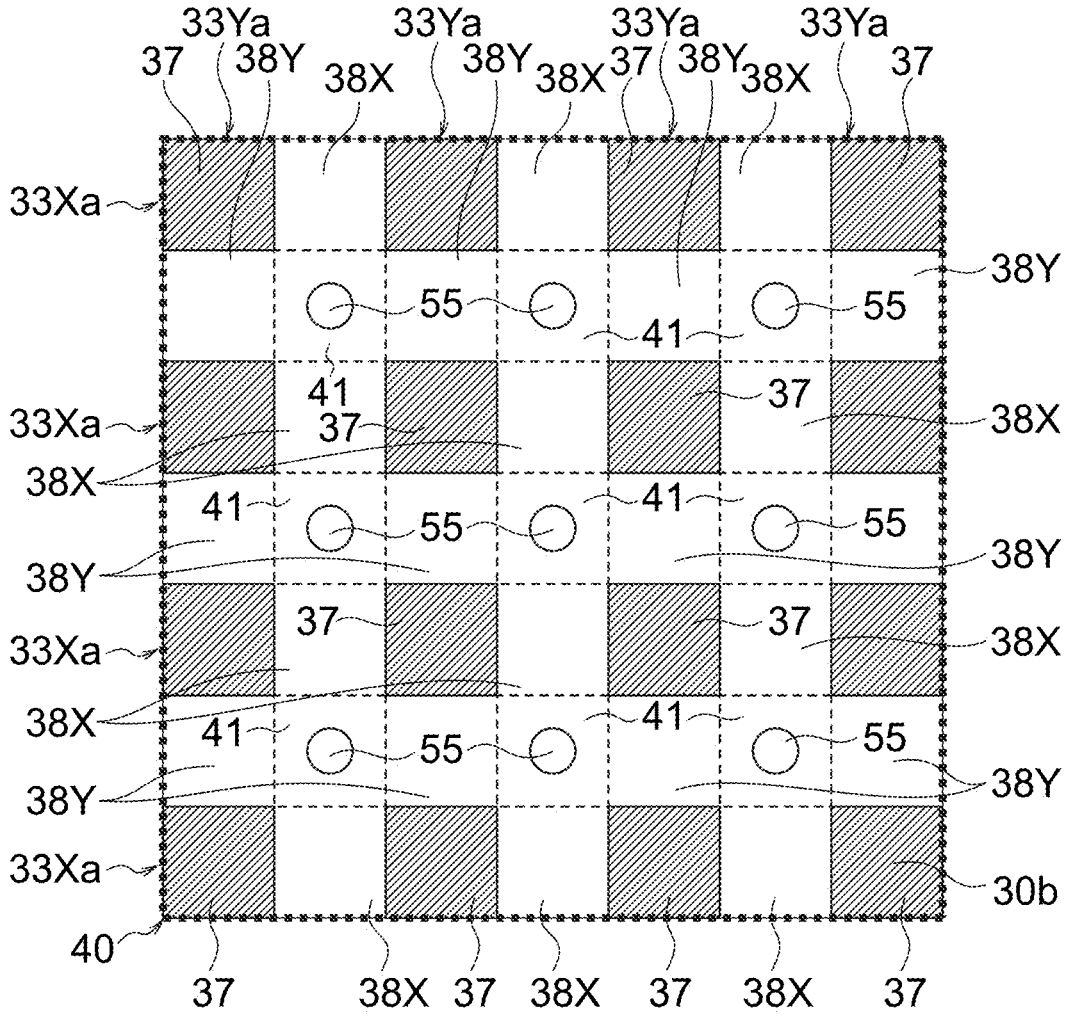
FIG. 40A is a plan view of another modification to the land connection region illustrated in FIG. 33.
Figure 40A:
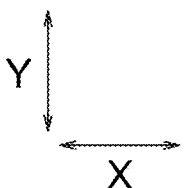
Figure 40B:
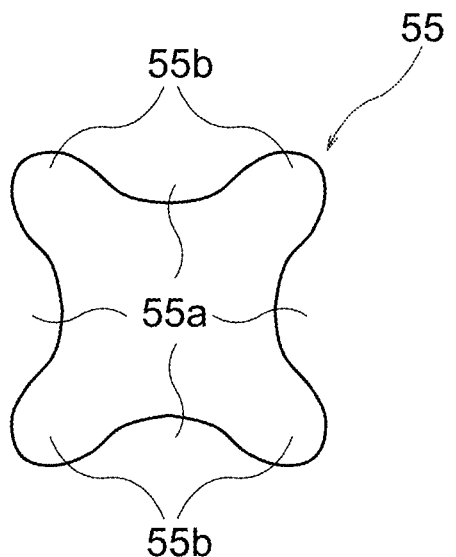
FIG. 40B is a plan view of a modification to the planar shapes of the passage division portions illustrated in FIG. 33.

In the example according to the first modification described above, the passage division portions 55 are formed in a rectangular shape in plan view. The present disclosure, however, is not limited thereto. For example, the passage division portions 55 may be formed in a rectangular shape having rounded corner portions in plan view. Alternatively, as illustrated in, for example, FIG. 40A, the passage division portions 55 may be formed in a circular shape in plan view. Alternatively, the passage division portions 55 may be formed in an elliptic shape in plan view although this is not illustrated, and this is freely determined. Alternatively, as illustrated in FIG. 40B, the passage division portions 55 may include passage projecting portions 55a and passage recessed portions 55b in plan view. The passage projecting portions 55a and the passage recessed portions 55b may alternate in the circumferential direction of the passage division portions 55. The passage projecting portions 55a are formed, and consequently, the working liquid 2b that condenses can be easily collected in the intersection grooves 67X and 67Y in the case where the land connection region 40 is located in the condensation region CR. The passage recessed portions 55b are formed, and consequently, the working vapor 2a that vaporizes can be smoothly dispersed to the passage division portions 55 in the case where the land connection region 40 is located in the vaporization region SR. In an example in FIG. 40B, the passage projecting portions 55a and the passage recessed portions 55b alternate at regular intervals in the circumferential direction. However, the passage projecting portions 55a and the passage recessed portions 55b may be arranged at irregular intervals in the circumferential direction. In the example in FIG. 40B, the passage projecting portions 55a have the same shape and the same size. However, the shapes of the passage projecting portions 55a may differ from each other, and the sizes of the passage projecting portions 55a may differ from each other. The same is true for the passage recessed portions 55b.

The eighteenth modification will be described.

Figure 41A:
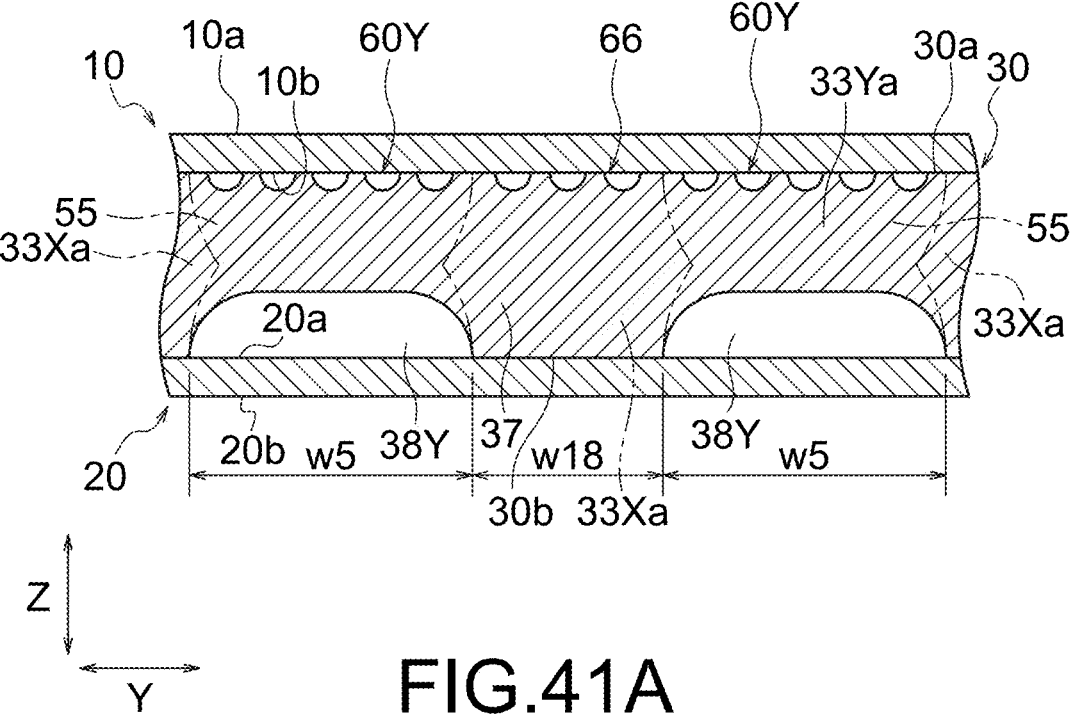
FIG. 41A is a sectional view of a modification to the land intersection portions illustrated in FIG. 35.

In an example described according to the fifteenth modification described above, the dimension in the Y direction of each land intersection portion 37 is equal to the width w5 of each second land recessed portion 38Y and is equal to the width w1 (see, for example, FIG. 8) of each first land portion 33X. The present disclosure, however, is not limited thereto. For example, as illustrated in FIG. 41A, the dimension w18 in the Y direction of each land intersection portion 37 may be less than the width w5 of each second land recessed portion 38Y For example, the dimension w18 in the Y direction of each land intersection portion 37 may be 20% to 90% of the width w5. In an example illustrated in FIG. 41A, the dimension w18 in the Y direction of each land intersection portion 37 may be equal to or may differ from the width w16 (see, for example, FIG. 33) of each first intersection land portion 33Xa.

According to the eighteenth modification, the land intersection portions 37 are formed, and consequently, the mechanical strength of the vapor chamber 1 can be ensured. According to the eighteenth modification, the width w5 of each second land recessed portion 38Y can be increased. This enables the flow path resistance of the working vapor 2a to be decreased and enables the transport efficiency of the working vapor 2a to be improved.

Figure 41B:
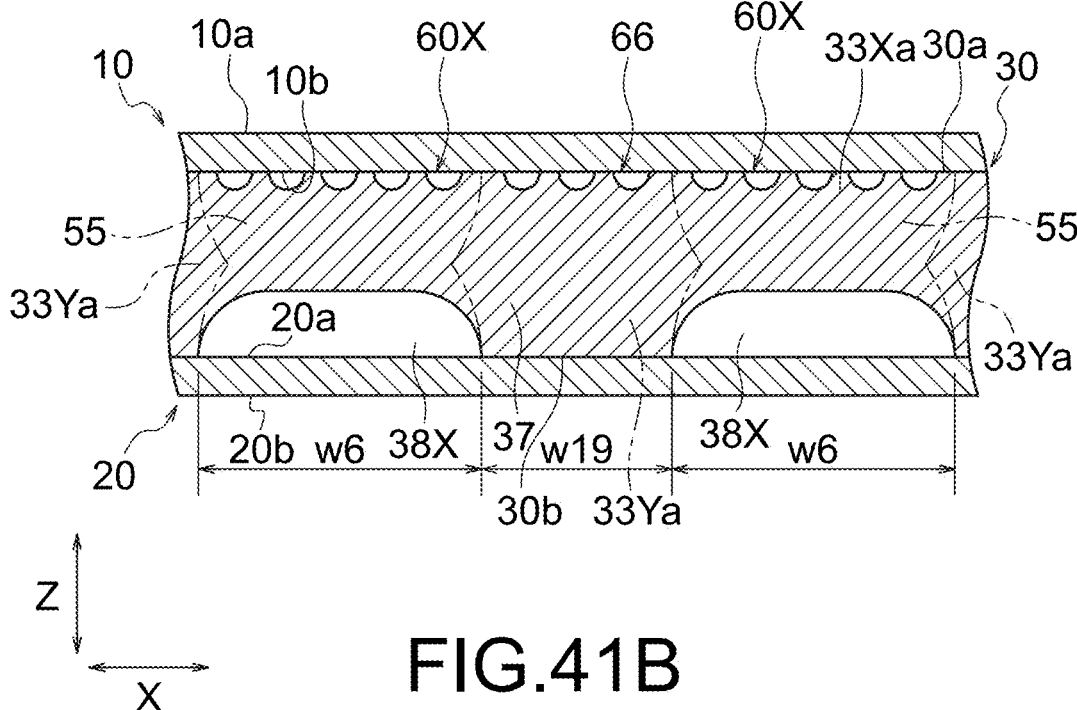
FIG. 41B is a sectional view of another modification to the land intersection portions illustrated in FIG. 35.

Similarly, in an example described according to the fifteenth modification described above, the dimension in the X direction of each land intersection portion 37 is equal to the width w6 of each first land recessed portion 38X and is equal to the width w2 (see, for example, FIG. 13) of each second land portion 33Y The present disclosure, however, is not limited thereto. For example, as illustrated in FIG. 41B, the dimension w19 in the X direction of each land intersection portion 37 may be less than the width w6 of each first land recessed portion 38X. For example, the dimension w19 in the X direction of each land intersection portion 37 may be 20% to 90% of the width w6. In an example illustrated in FIG. 411B, the dimension w19 in the X direction of each land intersection portion 37 may be equal to or may differ from the width w17 (see, for example, FIG. 33) of each second intersection land portion 33Ya.

According to the eighteenth modification, the land intersection portions 37 are formed, and consequently, the mechanical strength of the vapor chamber 1 can be ensured.

According to the eighteenth modification, the width w6 of each first land recessed portion 38X can be increased. This enables the flow path resistance of the working vapor 2a to be decreased and enables the transport efficiency of the working vapor 2a to be improved.

In an example described according to the fifteenth modification described above, the planar shapes of the land intersection portions 37 at the second body surface 30b are rectangular shapes. The present disclosure, however, is not limited thereto. For example, the planar shapes of the land intersection portions 37 at the second body surface 30b may be rectangular shapes having rounded corner portions, circular shapes, or elliptic shapes and are freely determined. In this case, the flow path resistance of the working vapor 2a can be decreased.

The nineteenth modification will be described.

In an example described according to the fifteenth modification described above, all of the land intersection portions 37 extend from the first body surface 30a to the second body surface 30b. The present disclosure, however, is not limited thereto. For example, as illustrated in FIG. 42 and FIG. 43, it may not be necessary for all of the land intersection portions 37 to extend to the second body surface 30b. In an example illustrated in FIG. 42 and FIG. 43, some of the land intersection portions 37 extend from the first body surface 30a to the second body surface 30b, and the land intersection portions 37 are used as first land intersection portions 37a. The other land intersection portions 37 do not extend to the second body surface 30b, and the land intersection portions 37 are used as second land intersection portions 37b. The second land intersection portions 37b are located on the first body surface 30a. The land intersection spaces 42 may be formed opposite the first body surface 30a at the second land intersection portions 37b. The land intersection spaces 42 may be located between the second land intersection portions 37b and the second sheet 20 and may overlap the second land intersection portions 37b in plan view. The land intersection spaces 42 may form the vapor flow path portion 50, and the first land recessed portions 38X, the second land recessed portions 38Y, and the passage division portions 55 adjacent thereto may be in communication with each other. The land intersection spaces 42 and the land recessed portions 38X and 38Y adjacent thereto may form continuous spaces.

First through-holes 43 that are in communication with the second land recessed portions 38Y and the first land recessed portions 38X may be formed in the land connection region 40. The first through-holes 43 may be located at positions that differ from those of the passage division portions 55 in plan view. As illustrated in FIG. 43, the first through-holes 43 may be formed at the second land intersection portions 37b and may extend from the first body surface 30a to the land intersection spaces 42. The first through-holes 43 may extend through the second land intersection portions 37b in the Z direction and may be in communication with the land intersection spaces 42. In FIG. 42, the first land intersection portions 37a are illustrated by using oblique hatching.

As illustrated in FIG. 42, in the case where the first through-holes 43 are formed at the second land intersection portions 37b, the passage division portions 55 and the first through-holes 43 may be in staggered arrangement. The passage division portions 55 and the first through-holes 43 are in staggered arrangement in a region other than an outer edge portion of the land connection region 40 illustrated in FIG. 42. More specifically, two passage division portions 55 adjacent to each other in the Y direction may be shifted from the first through-holes 43 in the X direction. The amount of the shift may be half of a pitch at which the passage division portions 55 are arranged in the X direction or half of a pitch at which the first through-holes 43 are arranged in the X direction and is freely determined.

As illustrated in FIG. 42, the dimension L3 in the X direction and the dimension L1 in the Y direction of each passage division portion 55 may be less than the dimension L2 in the Y direction (see FIG. 33) of each second vapor passage 52 as in the example illustrated in FIG. 38. The sizes of the passage division portions 55 in plan view may be decreased. The planar shapes of the first through-holes 43 may be rectangular shapes, rectangular shapes having rounded corner portions, circular shapes, or elliptic shapes and are freely determined. The planar shapes of the first through-holes 43 may be the same as or may differ from the planar shapes of the passage division portions 55. As illustrated in FIG. 42, the sizes of the planar shapes of the first through-holes 43 may be equal to or may differ from the sizes of the planar shapes of the passage division portions 55 and are freely determined.

According to the nineteenth modification, the passage division portions 55 and the first through-holes 43 are formed as flow paths through which the liquid flow path portions 60X and 60Y and the vapor passages 51 and 52 are in communication with each other. This enables the passage division portions 55 and the first through-holes 43 to function as flow paths through which the working vapor 2a that vaporizes at the liquid flow path portions 60X and 60Y moves toward the vapor passages 51 and 52 in the case where the land connection region 40 is located in the vaporization region SR. For this reason, the flow path sectional areas of the flow paths through which the working vapor 2a flows can be increased, and the amount of the working vapor 2a transported can be increased. The boundary between the working liquid 2b and the working vapor 2a can be formed not only at the passage division portions 55 but also in the first through-holes 43. As a result, the length of the gas-liquid interface can be increased, and the amount of vaporization of the working vapor 2a can be increased. In the case where the land connection region 40 is located in the condensation region CR, the passage division portions 55 and the first through-holes 43 can function as flow paths through which the working liquid 2b that condenses in the vapor passages 51 and 52 moves toward the liquid flow path portions 60X and 60Y For this reason, the length of the gas-liquid interface can be increased, and the amount of the working liquid 2b collected can be increased.

According to the nineteenth modification, the land intersection spaces 42 are formed opposite the first body surface 30a at the second land intersection portions 37b. This enables the flow path resistance of the working vapor 2a to be decreased and enables the transport efficiency of the working liquid 2b to be improved. In this case, the working vapor 2a can be transported from the vaporization region SR to distal positions on the vapor passages 51 and 52. For this reason, the working vapor 2a can disperse in a wide range, and the heat dissipation performance of the vapor chamber 1 can be improved.

Figure 44:
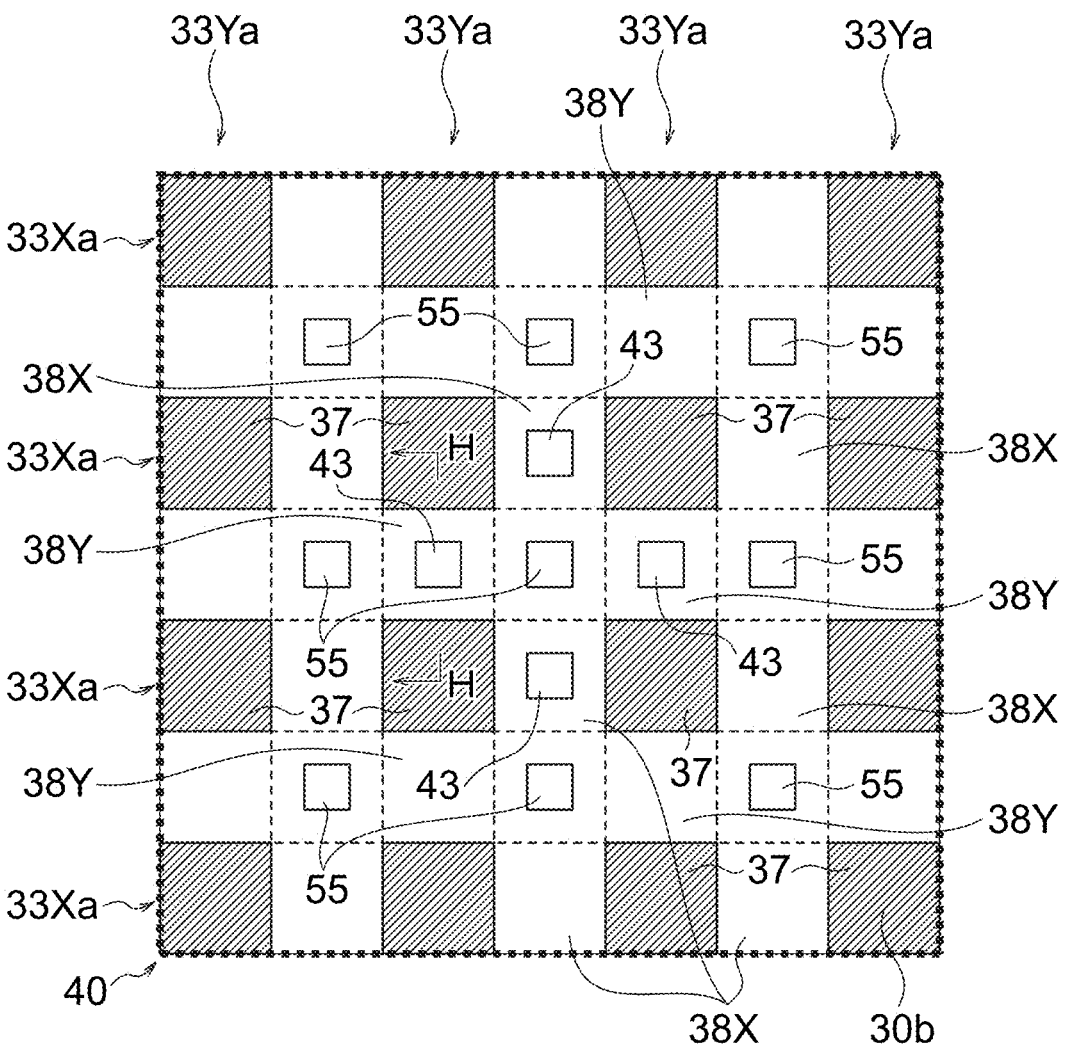
FIG. 44 is a partial enlarged plan view of another modification to the land connection region illustrated in FIG. 33.
Figure 44:
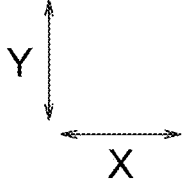

In an example described according to the nineteenth modification described above, the first through-holes 43 are formed at the second land intersection portions 37b. The present disclosure, however, is not limited thereto. For example, as illustrated in FIG. 44, the first through-holes 43 may be formed at least at the first intersection land portions 33Xa or the second intersection land portions 33Ya. As illustrated in FIG. 44, the first through-holes 43 may be formed at both of the first intersection land portions 33Xa and the second intersection land portions 33Ya. Each first through-hole 43 may be located between two land intersection portions 37 adjacent to each other in the X direction and the Y direction in the land connection region 40.

Figure 45:
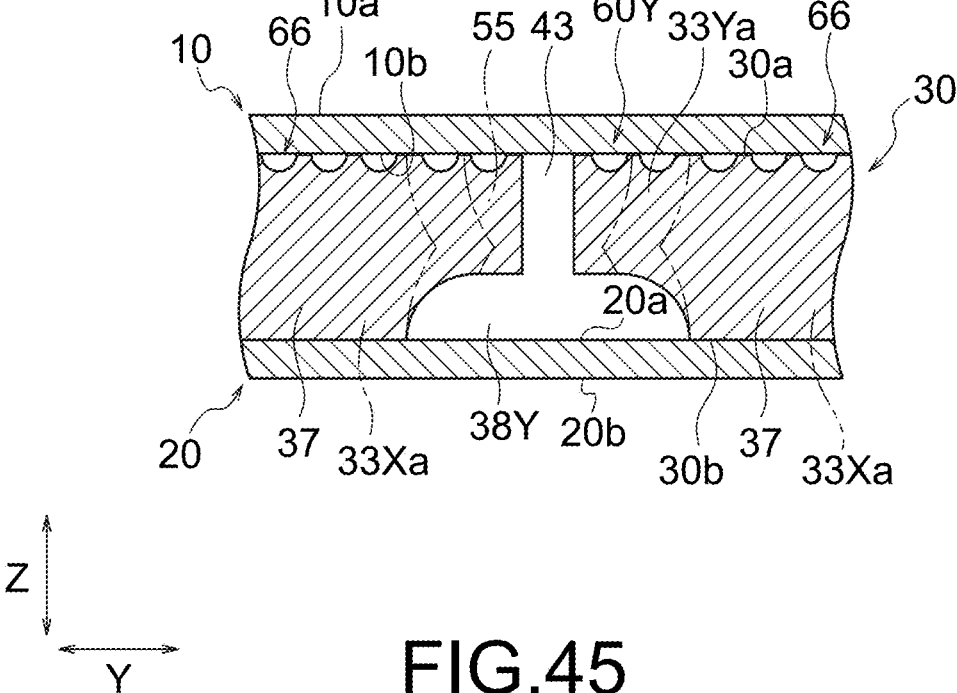
FIG. 45 is a sectional view of the first through-hole taken along a line H-H in FIG. 44.

As illustrated in FIG. 45, the first through-holes 43 may extend from the first body surface 30a to the land recessed portions 38X and 38Y The first through-holes 43 may extend through the intersection land portions 33Xa and 33Ya in the Z direction and may be in communication with the land recessed portions 38X and 38Y In an example illustrated in FIG. 44 and FIG. 45, the land intersection portions 37 may extend from the first body surface 30a to the second body surface 30b.

The twentieth modification will be described.

According to the nineteenth modification described above, as illustrated in FIG. 46 and FIG. 47, some of the passage division portions 55 may be replaced with block portions 44.

More specifically, each block portion 44 may be provided between two first intersection land portions 33Xa adjacent to each other and between two second intersection land portions 33Ya adjacent to each other. The block portions 44 are connected to the first intersection land portions 33Xa and the second intersection land portions 33Ya and are formed continuously with the first intersection land portions 33Xa and the second intersection land portions 33Ya. The block portions 44 are surrounded by the first intersection land portions 33Xa and the second intersection land portions 33Ya.

Figure 47:
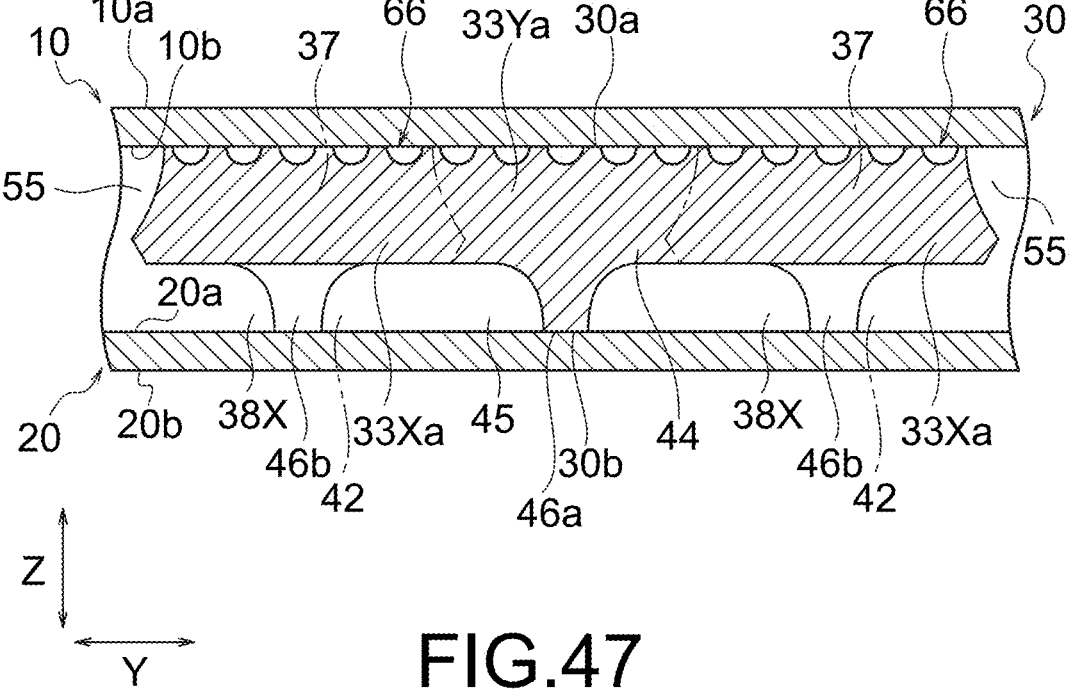
FIG. 47 is a sectional view of pillar portions taken along a line I-I in FIG. 46.

The block portions 44 are located on the first body surface 30a. As illustrated in FIG. 47, block spaces 45 may be formed opposite the first body surface 30a at the block portions 44. The block spaces 45 may be located between the block portions 44 and the second sheet 20 or may overlap the block portions 44 in plan view. The block spaces 45 may form the vapor flow path portion 50 and may be in communication with the first land recessed portions 38X and the second land recessed portions 38Y adjacent thereto. The first liquid flow path portions 60X and the second liquid flow path portions 60Y may be formed on the first body surface 30a at the block portions 44 as in the flange portions 41 described above.

Figure 46:
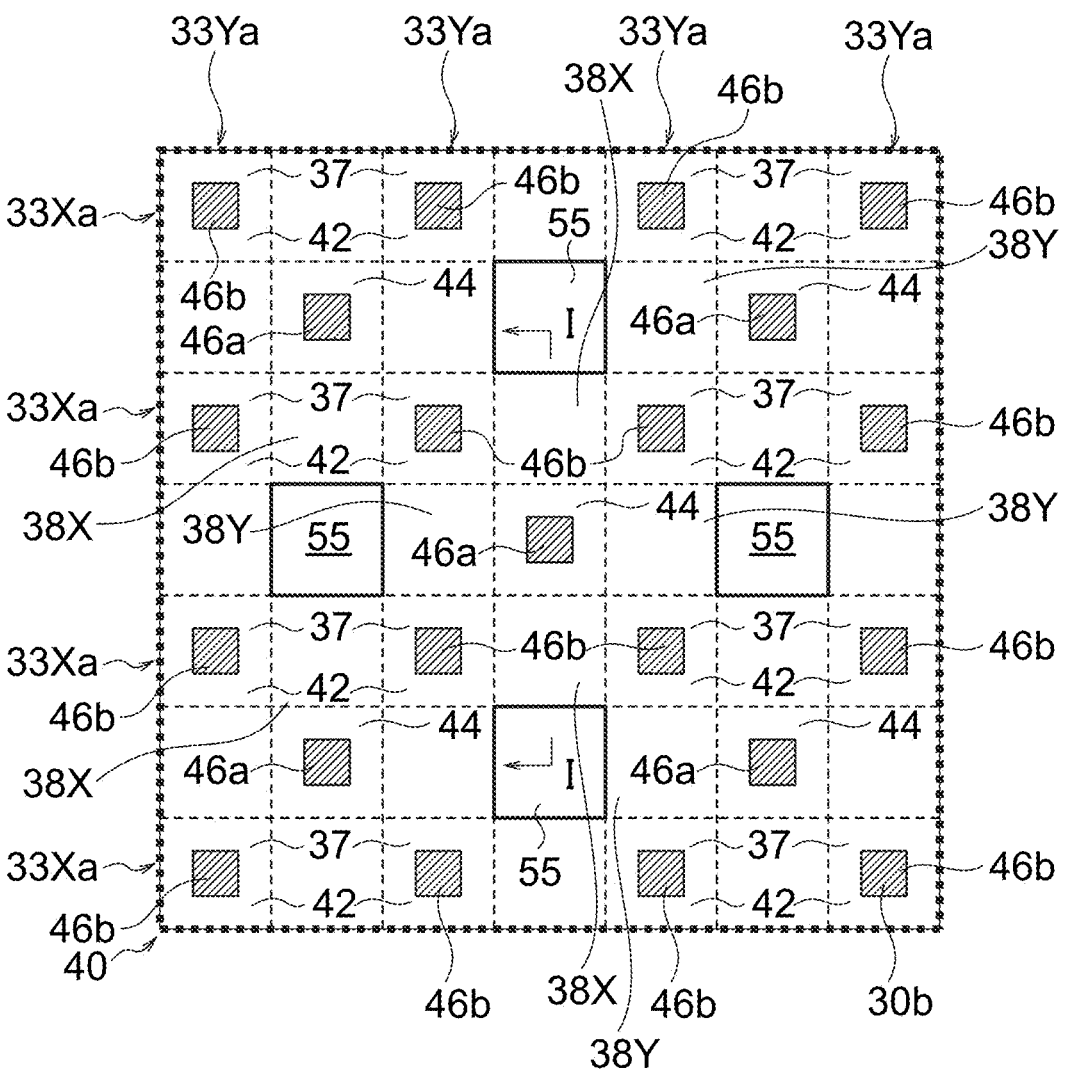
FIG. 46 is a plan view of another modification to the land connection region illustrated in FIG. 33.
Figure 46:
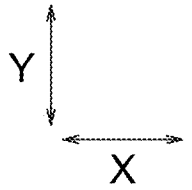

Pillar portions 46a may be formed at the block portions 44. As illustrated in FIG. 47, the pillar portions 46a may extend from the block portions 44 to the second body surface 30b. In FIG. 46, oblique hatching used for the pillar portions 46a represents these surfaces may form the second body surface 30b. The planar shapes of the pillar portions 46a at the second body surface 30b may be smaller than the planar shapes of the land intersection portions 37 at the second body surface 30b.

As illustrated in FIG. 47, the land intersection portions 37 may not extend to the second body surface 30b as in the second land intersection portions 37b illustrated in FIG. 42. The land intersection spaces 42 may be formed opposite the first body surface 30a at the land intersection portions 37 as in the example illustrated in FIG. 42 and FIG. 43. Pillar portions 46b may be formed in the land intersection spaces 42. The pillar portions 46b may extend from the land intersection portions 37 to the second body surface 30b. In FIG. 46, oblique hatching used for the pillar portions 46b represents these surfaces may form the second body surface 30b. The planar shapes of the pillar portions 46b at the second body surface 30b may be smaller than the planar shapes of the land intersection portions 37 at the second body surface 30b as illustrated in, for example, FIG. 38.

According to the twentieth modification, the block portions 44 and the pillar portions 46a are formed instead of the passage division portions 55. This enables the mechanical strength of the vapor chamber 1 to be improved. According to the twentieth modification, the block portions 44 can be formed instead of the passage division portions 55, and the amount of the working vapor 2a transported can be decreased as needed. For example, the block portions 44 are formed in a region in the land connection region 40, and consequently, the flow of the working vapor 2a can be controlled so as to be in directions toward distal positions on the vapor passages 51 and 52. For this reason, the flow of the working vapor 2a can be intentionally changed. In the case where the land connection region 40 is located in the vaporization region SR, the working vapor 2a can be transported to a position to which the working vapor 2a is unlikely to be transported. As a result, the working vapor 2a can disperse in a wide range, and the heat dissipation performance of the vapor chamber 1 can be improved.

The twenty-first modification will be described.

Figure 48:
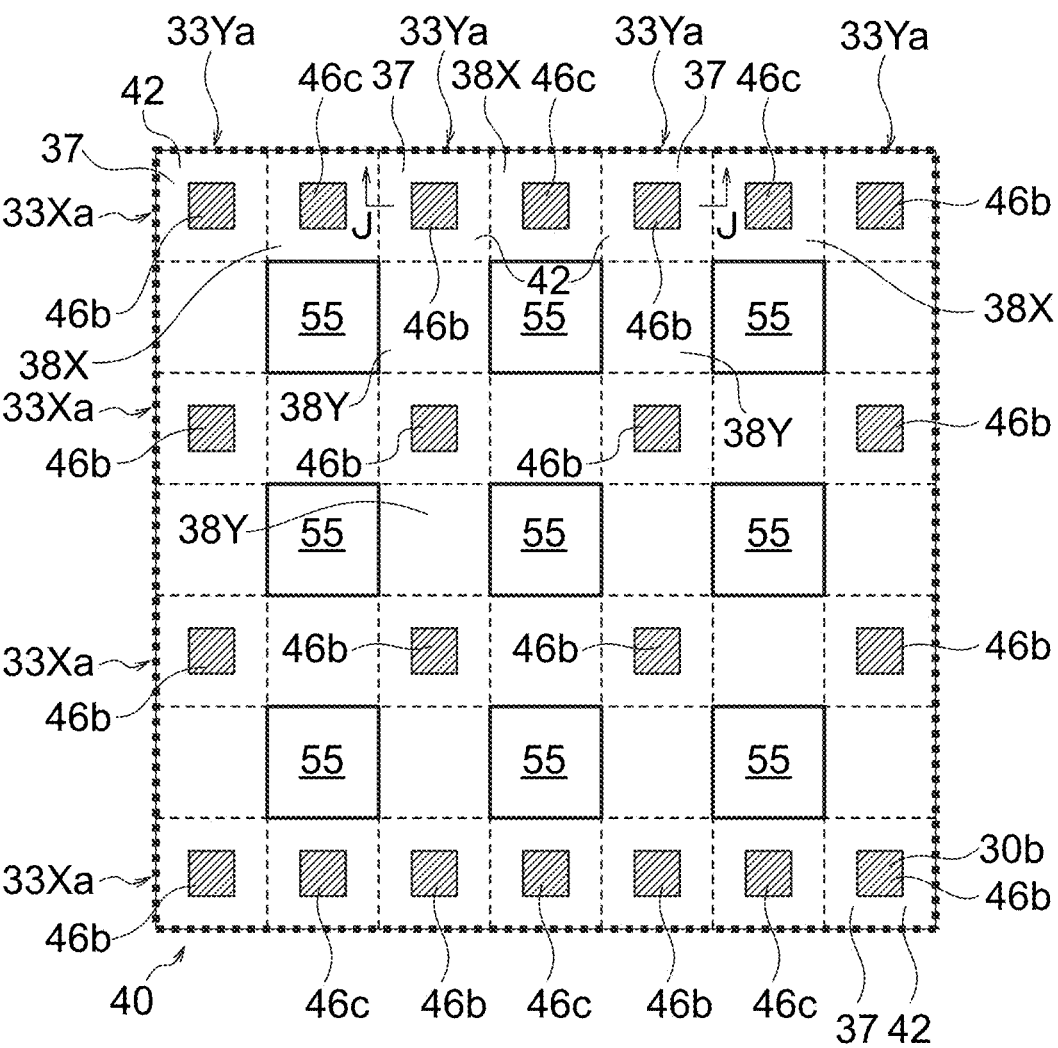
FIG. 48 is a plan view of another modification to the land connection region illustrated in FIG. 33.
Figure 48:
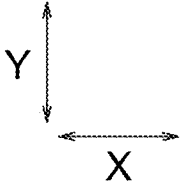
Figure 49:
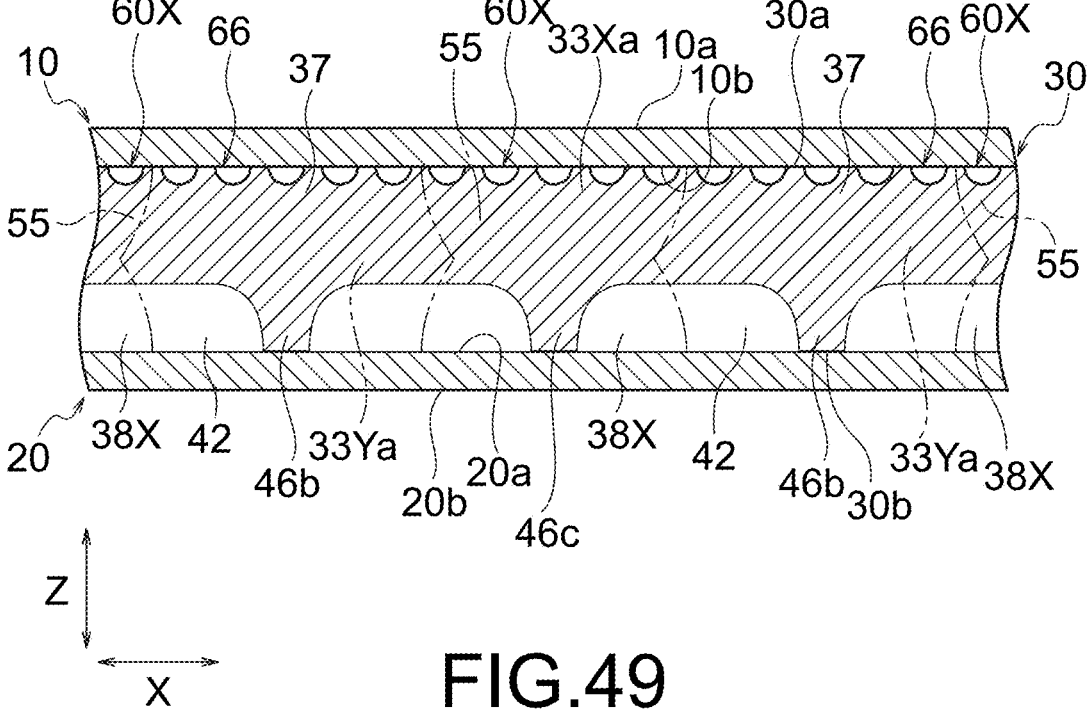
FIG. 49 is a sectional view of the pillar portions taken along a line J-J in FIG. 48.

According to the fifteenth modification described above, as illustrated in FIG. 48, each of pillar portions 46c may be formed between two land intersection portions 37 adjacent to each other in a region of the circumferential portion of the land connection region 40. The pillar portions 46c illustrated in FIG. 48 are located at the first land recessed portions 38X. As illustrated in FIG. 49, the pillar portions 46c extend from the first intersection land portions 33Xa and the second body surface 30b. The planar shapes of the pillar portions 46c at the second body surface 30b may be the same as the planar shapes of the pillar portions 46b illustrated in FIG. 46. The pillar portions 46b may be formed at the land intersection portions 37 as in the example illustrated in FIG. 46.

In an example illustrated in FIG. 48, the pillar portions 46c are located at parts of the circumferential portion of the land connection region 40. More specifically, the pillar portions 46c may be formed at the first intersection land portions 33Xa that are located at the circumferential portion of the land connection region 40. In this case, the working vapor 2a can be inhibited from dispersing in the Y direction. The pillar portions 46c may not be formed at the second intersection land portions 33Ya that are located at the circumferential portion of the land connection region 40. In this case, the working vapor 2a can disperse in the X direction.

According to the twenty-first modification, each pillar portion 46c is formed between two land intersection portions 37 adjacent to each other at the circumferential portion of the land connection region 40. In the case where the land connection region 40 is located in the vaporization region SR, the flow of the working vapor 2a can be controlled so as to be in directions toward distal positions on the vapor passages 51 and 52, and the working vapor 2a can be transported to a position to which the working vapor 2a is unlikely to be transported. For this reason, the working vapor 2a can disperse in a wide range, and the heat dissipation performance of the vapor chamber 1 can be improved.

The twenty-second modification will be described.

In an example described according to the fifteenth modification described above, the depth d4 of each first land recessed portion 38X is equal to the depth d3 of each second land recessed portion 38Y (see FIG. 10 and FIG. 11). The present disclosure, however, is not limited thereto. The depth d4 and the depth d3 may differ from each other. For this reason, the flow of the working vapor 2a can be intentionally changed. As a result, the working vapor 2a can disperse in a wide range, and the heat dissipation performance of the vapor chamber 1 can be improved.

Figure 50:
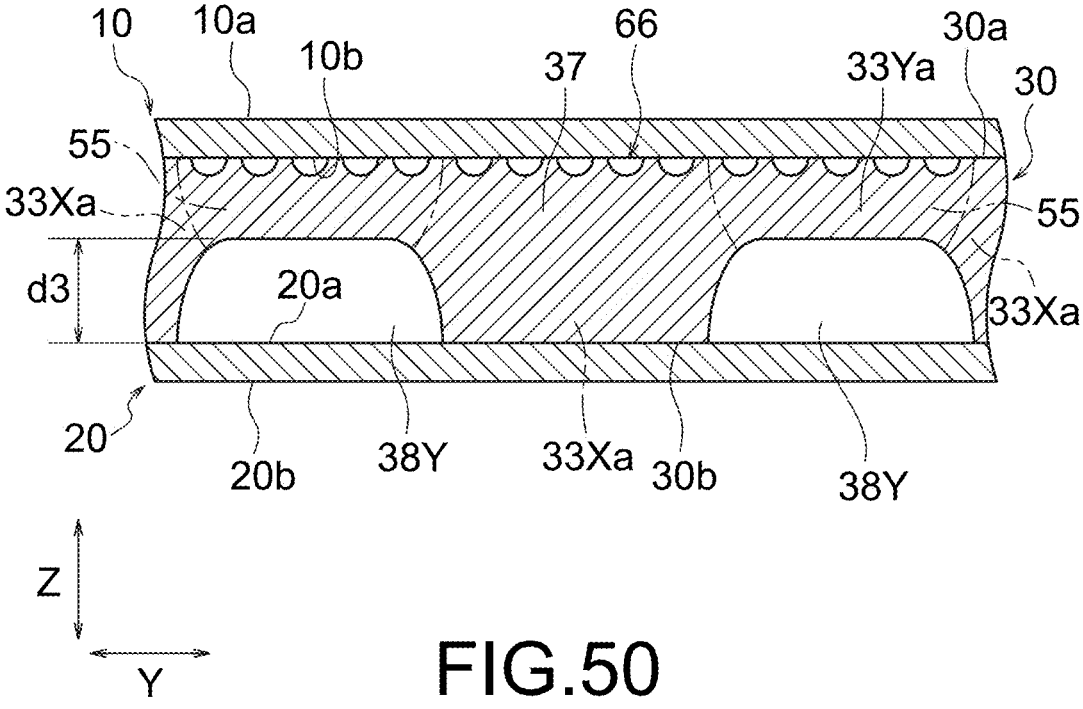
FIG. 50 is a sectional view of another modification to the land recessed portions illustrated in FIG. 35.
Figure 51:
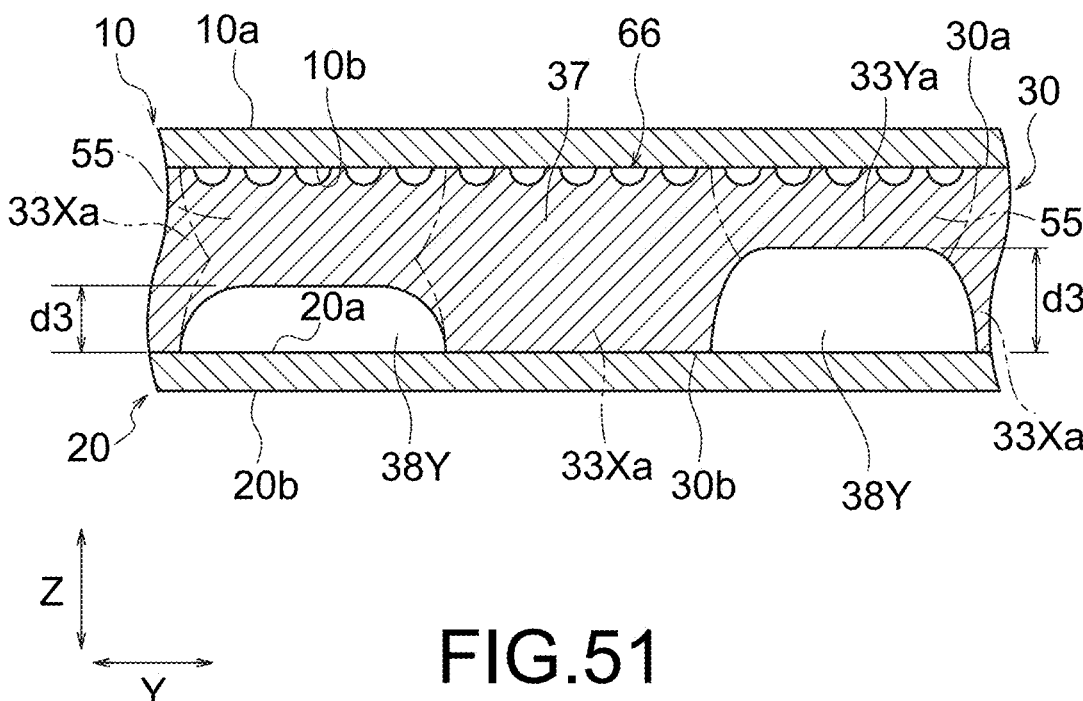
FIG. 51 is a sectional view of another modification to the land recessed portions illustrated in FIG. 35.

For example, as illustrated in FIG. 50, the depth d3 of each second land recessed portion 38Y may be more than the depth d4 (see FIG. 11) of each first land recessed portion 38X. The depth d3 of each second land recessed portion 38Y that is formed in the land connection region 40 may be more than the depth d4. Alternatively, as illustrated in FIG. 51, the depths d3 of some of the second land recessed portions 38Y that are formed in the land connection region 40 may be more than the depth d4 (see FIG. 11) of each first land recessed portion 38X, and the depths d3 of the other second land recessed portions 38Y may be equal to the depth d4. For this reason, the flow of the working vapor 2a can be intentionally changed finely.

Alternatively, for example, the depth d4 of each first land recessed portion 38X that is formed in the land connection region 40 may be more than the depth d3. Alternatively, the depths d4 of some of the first land recessed portions 38X that are formed in the land connection region 40 may be more than the depth d3, and the depths d4 of the other first land recessed portions 38X may be equal to the depth d3. For this reason, the flow of the working vapor 2a can be intentionally changed finely.

The flow of the working vapor 2a will now be described with reference to the plan view of the wick sheet 30. In an example described herein, the land connection region 40 is located in the vaporization region SR.

Figures 52, 53:
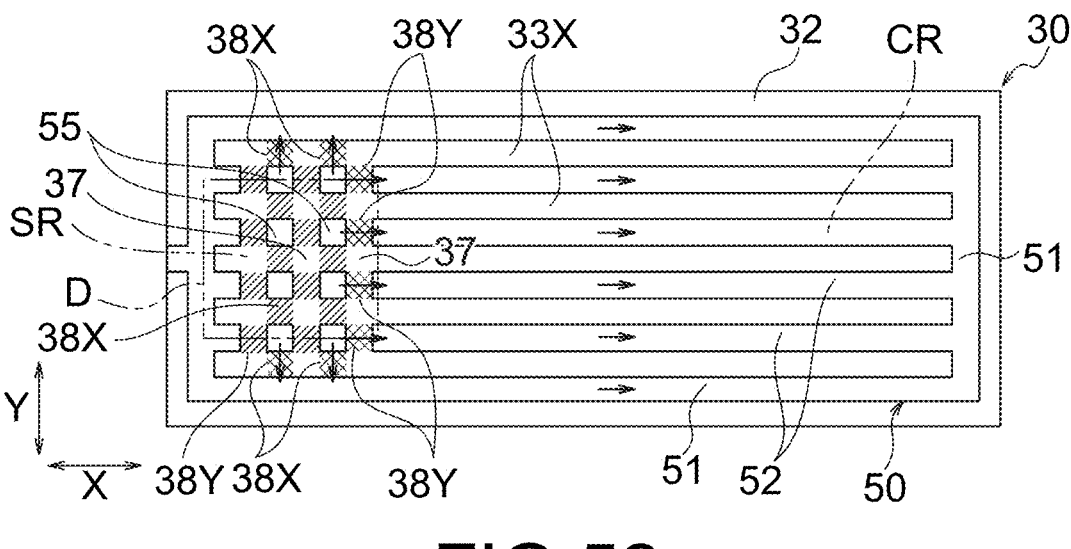
FIG. 52 is a plan view of another modification to the wick sheet illustrated in FIG. 6.
FIG. 53 is a plan view of another modification to the wick sheet illustrated in FIG. 6.

For example, as illustrated in FIG. 52, the vaporization region SR and the land connection region 40 may be located at positions near an end portion of the vapor chamber 1 in the X direction. In this case, the depths of the land recessed portions 38X and 38Y that are located at positions illustrated by using cross hatching in FIG. 52 at the circumferential portion of the land connection region 40 may be increased. In an example illustrated in FIG. 52, the working vapor 2a may disperse in the condensation region CR that is far from the vaporization region SR in the vapor chamber 1. The depths of the land recessed portions 38X and 38Y that correspond to the exit of the land connection region 40 from which the working vapor 2a exits may be more than the depths of the other land recessed portions 38X and 38Y that are located at the center of the land connection region 40. The land recessed portions 38X and 38Y that are deep are illustrated by using cross hatching, and the land recessed portions 38X and 38Y that are shallow are illustrated by using oblique hatching. In the example illustrated in FIG. 52, the working vapor 2a is likely to flow from the land connection region 40 upward, downward, and rightward in FIG. 52.

For example, as illustrated in FIG. 53, the vaporization region SR may be located with the vaporization region SR approaching a first side of the land connection region 40 in the Y direction. For this reason, the working vapor 2a is likely to flow from the land connection region 40 upward and rightward in FIG. 53. In an example illustrated in FIG. 53, the depths of the land recessed portions 38X and 38Y that are located at the exit of the land connection region 40 may be more than the depths of the land recessed portions 38X and 38Y that are located on the lower left. The depths of the other land recessed portions 38X and 38Y adjacent to the land recessed portions 38X and 38Y that are located at the exit may be more than the depths of the land recessed portions 38X and 38Y that are located on the lower left.

Figure 54:
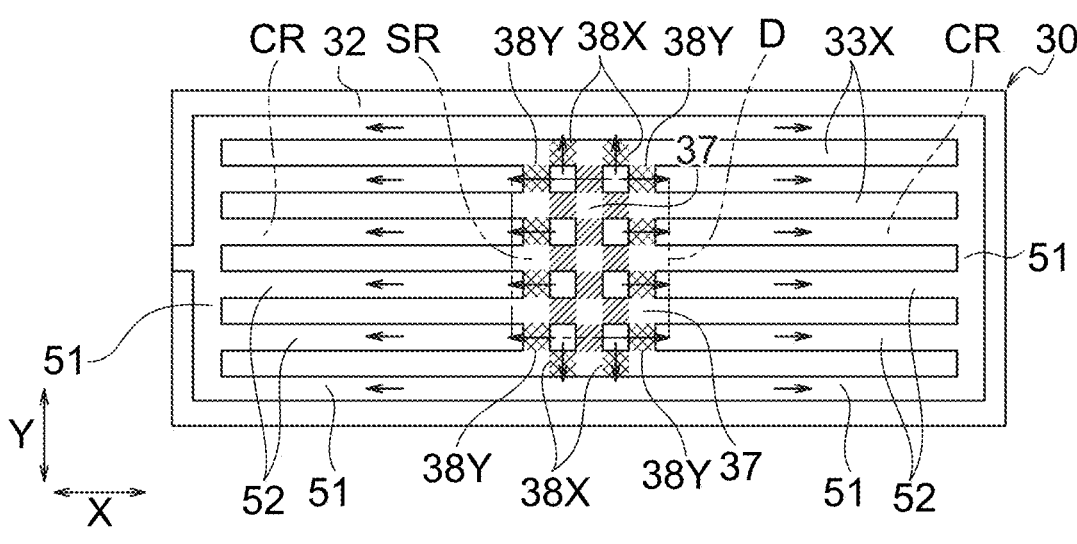
FIG. 54 is a plan view of another modification to the wick sheet illustrated in FIG. 6.

For example, as illustrated in FIG. 54, the vaporization region SR may be located at the center of the vapor chamber 1 in the X direction. In this case, the land recessed portions 38X and 38Y that are located at the circumferential portion may be deep over the entire circumference of the land connection region 40. In an example illustrated in FIG. 54, the vaporization region SR is located at the center of the land connection region 40 in the Y direction, and the working vapor is likely to flow from the land connection region 40 upward, downward, leftward, and rightward in FIG. 54.

The twenty-third modification will be described.

Figure 55:
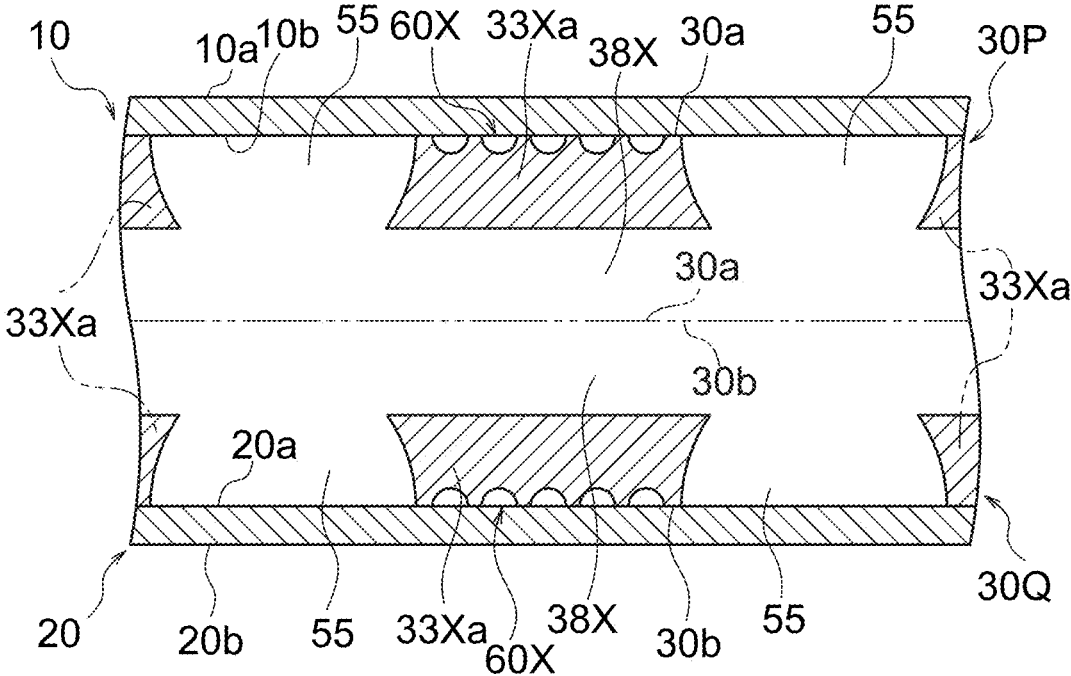
FIG. 55 is a sectional view of another modification to the land intersection portions illustrated in FIG. 35.
Figure 55:
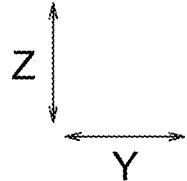
Figure 56:
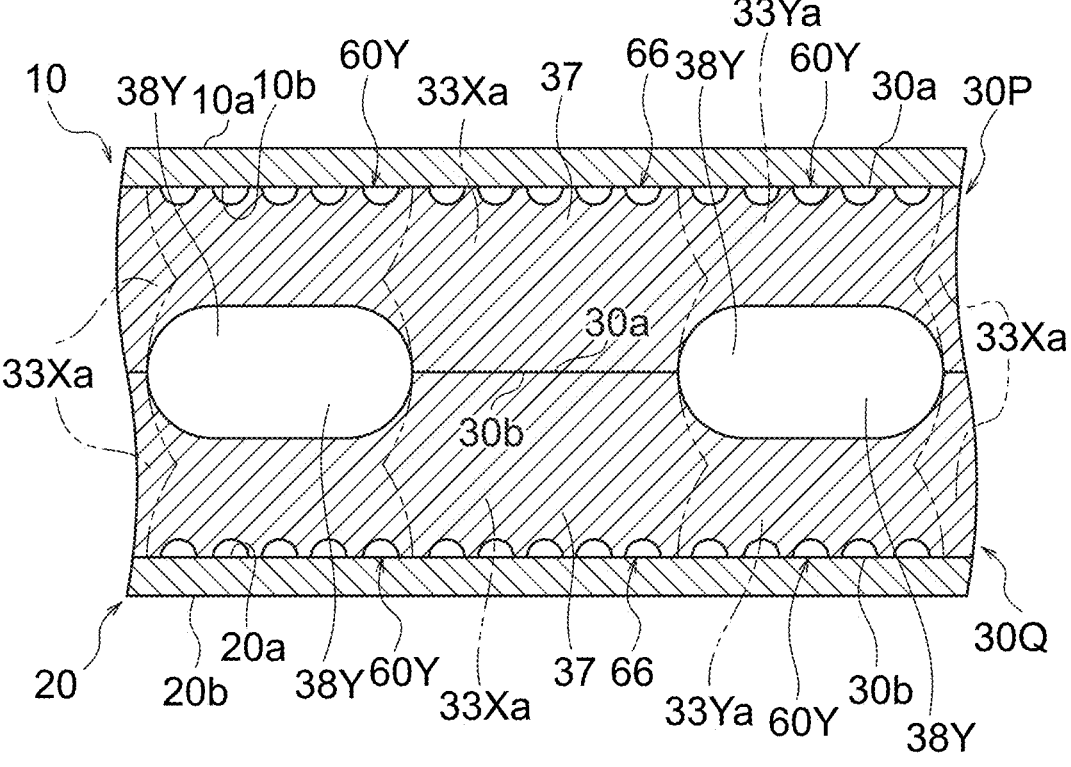
FIG. 56 is a sectional view of another modification to the land intersection portions illustrated in FIG. 35.
Figure 56:
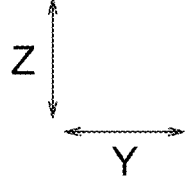

In an example described according to the fifteenth modification described above, the vapor chamber 1 includes three layers. The present disclosure, however, is not limited thereto. For example, as illustrated in FIG. 55 and FIG. 56, the vapor chamber 1 may include four layers. FIG. 55 illustrates a section in the Y direction at positions at which the first land recessed portions 38X are located. FIG. 56 illustrates a section in the Y direction at positions at which the land intersection portions 37 are located.

More specifically, as illustrated in FIG. 55 and FIG. 56, two wick sheets may be located between the first sheet 10 and the second sheet 20. The two wick sheets include a first wick sheet 30P and a second wick sheet 30Q that are stacked. The first wick sheet 30P is an example of a first body sheet, and the second wick sheet 30Q is an example of a second body sheet. The second body surface 30b of the first wick sheet 30P is located on the first body surface 30a of the second wick sheet 30Q. The first sheet 10 is located on the first body surface 30a of the first wick sheet 30P. The second sheet 20 is located on the second body surface 30b of the second wick sheet 30Q.

The first sheet inner surface 10b of the first sheet 10 and the first body surface 30a of the first wick sheet 30P are bonded to each other. The second body surface 30b of the first wick sheet 30P and the first body surface 30a of the second wick sheet 30Q are bonded to each other. The second body surface 30b of the second wick sheet 30Q and the second sheet inner surface 20a of the second sheet 20 are bonded to each other.

As illustrated in FIG. 55, the first liquid flow path portions 60X are located on the first body surface 30a at the first intersection land portions 33Xa of the first wick sheet 30P. As illustrated in FIG. 56, the second liquid flow path portions 60Y are located on the first body surface 30a at the second intersection land portions 33Ya of the first wick sheet 30P. As illustrated in FIG. 55, the first land recessed portions 38X are located on the second body surface 30b at the first intersection land portions 33Xa of the first wick sheet 30P. As illustrated in FIG. 56, the second land recessed portions 38Y are located on the second body surface 30b at the second intersection land portions 33Ya of the first wick sheet 30P.

As illustrated in FIG. 55, the first liquid flow path portions 60X are located on the second body surface 30b at the first intersection land portions 33Xa of the second wick sheet 30Q. As illustrated in FIG. 56, the second liquid flow path portions 60Y are located on the second body surface 30b at the second intersection land portions 33Ya of the second wick sheet 30Q. As illustrated in FIG. 55, the first land recessed portions 38X are located on the first body surface 30a at the first intersection land portions 33Xa of the second wick sheet 30Q. As illustrated in FIG. 56, the second land recessed portions 38Y are located on the first body surface 30a at the second intersection land portions 33Ya of the second wick sheet 30Q.

As illustrated in FIG. 55, the first land recessed portions 38X of the first wick sheet 30P and the first land recessed portions 38X of the second wick sheet 30Q face each other, and spaces continuous in the Z direction are formed. The first land recessed portions 38X are in communication with the passage division portions 55 adjacent thereto in the X direction.

As illustrated in FIG. 56, the second land recessed portions 38Y of the first wick sheet 30P and the second land recessed portions 38Y of the second wick sheet 30Q face each other, and spaces continuous in the Z direction are formed. The second land recessed portions 38Y are in communication with the passage division portions 55 adjacent thereto in the Y direction.

As illustrated in FIG. 55, the passage division portions 55 of the first wick sheet 30P and the passage division portions 55 of the second wick sheet 30Q face each other, and spaces continuous in the Z direction are formed. As illustrated in FIG. 56, the land intersection portions 37 of the first wick sheet 30P and the land intersection portions 37 of the second wick sheet 30Q are bonded to each other.

According to the twenty-third modification, the first land recessed portions 38X of the first wick sheet 30P and the first land recessed portions 38X of the second wick sheet 30Q face each other. The second land recessed portions 38Y of the first wick sheet 30P and the second land recessed portions 38Y of the second wick sheet 30Q face each other. This enables spaces continuous in the Z direction to be formed and enables the flow path sectional areas of the flow paths through which the working vapor 2a flows to be increased. For this reason, the flow path resistance of the working vapor 2a can be decreased, and the transport efficiency of the working vapor 2a can be improved.

According to the twenty-third modification, the depths of the land recessed portions 38X and 38Y of the first wick sheet 30P and the depths of the land recessed portions 38X and 38Y of the second wick sheet 30Q may differ from each other in a freely determined manner as in the twenty-second modification.

In an example described according the twenty-third modification, the two wick sheets 30P and 30Q are located between the first sheet 10 and the second sheet 20. The present disclosure, however, is not limited thereto, and three or more wick sheets may be located between the first sheet 10 and the second sheet 20.

The twenty-fourth modification will be described.

Figure 57:
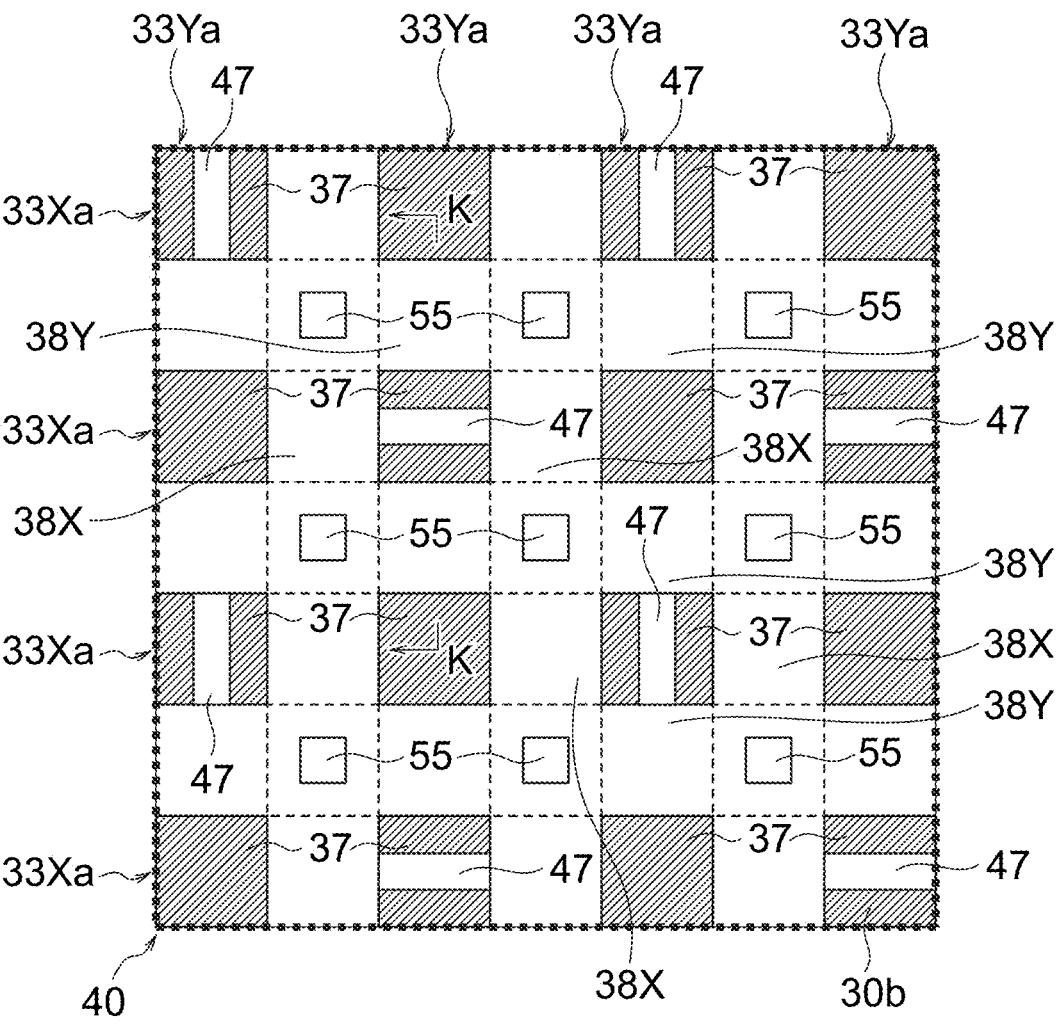
FIG. 57 is a plan view of another modification to the land connection region illustrated in FIG. 33.
Figure 57:
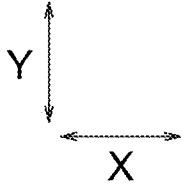

According to the fifteenth modification described above, as illustrated in, for example, FIG. 57 and FIG. 58, liquid storage grooves 47 may be located on the second body surface 30b at the land intersection portions 37. The liquid storage grooves 47 are examples of a liquid reservoir. One of the liquid storage grooves 47 is formed at one of the land intersection portions 37. The liquid storage grooves 47 may be formed at the land intersection portions 37. As illustrated in FIG. 57, however, the liquid storage grooves 47 may be formed at some of the land intersection portions 37, and the liquid storage grooves 47 may not be formed at the other land intersection portions 37. The liquid storage grooves 47 may extend in the X direction and may extend in the Y direction. The liquid storage grooves 47 may extend in freely determined directions. As illustrated in FIG. 57, the liquid storage grooves 47 that extend in the X direction and the liquid storage grooves 47 that extend in the Y direction may be present together in the land connection region 40. The liquid storage grooves 47 may be in communication with the land recessed portions 38X and 38Y adjacent thereto. The liquid storage grooves 47 may be formed by being etched from the second body surface 30b.

Figure 58:
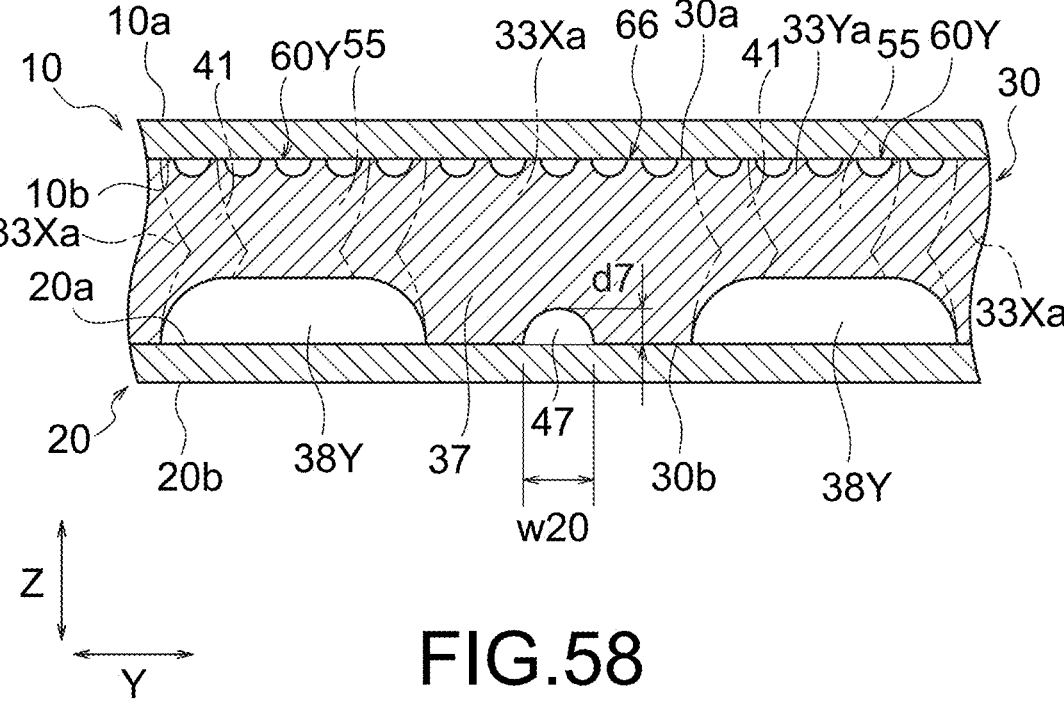
FIG. 58 is a sectional view of the land connection region taken along a line K-K in FIG. 57.

As illustrated in FIG. 58, the flow path sectional areas of the liquid storage grooves 47 may be larger than the flow path sectional areas of the first main flow grooves 61X. In this case, the capillary action of the liquid storage grooves 47 may be weaker than the capillary action of the first main flow grooves 61X. The flow path sectional areas of the liquid storage grooves 47 may be larger than the flow path sectional areas of the second main flow grooves 61Y In this case, the capillary action of the liquid storage grooves 47 may be weaker than the capillary action of the second main flow grooves 61Y The flow path sectional areas of the liquid storage grooves 47 may be smaller than the flow path sectional areas of the vapor passages 51 and 52.

The width w20 of each liquid storage groove 47 may be more than the width w7 (see FIG. 8) of each first main flow groove 61X. The width w20 of each liquid storage groove 47 may be more than the width w9 (see FIG. 13) of each second main flow groove 61Y The width w20 of each liquid storage groove 47 may be less than the width w3 (see FIG. 8) of each first vapor flow path recessed portion 53. The width w20 means the dimension of each liquid storage groove 47 at the second body surface 30b.

The depth d7 of each liquid storage groove 47 may be more than the depth d5 (see FIG. 8) of each first main flow groove 61X. The depth d7 of each liquid storage groove 47 corresponds to the dimension in the Z direction of each liquid storage groove 47.

According to the twenty-fourth modification, the liquid storage grooves 47 are formed on the second body surface 30b at the land intersection portions 37. This enables the working liquid 2b to be stored in the liquid storage grooves 47 while the vapor chamber 1 is not operating. For this reason, expansion force due to freezing can be weakened even in the case where the working liquid 2b is frozen and is expanded. While the vapor chamber 1 is operating, the flow paths for the working vapor 2a can function, and the flow path resistance of the working vapor 2a can be decreased.

Figure 59:
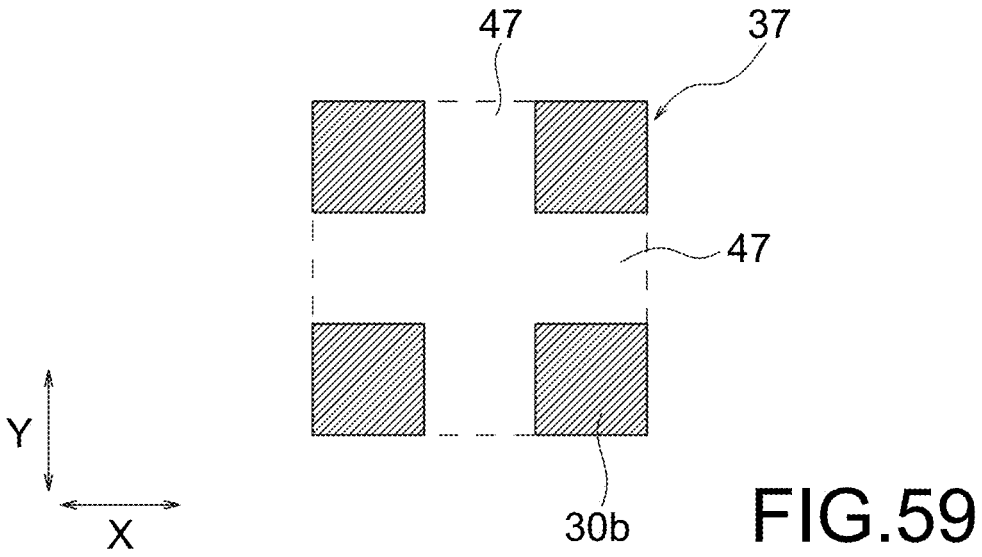
FIG. 59 is a partial enlarged plan view of a modification to liquid storage grooves illustrated in FIG. 57.

According to the twenty-fourth modification, as illustrated in FIG. 59, two liquid storage grooves 47 may be formed on the second body surface 30b at one of the land intersection portions 37. One of the two liquid storage grooves 47 may extend in the X direction, and the other liquid storage groove 47 may extend in the Y direction. The two liquid storage grooves 47 may be formed in a cross shape. The two liquid storage grooves 47, however, are not limited to a cross shape but may extend in different directions.

Figure 60:
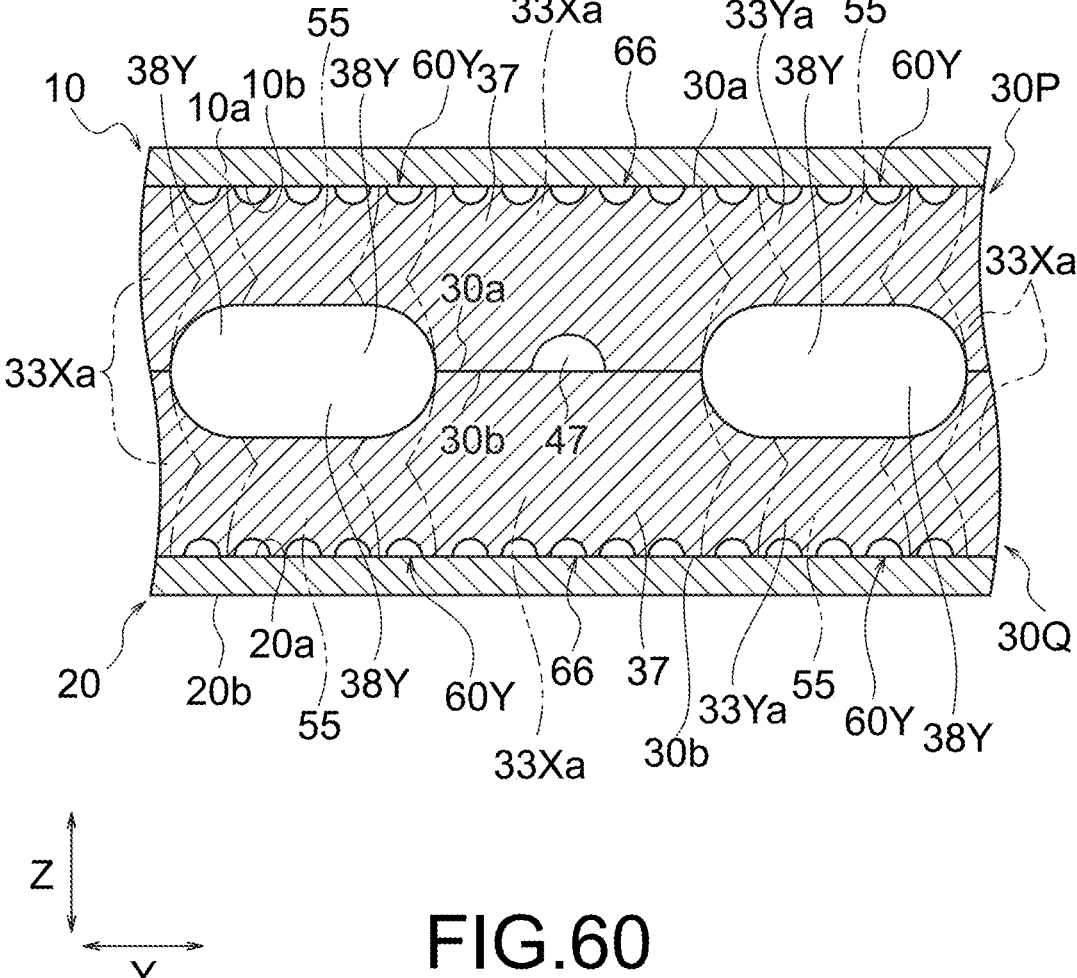
FIG. 60 is a sectional view of another modification to the land intersection portion illustrated in FIG. 58.
Figure 61:
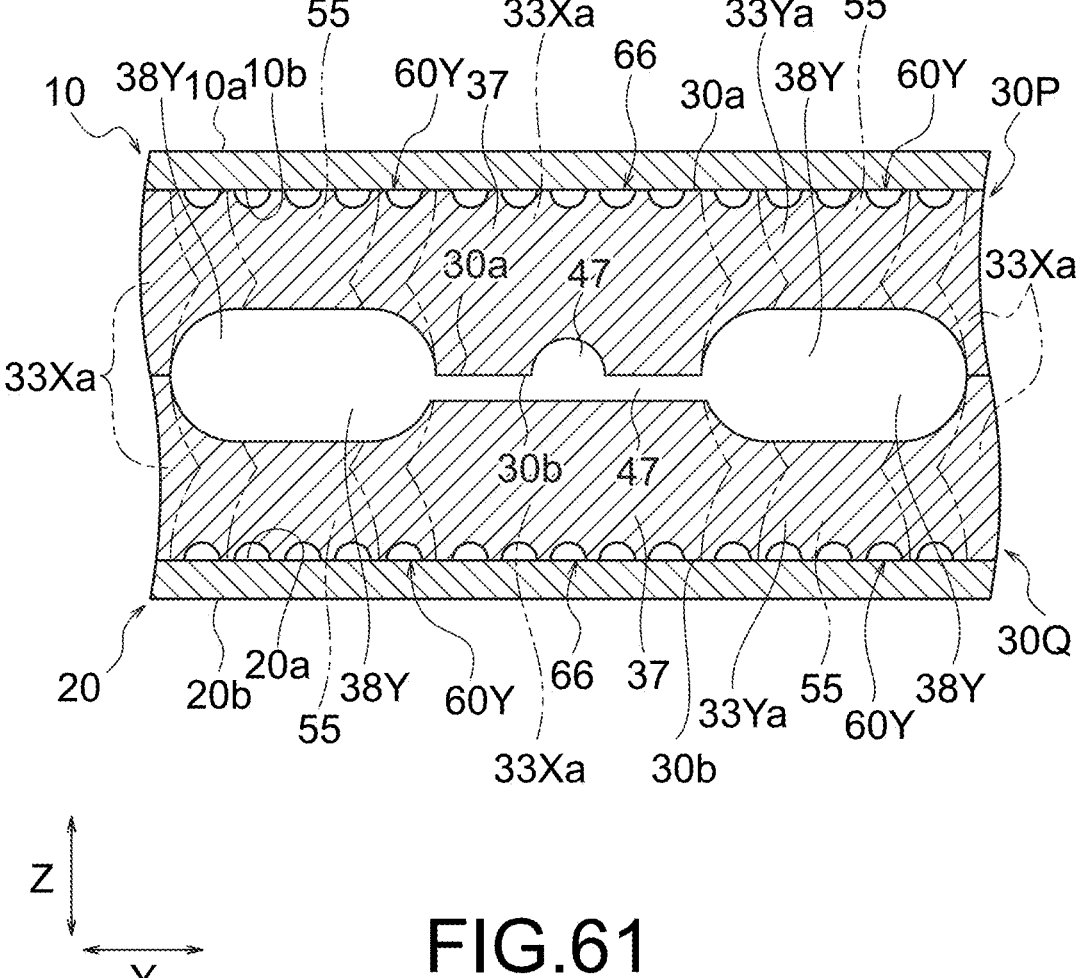
FIG. 61 is a sectional view of another modification to the land intersection portion illustrated in FIG. 58.

According to the twenty-fourth modification, the vapor chamber 1 may include four layers as in the twenty-third modification. For example, as illustrated in FIG. 60, the liquid storage grooves 47 may be formed on the second body surface 30b at the land intersection portions 37 of the first wick sheet 30P. The liquid storage grooves 47 may not be formed on the first body surface 30a at the land intersection portions 37 of the second wick sheet 30Q that faces the land intersection portions 37. For example, as illustrated in FIG. 61, the liquid storage grooves 47 may be formed on the second body surface 30b at the land intersection portions 37 of the first wick sheet 30P. The liquid storage grooves 47 may be formed on the first body surface 30a at the land intersection portions 37 of the second wick sheet 30Q that faces the land intersection portions 37. In this case, two liquid storage grooves 47 that face each other may extend in the same direction but may extend in different directions as illustrated in FIG. 61. In an example illustrated in FIG. 61, the liquid storage grooves 47 of the first wick sheet 30P extend in the X direction, and the liquid storage grooves 47 of the second wick sheet 30Q extend in the Y direction. The two liquid storage grooves 47 may be formed in a cross shape in plan view.

In the example illustrated in FIG. 61, the flow path sectional areas of the liquid storage grooves 47 can be increased, and the amount of the working liquid 2b stored can be increased. For this reason, the expansion force due to freezing can be weakened even in the case where the working liquid 2b is frozen and is expanded. While the vapor chamber 1 is operating, the flow paths for the working vapor 2a can function, and the flow path resistance of the working vapor 2a can be decreased.

The twenty-fifth modification will be described.

Figure 62:
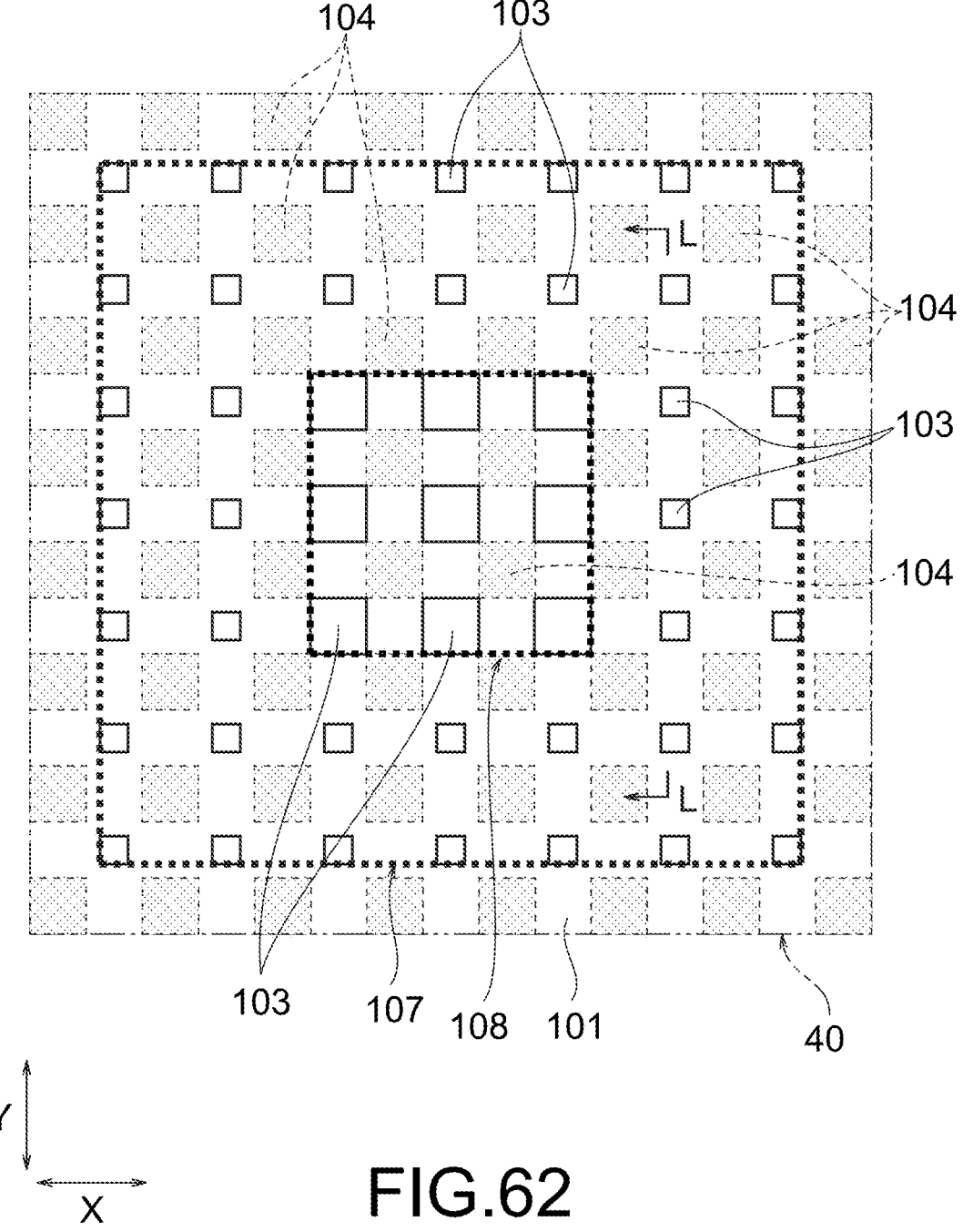
FIG. 62 is a plan view of another modification to the land connection region illustrated in FIG. 33.

As illustrated in FIG. 62, multiple second through-holes 103 may be located in the land connection region 40. The land connection region 40 illustrated in FIG. 62 will be described in more detail.

As illustrated in FIG. 62 and FIGS. 63, the land connection region 40 may include land connectors 101, land connection spaces 102, the second through-holes 103, pillar portions 104, and groove connection portions 105.

Figure 63A:
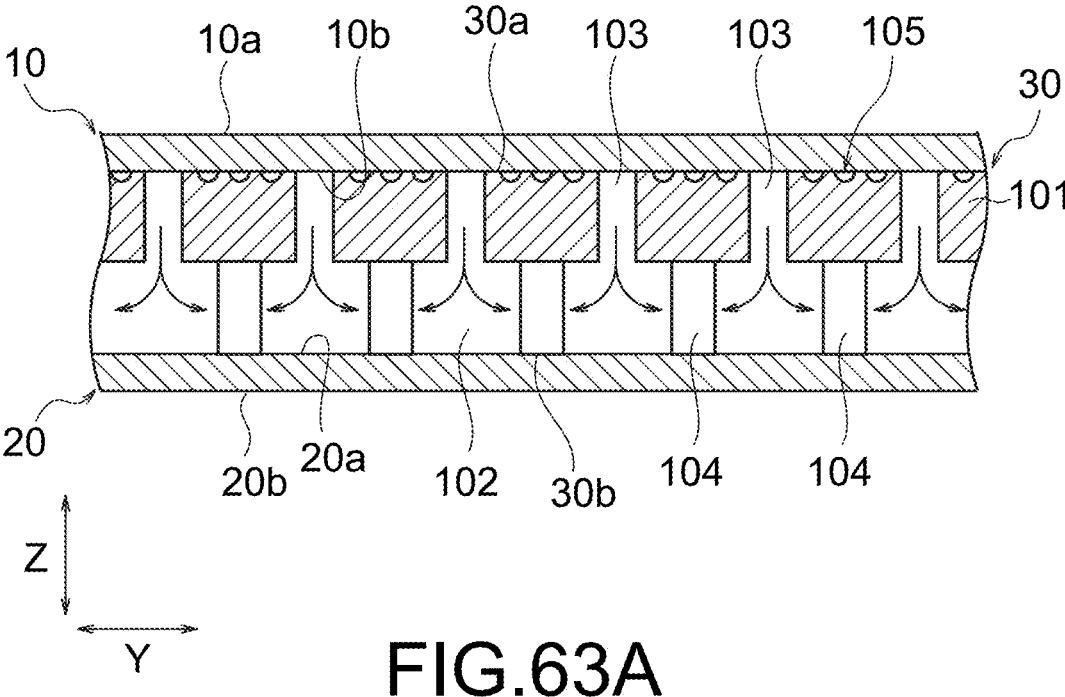
FIG. 63A is a sectional view of the land connection region taken along a line L-L in FIG. 62.
Figure 64:
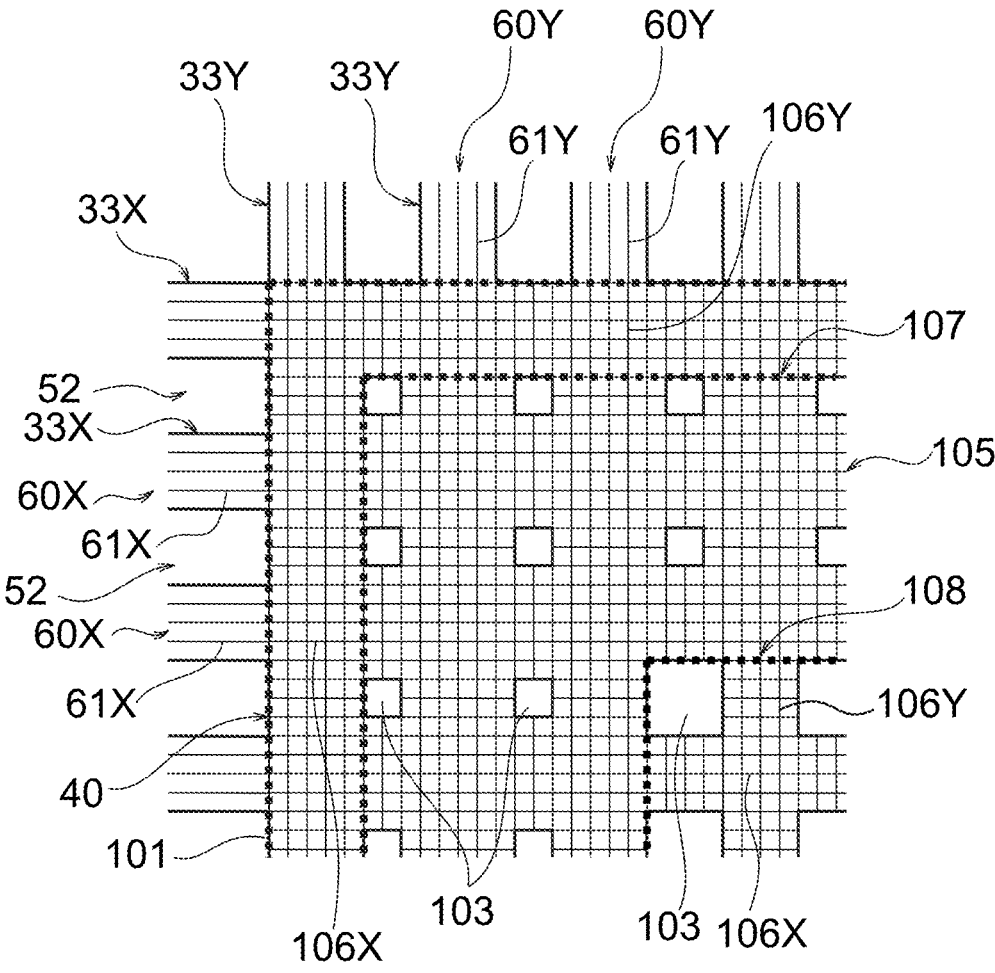
FIG. 64 is a partial enlarged plan view of the land connection region illustrated in FIG. 62.
Figure 64:
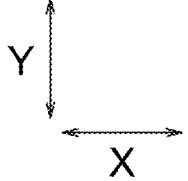

As illustrated in FIG. 62 and FIG. 63A, the land connectors 101 are located on the first body surface 30a of the wick sheet 30. As illustrated in FIG. 64, the land connectors 101 are connected to the multiple first land portions 33X and the multiple second land portions 33Y The land connectors 101 may be connected to the first land portions 33X and the second land portions 33Y As illustrated in FIG. 63A, the land connectors 101 extend from the first body surface 30a toward the second body surface 30b but may not extend to the second body surface 30b. The land connectors 101 may be separated from the second sheet 20. The land connectors 101 may correspond to the land connection region 40 that includes the multiple first intersection land portions 33Xa, the multiple second intersection land portions 33Ya, and the multiple land intersection portions 37 illustrated in, for example, FIG. 33. The land connectors 101 may be regions that are defined by thick dashed lines illustrated in FIG. 64 and that are connected to the first land portions 33X and the second land portions 33Y.

The land connectors 101 may be located at intermediate positions on the first land portions 33X in the X direction. In this case, the first land portions 33X are divided by the land connectors 101. The land connectors 101 may be located at intermediate positions on the second land portions 33Y in the Y direction. In this case, the second land portions 33Y are divided by the land connectors 101.

In an example illustrated in FIG. 64, the multiple first land portions 33X and the multiple second land portions 33Y are connected to the land connectors 101. However, the second land portions 33Y may not be connected to the land connectors 101. In this case, the wick sheet 30 may not include the second land portions 33Y.

As illustrated in FIG. 63A, the land connection spaces 102 may be formed opposite the first body surface 30a at the land connectors 101. The land connection spaces 102 may be located between the land connectors 101 and the second sheet 20 or may overlap the land connectors 101 in plan view. The land connection spaces 102 may form the vapor flow path portion 50. The land connection spaces 102 may be spaces through which the working vapor 2a mainly passes and may be in communication with the vapor passages 51 and 52. The land connection spaces 102 may include the passage division portions 55 (see, for example, FIG. 33) described above and the land recessed portions 38X and 38Y (see, for example, FIG. 10 and FIG. 11) described above.

As illustrated in FIG. 63A, the second through-holes 103 may extend through the land connectors 101. The second through-holes 103 may extend through the land connectors 101 in the Z direction from the first body surface 30a to the land connection spaces 102. The multiple second through-holes 103 may be formed in the land connectors 101. As illustrated in FIG. 64, the second through-holes 103 may be in communication with the first main flow grooves 61X of the first liquid flow path portions 60X and the second main flow grooves 61Y of the second liquid flow path portions 60Y. The second through-holes 103 may be in communication with the land connection spaces 102. As illustrated in FIG. 62, the second through-holes 103 may be arranged in the X direction and may be arranged in the Y direction. However, the second through-holes 103 may be in staggered arrangement as illustrated in FIG. 42. The second through-holes 103 may correspond to the passage division portions 55 (see, for example, FIG. 33) described above or may correspond to the first through-holes 43 (see, for example, FIG. 42 and FIG. 43) described above. The second through-holes 103 may include holes that correspond to the passage division portions 55 and holes that correspond to the first through-holes 43.

As illustrated in FIG. 63A, the pillar portions 104 may extend from the land connectors 101 to the second body surface 30b. This enables the mechanical strength of the vapor chamber 1 to be improved. The multiple pillar portions 104 may extend from the land connectors 101 to the second body surface 30b. The pillar portions 104 may be bonded to the second sheet 20. In FIG. 62, dot hatching used for the pillar portions 104 represents these surfaces may form the second body surface 30b. As illustrated in FIG. 62, the pillar portions 104 may be located in a first hole region 107 and a second hole region 108 described later. The pillar portions 104 may be located along extension lines from the first land portions 33X and may be located along extension lines from the second land portions 33Y However, the pillar portions 104 are not limited to an example illustrated in FIG. 62 and may be located at freely determined positions. The pillar portions 104 may be located at the same positions as those of the land intersection portions 37 (see, for example, FIG. 33) described above in plan view. The pillar portions 104 may be formed as in the land intersection portions 37 in sectional view. As illustrated in FIG. 63A, however, the pillar portions 104 may be formed as in the pillar portions 46a to 46c (see, for example, FIG. 47 and FIG. 49) described above.

As illustrated in FIG. 63A and FIG. 64, the groove connection portions 105 may be located on the first body surface 30a at the land connectors 101. The groove connection portions 105 are connected to the first main flow grooves 61X of the first liquid flow path portions 60X and are connected to the second main flow grooves 61Y of the second liquid flow path portions 60Y The first main flow grooves 61X of the first liquid flow path portions 60X may be connected to the groove connection portions 105. The second main flow grooves 61Y of the second liquid flow path portions 60Y may be connected to the groove connection portions 105. The groove connection portions 105 may be formed over the whole of the land connectors 101.

As illustrated in FIG. 64, the groove connection portions 105 are connected to the first main flow grooves 61X that are located at the first land portions 33X on both sides in the X direction and are connected to the second main flow grooves 61Y that are located at the second land portions 33Y on both sides in the Y direction. Consequently, the first main flow grooves 61X that are located at the first land portions 33X and the second main flow grooves 61Y that are located at the second land portions 33Y are in communication with each other.

As illustrated in FIG. 64, the groove connection portions 105 may include multiple first intersection grooves 106X and multiple second intersection grooves 106Y. The first intersection grooves 106X and the second intersection grooves 106Y may be located on the first body surface 30*a* at the land connectors 101. The first intersection grooves 106X and the second intersection grooves 106Y may have small flow path sectional areas such that the working liquid 2*b* mainly flows due to the capillary action. The flow path sectional areas of the first intersection grooves 106X are smaller than the flow path sectional areas of the vapor passages 51 and 52. The width of each first intersection groove 106X may be equal to the width w7 of each first main flow groove 61X. The width of each first intersection groove 106X corresponds to the dimension in the Y direction of each first intersection groove 106X at the first body surface 30*a*. The depth of each first intersection groove 106X may be equal to the depth d5 of each first main flow groove 61X. The depth of each first intersection groove 106X corresponds to the dimension in the Z direction of each first intersection groove 106X. The width of each second intersection groove 106Y may be equal to the width of each second main flow groove 61Y The width of each second intersection groove 106Y corresponds to the dimension in the X direction of each second intersection groove 106Y at the first body surface 30*a*. The depth of each second intersection groove 106Y may be equal to the depth of each second main flow groove 61Y The depth of each second intersection groove 106Y corresponds to the dimension in the Z direction of each second intersection groove 106Y The first intersection grooves 106X and the second intersection grooves 106Y may be formed by being etched as in the main flow grooves 61X and 61Y described above.

The first intersection grooves 106X may extend in the X direction along extension lines from the first main flow grooves 61X corresponding thereto. The second intersection grooves 106Y may extend in the Y direction along extension lines from the second main flow grooves 61Y corresponding thereto. The first intersection grooves 106X are arranged in the Y direction, and the second intersection grooves 106Y are arranged in the X direction. The first intersection grooves 106X and the second intersection grooves 106Y intersect with each other. The first intersection grooves 106X and the second intersection grooves 106Y may intersect with each other in a cross shape. In this case, the multiple first intersection grooves 106X and the multiple second intersection grooves 106Y may be at least partly formed in a lattice pattern. As illustrated in FIG. 64, the multiple first intersection grooves 106X and the multiple second intersection grooves 106Y may be entirely formed in a lattice pattern or may be partly formed in a lattice pattern. The first intersection grooves 106X and the second intersection grooves 106Y are connected to each other such that the working liquid 2*b* can move forward and backward.

As illustrated in FIG. 64, the groove connection portions 105 may be in communication with the second through-holes 103 described above. The first intersection grooves 106X and the second intersection grooves 106Y may be in communication with the second through-holes 103. As for the first intersection grooves 106X and the second intersection grooves 106Y, the first main flow grooves 61X and the second main flow grooves 61Y may be in communication with the second through-holes 103. As illustrated in FIG. 63A, the working vapor 2*a* that vaporizes from the working liquid 2*b* that is supplied by using the first intersection grooves 106X and the second intersection grooves 106Y can be smoothly dispersed from the second through-holes 103 to the vapor passages 51 and 52 via the land connection spaces 102.

The land connectors 101 may include the first hole region 107 and the second hole region 108.

Figure 63B:
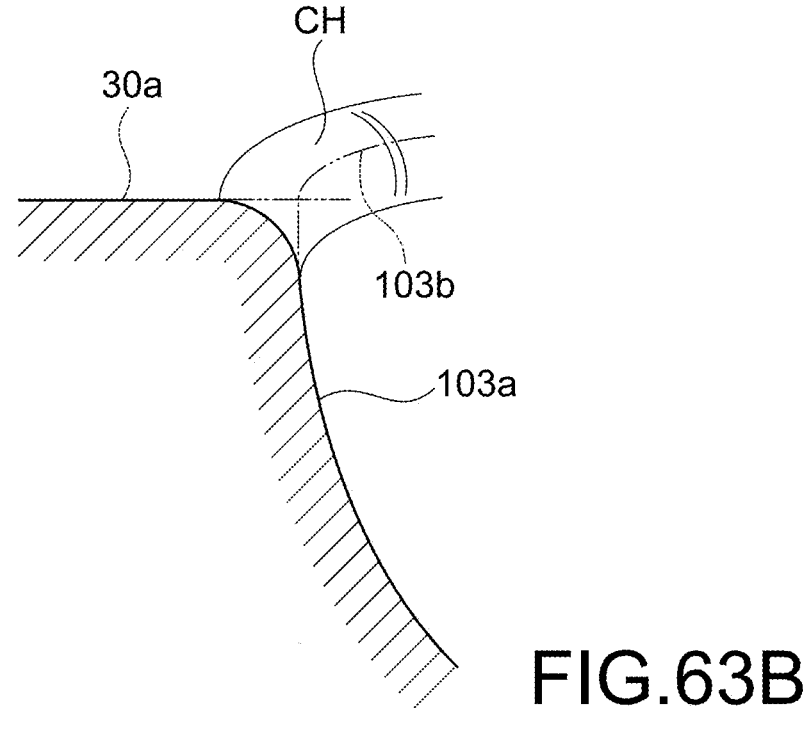
FIG. 63B is a partial enlarged sectional view of second through-holes illustrated in FIG. 62.

As illustrated in FIG. 62, the first hole region 107 is located in the land connection region 40. The first hole region 107 may include the multiple second through-holes 103 that are formed with a first unit circumferential length. The first unit circumferential length is equal to the total value of the circumferential lengths of the second through-holes 103 that are located in the first hole region 107 per unit area. The first unit circumferential length has a value obtained by converting the total value of the circumferential lengths of the second through-holes 103 that are located in the first hole region 107 into a value per unit area. The first unit circumferential length is calculated by dividing the total value of the circumferential lengths of the second through-holes 103 that are located in a measurement frame having a square shape of 2 mm×2 mm by the area of the measurement frame. Even in the case where some of the second through-holes 103 are located outside the measurement frame, the circumferential length of a portion that is located inside the measurement frame in the second through-holes 103 is used for the calculation of the first unit circumferential length. The average value of values that are calculated when measurement frames are placed at freely determined five positions in the first hole region 107 is used as the first unit circumferential length. The circumferential lengths of the second through-holes 103 are the lengths of contour lines of the second through-holes 103 at the first body surface 30*a*. More specifically, as illustrated in FIG. 63B, the circumferential lengths of the second through-holes 103 are the lengths of contour lines 103*b* of the second through-holes 103 that are formed with the first body surface 30*a* and wall surfaces 103*a* of the second through-holes 103 intersecting with each other. In the case where chamfered surfaces CH are formed between the wall surfaces 103*a* and the first body surface 30*a*, the chamfered surfaces CH do not form the wall surfaces 103*a* of the second through-holes 103. The chamfered surfaces CH include a tapered surface or a curved surface having a relatively small radius of curvature. As illustrated in FIG. 39, in the case where the flange portions 41 are formed, the wall surfaces 103*a* described above are the wall surfaces of the flange portions 41.

The first hole region 107 is defined by the second through-holes 103 that form the outer circumferential portions among the multiple second through-holes 103 that are formed with the first unit circumferential length. In the example illustrated in FIG. 62, the first hole region 107 is defined by thick dashed lines that pass through the outer edges of the second through-holes 103 that form the outer circumferential portions in plan view. The outer edge of the first hole region 107 is defined at the first body surface 30*a*. An inner circumferential portion of the first hole region 107 is defined by an outer circumferential portion of the second hole region 108 described later.

The second hole region 108 is located in the land connection region 40. The second hole region 108 may include the multiple second through-holes 103 that are formed with a second unit circumferential length. The second unit circumferential length is equal to the total value of the circumferential lengths of the second through-holes 103 that are located in the second hole region 108 per unit area. The second unit circumferential length has a value obtained by converting the total value of the circumferential lengths of the second through-holes 103 that are located in the second hole region 108 into a value per unit area. The second unit circumferential length is obtained as in the first unit circumferential length.

The second hole region 108 is defined by the second through-holes 103 that form the outer circumferential portions among the multiple second through-holes 103 that are formed with the second unit circumferential length. In the example illustrated in FIG. 62, the second hole region 108 is defined by thick dashed lines that pass through the outer edges of the second through-holes 103 that form the outer circumferential portions in plan view. The outer edge of the second hole region 108 is defined at the first body surface 30*a*.

A positional relationship between the first hole region 107 and the second hole region 108 is freely determined. The positions of the first hole region 107 and the second hole region 108 may be determined depending on the position of the electronic device D.

For example, as illustrated in FIG. 62, the second hole region 108 may be located inside the first hole region 107. In this case, the second hole region 108 may be surrounded by the first hole region 107. In the case where the first hole region 107 and the second hole region 108 are formed in a rectangular shape in plan view, the first hole region 107 and the second hole region 108 each have four sides that form the outer edges. In the example illustrated in FIG. 62, the four sides of the second hole region 108 are inside the facing sides of the first hole region 107 in plan view.

Figure 65:
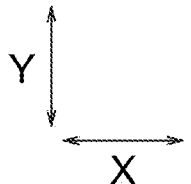
FIG. 65 is a plan view of a modification to the land connection region illustrated in FIG. 62.
Figure 66:
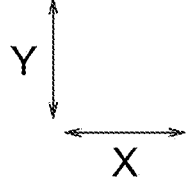
FIG. 66 is a plan view of another modification to the land connection region illustrated in FIG. 62.

Alternatively, a portion of the outer edge of the second hole region 108 may not be located inside the outer edge of the first hole region 107. For example, as illustrated in FIG. 65, one of the sides of the second hole region 108 may be located outside the facing surface of the first hole region 107 in plan view or may overlap the facing surface of the first hole region 107. Alternatively, as illustrated in FIG. 66, two sides of the second hole region 108 may be located outside the facing surfaces of the first hole region 107 corresponding thereto in plan view or may overlap the facing surfaces of the first hole region 107 corresponding thereto.

As illustrated in FIG. 62, the second through-holes 103 that are located in the second hole region 108 may be arranged in the X direction along the second through-holes 103 that are located in the first hole region 107. More specifically, the centers of the second through-holes 103 that are located in the second hole region 108 may be arranged in the X direction together with the centers of the second through-holes 103 that are located in the first hole region 107. However, the second through-holes 103 that are located in the second hole region 108 may not be arranged in the X direction together with the second through-holes 103 that are located in the first hole region 107.

As illustrated in FIG. 62, the second through-holes 103 that are located in the second hole region 108 may be arranged in the Y direction together with the second through-holes 103 that are located in the first hole region 107. More specifically, the centers of the second through-holes 103 that are located in the second hole region 108 may be arranged in the Y direction together with the centers of the second through-holes 103 that are located in the first hole region 107. However, the second through-holes 103 that are located in the second hole region 108 may not be arranged in the Y direction together with the second through-holes 103 that are located in the first hole region 107.

The second unit circumferential length may differ from the first unit circumferential length. The second unit circumferential length may be more than the first unit circumferential length. In the example illustrated in FIG. 62, for convenience, the circumferential lengths of the second through-holes 103 that are located in the first hole region 107 are constant, and the circumferential lengths of the second through-holes 103 that are located in the second hole region 108 are constant. The second through-holes 103 that are located in the first hole region 107 and the second hole region 108 are formed in a rectangular shape in plan view. A pitch at which the second through-holes 103 that are located in the first hole region 107 are arranged is equal to a pitch at which the second through-holes 103 that are located in the second hole region 108 are arranged. The planar shapes of the second through-holes 103 that are located in the second hole region 108 are larger than the planar shapes of the second through-holes 103 that are located in the first hole region 107. For this reason, the circumferential lengths of the second through-holes 103 that are located in the second hole region 108 are more than the circumferential lengths of the second through-holes 103 that are located in the first hole region 107, and the second unit circumferential length is more than the first unit circumferential length.

According to the twenty-fifth modification, the second unit circumferential length is more than the first unit circumferential length, and consequently, the length of the gas-liquid interface in the second hole region 108 can be increased. For this reason, in the case where the land connection region 40 is located in the vaporization region SR, the amount of vaporization of the working vapor 2*a* in the second hole region 108 can be increased. The length of the gas-liquid interface means the length of the interface between the working liquid 2*b* and the working vapor 2*a* as described above. In the case where the land connection region 40 is located in the vaporization region SR, the interface between the working liquid 2*b* and the working vapor 2*a* is typically formed near the second through-holes 103 in the intersection grooves 106X and 106Y In this case, the length of the gas-liquid interface corresponds to the total value of the length of the gas-liquid interface that is formed at the intersection grooves 106X and 106Y In the case where the land connection region 40 is located in the condensation region CR, the interface between the working liquid 2*b* and the working vapor 2*a* is typically formed near the intersection grooves 67X and 67Y at the passage division portions 55. In this case, the length of the gas-liquid interface corresponds to the total value of the length of the gas-liquid interface that is formed at the passage division portions 55. When the first unit circumferential length is less than the second unit circumferential length, the length of the gas-liquid interface in the first hole region 107 can be decreased. This enables the amount of vaporization of the working vapor 2*a* in the first hole region 107 to be decreased in the case where the land connection region 40 is located in the vaporization region SR. For this reason, the working liquid 2*b* is supplied to the second hole region 108, and the amount of vaporization of the working vapor 2*a* in the second hole region 108 can be increased.

The ratio of the second unit circumferential length to the first unit circumferential length may be 1.1 times to 20.0 times. The case where the land connection region 40 is located in the vaporization region SR will be described. When the ratio of the second unit circumferential length to the first unit circumferential length is 1.1 times or more, there can be a significant difference between the amount of vaporization of the working vapor 2*a* in the first hole region 107 and the amount of vaporization of the working vapor 2*a* in the second hole region 108. This enables the working liquid 2*b* to be supplied to the second hole region 108 and enables the amount of vaporization of the working vapor 2*a* in the second hole region 108 to be effectively increased. For this reason, absorbing the heat from the electronic device D can be facilitated, and the absorbing efficiency of the heat of the electronic device D can be improved. When the ratio of the second unit circumferential length to the first unit circumferential length is 1.3 times or more, the amount of vaporization of the working vapor 2*a* in the second hole region 108 can be more effectively increased. When the ratio of the second unit circumferential length to the first unit circumferential length is 20.0 times or less, the flow paths for the working liquid 2*b* in the second hole region 108 can be maintained. This enables the working liquid 2*b* in the second hole region 108 to be inhibited from being lacking and enables the working liquid 2*b* to be transported to the vicinity of the center of the second hole region 108. For this reason, the absorbing efficiency of the heat of the electronic device D can be inhibited from decreasing.

In the example illustrated in FIG. 62, the circumferential lengths of the second through-holes 103 are constant in the first hole region 107 and the second hole region 108. The present disclosure, however, is not limited thereto. When the first unit circumferential length is less than the second unit circumferential length, the circumferential lengths of the second through-holes 103 that are located in the first hole region 107 may not be constant. Alternatively, when the second unit circumferential length is more than the first unit circumferential length, the circumferential lengths of the second through-holes 130 that are located in the second hole region 108 may not be constant.

Figure 67:
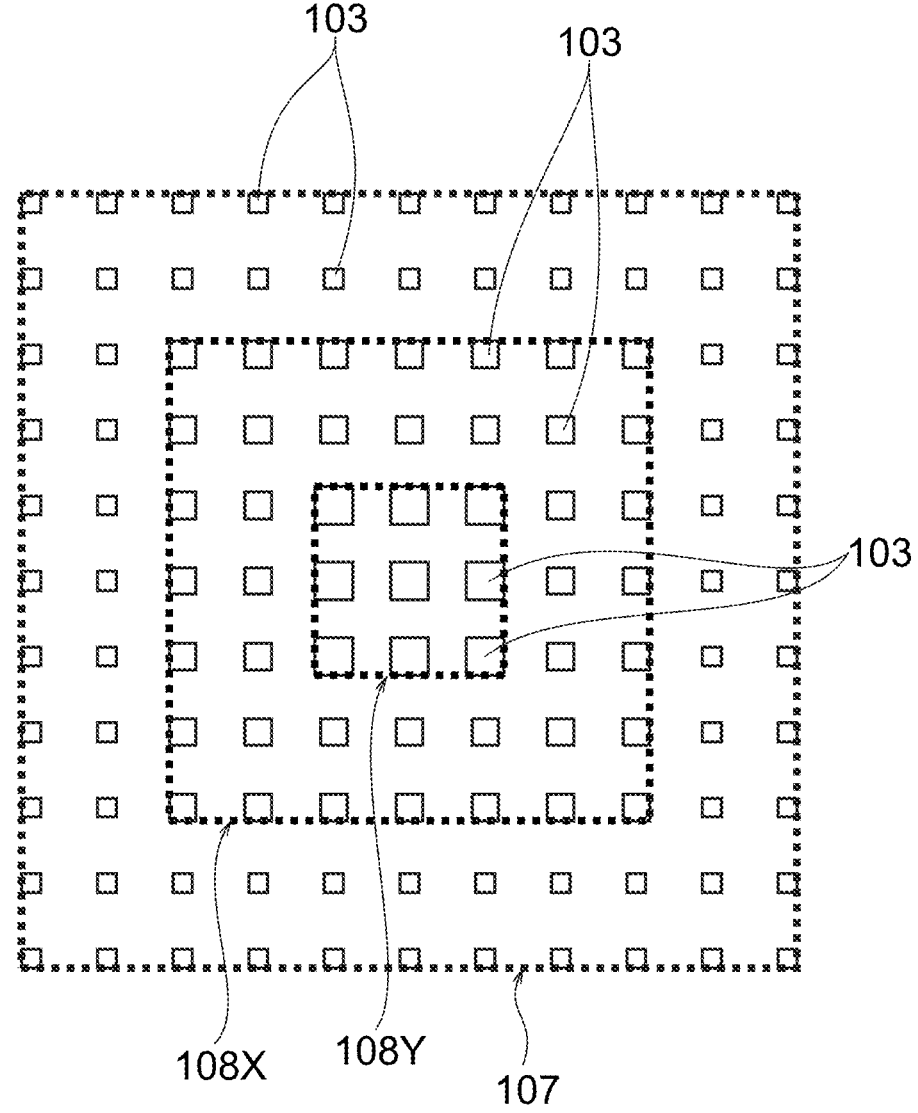
FIG. 67 is a plan view of another modification to the land connection region illustrated in FIG. 62.
Figure 67:
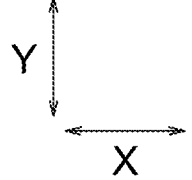

In a case that will now be described, the second hole region 108 is a region illustrated by using a reference sign 108X, and a region illustrated by using a reference sign 108Y is included in the region illustrated by using the reference sign 108X in an example illustrated in FIG. 67. In this case, the circumferential lengths of the second through-holes 103 that are located in the first hole region 107 are constant. However, the circumferential lengths of the second through-holes 103 that are located in the region illustrated by using the reference sign 108Y are more than the circumferential lengths of the second through-holes 103 that are located in the region illustrated by using the reference sign 108X. For this reason, the circumferential lengths of the second through-holes 103 that are located in the second hole region 108 are not constant. In this case, the planar shapes of the second through-holes 103 that are located in the second hole region 108 are larger than the planar shapes of the second through-holes 103 that are located in the first hole region 107. For this reason, the second unit circumferential length of the second hole region 108 can be more than the first unit circumferential length of the first hole region 107. In FIG. 67, the pillar portions 104 described above are omitted for simplicity of the figure.

In a case that will now be described, the second hole region 108 is a region illustrated by using the reference sign 108Y, and a region illustrated by using the reference sign 108X is included in the first hole region 107 in the example illustrated in FIG. 67. In this case, the circumferential lengths of the second through-holes 103 that are located in the second hole region 108 are constant. However, the circumferential lengths of the second through-holes 103 that are located in the region illustrated by using the reference sign 108X are more than the circumferential lengths of the second through-holes 103 that are located in the region illustrated by using a reference sign 107. For this reason, the circumferential lengths of the second through-holes 103 that are located in the first hole region 107 are not constant. Also, in this case, the planar shapes of the second through-holes 103 that are located in the second hole region 108 are larger than the planar shapes of the second through-holes 103 that are located in the first hole region 107. For this reason, the second unit circumferential length of the second hole region 108 can be more than the first unit circumferential length of the first hole region 107.

In an example described according to the twenty-fifth modification, the second unit circumferential length is more than the first unit circumferential length. However, the second unit circumferential length may be less than the first unit circumferential length. In this case, the length of the gas-liquid interface in the second hole region 108 can be decreased. This enables the vapor pressure of the working vapor 2*a* in the second hole region 108 to be decreased in the case where the land connection region 40 is located in the vaporization region SR. For this reason, the working liquid 2*b* is likely to vaporize in the second hole region 108, and the working liquid 2*b* can be smoothly transported from the first hole region 107 to the second hole region 108. When the first unit circumferential length is more than the second unit circumferential length, the length of the gas-liquid interface in the first hole region 107 can be increased. This enables the amount of vaporization of the working vapor 2*a* in the first hole region 107 to be increased in the case where the land connection region 40 is located in the vaporization region SR. For this reason, the amount of the working vapor 2*a* that disperses from the first hole region 107 to the vapor passages 51 and 52 can be increased.

The twenty-sixth modification will be described.

In an example described according to the twenty-fifth modification, the first hole region 107 includes the multiple second through-holes 103 that are formed with the first unit circumferential length, and the second hole region 108 includes the multiple second through-holes 103 that are formed with the second unit circumferential length. The present disclosure, however, is not limited thereto. The first hole region 107 may include the multiple second through-holes 103 that are formed with a first unit longitudinal dimension, and the second hole region 108 may include the multiple second through-holes 103 that are formed with a second unit longitudinal dimension.

The first unit longitudinal dimension is equal to the total value of the longitudinal dimensions of the second through-holes 103 that are located in the first hole region 107 per unit area. The first unit longitudinal dimension has a value obtained by converting the total value of the longitudinal dimensions of the second through-holes 103 that are located in the first hole region 107 into a value per unit area. The first unit longitudinal dimension is calculated by dividing the total value of the longitudinal dimensions of the second through-holes 103 that are located in a measurement frame having a square shape of 2 mm×2 mm by the area of the measurement frame. Even in the case where some of the second through-holes 103 are located outside the measurement frame, the longitudinal dimensions of the second through-holes 103 are used for the calculation of the first unit longitudinal dimension. The average value of values that are calculated when measurement frames are placed at freely determined five positions in the first hole region 107 is used as the first unit longitudinal dimension.

The first hole region 107 is defined by the second through-holes 103 that form the outer circumferential portions among the multiple second through-holes 103 that are formed with the first unit longitudinal dimension. In the example illustrated in FIG. 62, the first hole region 107 is defined by the thick dashed lines that pass through the outer edges of the second through-holes 103 that form the outer circumferential portions in plan view.

The second unit longitudinal dimension is equal to the total value of the longitudinal dimensions of the second through-holes 103 that are located in the second hole region 108 per unit area. The second unit longitudinal dimension has a value obtained by converting the total value of the longitudinal dimensions of the second through-holes 103 that are located in the second hole region 108 into a value per unit area. The second unit longitudinal dimension is obtained as in the first unit longitudinal dimension.

The second hole region 108 is defined by the second through-holes 103 that form the outer circumferential portions among the multiple second through-holes 103 that are formed with the second unit longitudinal dimension. In the example illustrated in FIG. 62, the second hole region 108 is defined by the thick dashed lines that pass through the outer edges of the second through-holes 103 that form the outer circumferential portions in plan view.

The longitudinal dimensions of the second through-holes 103 are equal to the maximum dimension of the second through-holes 103 at the first body surface 30*a*. More specifically, the longitudinal dimensions of the second through-holes 103 are equal to the maximum dimension of a region surrounded by the contour lines 103*b* illustrated in FIG. 63B.

Figure 68A:
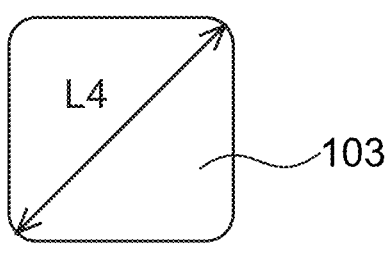
FIG. 68A is a plan view of an example of the second through-holes illustrated in FIG. 62.
Figure 68B:
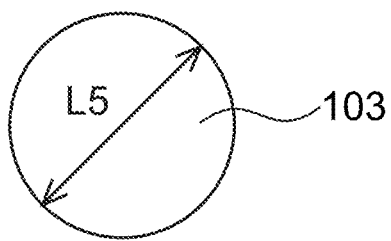
FIG. 68B is a plan view of an example of the second through-holes illustrated in FIG. 62.
Figure 68C:
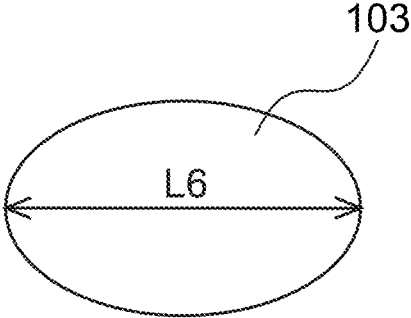
FIG. 68C is a plan view of an example of the second through-holes illustrated in FIG. 62.

For example, as illustrated in FIG. 68A, in the case where each second through-hole 103 is formed in a rectangular shape in plan view, the length L4 of a diagonal of the second through-hole 103 corresponds to the maximum dimension. The second through-hole 103 illustrated in FIG. 68A is rounded, but the length L4 of the diagonal of the second through-hole 103 corresponds to the maximum dimension even in this case. For example, as illustrated in FIG. 68B, in the case where each second through-hole 103 is formed in a circular shape in plan view, the diameter L5 of the second through-hole 103 corresponds to the maximum dimension. For example, as illustrated in FIG. 68C, in the case where each second through-hole 103 is formed in an elliptic shape in plan view, the diameter L6 of the second through-hole 103 corresponds to the maximum dimension.

The second unit longitudinal dimension may differ from the first unit longitudinal dimension. The second unit longitudinal dimension may be more than the first unit longitudinal dimension. In the example illustrated in FIG. 62, for convenience, the longitudinal dimensions of the second through-holes 103 that are located in the first hole region 107 are constant, and the longitudinal dimensions of the second through-holes 103 that are located in the second hole region 108 are constant. The second through-holes 103 that are located in the first hole region 107 and the second hole region 108 are formed in a rectangular shape in plan view. The pitch at which the second through-holes 103 that are located in the first hole region 107 are arranged is equal to the pitch at which the second through-holes 103 that are located in the second hole region 108 are arranged. The planar shapes of the second through-holes 103 that are located in the second hole region 108 are larger than the planar shapes of the second through-holes 103 that are located in the first hole region 107. For this reason, the longitudinal dimensions of the second through-holes 103 that are located in the second hole region 108 are more than the longitudinal dimensions of the second through-holes 103 that are located in the first hole region 107, and the second unit longitudinal dimension is more than the first unit longitudinal dimension.

According to the twenty-sixth modification, the second unit longitudinal dimension is more than the first unit longitudinal dimension, the sizes of the second through-holes 103 that are located in the second hole region 108 can be consequently increased, and the flow path resistance of the working vapor 2*a* in the second hole region 108 can be decreased. For this reason, in the case where the land connection region 40 is located in the vaporization region SR, the working vapor 2*a* that vaporizes can be smoothly dispersed from the second through-holes 103 to the vapor passages 51 and 52 via the land connection spaces 102. When the first unit longitudinal dimension is less than the second unit longitudinal dimension, the sizes of the second through-holes 103 that are located in the first hole region 107 can be decreased, and the flow path resistance of the working vapor 2*a* in the first hole region 107 can be increased. This enables the amount of vaporization of the working vapor 2*a* in the first hole region 107 to be decreased in the case where the land connection region 40 is located in the vaporization region SR. For this reason, the working liquid 2*b* is supplied to the second hole region 108, and the amount of vaporization of the working vapor 2*a* in the second hole region 108 can be increased.

The ratio of the second unit longitudinal dimension to the first unit longitudinal dimension may be 1.1 times to 20.0 times. The case where the land connection region 40 is located in the vaporization region SR will be described. When the ratio of the second unit longitudinal dimension to the first unit longitudinal dimension is 1.1 times or more, there can be a significant difference between the amount of vaporization of the working vapor 2*a* in the first hole region 107 and the amount of vaporization of the working vapor 2*a* in the second hole region 108. This enables the working liquid 2*b* to be supplied to the second hole region 108 and enables the amount of vaporization of the working vapor 2*a* in the second hole region 108 to be effectively increased. For this reason, absorbing the heat from the electronic device D can be facilitated, and the absorbing efficiency of the heat of the electronic device D can be improved. When the ratio of the second unit longitudinal dimension to the first unit longitudinal dimension is 1.3 times or more, the amount of vaporization of the working vapor 2*a* in the second hole region 108 can be more effectively increased. When the ratio of the second unit longitudinal dimension to the first unit longitudinal dimension is 20.0 times or less, the flow paths for the working liquid 2*b* in the second hole region 108 can be maintained. This enables the working liquid 2*b* in the second hole region 108 to be inhibited from being lacking and enables the working liquid 2*b* to be transported to the vicinity of the center of the second hole region 108. For this reason, the absorbing efficiency of the heat of the electronic device D can be inhibited from decreasing.

According to the twenty-sixth modification, as illustrated in FIG. 62, the longitudinal dimensions of the second through-holes 103 are constant in the first hole region 107 and the second hole region 108. The present disclosure, however, is not limited thereto. When the first unit longitudinal dimension is less than the second unit longitudinal dimension, the longitudinal dimensions of the second through-holes 103 that are located in the first hole region 107 may not be constant. When the second unit longitudinal dimension is more than the first unit longitudinal dimension, the longitudinal dimensions of the second through-holes 103 that are located in the second hole region 108 may not be constant. The circumferential lengths of the second through-holes 103 that are located in the first hole region 107 may be constant or may differ from each other. The circumferential lengths of the second through-holes 103 that are located in the second hole region 108 may be constant or may differ from each other.

In an example described according to the twenty-sixth modification, the second unit longitudinal dimension is more than the first unit longitudinal dimension. However, the second unit longitudinal dimension may be less than the first unit longitudinal dimension. In this case, the sizes of the second through-holes 103 that are located in the second hole region 108 can be decreased. In the case where the land connection region 40 is located in the vaporization region SR, the vapor pressure of the working vapor 2a in the second hole region 108 can be decreased. This enables the working liquid 2b to be likely to vaporize in the second hole region 108 and enables the working liquid 2b to be smoothly transported from the first hole region 107 to the second hole region 108. In addition, the sizes of the second through-holes 103 that are located in the first hole region 107 can be increased, and the flow path resistance of the working vapor 2a in the first hole region 107 can be decreased. This enables the vapor pressure of the working vapor 2a in the first hole region 107 to be decreased. For this reason, the working liquid 2b is likely to vaporize in the first hole region 107, and the amount of the working vapor 2a that disperses from the first hole region 107 to the vapor passages 51 and 52 can be increased.

The twenty-seventh modification will be described.

In an example described according to the twenty-fifth modification, the first hole region 107 includes the multiple second through-holes 103 that are formed with the first unit circumferential length, and the second hole region 108 includes the multiple second through-holes 103 that are formed with the second unit circumferential length. The present disclosure, however, is not limited thereto. The first hole region 107 may include the multiple second through-holes 103 that are formed at a first occupancy ratio, and the second hole region 108 may include the multiple second through-holes 103 that are formed at a second occupancy ratio. According to the twenty-seventh modification, the unit circumferential lengths of the second through-holes 103 that are located in the first hole region 107 may be constant or may differ from each other. The unit circumferential lengths of the second through-holes 103 that are located in the second hole region 108 may be constant or may differ from each other.

The first occupancy ratio is equal to the total value of the areas of the second through-holes 103 that are located in the first hole region 107 per unit area. The first occupancy ratio has a value obtained by converting the total value of the areas of the second through-holes 103 that are located in the first hole region 107 into a value per unit area. The first occupancy ratio is calculated by dividing the total value of the areas of the second through-holes 103 that are located in a measurement frame having a square shape of 2 mm×2 mm by the area of the measurement frame. Even in the case where some of the second through-holes 103 are located outside the measurement frame, the areas of portions that are located inside the measurement frame in the second through-holes 103 are used for the calculation of the first occupancy ratio. The average value of values that are calculated when measurement frames are placed at freely determined five positions in the first hole region 107 is used as the first occupancy ratio. The areas of the second through-holes 103 are areas at the first body surface 30a. More specifically, the areas of the second through-holes 103 are the areas of regions that are surrounded by the contour lines 103b illustrated in FIG. 63B.

The first hole region 107 is defined by the second through-holes 103 that form the outer circumferential portions among the multiple second through-holes 103 that are formed at the first occupancy ratio. In the example illustrated in FIG. 62, the first hole region 107 is defined by the thick dashed lines that pass through the outer edges of the second through-holes 103 that form the outer circumferential portions in plan view.

The second occupancy ratio is equal to the total value of the areas of the second through-holes 103 that are located in the second hole region 108 per unit area. The second occupancy ratio has a value obtained by converting the total value of the areas of the second through-holes 103 that are located in the second hole region 108 into a value per unit area. The second occupancy ratio is obtained as at the first occupancy ratio.

The second hole region 108 is defined by the second through-holes 103 that form the outer circumferential portions among the multiple second through-holes 103 that are formed at the second occupancy ratio. In the example illustrated in FIG. 62, the second hole region 108 is defined by the thick dashed lines that pass through the outer edges of the second through-holes 103 that form the outer circumferential portions in plan view.

The second occupancy ratio may differ from the first occupancy ratio. The second occupancy ratio may be higher than the first occupancy ratio. In the example illustrated in FIG. 62, for convenience, the areas of the second through-holes 103 that are located in the first hole region 107 are constant, and the areas of the second through-holes 103 that are located in the second hole region 108 are constant. The second through-holes 103 that are located in the first hole region 107 and the second hole region 108 are formed in a rectangular shape in plan view. The pitch at which the second through-holes 103 that are located in the first hole region 107 are arranged is equal to the pitch at which the second through-holes 103 that are located in the second hole region 108 are arranged. The planar shapes of the second through-holes 103 that are located in the second hole region 108 are larger than the planar shapes of the second through-holes 103 that are located in the first hole region 107. For this reason, the second occupancy ratio of the second through-holes 103 that are located in the second hole region 108 is higher than the first occupancy ratio of the second through-holes 103 that are located in the first hole region 107.

According to the twenty-seventh modification, the second occupancy ratio is higher than the first occupancy ratio, and consequently, the flow path resistance of the working vapor 2a in the second hole region 108 can be decreased in the case where the land connection region 40 is located in the vaporization region SR. This enables the working vapor 2a that vaporizes to be smoothly dispersed from the second through-holes 103 to the vapor passages 51 and 52 via the land connection spaces 102. When the first occupancy ratio is lower than the second occupancy ratio, the flow path resistance of the working vapor 2a in the first hole region 107 can be increased. This enables the amount of vaporization of the working vapor 2a in the first hole region 107 to be decreased. For this reason, the working liquid 2b is supplied to the second hole region 108, and the amount of vaporization of the working vapor 2a in the second hole region 108 can be increased.

The ratio of the second occupancy ratio to the first occupancy ratio may be 1.1 times to 100.0 times. The case where the land connection region 40 is located in the vaporization region SR will be described. When the ratio of the second occupancy ratio to the first occupancy ratio is 1.1 times or more, there can be a significant difference between the amount of vaporization of the working vapor 2a in the first hole region 107 and the amount of vaporization of the working vapor 2a in the second hole region 108. This enables the working liquid 2b to be supplied to the second hole region 108 and enables the amount of vaporization of the working vapor 2a in the second hole region 108 to be effectively increased. For this reason, absorbing the heat from the electronic device D can be facilitated, and the absorbing efficiency of the heat of the electronic device D can be improved. When the ratio of the second occupancy ratio to the first occupancy ratio is 1.3 times or more, the amount of vaporization of the working vapor 2a in the second hole region 108 can be more effectively increased. When the ratio of the second occupancy ratio to the first occupancy ratio is 100.0 times or less, the flow paths for the working liquid 2b in the second hole region 108 can be maintained. This enables the working liquid 2b in the second hole region 108 to be inhibited from being lacking and enables the working liquid 2b to be transported to the vicinity of the center of the second hole region 108. For this reason, the absorbing efficiency of the heat of the electronic device D can be inhibited from decreasing.

According to the twenty-seventh modification, as illustrated in FIG. 62, the areas of the second through-holes 103 are constant in the first hole region 107 and the second hole region 108. The present disclosure, however, is not limited thereto. When the first occupancy ratio is lower than the second occupancy ratio, the areas of the second through-holes 103 that are located in the first hole region 107 may not be constant. When the second occupancy ratio is higher than the first occupancy ratio, the areas of the second through-holes 103 that are located in the second hole region 108 may not be constant. The circumferential lengths of the second through-holes 103 that are located in the first hole region 107 may be constant or may differ from each other. The circumferential lengths of the second through-holes 103 that are located in the second hole region 108 may be constant or may differ from each other.

In an example described according to the twenty-seventh modification, the second occupancy ratio is higher than the first occupancy ratio. However, the second occupancy ratio may be lower than the first occupancy ratio. In the case where the land connection region 40 is located in the vaporization region SR, the vapor pressure of the working vapor 2a in the second hole region 108 can be decreased. This enables the working liquid 2b to be likely to vaporize in the second hole region 108 and enables the working liquid 2b to be smoothly transported from the first hole region 107 to the second hole region 108. When the first occupancy ratio is higher than the second occupancy ratio, the vapor pressure of the working vapor 2a in the first hole region 107 can be decreased. For this reason, the working liquid 2b is likely to vaporize in the first hole region 107, and the amount of the working vapor 2a that disperses from the first hole region 107 to the vapor passages 51 and 52 can be increased.

The twenty-eighth modification will be described.

Figure 69:
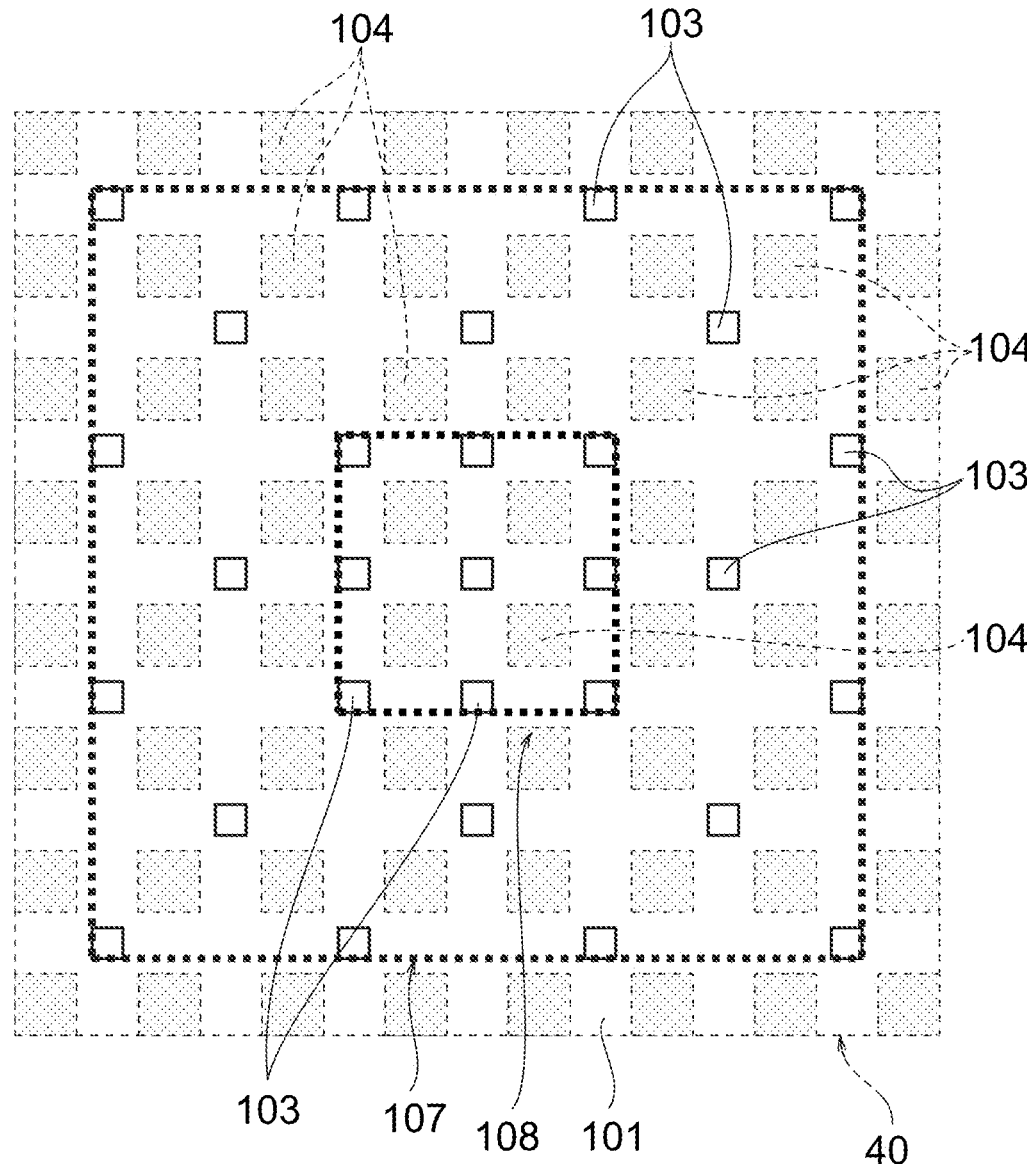
FIG. 69 is a plan view of another modification to the land connection region illustrated in FIG. 62.
Figure 69:
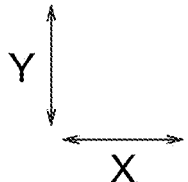

In an example described according to the twenty-fifth modification, the first hole region 107 includes the multiple second through-holes 103 that are formed with the first unit circumferential length, and the second hole region 108 includes the multiple second through-holes 103 that are formed with the second unit circumferential length. The present disclosure, however, is not limited thereto. As illustrated in FIG. 69, the first hole region 107 may include the multiple second through-holes 103 that are formed with a first unit number, and the second hole region 108 may include the multiple second through-holes 103 that are formed with a second unit number.

The first unit number is the number of the second through-holes 103 that are located in the first hole region 107 per unit area. The first unit number has a value obtained by converting the number of the second through-holes 103 that are located in the first hole region 107 into a value per unit area. The first unit number is calculated by dividing the number of the second through-holes 103 that are located in a measurement frame having a square shape of 2 mm×2 mm by the area of the measurement frame. Even in the case where some of the second through-holes 103 are located outside the measurement frame, the second through-holes 103 are counted for the calculation of the first unit number. The average value of values that are calculated when measurement frames are placed at freely determined five positions in the first hole region 107 is used as the first unit number.

The first hole region 107 is defined by the second through-holes 103 that form the outer circumferential portions among the multiple second through-holes 103 that are formed with the first unit number. In an example illustrated in FIG. 69, the first hole region 107 is defined by thick dashed lines that pass through the outer edges of the second through-holes 103 that form the outer circumferential portions in plan view.

The second unit number is the number of the second through-holes 103 that are located in the second hole region 108 per unit area. The second unit number has a value obtained by converting the number of the second through-holes 103 that are located in the second hole region 108 into a value per unit area. The second unit number is obtained as in the first unit number. A value that is calculated when a measurement frame is placed at a freely determined position in the second hole region 108 is used as the second unit number.

The second hole region 108 is defined by the second through-holes 103 that form the outer circumferential portions among the multiple second through-holes 103 that are formed with the second unit number. In the example illustrated in FIG. 69, the second hole region 108 is defined by thick dashed lines that pass through the outer edges of the second through-holes 103 that form the outer circumferential portions in plan view.

The second unit number may differ from the first unit number. The second unit number may be larger than the first unit number. In the example illustrated in FIG. 69, for convenience, the planar shapes of the second through-holes 103 that are located in the first hole region 107 are constant, and the planar shapes of the second through-holes 103 that are located in the second hole region 108 are constant. The planar shapes of the second through-holes 103 that are located in the first hole region 107 are the same as the planar shapes of the second through-holes 103 that are located in the second hole region 108. In the example illustrated in FIG. 69, a pitch at which the second through-holes 103 that are located in the second hole region 108 are arranged is smaller than a pitch at which the second through-holes 103 that are located in the first hole region 107 are arranged. For this reason, the number of the second through-holes 103 that are located in the second hole region 108 per unit area is larger than the number of the second through-holes 103 that are located in the first hole region 107 per unit area.

According to the twenty-eighth modification, the second unit number is larger than the first unit number, and the length of the gas-liquid interface in the second hole region 108 can be increased. For this reason, in the case where the land connection region 40 is located in the vaporization region SR, the amount of vaporization of the working vapor 2a in the second hole region 108 can be increased. When the first unit number is smaller than the second unit number, the length of the gas-liquid interface in the first hole region 107 can be decreased. This enables the amount of vaporization of the working vapor 2a in the first hole region 107 to be decreased. For this reason, the working liquid 2b is supplied to the second hole region 108, and the amount of vaporization of the working vapor 2a in the second hole region 108 can be increased.

The ratio of the second unit number to the first unit number may be 1.1 times to 50.0 times. The case where the land connection region 40 is located in the vaporization region SR will be described. When the ratio of the second unit number to the first unit number is 1.1 times or more, there can be a significant difference between the amount of vaporization of the working vapor 2a in the first hole region 107 and the amount of vaporization of the working vapor 2a in the second hole region 108. This enables the working liquid 2b to be supplied to the second hole region 108 and enables the amount of vaporization of the working vapor 2a in the second hole region 108 to be effectively increased. For this reason, absorbing the heat from the electronic device D can be facilitated, and the absorbing efficiency of the heat of the electronic device D can be improved. When the ratio of the second unit number to the first unit number is 1.3 times or more, the amount of vaporization of the working vapor 2a in the second hole region 108 can be more effectively increased. When the ratio of the second unit number to the first unit number is 50.0 times or less, the flow paths for the working liquid 2b in the second hole region 108 can be maintained. This enables the working liquid 2b in the second hole region 108 to be inhibited from being lacking and enables the working liquid 2b to be transported to the vicinity of the center of the second hole region 108. For this reason, the absorbing efficiency of the heat of the electronic device D can be inhibited from decreasing.

According to the twenty-eighth modification, the circumferential lengths of the second through-holes 103 that are located in the first hole region 107 may be constant or may differ from each other. The circumferential lengths of the second through-holes 103 that are located in the second hole region 108 may be constant or may differ from each other.

In an example described according to the twenty-eighth modification, the second unit number is larger than the first unit number. However, the second unit number may be smaller than the first unit number. This enables the length of the gas-liquid interface in the second hole region 108 to be decreased. In the case where the land connection region 40 is located in the vaporization region SR, the vapor pressure of the working vapor 2a in the second hole region 108 can be decreased. This enables the working liquid 2b to be likely to vaporize in the second hole region 108 and enables the working liquid 2b to be smoothly transported from the first hole region 107 to the second hole region 108. When the first unit number is larger than the second unit number, and the length of the gas-liquid interface in the first hole region 107 can be increased. This enables the vapor pressure of the working vapor 2a in the first hole region 107 to be decreased. For this reason, the working liquid 2b is likely to vaporize in the first hole region 107, and the amount of the working vapor 2a that disperses from the first hole region 107 to the vapor passages 51 and 52 can be increased.

The twenty-ninth modification will be described.

According to the twenty-ninth modification, a relationship between the total value of the flow path sectional areas of the main flow grooves 61X and 61Y in the land connection region 40 and the total value of the flow path sectional areas of the intersection grooves 106X and 106Y that are connected to the second through-holes 103 may be defined.

Figures 70A, 70B:
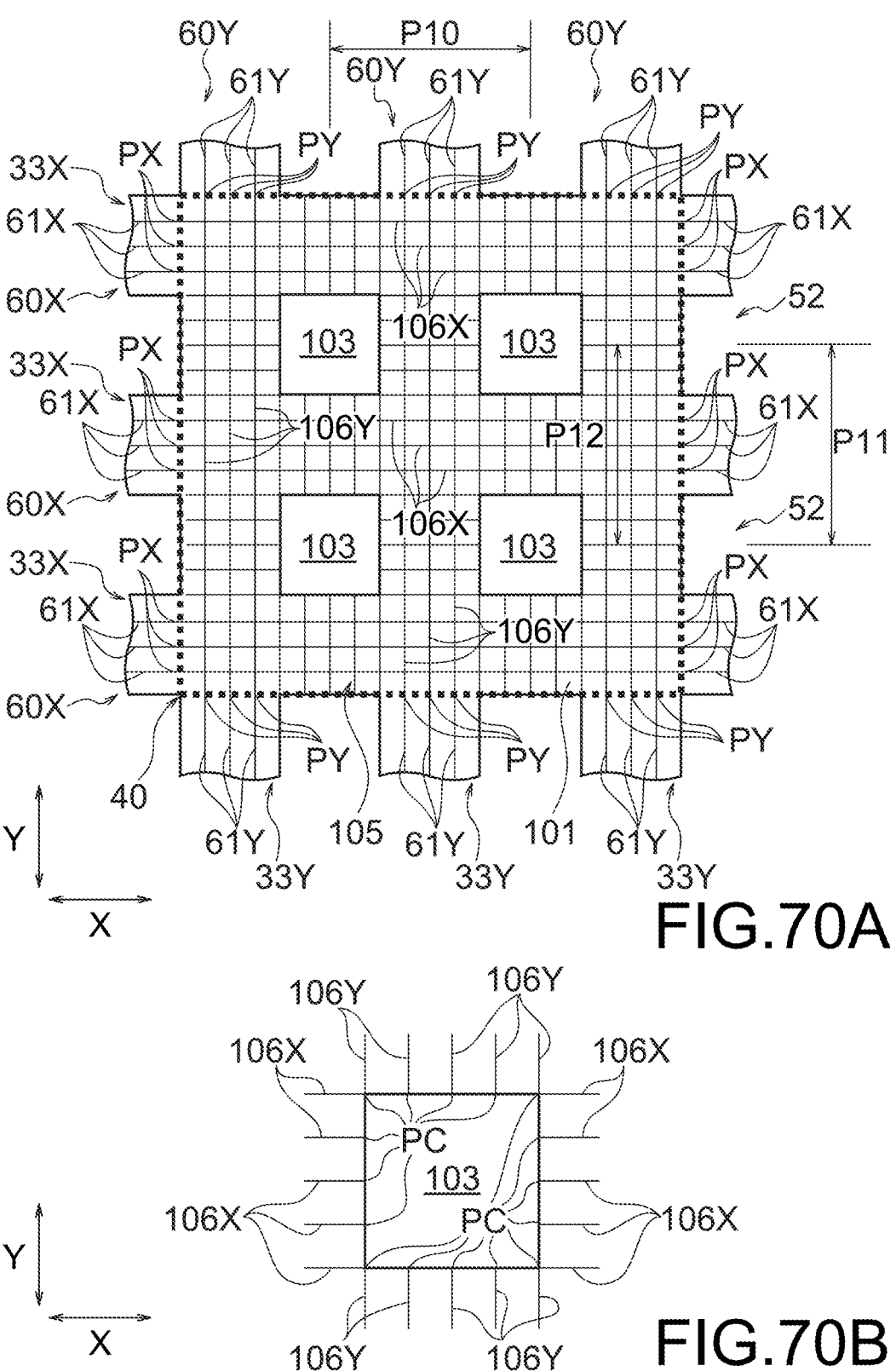
FIG. 70A is a plan view of the land connection region illustrated in FIG. 62.
FIG. 70B is a plan view of one of the second through-holes in FIG. 70A.

As illustrated in FIG. 70A, the first main flow grooves 61X are connected to the first intersection grooves 106X at first connection positions PX. The first main flow grooves 61X are connected to the first intersection grooves 106X corresponding thereto at the first connection positions PX. The first connection positions PX are located on the outer edges of the land connectors 101 and on boundaries between the land connectors 101 and the first land portions 33X in plan view. As illustrated in FIG. 70A, the first connection positions PX are located on both sides of the land connectors 101 in the X direction and are defined for every first main flow groove 61X.

The second main flow grooves 61Y are connected to the second intersection grooves 106Y at second connection positions PY. The second main flow grooves 61Y are connected to the second intersection grooves 106Y corresponding thereto at the second connection positions PY The second connection positions PY are located on the outer edges of the land connectors 101 and on boundaries between the land connectors 101 and the second land portions 33Y in plan view. As illustrated in FIG. 70A, the second connection positions PY are located on both sides of the land connectors 101 in the Y direction and are defined for every second main flow groove 61Y.

As illustrated in FIG. 70A and FIG. 70B, the multiple intersection grooves 106X and 106Y are connected to the second through-holes 103 at third connection positions PC. The second through-holes 103 are connected to the intersection grooves 106X and 106Y corresponding thereto at the third connection positions PC. More specifically, the second through-holes 103 are connected to the first intersection grooves 106X and the second intersection grooves 106Y corresponding thereto at the third connection positions PC. The third connection positions PC are located on the outer edges of the second through-holes 103 and on boundaries between the second through-holes 103 and the intersection grooves 106X and 106Y in plan view. The third connection positions PC are located on both sides of the second through-holes 103 in the X direction and are defined for every first intersection groove 106X. The third connection positions PC are located on both sides of the second through-holes 103 in the Y direction and are defined for every second intersection groove 106Y.

The total value of the flow path sectional areas of the first main flow grooves 61X at the first connection positions PX is designated as S1. S1 represents the total value of the flow path sectional areas of the first main flow grooves 61X at all of the first connection positions PX.

The total value of the flow path sectional areas of the second main flow grooves 61Y at the second connection positions PY is designated as S2. S2 represents the total value of the flow path sectional areas of the second main flow grooves 61Y at all of the second connection positions PY.

The total value of the flow path sectional areas of the intersection grooves 106X and 106Y at the third connection positions PC is designated as S3. S3 represents the sum of the total value of the flow path sectional areas of the multiple first intersection grooves 106X and the total value of the flow path sectional areas of the multiple second intersection grooves 106Y at all of the third connection positions PC. Even in the case where some of the first intersection grooves 106X do not face the second through-holes 103, the flow path sectional areas of portions of the first intersection grooves 106X that face the second through-holes 103 are added into S3. The case where the first intersection grooves 106X are connected to corner portions of the second through-holes 103 in plan view corresponds to the case where some of the first intersection grooves 106X do not face the second through-holes 103. Even in the case where some of the second intersection grooves 106Y do not face the second through-holes 103, the flow path sectional areas of portions of the second intersection grooves 106Y that face the second through-holes 103 are added into S3. The case where the second intersection grooves 106Y are connected to the corner portions of the second through-holes 103 in plan view corresponds to the case where some of the second intersection grooves 106Y do not face the second through-holes 103.

A total main flow groove sectional area ST obtained by adding S1 and S2 is larger than S3.

According to the twenty-ninth modification, in the case where the land connection region 40 is located in the vaporization region SR, the amount of the working liquid 2b transported to the land connection region 40 can be increased, and the working liquid 2b can be transported to the vicinity of the center of the land connection region 40. For this reason, absorbing the heat from the electronic device D can be uniform, and the absorbing efficiency of the heat of the electronic device D can be improved.

The ratio of ST to S3 described above may be 1.0 times to 5.0 times. The case where the land connection region 40 is located in the vaporization region SR will be described. When the ratio of ST to S3 is 1.0 times or more, the amount of the working liquid 2b transported to the land connection region 40 can be increased, and the working liquid 2b can be transported to the vicinity of the center of the land connection region 40. When the ratio of ST to S3 is 1.1 times or more, there can be a significant difference between ST and S3. This enables the amount of the working liquid 2b transported to the land connection region 40 to be further increased. When the ratio of ST to S3 is 5.0 times or less, the amount of the working liquid 2b transported to the land connection region 40 can be inhibited from being excessive. This enables the working liquid 2b to be inhibited from overflowing from the main flow grooves 61X and 61Y and enables the vapor passages 51 and 52 to be inhibited from being blocked near the first connection positions PX and near the second connection positions PY For this reason, the absorbing efficiency of the heat of the electronic device D can be inhibited from decreasing.

In an example illustrated in FIG. 70A, a pitch p10 at which the second through-holes 103 are arranged in the X direction is equal to a pitch p11 at which the second vapor passages 52 that are located outside the land connection region 40 are arranged in the Y direction, the pitch p10 of arrangement may be larger than the pitch p11 of arrangement. In the example illustrated in FIG. 70A, a pitch p12 at which the second through-holes 103 are arranged in the Y direction is equal to the pitch p11 at which the second vapor passages 52 are arranged in the Y direction, but the pitch p12 of arrangement may be larger than the pitch p11 of arrangement. Increasing the pitches p10 and p12 at which the second through-holes 103 are arranged enables the number of the second through-holes 103 that are located in the land connection region 40 to be decreased and enables the total value of the plane areas of the second through-holes 103 to be decreased. For this reason, in the case where the land connection region 40 is located in the vaporization region SR, the working liquid 2b can be transported also to the vicinity of the center of the land connection region 40. The pitches p10, p11, and p12 of arrangement are dimensions at the first body surface 30a.

The thirtieth modification will be described.

Figure 70C:
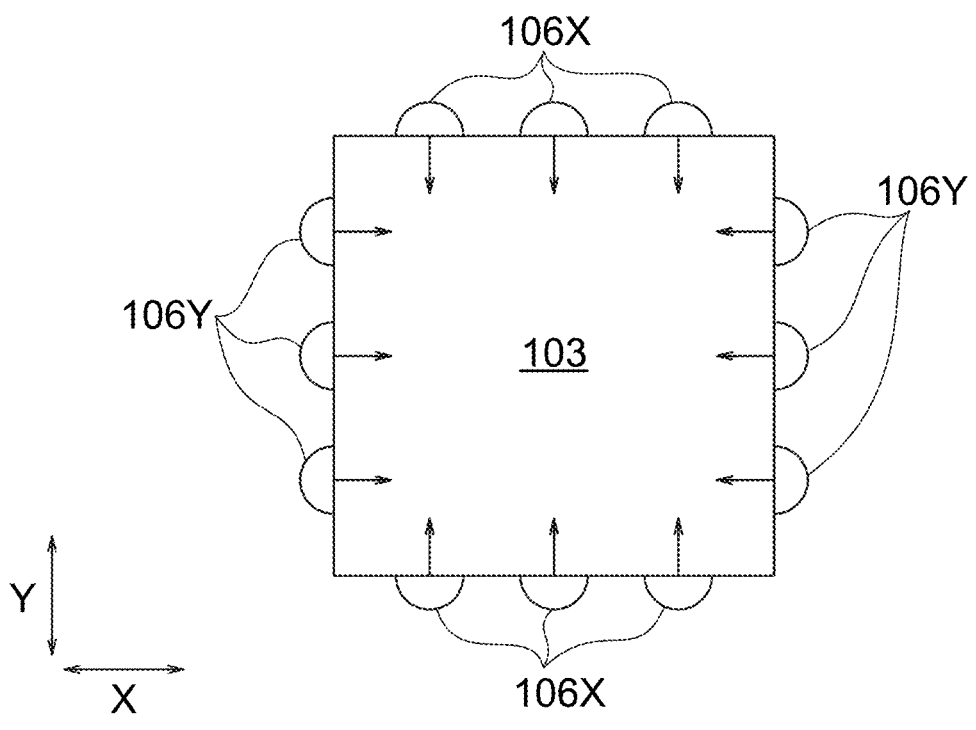
FIG. 70C is a schematic plan view illustrating a relationship between intersection grooves and one of the second through-holes illustrated in FIG. 70A.

As illustrated in FIG. 70A and FIG. 70B, the multiple intersection grooves 106X and 106Y are connected to the second through-holes 103 at the third connection positions PC. The multiple intersection grooves 106X and 106Y are connected to the second through-holes 103. More specifically, as illustrated in FIG. 70C, the multiple first intersection grooves 106X and the multiple second intersection grooves 106Y are connected to one of the second through-holes 103.

The plane area S4 of one of the second through-holes 103 is equal to or more than the total value S5 of the flow path sectional areas of the multiple intersection grooves 106X and 106Y that are connected to the one of the second through-holes 103. More specifically, S5 is equal to a value obtained by adding the total value of the flow path sectional areas of the multiple second intersection grooves 106Y and the total value of the flow path sectional areas of the multiple first intersection grooves 106X that are connected to the one of the second through-holes 103. S4 may be equal to S5 or may be larger than S5. Even in the case where some of the first intersection grooves 106X do not face the second through-holes 103, the flow path sectional areas of portions of the first intersection grooves 106X that face the second through-holes 103 are added into S5. The case where the first intersection grooves 106X are connected to the corner portions of the second through-holes 103 in plan view corresponds to the case where some of the first intersection grooves 106X do not face the second through-holes 103. Even in the case where some of the second intersection grooves 106Y do not face the second through-holes 103, the flow path sectional areas of portions of the second intersection grooves 106Y that face the second through-holes 103 are added into S5. The case where the second intersection grooves 106Y are connected to the corner portions of the second through-holes 103 in plan view corresponds to the case where some of the second intersection grooves 106Y do not face the second through-holes 103.

According to the thirtieth modification, in the case where the land connection region 40 is located in the vaporization region SR, the working vapor 2a that vaporizes from the working liquid 2b that is transported by using the intersection grooves 106X and 106Y can be smoothly dispersed from the second through-holes 103 to the vapor passages 51 and 52. For this reason, the transport efficiency of the working vapor 2a can be improved, and the heat dissipation performance of the vapor chamber 1 can be improved.

The relationship described above between the plane area S4 of the second through-hole 103 and the total value S5 of the flow path sectional areas of the intersection grooves 106X and 106Y may be defined regarding the second through-holes 103 that are located in the land connection region 40. The plane areas of the second through-holes 103 are areas at the first body surface 30a.

The ratio of S4 to S5 described above may be 1.1 times to 30.0 times. The case where the land connection region 40 is located in the vaporization region SR will be described. When the ratio of S4 to S5 is 1.1 times or more, there can be a significant difference between S4 and S5. This enables the working vapor 2a that vaporizes from the working liquid 2b that is transported by using the intersection grooves 106X and 106Y to be smoothly dispersed from the second through-holes 103 to the vapor passages 51 and 52. When the ratio of S4 to S5 is 1.3 times or more, the working vapor 2a can be more smoothly dispersed by using the vapor passages 51 and 52. When the ratio of S4 to S5 is 30.0 times or less, the amount of the working liquid 2b supplied in the land connection region 40 can be ensured, and the amount of vaporization of the working vapor 2a can be ensured. For this reason, the absorbing efficiency of the heat of the electronic device D can be inhibited from decreasing.

The thirty-first modification will be described.

The total value of the plane areas of the second through-holes 103 that are located in the land connection region 40 may be 3% to 30% of the plane areas of the land connectors 101 in the land connection region 40. For example, in the example illustrated in FIG. 70A, four second through-holes 103 are located in the land connection region 40. In this case, the total value of the plane areas of the four second through-holes 103 may be 3% to 30% of the plane areas of the land connectors 101. The plane areas of the land connectors 101 are equal to the plane area of the land connection region 40 illustrated by using the thick dashed lines in FIG. 33. The case where the land connection region 40 is located in the vaporization region SR will be described. When the total value of the plane areas of the second through-holes 103 is 3% or more of the plane areas of the land connectors 101, the amount of the working vapor 2a that disperses from the second through-holes 103 to the vapor passages 51 and 52 can be ensured. This enables the absorbing efficiency of the heat of the electronic device D to be improved. When the total value of the plane areas of the second through-holes 103 is 30% or less of the plane areas of the land connectors 101, the plane areas of the first liquid flow path portions 60X and the second liquid flow path portions 60Y can be ensured. This enables the amount of the working liquid 2b transported to be ensured. For this reason, the electronic device D can be cooled. The plane areas of the land connectors 101 are areas at the first body surface 30a.

Alternatively, the total value of the plane areas of the second through-holes 103 that overlap a contact region DR in which the electronic device D comes into contact may be 3% to 30% of the plane area of the contact region DR of the electronic device D. The electronic device D is to be cooled by the vapor chamber 1. The plane areas of the second through-holes 103 are areas at the first body surface 30a. Even in the case where some of the second through-holes 103 are located outside the contact region DR of the electronic device D, the areas of portions of the second through-holes 103 that overlap the contact region DR are added into the total value of the plane areas of the second through-holes 103. As illustrated in FIG. 71, the contact region DR of the electronic device D is the region in which the electronic device D comes into contact with the first sheet 10 of the vapor chamber 1.

Second Embodiment

A vapor chamber body sheet, a vapor chamber, and an electronic apparatus according to a second embodiment of the present disclosure will now be described with reference to FIG. 72 to FIG. 114.

According to the second embodiment illustrated in FIG. 72 to FIG. 114, the vapor chamber is changed so as to include storage flow path portions. The other structure is substantially the same as that according to the first embodiment illustrated in FIG. 1 to FIG. 71. In FIG. 72 to FIG. 114, portions like to those according to the first embodiment illustrated in FIG. 1 to FIG. 71 are designated by like reference signs, and a detailed description is omitted. In an example described according to the present embodiment, a single wick sheet 30 is located between the first sheet 10 and the second sheet 20. However, multiple wick sheets 30 may be located between the first sheet 10 and the second sheet 20.

Figure 72:
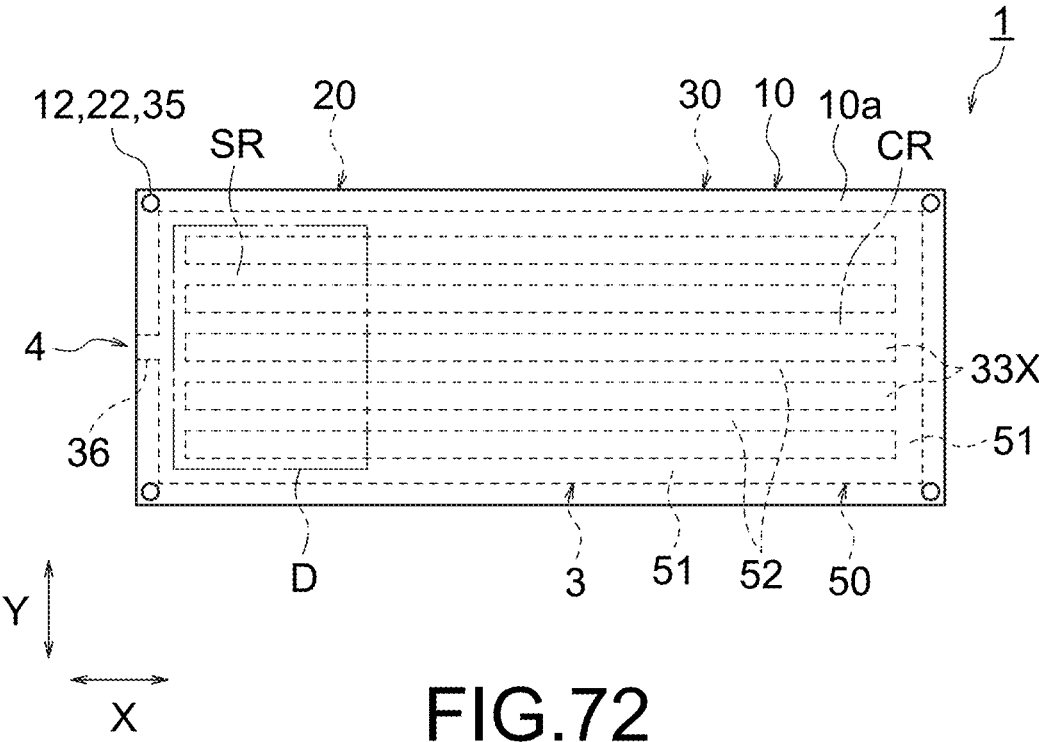
FIG. 72 is a plan view of a vapor chamber according to a second embodiment of the present disclosure.
Figure 73:
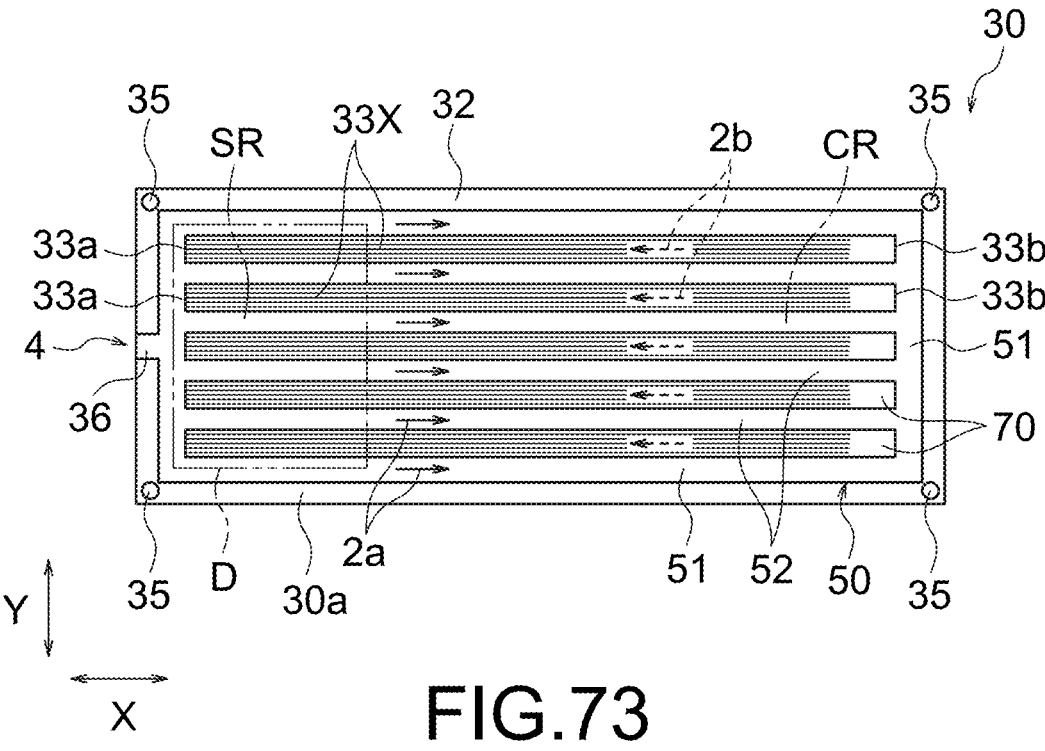
FIG. 73 is a plan view of the first body surface of the wick sheet of the vapor chamber illustrated in FIG. 72.
Figure 74:
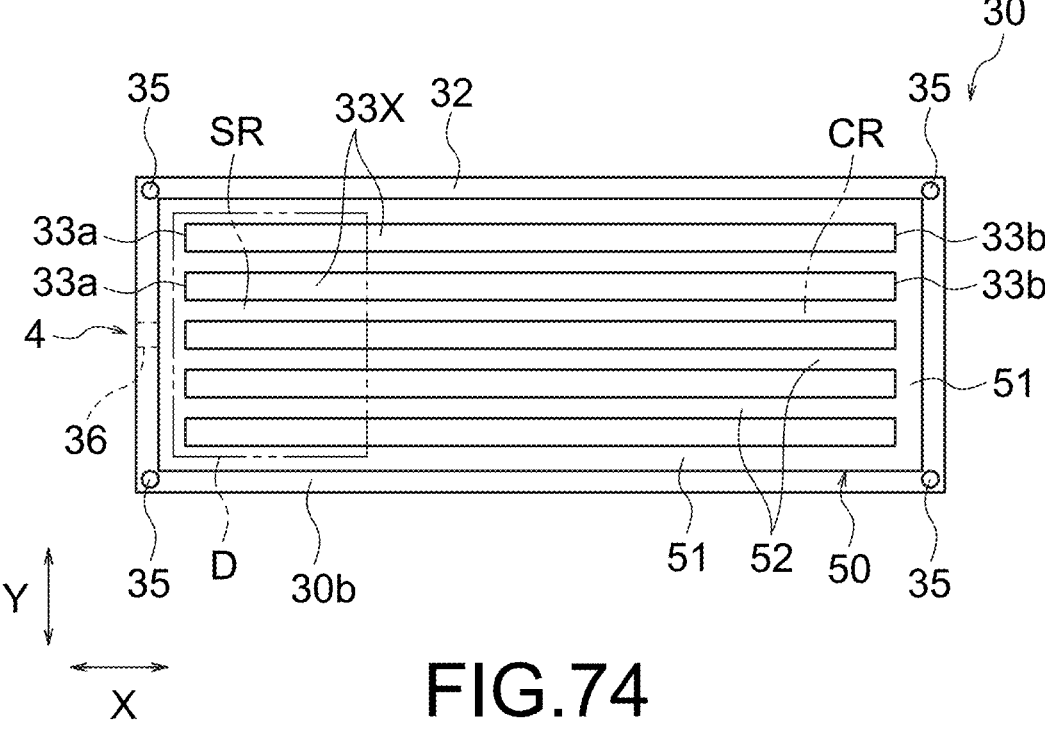
FIG. 74 is a plan view of the second body surface of the wick sheet of the vapor chamber illustrated in FIG. 72.
Figure 75:
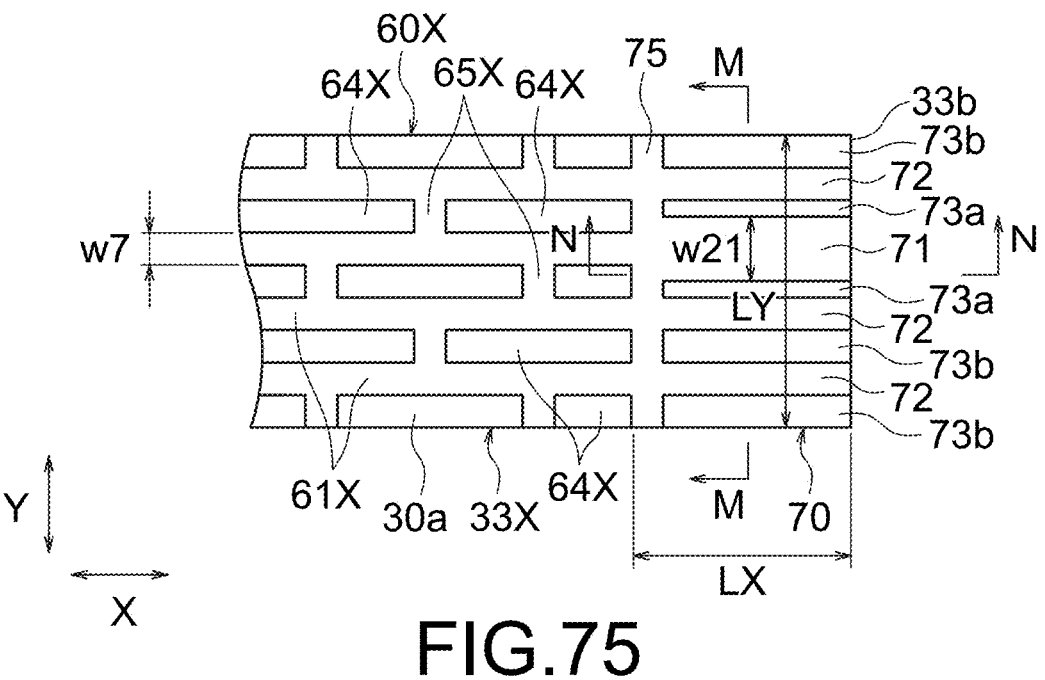
FIG. 75 is a partial enlarged plan view of a storage flow path portion illustrated in FIG. 73.

As for the vapor chamber 1 according to the present embodiment, as illustrated in FIG. 72 to FIG. 74, the second land portions 33Y and the land intersection portions 37 may not be formed. As illustrated in FIG. 75, the vapor chamber 1 according to the present embodiment may include storage flow path portions 70.

The storage flow path portions 70 will now be described.

As illustrated in FIG. 73 and FIG. 75, the storage flow path portions 70 may be located on the first body surface 30a of the wick sheet 30. The storage flow path portions 70 according to the present embodiment are located on the first body surface 30a at the first land portions 33X. The storage flow path portions 70 may be in contact with the first liquid flow path portions 60X in the X direction or may be connected and in communication with the first main flow grooves 61X. The first liquid flow path portions 60X are examples of a first groove flow path portion.

The storage flow path portions 70 may include flow paths through which the working liquid 2b mainly passes and in which the working liquid 2b can be stored. The working vapor 2a described above may pass through the flow paths of the storage flow path portions 70. The flow paths of the storage flow path portions 70 form portions of the enclosure space 3 described above and are in communication with the vapor passages 51 and 52. At least portions of the flow paths of the storage flow path portions 70 may have the capillary action for transporting the working liquid 2b to the vaporization region SR.

The storage flow path portions 70 may be located at second land end portions 33b of the first land portions 33X. As illustrated in FIG. 73, the first land portions 33X include first land end portions 33a and the second land end portions 33b. The first land end portions 33a are first end portions in the X direction. The second land end portions 33b are second end portions in the X direction and are opposite the first land end portions 33a. The first land end portions 33a may be located in the vaporization region SR or may be located near the vaporization region SR. The second land end portions 33b may be located in the condensation region CR far from the vaporization region SR. The storage flow path portions 70 according to the present embodiment are located in the condensation region CR.

As illustrated in FIG. 73 and FIG. 75, the storage flow path portions 70 are in contact with the first liquid flow path portions 60X on first sides in the X direction. The first liquid flow path portions 60X may be located near the vaporization region SR with respect to the storage flow path portions 70. The storage flow path portions 70 may be in contact with the first vapor passage 51 in the X direction and may not be in contact with the first liquid flow path portions 60X on second sides. The first liquid flow path portions 60X may not be formed at positions far from the vaporization region SR with respect to the storage flow path portions 70.

As illustrated in FIG. 75, the storage flow path portions 70 may include multiple storage main flow grooves 71 and 72 and storage communication grooves 75. The storage main flow grooves 71 and 72 and the storage communication grooves 75 are flow paths of the storage flow path portions 70 through which the working liquid 2b mainly passes. The storage communication grooves 75 are connected and in communication with the storage main flow grooves 71 and 72. The storage main flow grooves 71 and 72 and the storage communication grooves 75 may be located on the first body surface 30a at the first land portions 33X. The storage main flow grooves 71 and 72 and the storage communication grooves 75 may be in communication with the vapor passages 51 and 52. The storage main flow grooves 71 and 72 may be in communication with the first main flow grooves 61X of the first liquid flow path portions 60X. The storage main flow grooves 71 and 72 and the storage communication grooves 75 may be formed by being etched from the first body surface 30a as in the first main flow grooves 61X and the first communication grooves 65X.

The multiple storage main flow grooves 71 and 72 may include the first storage main flow grooves 71 and the second storage main flow grooves 72. The storage main flow grooves 71 and 72 may extend in the X direction. The storage main flow grooves 71 and 72 may be arranged in the Y direction.

Figure 76:
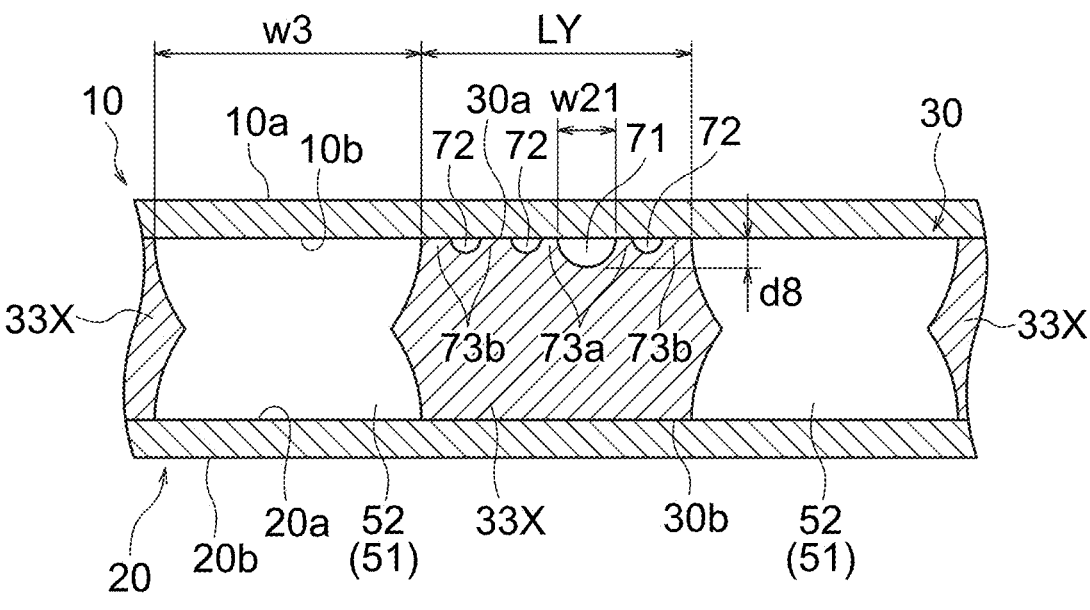
FIG. 76 is a sectional view of the storage flow path portion taken along a line M-M in FIG. 75.
Figure 76:

As illustrated in FIG. 75 and FIG. 76, the flow path sectional areas of the first storage main flow grooves 71 according to the present embodiment may be larger than the flow path sectional areas of the first main flow grooves 61X. The flow path sectional areas of the first storage main flow grooves 71 may be larger than the flow path sectional areas of the second storage main flow grooves 72. In this case, the capillary action of the first storage main flow grooves 71 may be weaker than the capillary action of the first main flow grooves 61X and may be weaker than the capillary action of the second storage main flow grooves 72. The flow path sectional areas of the first storage main flow grooves 71 may be smaller than the flow path sectional areas of the vapor passages 51 and 52.

The width w21 of each first storage main flow groove 71 may be more than the width w7 of each first main flow groove 61X. The width w21 of each first storage main flow groove 71 may be less than the width w3 (see FIG. 8) of each first vapor flow path recessed portion 53. The width w21 means the dimension of each first storage main flow groove 71 at the first body surface 30a. The width w21 corresponds to a dimension in the Y direction.

As illustrated in FIG. 76, the depth d8 of each first storage main flow groove 71 may be more than the depth d5 (see FIG. 8) of each first main flow groove 61X. The depth d8 of each first storage main flow groove 71 may be less than the depth d1 (see FIG. 8) from the first body surface 30a to the end of each through-portion 34 described above. The depth d8 corresponds to the dimension in the Z direction of each first storage main flow groove 71.

The flow path sectional areas of the second storage main flow grooves 72 according to the present embodiment are equal to the flow path sectional areas of the first main flow grooves 61X. When the flow path sectional areas of the storage flow path portions 70 are larger than the flow path sectional areas of the first liquid flow path portions 60X, however, the flow path sectional areas of the second storage main flow grooves 72 may be smaller than the flow path sectional areas of the first main flow grooves 61X. The second storage main flow grooves 72 may have small flow path sectional areas such that the working liquid 2b mainly flows due to the capillary action. The flow path sectional areas of the second storage main flow grooves 72 may be smaller than the flow path sectional areas of the vapor passages 51 and 52. The width of each second storage main flow groove 72 may be equal to the width w7 of each first main flow groove 61X or may be less than the width w7. The width of each second storage main flow groove 72 corresponds to a dimension in the Y direction at the first body surface 30a. The depth of each second storage main flow groove 72 may be equal to or may be less than the depth of each first main flow groove 61X. The depth of each second storage main flow groove 72 corresponds to the dimension in the Z direction of the second storage main flow groove 72.

The first storage main flow grooves 71 may be located between the second storage main flow grooves 72 in the Y direction. The second storage main flow grooves 72 may be located between the first storage main flow grooves 71 and the vapor passages 51 and 52.

The storage main flow grooves 71 and 72 may be located at positions corresponding to those of the first main flow grooves 61X. The storage main flow grooves 71 and 72 may be located at the same positions in the Y direction as those of the first main flow grooves 61X corresponding thereto. More specifically, the storage main flow grooves 71 and 72 may be located along extension lines from the first main flow grooves 61X corresponding thereto.

In an example illustrated in FIG. 75, a single first storage main flow groove 71 and three second storage main flow grooves 72 are formed on the first body surface 30a. However, the number of the first storage main flow grooves 71 and the number of the second storage main flow grooves 72 are freely determined provided that the flow path sectional areas of the storage flow path portions 70 are larger than the flow path sectional areas of the first liquid flow path portions 60X.

As illustrated in FIG. 75, the storage communication grooves 75 extend in a direction that differs from the X direction. According to the present embodiment, the storage communication grooves 75 extend in the Y direction and are perpendicular to the storage main flow grooves 71 and 72. The storage communication grooves 75 may linearly extend in the Y direction over the entire width of each first land portion 33X. The storage communication grooves 75 may be located between the first main flow grooves 61X and the storage main flow grooves 71 and 72 in the X direction. Each storage flow path portion 70 according to the present embodiment includes the single storage communication groove 75.

The flow path sectional areas of the storage communication grooves 75 may be equal to or may differ from the flow path sectional areas of the first communication grooves 65X. The storage communication grooves 75 may have small flow path sectional areas such that the working liquid 2b mainly flows due to the capillary action. The flow path sectional areas of the storage communication grooves 75 may be smaller than the flow path sectional areas of the vapor passages 51 and 52. The width of each storage communication groove 75 may be equal to or may differ from the width w8 of each first communication groove 65X. The width of each storage communication groove 75 correspond to a dimension in the X direction at the first body surface 30a. The depth of each storage communication groove 75 may be equal to or may differ from the depth of each first communication groove 65X. The depth of each storage communication groove 75 corresponds to the dimension in the Z direction in the storage communication groove 75.

As illustrated in FIG. 75, the storage flow path portions 70 may include multiple storage projecting portions 73a and 73b that are located on the first body surface 30a at the first land portions 33X. The storage projecting portions 73a and 73b may be defined by the storage main flow grooves 71 and 72, the storage communication grooves 75, and the vapor passages 51 and 52. The storage projecting portions 73*a* and 73*b* may be formed in a rectangular shape such that the X direction is the longitudinal direction in plan view or may be formed in a rounded rectangular shape. The storage projecting portions 73*a* and 73*b* are not etched, and the material of the wick sheet 30 remains at the portions. The storage projecting portions 73*a* and 73*b* may be bonded to the first sheet inner surface 10*b* of the first sheet 10. The dimensions in the X direction of the storage projecting portions 73*a* and 73*b* may be equal to each other. The storage projecting portions 73*a* and 73*b* may be arranged in the Y direction at the same position in the X direction.

The multiple storage projecting portions 73*a* and 73*b* may include first storage projecting portions 73*a* and second storage projecting portions 73*b*. The first storage projecting portions 73*a* are located between the first storage main flow grooves 71 and the second storage main flow grooves 72. Each second storage projecting portion 73*b* is located between two second storage main flow grooves 72 adjacent to each other and is located between the vapor passages 51 and 52 and the second storage main flow grooves 72. The width of each first storage projecting portion 73*a* may be less than the width of each second storage projecting portion 73*b*. The width of each second storage projecting portion 73*b* may be equal to or may differ from the width of each first projecting portion 64X. The widths of the storage projecting portions 73*a* and 73*b* correspond to dimensions in the Y direction at the first body surface 30*a*.

The flow path sectional areas of the storage flow path portions 70 perpendicular to the X direction may be larger than the flow path sectional areas of the first liquid flow path portions 60X perpendicular to the X direction. More specifically, the flow path sectional areas of the first storage main flow grooves 71 may be larger than the flow path sectional areas of the first main flow grooves 61X as described above.

The flow path sectional areas of the first liquid flow path portions 60X perpendicular to the X direction are equal to the areas of flow path sections in the Y direction at positions at which the first communication grooves 65X described above are not present. The flow path sectional areas of the first liquid flow path portions 60X are equal to the maximum flow path sectional area of flow path sectional areas at freely determined positions in the X direction other than positions at which the first communication grooves 65X are present. The flow path sectional areas of the first liquid flow path portions 60X are equal to the total value of the flow path sectional areas of the first main flow grooves 61X. More specifically, the flow path sectional areas of the first liquid flow path portions 60X are equal to the total value of the flow path sectional areas of the first main flow grooves 61X in a section illustrated in FIG. 8.

The flow path sectional areas of the storage flow path portions 70 perpendicular to the X direction according to the present embodiment are equal to the areas of flow path sections in the Y direction at positions at which the storage communication grooves 75 described above are not present. The flow path sectional areas of the storage flow path portions 70 perpendicular to the X direction are equal to the maximum flow path sectional area of flow path sectional areas at freely determined positions in the X direction other than positions at which the storage communication grooves 75 are present. The flow path sectional areas of the storage flow path portions 70 perpendicular to the X direction are equal to the total value of the flow path sectional areas of the storage main flow grooves 71 and 72. More specifically, the flow path sectional areas of the storage flow path portions 70 perpendicular to the X direction are equal to the total value of the flow path sectional areas of the storage main flow grooves 71 and 72 in a section illustrated in FIG. 76.

According to the present embodiment, the flow path sectional areas of the first storage main flow grooves 71 are larger than the flow path sectional areas of the first main flow grooves 61X, and the flow path sectional areas of the second storage main flow grooves 72 are equal to the flow path sectional areas of the first main flow grooves 61X as described above. The number of the storage main flow grooves 71 and 72 is equal to the number of the first main flow grooves. In this case, the total value of the flow path sectional areas of the storage main flow grooves 71 and 72 is larger than the flow path sectional areas of the first main flow grooves 61X. For this reason, the flow path sectional areas of the storage flow path portions 70 perpendicular to the X direction according to the present embodiment are larger than the flow path sectional areas of the first liquid flow path portions 60X perpendicular to the X direction.

The first surface residual ratio of the storage flow path portions 70 may be lower than the second surface residual ratio of the first liquid flow path portions 60X.

Figure 77:
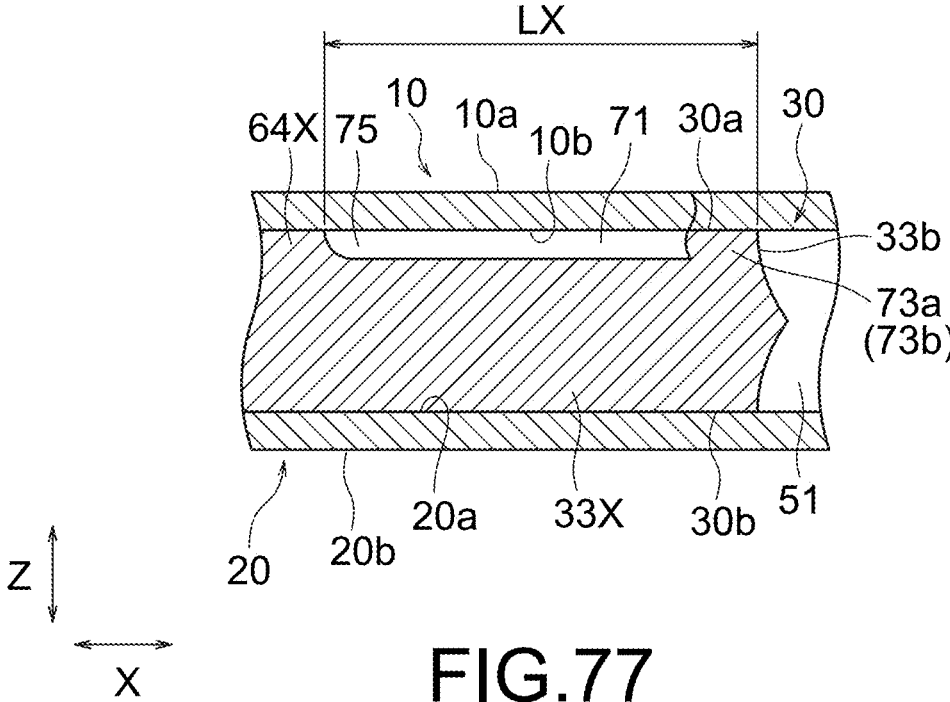
FIG. 77 is a sectional view of the storage flow path portion taken along a line N-N in FIG. 75.

The first surface residual ratio represents a ratio at which the first body surface 30*a* at the storage flow path portions 70 remains. The first surface residual ratio is calculated by dividing the total value of the area of the first body surface 30*a* that remains at the storage flow path portions 70 by the areas of the storage flow path portions 70. The storage flow path portions 70 are regions in which the first storage main flow grooves 71, the second storage main flow grooves 72, the storage communication grooves 75, and the storage projecting portions 73*a* and 73*b* are provided, and the regions are represented by using a dimension LX in the X direction and a dimension LY in the Y direction as illustrated in FIG. 75 to FIG. 77. The areas of the storage flow path portions 70 are calculated by multiplying the dimension LX and the dimension LY The dimension LX is defined as a distance from each second land end portion 33*b* to an edge portion of one of the first projecting portions 64X in contact with the storage flow path portions 70. The dimension LX corresponds to a dimension in the X direction at the first body surface 30*a*. The dimension LY corresponds to the entire width of each first land portion 33X at the first body surface 30*a* and the width w1 (see FIG. 8) described above.

The second surface residual ratio represents a ratio at which the first body surface 30*a* at the first liquid flow path portions 60X remains. The second surface residual ratio is calculated by dividing the total value of the area of the first body surface 30*a* that remains at the first liquid flow path portions 60X by the areas of the first liquid flow path portions 60X. The areas of the first liquid flow path portions 60X do not include the areas of the storage flow path portions 70.

The materials of the first sheet 10, the second sheet 20, and the wick sheet 30 are not particularly limited provided that the materials have excellent thermal conductivity to such an extent that the heat dissipation performance of the vapor chamber 1 can be ensured. For example, the sheets 10, 20, and 30 may be composed of a metal material. For example, the sheets 10, 20, and 30 may contain copper or a copper alloy. The copper and the copper alloy have excellent thermal conductivity and corrosion resistance in the case where pure water is used as the working fluid. Examples of the copper include pure copper and oxygen-free copper (C1020). Examples of the copper alloy include a copper alloy that contains tin, a copper alloy (such as C1990) that contains titanium, and a Corson copper alloy (such as C7025) that is a copper alloy that contains nickel, silicon, and magnesium. An example of the copper alloy that contains tin is phosphor bronze (such as C5210).

The material of the first sheet 10 may be harder than the material of the wick sheet 30. In this case, the first sheet 10 can be inhibited from deforming at portions of the first sheet 10 that overlap the storage flow path portions 70 in plan view. This enables the degree of the capillary action and the flow path resistance of the storage flow path portions 70 to be inhibited from changing in the flow paths of the storage flow path portions 70 and enables the performance of the vapor chamber 1 to be stabilized. The use of a hard material for the first sheet 10 enables the thickness of the first sheet 10 to be decreased and enables the thickness of the vapor chamber 1 to be decreased. Examples of the hard material include an iron alloy, nickel, a nickel alloy, titanium, a titanium alloy, and a material that contains, for example, an aluminum alloy. Examples of the iron alloy include stainless steel, an invar material (an iron alloy that contains nickel), and Kovar (an iron alloy that contains cobalt).

While the vapor chamber 1 is operating, portions of the working liquid 2b are stored at the storage flow path portions 70. More specifically, the working liquid 2b that condenses at positions near the second land end portions 33b of the first land portions 33X moves to the storage main flow grooves 71 and 72 via the storage communication grooves 75 due to the capillary action of the storage communication grooves 75 and the storage main flow grooves 71 and 72. The flow path sectional areas of the first storage main flow grooves 71 are larger than the flow path sectional areas of the first main flow grooves 61X, and accordingly, the capillary action of the first storage main flow grooves 71 is weaker than the capillary action of the second storage main flow grooves 72. For this reason, the portions of the working liquid 2b that move to the first storage main flow grooves 71 do not move to the first main flow grooves 61X but can be stored in the first storage main flow grooves 71. The volumes of the first storage main flow grooves 71 can be increased, and accordingly, the amount of the working liquid 2b that is stored in the first storage main flow grooves 71 can be increased. The working liquid 2b that moves to the second storage main flow grooves 72 moves to the first main flow grooves 61X due to the capillary action.

In the case where the amount of vaporization of the working liquid 2b in the vaporization region SR is small, the working liquid 2b that is present at the first liquid flow path portions 60X enables the amount of the working liquid 2b transported to the vaporization region SR to be ensured. In this case, the working liquid 2b in the first storage main flow grooves 71 of the storage flow path portions 70 is not transported to the vaporization region SR but can be stored. In the case where the amount of vaporization of the working liquid 2b is large in the vaporization region SR, the amount of the working liquid 2b transported to the vaporization region SR can be lacking. In this case, the working liquid 2b that is stored in the first storage main flow grooves 71 moves to the first main flow grooves 61X due to the capillary action and is transported to the vaporization region SR. In this way, the amount of the working liquid 2b transported from the first storage main flow grooves 71 to the vaporization region SR is adjusted depending on the amount of vaporization of the working liquid 2b in the vaporization region SR. For this reason, the working liquid 2b in the vaporization region SR can be prevented from being lacking.

The working liquid 2b that reaches the vaporization region SR is heated again by the electronic device D and vaporizes. The working vapor 2a that vaporizes from the working liquid 2b in the first main flow grooves 61X moves to the vapor passages 51 and 52 via the first communication grooves 65X of the edge communication groove columns 63Xa. The working vapor 2a disperses in the vapor passages 51 and 52. In this way, the working fluids 2a and 2b circulate in the enclosure space 3 while repeating the phase changes, that is, the vaporization and the condensation. Consequently, the heat of the electronic device D is dispersed and is dissipated. As a result, the electronic device D is cooled.

According to the present embodiment, the storage flow path portions 70 that are connected to the first liquid flow path portions 60X are thus located on the first body surface 30a at the first land portions 33X. The flow path sectional areas of the storage flow path portions 70 perpendicular to the X direction are larger than the flow path sectional areas of the first liquid flow path portions 60X perpendicular to the X direction. This enables a flow path volume for storing the working liquid 2b at the storage flow path portions 70 to be increased and enables the working liquid 2b to be stored at the storage flow path portions 70. For this reason, in the case where the amount of vaporization of the working liquid 2b in the vaporization region SR is small, the working liquid 2b can be stored at the storage flow path portions 70. In the case where the amount of vaporization of the working liquid 2b in the vaporization region SR is large, the working liquid 2b that is stored at the storage flow path portions 70 can be transported to the vaporization region SR. As a result, the working liquid 2b in the vaporization region SR can be inhibited from being lacking, and the heat dissipation performance of the vapor chamber 1 can be improved.

According to the present embodiment, the storage flow path portions 70 include the first storage main flow grooves 71 that have a width more than the width of each first main flow groove 61X. This enables the flow path sectional areas of the first storage main flow grooves 71 to be larger than the flow path sectional areas of the first main flow grooves 61X. For this reason, the flow path volume for storing the working liquid 2b at the storage flow path portions 70 can be increased, and the working liquid 2b can be stored.

According to the present embodiment, the storage flow path portions 70 include the first storage main flow grooves 71 that have a depth more than the depth of each first main flow groove 61X. This enables the flow path sectional areas of the first storage main flow grooves 71 to be larger than the flow path sectional areas of the first main flow grooves 61X. For this reason, the flow path volume for storing the working liquid 2b at the storage flow path portions 70 can be increased, and the working liquid 2b can be stored.

According to the present embodiment, the first surface residual ratio that represents an area ratio at which the first body surface 30a remains at the storage flow path portions 70 is lower than the second surface residual ratio that represents an area ratio at which the first body surface remains at the first liquid flow path portions 60X. This enables the ratio at which the first body surface 30a remains at the storage flow path portions 70 to be decreased. In this case, the percentages of the storage main flow grooves 71 and 72 and the storage communication grooves 75 that are formed at the storage flow path portions 70 can be increased. For this reason, the flow path volume for storing the working liquid 2b at the storage flow path portions 70 can be increased, and the working liquid 2b can be stored at the storage flow path portions 70. For this reason, in the case where the amount of vaporization of the working liquid 2b in the vaporization region SR is small, the working liquid 2b can be stored at the storage flow path portions 70. In the case where the amount of vaporization of the working liquid 2b in the vaporization region SR is large, the working liquid 2b that is stored at the storage flow path portions 70 can be transported to the vaporization region SR. As a result, the working liquid 2b in the vaporization region SR can be inhibited from being lacking, and the heat dissipation performance of the vapor chamber 1 can be improved.

Modifications to the second embodiment described above will now be described.

A thirty-second modification will be described.

In an example described according to the second embodiment described above, each storage flow path portion 70 includes the single first storage main flow groove 71 and the three second storage main flow grooves 72. The present disclosure, however, is not limited thereto. Each storage flow path portion 70 may include multiple first storage main flow grooves 71.

Figure 78:
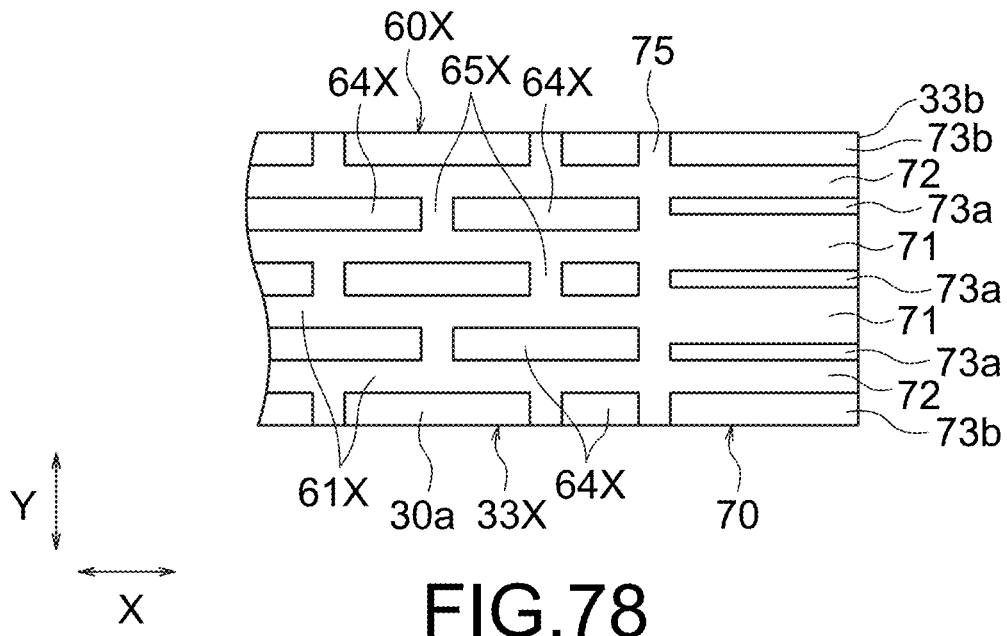
FIG. 78 is a partial enlarged plan view of a modification to the storage flow path portion illustrated in FIG. 75.

For example, as illustrated in FIG. 78, the storage flow path portions 70 may include two first storage main flow grooves 71 and two second storage main flow grooves 72. Also, in this case, the two first storage main flow grooves 71 are located between the two second storage main flow grooves 72. Also, in an example illustrated in FIG. 78, the storage main flow grooves 71 and 72 are located at the same positions in the Y direction as those of the first main flow grooves 61X corresponding thereto. More specifically, the storage main flow grooves 71 and 72 may be located along extension lines from the first main flow grooves 61X corresponding thereto.

According to the modification illustrated in FIG. 78, the number of the first storage main flow grooves 71 that have large flow path sectional areas is increased, and accordingly, the amount of the working liquid 2b stored can be increased. In the example illustrated in FIG. 78, each first storage projecting portion 73a that is narrow is positioned between two storage main flow grooves 71 and 72 adjacent to each other, and the second storage projecting portions 73b that are wide are located between the vapor passages 51 and 52 and the second storage main flow grooves 72.

Also, in the example illustrated in FIG. 78, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction according to the present embodiment described above.

Figure 79:
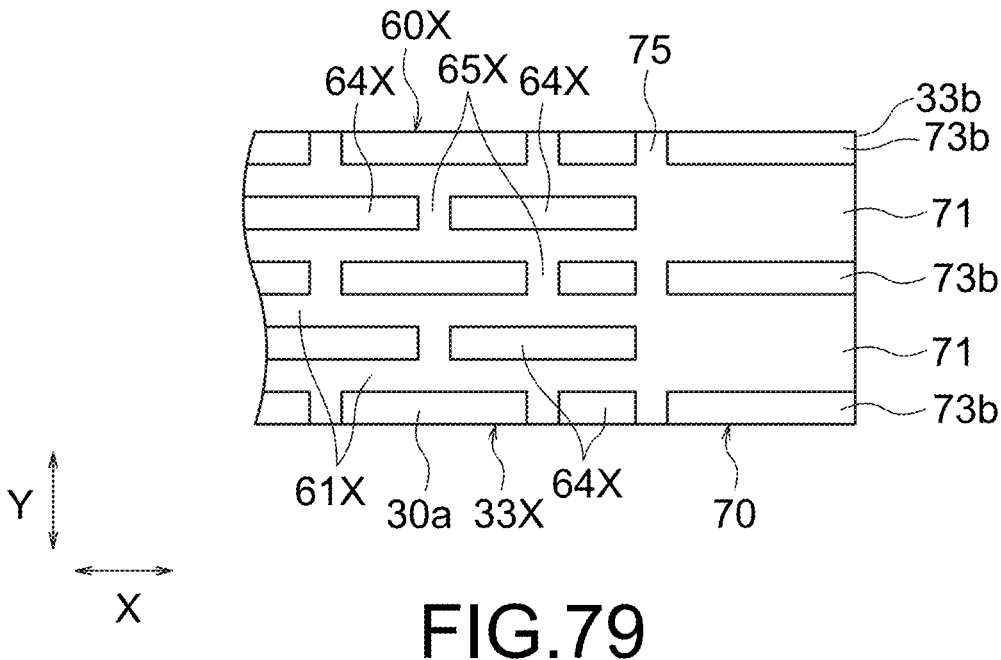
FIG. 79 is a partial enlarged plan view of another modification to the storage flow path portion illustrated in FIG. 75.

Alternatively, as illustrated in, for example, FIG. 79, the storage flow path portions 70 may include two first storage main flow grooves 71 and may not include the second storage main flow grooves 72. In this case, the width of each first storage main flow groove 71 is more than the width w21 of each first storage main flow groove 71 illustrated in FIG. 76. The first storage main flow grooves 71 are formed so as to contain the same positions in the Y direction as those of two first main flow grooves 61X corresponding thereto and are formed so as to be across the two first main flow grooves 61X in the X direction.

Also, in an example illustrated in FIG. 79, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction according to the present embodiment described above.

According to the modification illustrated in FIG. 79, the number of the first storage main flow grooves 71 that have large flow path sectional areas is increased, and accordingly, the amount of the working liquid 2b stored can be increased. In addition, the width of each first storage main flow groove 71 can be increased, and the flow path sectional areas of the first storage main flow grooves 71 can be increased. For this reason, the amount of the working liquid 2b stored can be increased. In the example illustrated in FIG. 79, the second storage projecting portions 73b is located between two of the storage main flow grooves 71 and 72 adjacent to each other, and the second storage projecting portions 73b are located between the vapor passages 51 and 52 and the first storage main flow grooves 71. The first storage projecting portions 73a may not be formed.

A thirty-third modification will be described.

In an example described according to the second embodiment described above, the width of each first storage main flow groove 71 of the storage flow path portions 70 are more than the width of each first main flow groove 61X of the first liquid flow path portions 60X, and the depth of each first storage main flow groove 71 is more than the depth of each first main flow groove 61X. The present disclosure, however, is not limited thereto. The width and depth of each first storage main flow groove 71 are freely determined provided that the flow path sectional areas of the storage flow path portions 70 perpendicular to the X direction are larger than the flow path sectional areas of the first liquid flow path portions 60X perpendicular to the X direction. For example, in the case where the flow path sectional areas of the first storage main flow grooves 71 are larger than the flow path sectional areas of the first main flow grooves 61X, the width of each first storage main flow groove 71 may be equal to the width of each first main flow groove 61X, or the depth of each first storage main flow groove 71 may be equal to the depth of each first main flow groove 61X.

A thirty-fourth modification will be described.

Figure 80:
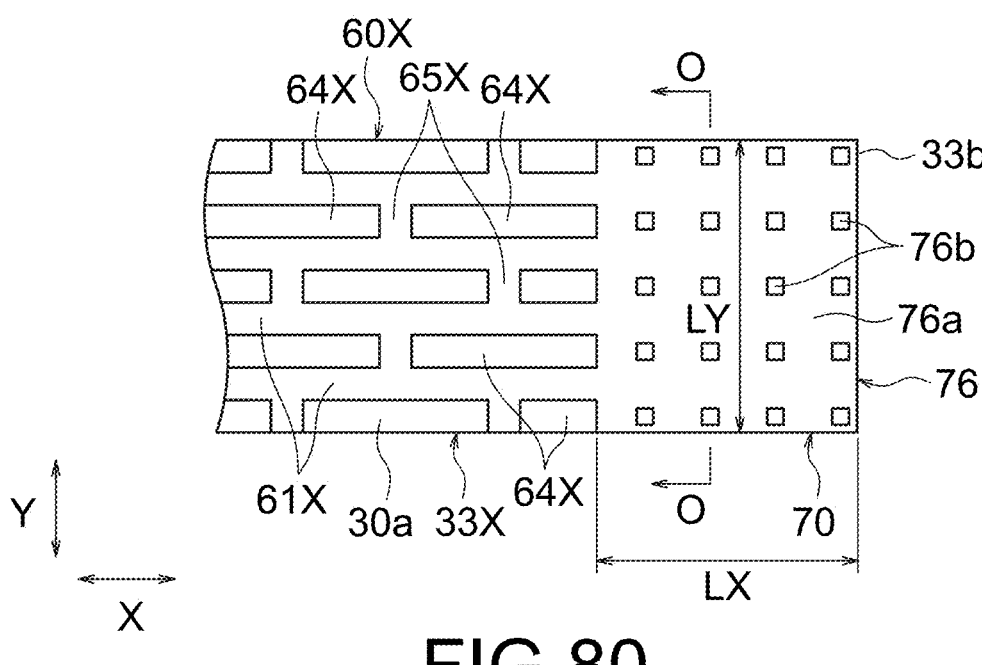
FIG. 80 is a partial enlarged plan view of another modification to the storage flow path portion illustrated in FIG. 75.
Figure 81:
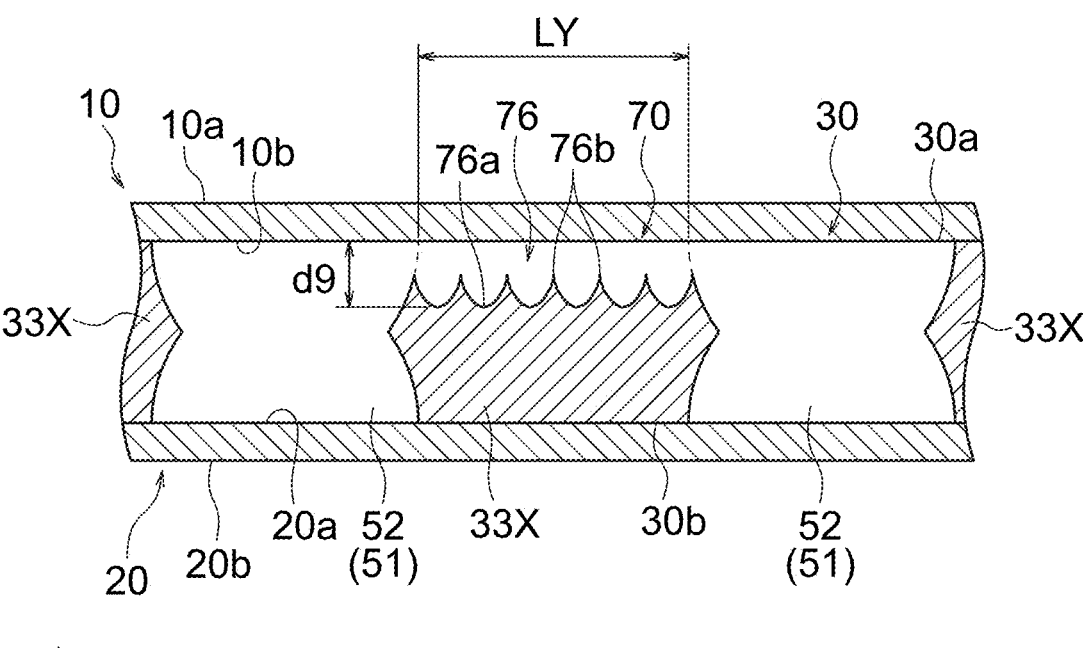
FIG. 81 is a sectional view of the storage flow path portion taken along a line O-O in FIG. 80.

In an example described according to the second embodiment described above, the storage flow path portions 70 include the multiple storage main flow grooves 71 and 72 and the storage communication grooves 75. The present disclosure, however, is not limited thereto. For example, as illustrated in FIG. 80 and FIG. 81, the storage flow path portions 70 may include storage recessed portions 76. The storage recessed portions 76 may be located on the first body surface 30a at the first land portions 33X. The storage recessed portions 76 are connected to the first main flow grooves 61X. The storage recessed portions 76 are formed across the multiple first main flow grooves 61X that are located at the first land portions 33X in the Y direction. The storage recessed portions 76 may be formed over the entire width of each first land portion 33X.

As illustrated in FIG. 81, the storage recessed portions 76 may have storage bottom surfaces 76a. The storage bottom surfaces 76a may be located at positions near the second body surface 30b at the storage recessed portions 76. The depth d9 of each storage recessed portion 76 may be equal to the depth d5 (see FIG. 8) of each first main flow groove 61X or may be more than the depth d5. The depth d9 of each storage recessed portion 76 may be less than the depth d1 (see FIG. 8) from the first body surface 30a to each through-portion 34 or may be equal to the depth d1. The depth d9 is equal to distances from the first body surface 30a to the storage bottom surfaces 76a.

As illustrated in FIG. 80 and FIG. 81, protrusions 76b that project toward the first body surface 30a may be located on the storage bottom surfaces 76a. The protrusions 76b may be arranged in the X direction and may be arranged in the Y direction. The protrusions 76b may be formed so as to taper and project toward the first body surface 30a when viewed in the X direction and the Y direction. The protrusions 76b may be separated inward from an extension surface of the first body surface 30a. In this case, the protrusions 76b may be separated from the first sheet inner surface 10b of the first sheet 10. The sectional shapes of the protrusions 76b are freely determined. The protrusions 76b may be formed by being etched from the first body surface 30a.

The flow path sectional area of the storage flow path portion 70 illustrated in FIG. 80 perpendicular to the X direction may be larger than the flow path sectional areas of the first liquid flow path portions 60X perpendicular to the X direction. In an example illustrated in FIG. 80, the flow path sectional areas of the storage flow path portions 70 perpendicular to the X direction are the flow path sectional areas of the storage recessed portions 76 in the direction perpendicular to the X direction and are the areas of flow path sections in the Y direction at positions at which the protrusions 76b described above are not present. The flow path sectional areas of the storage flow path portions 70 perpendicular to the X direction are equal to the maximum flow path sectional area of the flow path sectional areas of the storage recessed portions 76 at freely determined positions in the X direction other than positions at which the protrusions 76b are present.

Also, in an example illustrated in FIG. 80 and FIG. 81, the first surface residual ratio of the storage flow path portions 70 may be lower than the second surface residual ratio of the first liquid flow path portions 60X. The dimension LX in the X direction and the dimension LY in the Y direction for calculating the first surface residual ratio are obtained as in the example illustrated in FIG. 75 to FIG. 77. In the example illustrated in FIG. 80 and FIG. 81, the first surface residual ratio may be zero.

According to the modification illustrated in FIG. 80 and FIG. 81, the flow path sectional areas of the storage recessed portions 76 can be increased, and the amount of the working liquid 2b stored can be increased. In addition, the capillary action can be applied to the working liquid 2b by using the protrusions 76b. The protrusions 76b are separated inward from the first sheet inner surface 10b, the capillary action can be consequently applied between the protrusions 76b and the first sheet inner surface 10b, and the working liquid 2b can be likely to be drawn into the storage recessed portions 76. The storage spaces for the working liquid 2b can be formed between the protrusions 76b and the first sheet inner surface 10b, and the amount of storage can be increased.

Figure 82:
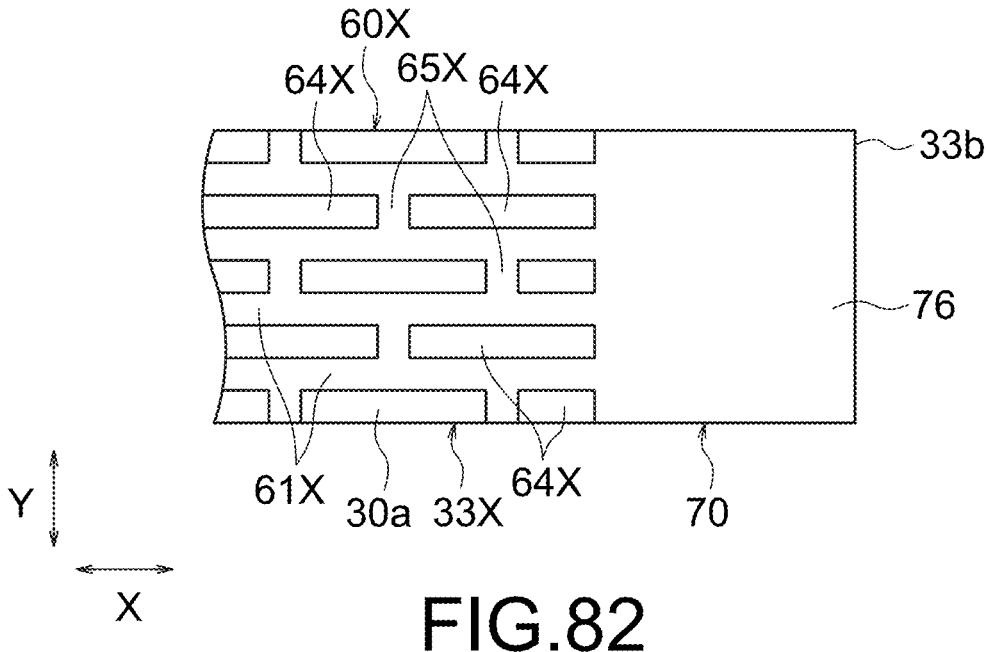
FIG. 82 is a partial enlarged plan view of another modification to the storage flow path portion illustrated in FIG. 75.

As illustrated in FIG. 82, the protrusions 76b may not be located on the storage bottom surfaces 76a. In this case, the flow path sectional areas of the storage recessed portions 76 can be increased, and the amount of the working liquid 2b stored can be increased. The storage bottom surfaces 76a may be substantially flat.

Also, in an example illustrated in FIG. 82, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are the areas of flow path sections in the Y direction and are equal to the maximum flow path sectional area of the flow path sectional areas of the storage recessed portions 76 at freely determined positions in the X direction.

A thirty-fifth modification will be described.

Figure 83:
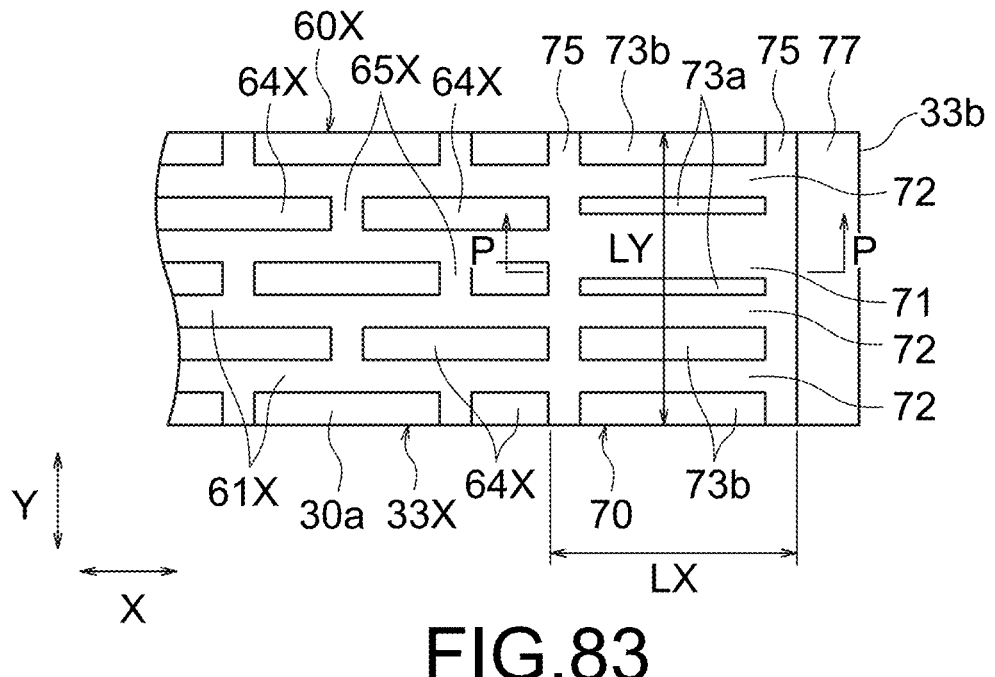
FIG. 83 is a partial enlarged plan view of another modification to the storage flow path portion illustrated in FIG. 75.
Figure 84:
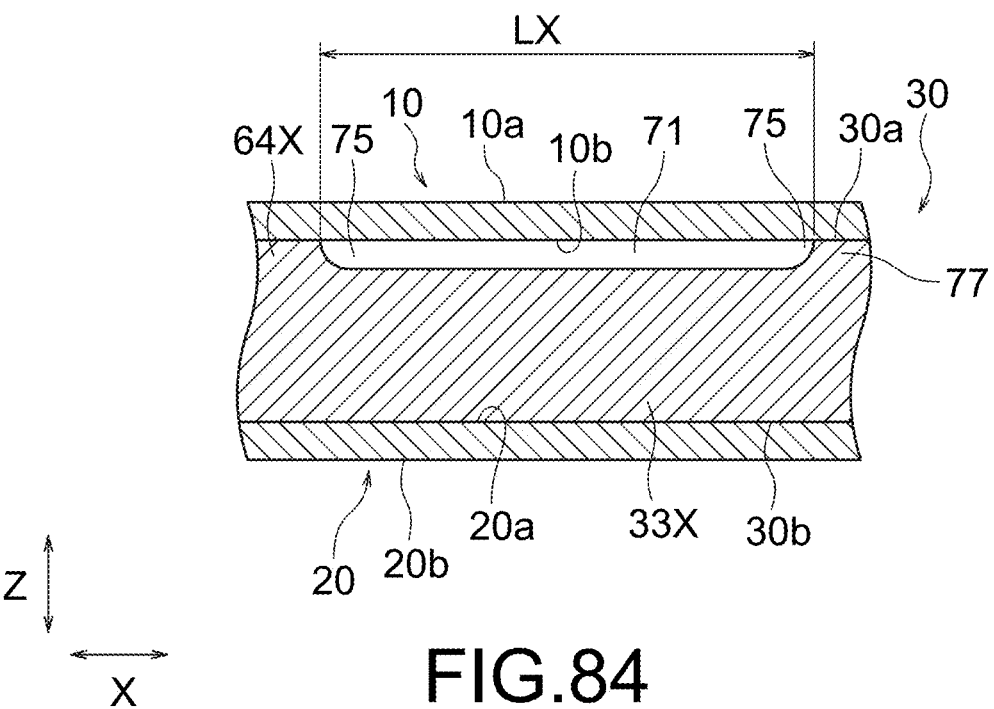
FIG. 84 is a sectional view of the storage flow path portion taken along a line P-P in FIG. 83.

In an example described according to the second embodiment described above, the storage flow path portions 70 are located at the second land end portions 33b of the first land portions 33X. The present disclosure, however, is not limited thereto. For example, as illustrated in FIG. 83 and FIG. 84, the storage flow path portions 70 may be in contact with the first liquid flow path portions 60X on the first sides in the X direction and may be in contact with first partition walls 77 on the second sides in the X direction. The storage flow path portions 70 are in contact with the first partition walls 77 opposite the first liquid flow path portions 60X. The storage flow path portions 70 may be located between the first liquid flow path portions 60X and the first partition walls 77 in the X direction. The first partition walls 77 may demarcate the storage flow path portions 70 from the other region. The first partition walls 77 may demarcate the storage flow path portions 70 from positions opposite the vaporization region SR. The first partition walls 77 may be located at the second land end portions 33b.

The first partition walls 77 may linearly extend over the entire width of each storage flow path portion 70 in the Y direction. Each first partition wall 77 may linearly extend over the whole of one of the first land portions 33X at which the storage flow path portions 70 are provided in a width direction. The first partition walls 77 may be formed in a rectangular shape such that the Y direction is the longitudinal direction in plan view or may be formed in a rounded rectangular shape. The first partition walls 77 are not etched, and the material of the wick sheet 30 remains at the portions. The first partition walls 77 may be bonded to the first sheet inner surface 10b of the first sheet 10.

The storage flow path portions 70 may include the storage main flow grooves 71 and 72 and the storage communication grooves 75. The storage main flow grooves 71 and 72 and the storage communication grooves 75 may be formed as in the storage main flow grooves 71 and 72 and the storage communication grooves 75 illustrated in FIG. 75. The storage communication grooves 75 may be located between the first partition walls 77 and the storage main flow grooves 71 and 72. The storage communication grooves 75 may linearly extend in the Y direction over the entire width of each first land portion 33X. The working liquid 2b that condenses can move to the storage main flow grooves 71 and 72 via the storage communication grooves 75 that are located between the first partition walls 77 and the storage main flow grooves 71 and 72.

Also, in an example illustrated in FIG. 83 and FIG. 84, the first surface residual ratio of the storage flow path portions 70 may be lower than the second surface residual ratio of the first liquid flow path portions 60X. The dimension LX for calculating the first surface residual ratio is defined as a distance from an edge portion of one of the first partition walls 77 in contact with the storage flow path portions 70 to an edge portion of one of the first projecting portions 64X in contact with the storage flow path portions 70.

Also, in the example illustrated in FIG. 83 and FIG. 84, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction according to the present embodiment described above.

According to the modification illustrated in FIG. 83 and FIG. 84, the first partition walls 77 enable the storage flow path portions 70 to be demarcated from the other region. This enables the amount of the working liquid 2*b* that is stored at the storage flow path portions 70 to be increased.

Figure 85:
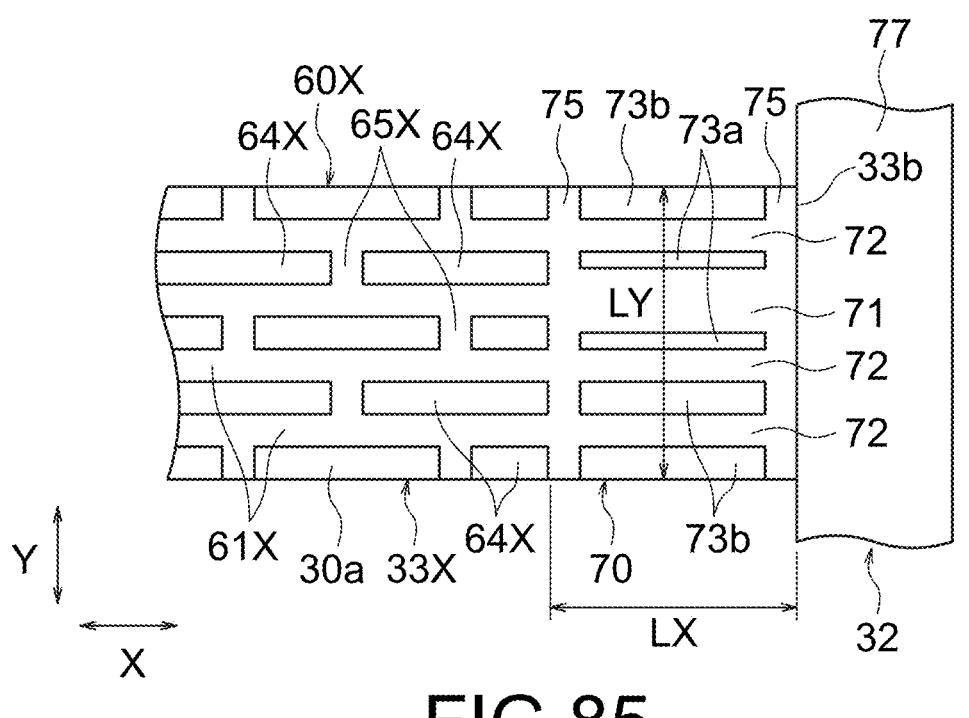
FIG. 85 is a partial enlarged plan view of another modification to the storage flow path portion illustrated in FIG. 75.

As illustrated in FIG. 85, the first partition walls 77 may be located on the frame portion 32. In other words, the first partition walls 77 may form parts of the frame portion 32. In an example illustrated in FIG. 85, the second land end portions 33*b* of the first land portions 33X are connected to the frame portion 32. In this case, the storage flow path portions 70 are not in contact with the vapor passages 51 and 52 opposite the first liquid flow path portions 60X. The storage flow path portions 70 are in contact with the vapor passages 51 and 52 on both sides in the Y direction. The first vapor passage 51 may not be formed between the second land end portions 33*b* and the frame portion 32.

Also, in the example illustrated in FIG. 85, the first surface residual ratio of the storage flow path portions 70 may be lower than the second surface residual ratio of the first liquid flow path portions 60X. The dimension LX in the X direction and the dimension LY in the Y direction for calculating the first surface residual ratio are obtained as in the example illustrated in FIG. 83 and FIG. 84.

Also, in the example illustrated in FIG. 85, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction according to the present embodiment described above.

According to the modification illustrated in FIG. 85, the storage flow path portions 70 can be demarcated from the other region. This enables the amount of the working liquid 2*b* that is stored at the storage flow path portions 70 to be increased.

In the examples illustrated in FIG. 83 to FIG. 85, the storage flow path portions 70 may be formed by the storage recessed portions 76 illustrated in FIG. 80 to FIG. 82.

A thirty-sixth modification will be described.

In an example described according to the second embodiment described above, the second land end portions 33*b* at which the storage flow path portions 70 are located in the condensation region CR far from the vaporization region SR. The present disclosure, however, is not limited thereto. For example, the second land end portions 33*b* at which the storage flow path portions 70 are located may be located near the vaporization region SR or may be located in the vaporization region SR. In this case, when the amount of vaporization of the working liquid 2*b* in the vaporization region SR is large, the working liquid 2*b* that is stored at the storage flow path portions 70 can be more rapidly transported to the position at which the amount of vaporization is large. For this reason, the amount of vaporization of the working liquid 2*b* can be increased, and the heat dissipation performance of the vapor chamber 1 can be further improved.

A thirty-seventh modification will be described.

Figure 86:
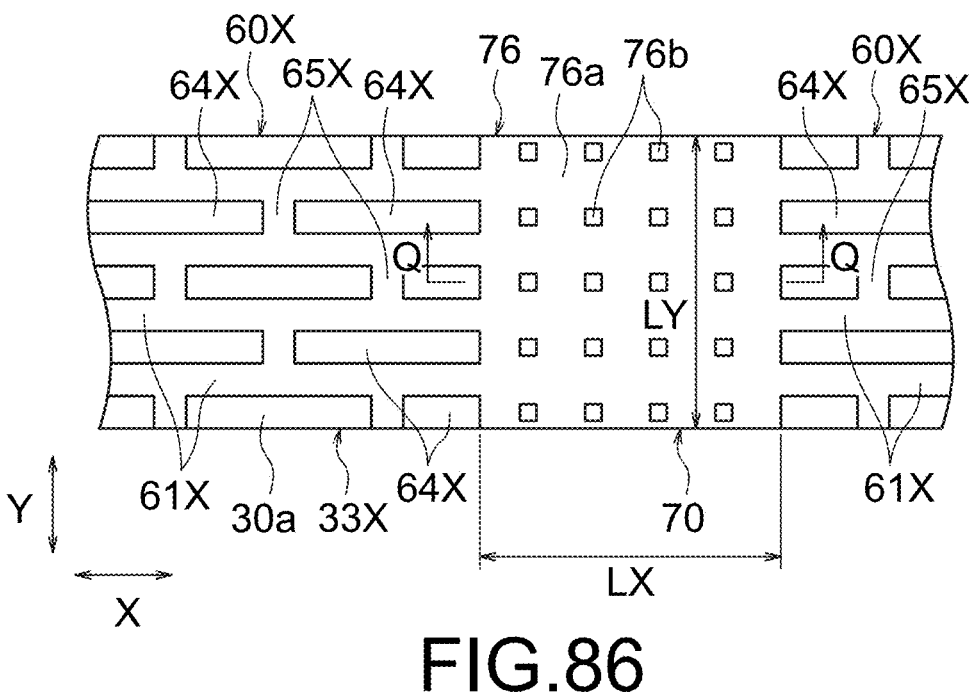
FIG. 86 is a partial enlarged plan view of another modification to the storage flow path portion illustrated in FIG. 75.
Figure 87:
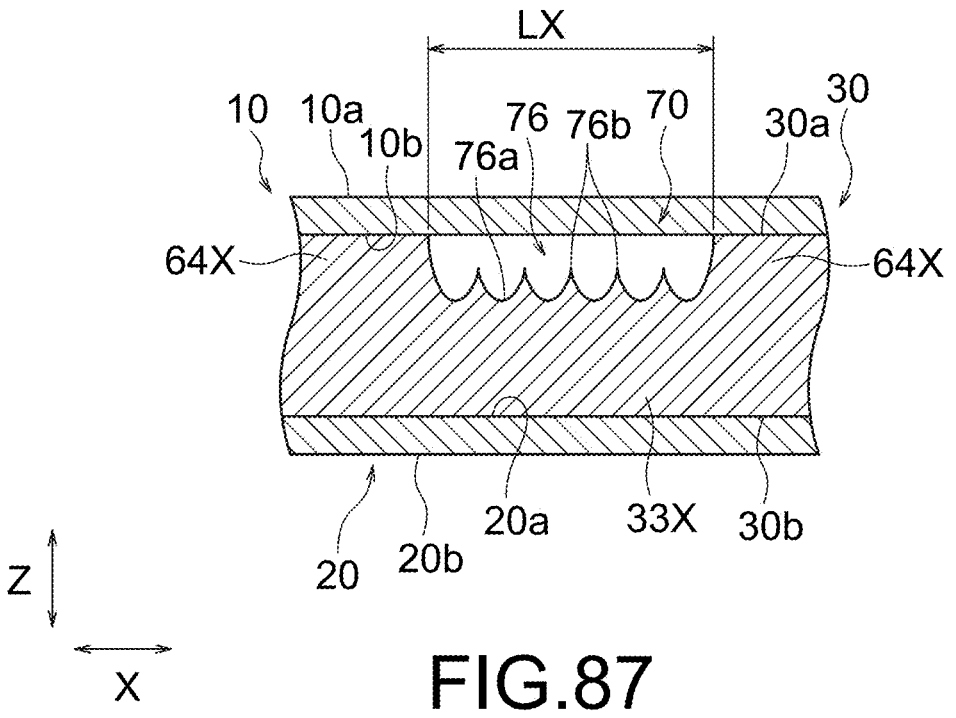
FIG. 87 is a sectional view of the storage flow path portion taken along a line Q-Q in FIG. 86.

In an example described according to the second embodiment described above, the storage flow path portions 70 are in contact with the first liquid flow path portions 60X on the first sides in the X direction and are in contact with the first vapor passage 51 on the second sides in the X direction. The present disclosure, however, is not limited thereto. For example, as illustrated in FIG. 86 and FIG. 87, the storage flow path portions 70 may not be in contact with the vapor passages 51 and 52 opposite the first liquid flow path portions 60X. The storage flow path portions 70 may be in contact with the first liquid flow path portions 60X on both sides in the X direction. More specifically, the storage flow path portions 70 are in contact with the first liquid flow path portions 60X on the first sides in the X direction and are in contact with the first liquid flow path portions 60X on the second sides in the X direction. The storage flow path portion 70 illustrated in FIG. 86 is located at intermediate positions on the first liquid flow path portions 60X and divides the first liquid flow path portions 60X in the X direction. The storage recessed portions 76 may be in contact with the vapor passages 51 and 52 on both sides in the Y direction.

The first main flow grooves 61X that are located on both sides of the storage flow path portions 70 in the X direction may be located at the same position in the Y direction. In this case, the first main flow grooves 61X that are located on the first sides in the X direction may be located along extension lines from the first main flow grooves 61X corresponding thereto on the second sides.

The storage flow path portions 70 may include the storage recessed portions 76. The storage recessed portions 76 may be formed as in the storage recessed portions 76 illustrated in FIG. 80 and FIG. 81.

Also, in an example illustrated in FIG. 86 and FIG. 87, the first surface residual ratio of the storage flow path portions 70 may be lower than the second surface residual ratio of the first liquid flow path portions 60X. The dimension LX for calculating the first surface residual ratio is defined as a distance from an edge portion of one of the first projecting portions 64X that are located on the first sides in the X direction in contact with the storage flow path portions 70 to an edge portion of one of the first projecting portions 64X that are located on the second sides in contact with the storage flow path portions 70.

Also, in the example illustrated in FIG. 86 and FIG. 87, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above.

According to the modification illustrated in FIG. 86 and FIG. 87, the working liquid 2*b* that condenses at positions near the storage flow path portions 70 directly moves to the storage recessed portions 76 of the storage flow path portions 70. The working liquid 2*b* moves, to the storage recessed portions 76, from the first liquid flow path portions 60X that are farther than the storage flow path portions 70 from the vaporization region SR. Portions of the working liquid 2*b* that move to the storage recessed portions 76 do not move to the first liquid flow path portions 60X that are located near the vaporization region SR and can be stored at the storage recessed portions 76. For this reason, the amount of the working liquid 2*b* that is stored at the storage flow path portions 70 can be increased. Portions of the working liquid 2*b* that are stored at the storage recessed portions 76 move to the first main flow grooves 61X due to the capillary action and are transported to the vaporization region SR.

In the example illustrated in FIG. 86 and FIG. 87, the storage flow path portions 70 include the storage recessed portions 76 at which the protrusions 76b are formed on the storage bottom surfaces 76a as in the example illustrated in FIG. 80 and FIG. 81. The present disclosure, however, is not limited thereto, and the structures of the storage flow path portions 70 are freely determined. For example, the storage flow path portions 70 may be formed by the storage main flow grooves 71 and 72 illustrated in FIG. 75 to FIG. 79.

In the case where the storage flow path portions 70 are in contact with the first liquid flow path portions 60X on both sides in the X direction as described above, the storage flow path portions 70 can be located in the vaporization region SR or can be located at positions near the vaporization region SR. In this case, when the amount of vaporization of the working liquid 2b in the vaporization region SR is large, the working liquid 2b that is stored at the storage flow path portions 70 can be more rapidly transported to the position at which the amount of vaporization is large. For this reason, the amount of vaporization of the working liquid 2b can be increased, and the heat dissipation performance of the vapor chamber 1 can be further improved.

A thirty-eighth modification will be described.

In an example described according to the thirty-seventh modification described above, the storage recessed portions 76 are in contact with the vapor passages 51 and 52 on both sides in the Y direction. The present disclosure, however, is not limited thereto. For example, as illustrated in FIG. 88 and FIG. 89, second partition walls 78 may be located on the first body surface 30a at the first land portions 33X.

The second partition walls 78 may be located on both sides of the storage recessed portions 76 in the Y direction. The second partition walls 78 may demarcate the storage recessed portions 76 from the vapor passages 51 and 52. The second partition walls 78 are located between the vapor passages 51 and 52 and the storage recessed portions 76 in the Y direction. The second partition walls 78 may be formed in a rectangular shape such that the X direction is the longitudinal direction in plan view or may be formed in a rounded rectangular shape. The second partition walls 78 are not etched, and the material of the wick sheet 30 remains at the portions. The second partition walls 78 may be bonded to the first sheet inner surface 10b of the first sheet 10. The dimensions in the X direction of the two second partition walls 78 may be equal to each other. The second partition walls 78 may be located at the same position in the X direction. The second partition walls 78 may be continuously formed at the first projecting portions 64X that are located on both sides in the X direction.

The storage flow path portions 70 may include the storage recessed portions 76 at which the protrusions 76b are formed on the storage bottom surfaces 76a, and the structures of the storage flow path portions 70 are freely determined.

Figures 88, 89:
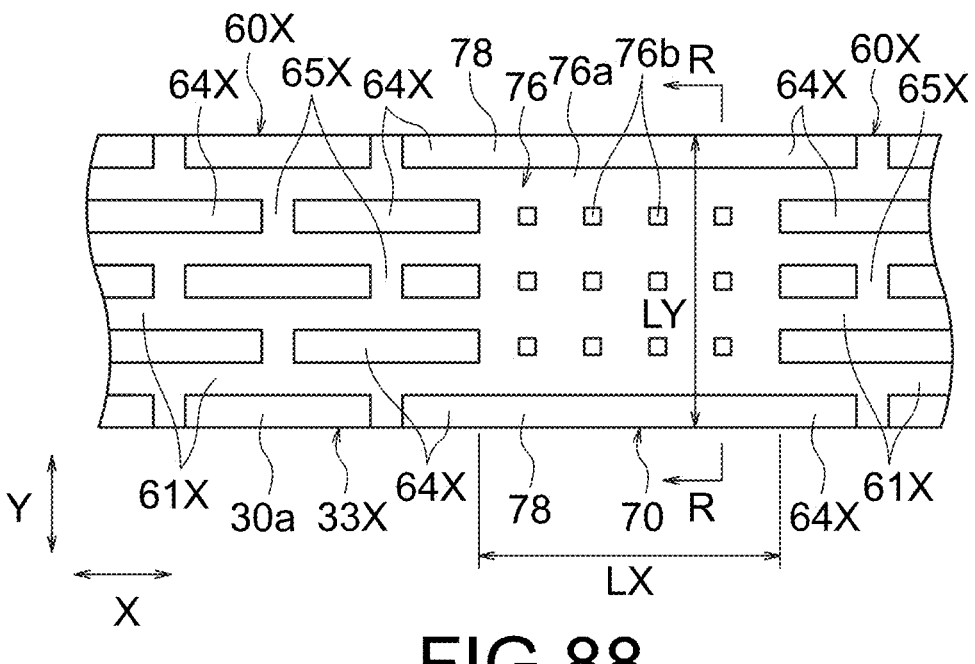
FIG. 88 is a partial enlarged plan view of another modification to the storage flow path portion illustrated in FIG. 75.
FIG. 89 is a sectional view of the storage flow path portion taken along a line R-R in FIG. 88.

Also, in an example illustrated in FIG. 88 and FIG. 89, the flow path sectional areas of the storage flow path portions 70 perpendicular to the X direction may be larger than the flow path sectional areas of the first liquid flow path portions 60X perpendicular to the X direction as in the example illustrated in FIG. 80 and FIG. 81. The flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above.

Also, in the example illustrated in FIG. 88 and FIG. 89, the first surface residual ratio of the storage flow path portions 70 may be lower than the second surface residual ratio of the first liquid flow path portions 60X. The dimension LX for calculating the first surface residual ratio is defined as a distance from an edge portion of one of the first projecting portions 64X that are located on the first sides in the X direction in contact with the storage flow path portions 70 to an edge portion of one of the first projecting portions 64X that are located on the second sides in contact with the storage flow path portions 70. The dimension LY corresponds to the entire width of each first land portion 33X at the first body surface 30a. The second partition walls 78 are included in the storage flow path portions 70.

According to the modification illustrated in FIG. 88 and FIG. 89, the second partition walls 78 demarcate the storage recessed portions 76 of the storage flow path portions 70 from the vapor passages 51 and 52. This enables the working liquid 2b that is stored at the storage recessed portions 76 to be inhibited from moving from the storage recessed portions 76 to the vapor passages 51 and 52. For this reason, the amount of the working liquid 2b stored can be increased.

Figures 90, 91:
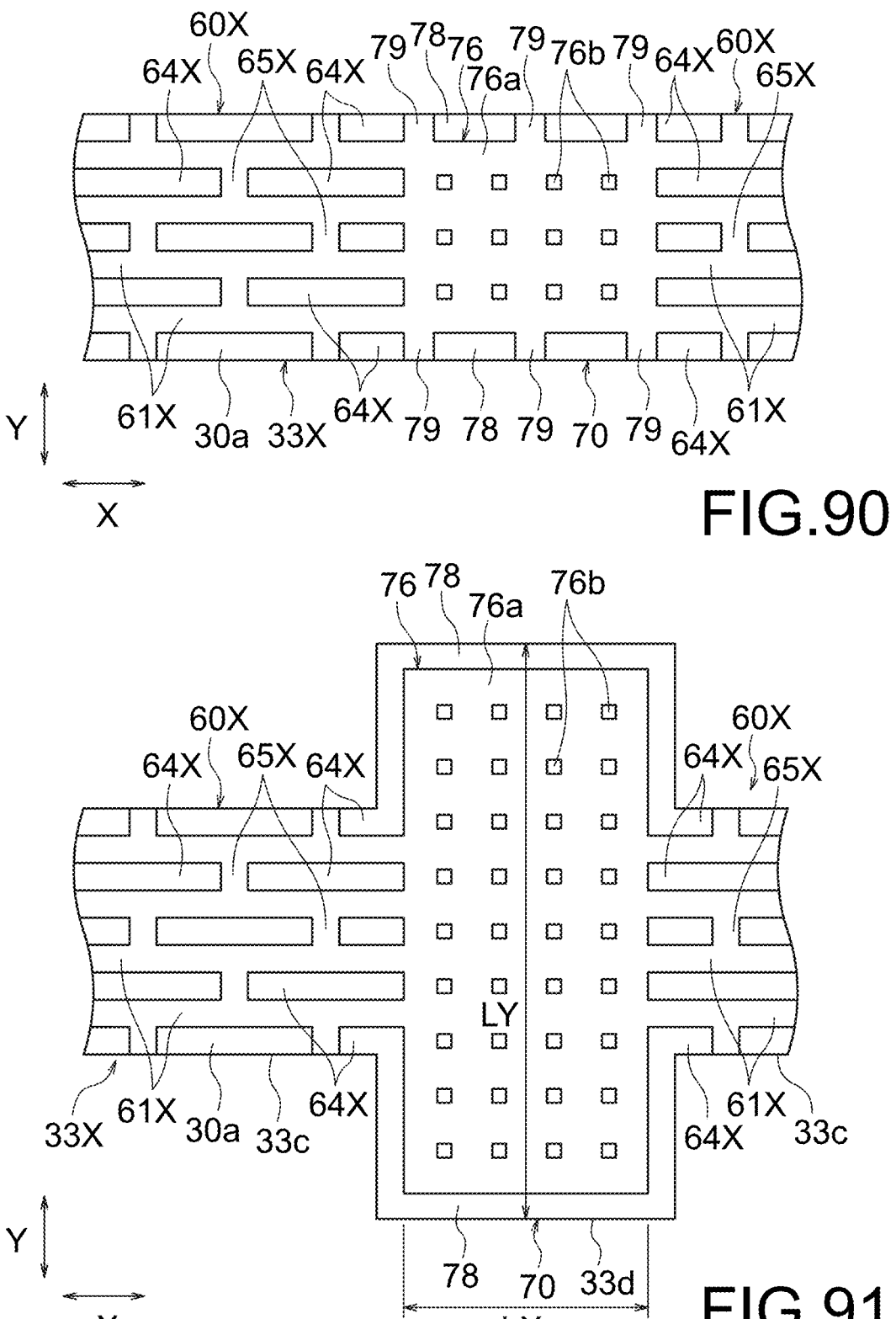
FIG. 90 is a partial enlarged plan view of another modification to the storage flow path portion illustrated in FIG. 75.
FIG. 91 is a partial enlarged plan view of another modification to the storage flow path portion illustrated in FIG. 75.

As illustrated in FIG. 90, partition wall grooves 79 that connect the vapor passages 51 and 52 and the storage recessed portions 76 of the storage flow path portions 70 to each other may be located at the second partition walls 78. The partition wall grooves 79 may extend in a direction that differs from the X direction. In an example illustrated in FIG. 90, the partition wall grooves 79 extend in the Y direction. In the example illustrated in FIG. 90, three partition wall grooves 79 are located at each second partition wall 78, but the number of the partition wall grooves 79 is freely determined.

The flow path sectional areas of the partition wall grooves 79 may be equal to or may differ from the flow path sectional areas of the first communication grooves 65X. The partition wall grooves 79 may have small flow path sectional areas such that the working liquid 2b mainly flows due to the capillary action. The flow path sectional areas of the partition wall grooves 79 may be smaller than the flow path sectional areas of the vapor passages 51 and 52. The width of each partition wall groove 79 may be equal to or may differ from the width of each first communication groove 65X. The width of each partition wall groove 79 corresponds to a dimension in the X direction at the first body surface 30a. The depth of each partition wall groove 79 may be equal to or may differ from the depth of each first communication groove 65X. The depth of each partition wall groove 79 corresponds to the dimension in the Z direction of the partition wall groove 79. The partition wall grooves 79 may be formed as in the first communication grooves 65X.

Also, in the example illustrated in FIG. 90, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above. However, the flow path sectional areas of the storage flow path portions 70 perpendicular to the X direction are equal to the maximum flow path sectional area of flow path sectional areas at freely determined positions in the X direction other than positions at which the partition wall grooves 79 are present.

According to the modification illustrated in FIG. 90, the partition wall grooves 79 enable the working liquid 2b that condenses at positions near the storage flow path portions 70 to directly move to the storage recessed portions 76. This enables the amount of the working liquid 2b that is stored at the storage recessed portions 76 to be increased.

A thirty-ninth modification will be described.

In an example described according to the second embodiment described above, the planar shapes of the first land portions 33X are elongated rectangular shapes. The present disclosure, however, is not limited thereto. For example, as illustrated in FIG. 91, the first land portions 33X may include land body portions 33c and land wide portions 33d that have widths more than the widths of the land body portions 33c. The storage flow path portions 70 may be located on the first body surface 30a at the land wide portions 33d. The width of each storage flow path portion 70 may be more than the width of each land body portion 33c. The width of each land body portion 33c and the width of each land wide portion 33d correspond to dimensions in the Y direction at the first body surface 30a.

More specifically, the land body portions 33c may be located on both sides of the land wide portions 33d in the X direction. One of the land body portions 33c is located nearer than the land wide portions 33d to the vaporization region SR, and the other land body portion 33c may be located farther than the land wide portions 33d from the vaporization region SR. The land wide portions 33d may be located between one of the land body portions 33c and the other land body portion 33c in the X direction. The land wide portions 33d are located on intermediate positions on the first land portions 33X and divide the first land portions 33X in the X direction.

The width of each land wide portion 33d is more than the width of each land body portion 33c. The land wide portions 33d may project from both sides of the land body portions 33c in the Y direction. The present disclosure, however, is not limited thereto, and the land wide portions 33d may project from the first sides of the land body portions 33c in the Y direction and may not project from the second sides thereof.

The land wide portions 33d of the first land portions 33X may be located at the same position in the X direction or may be located at different positions.

The storage flow path portions 70 may include the storage recessed portions 76 at which the protrusions 76b are formed on the storage bottom surfaces 76a. The storage recessed portions 76 may be formed as in the storage recessed portions 76 illustrated in FIG. 88 and FIG. 89. The storage recessed portions 76 are formed on the first body surface 30a at the land wide portions 33d. The width of each storage recessed portion 76 is more than the width of each land body portion 33c. The storage recessed portions 76 may project from both sides of the land body portions 33c in the Y direction.

The storage flow path portions 70 may be in contact with the first liquid flow path portions 60X on both sides in the X direction. The storage flow path portions 70 are located at intermediate positions on the first liquid flow path portions 60X and divide the first liquid flow path portions 60X in the X direction.

The second partition walls 78 may demarcate the storage recessed portions 76 from the vapor passages 51 and 52. The second partition walls 78 may be located on both sides of the storage recessed portions 76 in the Y direction. The second partition walls 78 are located between the vapor passages 51 and 52 and the storage recessed portions 76. The second partition walls 78 may be formed in a U-shape so as to surround parts of the storage recessed portions 76 that project from the land body portions 33c in the Y direction.

The second partition walls 78 may be continuously formed at the first projecting portions 64X that are located on both sides in the X direction.

Also, in an example illustrated in FIG. 91, the flow path sectional areas of the storage flow path portions 70 perpendicular to the X direction may be larger than the flow path sectional areas of the first liquid flow path portions 60X perpendicular to the X direction as in the example illustrated in FIG. 80 and FIG. 81. Also, in the example illustrated in FIG. 91, the flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above.

Also, in the example illustrated in FIG. 91, the first surface residual ratio of the storage flow path portions 70 may be lower than the second surface residual ratio of the first liquid flow path portions 60X. The dimension LX for calculating the first surface residual ratio is defined as a distance from an edge portion of one of the first projecting portions 64X that are located on the first sides in the X direction in contact with the storage flow path portions 70 to an edge portion of one of the first projecting portions 64X that are located on the second sides in contact with the storage flow path portions 70. The dimension LY corresponds to the entire width of each land wide portion 33d at the first body surface 30a. Portions of the second partition walls 78 illustrated by using an arrow for the dimension LX in FIG. 91 are included in the storage flow path portions 70.

According to the modification illustrated in FIG. 91, the width of each storage recessed portion 76 is more than the width of each land body portion 33c. This enables the volumes of the storage recessed portions 76 to be increased and enables the amount of the working liquid 2b that is stored at the storage recessed portions 76 to be increased.

In the example illustrated in FIG. 91, the storage flow path portions 70 include the storage recessed portions 76 at which the protrusions 76b are formed on the storage bottom surfaces 76a as in the example illustrated in FIG. 89. The present disclosure, however, is not limited thereto, and the structures of the storage flow path portions 70 are freely determined.

A fortieth modification will be described.

Figure 92:
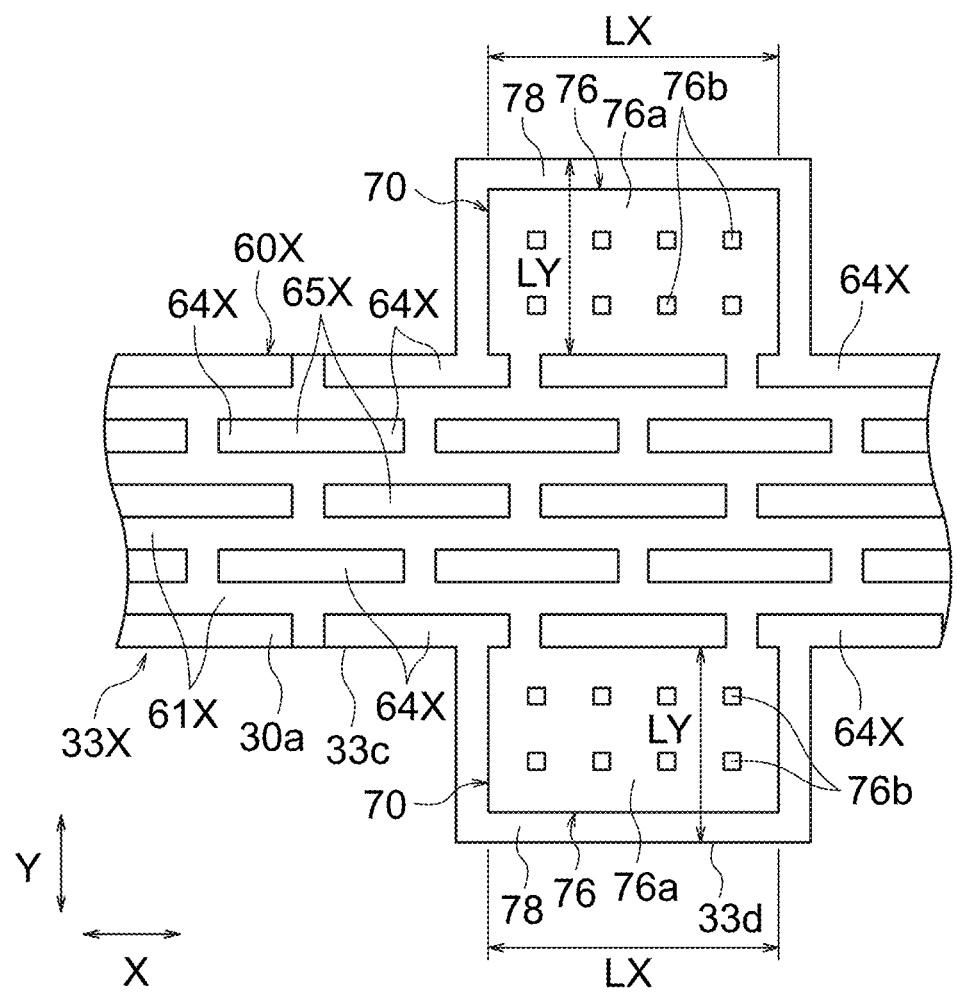
FIG. 92 is a partial enlarged plan view of another modification to the storage flow path portion illustrated in FIG. 75.

In an example described according to the thirty-ninth modification described above, the width of each storage recessed portion 76 is more than the width of each land body portion 33c. The present disclosure, however, is not limited thereto. For example, as illustrated in FIG. 92, two storage flow path portions 70 may be located on the first body surface 30a, and the two storage flow path portions 70 may be located at different positions in the Y direction. Each first liquid flow path portion 60X may be located between two storage flow path portions 70.

More specifically, as illustrated in FIG. 91, the storage flow path portions 70 may be located at parts of the land wide portions 33d that project from the land body portions 33c in the Y direction. The storage flow path portions 70 may not be formed between the parts.

The storage flow path portions 70 may include the storage recessed portions 76 at which the protrusions 76b are formed on the storage bottom surfaces 76a. The storage recessed portions 76 are formed on the first body surface 30a at the land wide portions 33d. The second partition walls 78 may demarcate the storage recessed portions 76 from the vapor passages 51 and 52. The storage recessed portions 76 may be formed at parts of the land wide portions 33d that project from the land body portions 33c in the Y direction when viewed in the X direction. The present disclosure, however, is not limited thereto, and the storage recessed portions 76 may extend toward the centers of the first land portions 33X in the Y direction and may enter the first liquid flow path portions 60X. In other words, the storage recessed portions 76 may be formed also at parts of the land wide portions 33d that overlap the land body portions 33c when viewed in the X direction.

Each first liquid flow path portion 60X may be located between two storage recessed portions 76 in the Y direction. The first liquid flow path portions 60X extend in the X direction across the storage recessed portions 76. The storage recessed portions 76 may be connected to the first main flow grooves 61X with the first communication grooves 65X of the first liquid flow path portions 60X interposed therebetween. The storage recessed portions 76 may be connected to the first main flow grooves 61X with the multiple first communication grooves 65X that are located at different positions in the X direction interposed therebetween. The working liquid 2b moves from the first communication grooves 65X to the storage recessed portions 76, and the working liquid 2b in the storage recessed portions 76 moves from the first communication grooves 65X to the first main flow grooves 61X.

Also, in an example illustrated in FIG. 92, the flow path sectional areas of the storage flow path portions 70 perpendicular to the X direction may be larger than the flow path sectional areas of the first liquid flow path portions 60X perpendicular to the X direction. Also, in the example illustrated in FIG. 92, the flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above.

Also, in the example illustrated in FIG. 92, the first surface residual ratio of the storage flow path portions 70 may be lower than the second surface residual ratio of the first liquid flow path portions 60X. The dimension LX for calculating the first surface residual ratio is defined as a distance from an edge portion of one of the first projecting portions 64X that are located on the first sides in the X direction in contact with the storage flow path portions 70 to an edge portion of one of the first projecting portions 64X that are located on the second sides in contact with the storage recessed portions 76. The dimension LY is defined as a distance in the Y direction from an outer edge portion of one of the land wide portions 33d in the Y direction to an edge portion of the first projecting portion 64X nearest to the outer edge portion in contact with one of the storage recessed portions 76. Portions of the second partition walls 78 illustrated by using an arrow for the dimension LX in FIG. 92 are included in the storage flow path portions 70.

According to the modification illustrated in FIG. 92, each first liquid flow path portion 60X is located between two storage recessed portions 76. This enables disruption of transportation of the working liquid 2b to the vaporization region SR to be reduced. For this reason, the transport efficiency of the working liquid 2b to the vaporization region SR can be improved, and the working liquid 2b in the vaporization region SR can be inhibited from being lacking. The working liquid 2b can be stored at the two storage recessed portions 76. In the case where the amount of vaporization of the working liquid 2b in the vaporization region SR is small, the working liquid 2b can be stored at the two storage recessed portions 76. In the case where the amount of vaporization of the working liquid 2b in the vaporization region SR is large, the working liquid 2b that is stored at the storage recessed portions 76 can be transported to the vaporization region SR via the first liquid flow path portions 60X.

In an example described according to the fortieth modification described above, the storage recessed portions 76 are located on both sides of the first land portions 33X in the Y direction. The present disclosure, however, is not limited thereto, and the land wide portions 33d may project from the first sides of the land body portions 33c in the Y direction and may not project from the second sides thereof. In this case, the storage recessed portions 76 may be located on the first sides of the first land portions 33X, and the storage recessed portions 76 may not be located on the second sides thereof.

According to the modification illustrated in FIG. 92, the storage flow path portions 70 include the storage recessed portions 76 at which the protrusions 76b are formed on the storage bottom surfaces 76a. The present disclosure, however, is not limited thereto, and the structures of the storage flow path portions 70 are freely determined.

A forty-first modification will be described.

Figure 93:
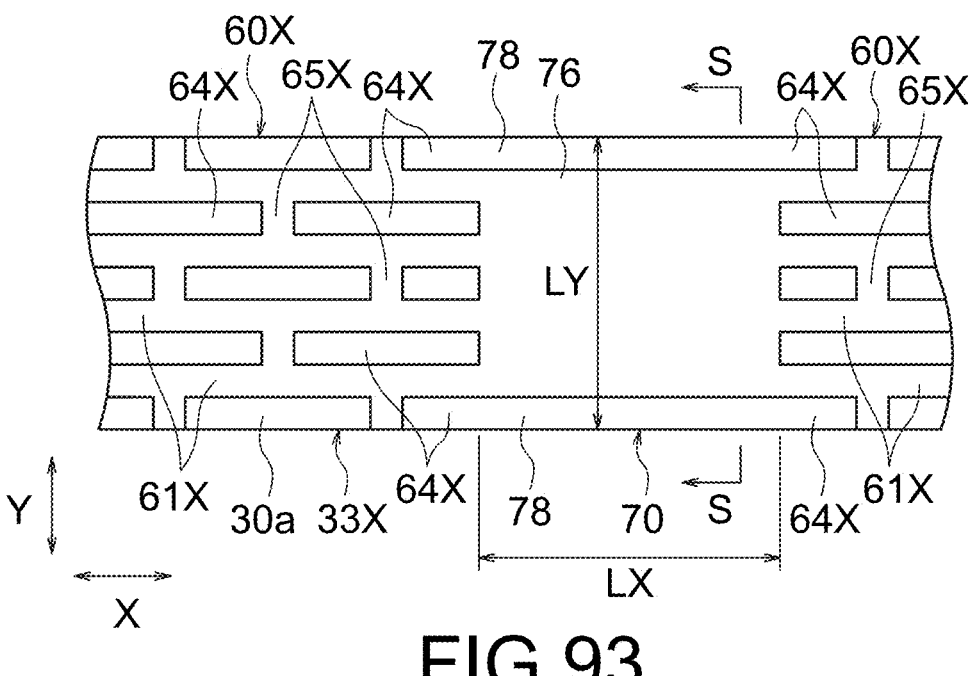
FIG. 93 is a partial enlarged plan view of another modification to the storage flow path portion illustrated in FIG. 75.
Figure 94:
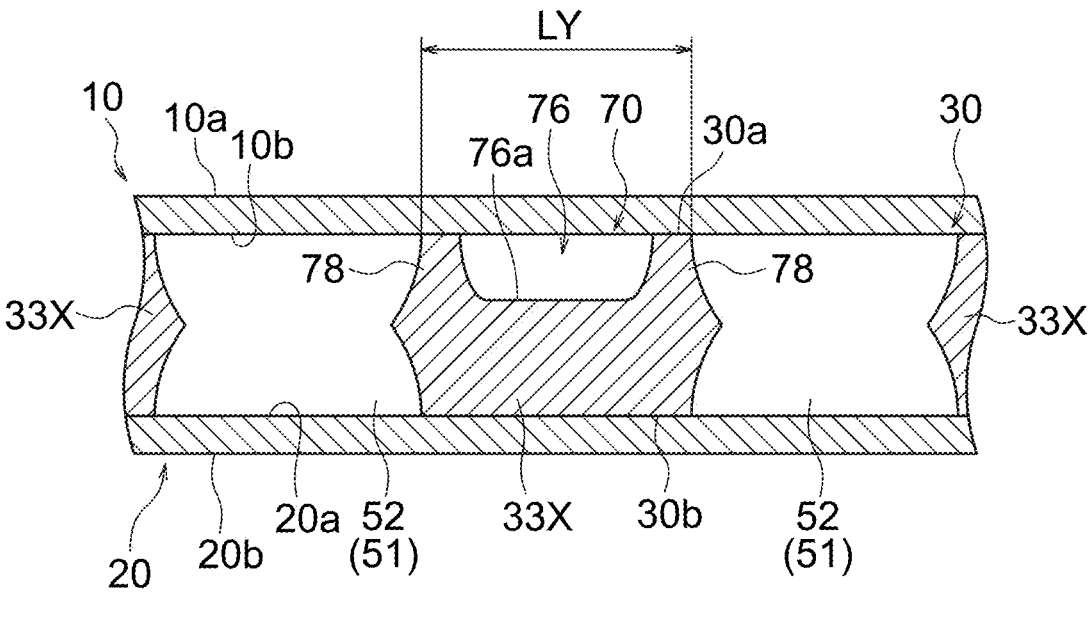
FIG. 94 is a sectional view of the storage flow path portion taken along a line S-S in FIG. 93.

In an example described according to the thirty-eighth modification described above, the second partition walls 78 are located on both sides of the storage flow path portions 70 in the Y direction, and the storage flow path portions 70 include the storage recessed portions 76 at which the protrusions 76b are formed on the storage bottom surfaces 76a. The present disclosure, however, is not limited thereto. For example, as illustrated in FIG. 93 and FIG. 94, the protrusions 76b may not be formed on the storage bottom surfaces 76a of the storage recessed portions 76. In this case, the flow path sectional areas of the storage recessed portions 76 can be increased, and the amount of the working liquid 2b stored can be increased. The storage bottom surfaces 76a may be substantially flat. The storage recessed portions 76 may be formed in a rectangular shape in the X direction and the Y direction in plan view.

Also, in an example illustrated in FIG. 93, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 82 described above.

According to the modification illustrated in FIG. 93 and FIG. 94, the protrusions 76b are not formed on the storage bottom surfaces 76a of the storage recessed portions 76, and accordingly, the flow path resistance of the working liquid 2b in the storage recessed portions 76 can be decreased.

Figure 95:
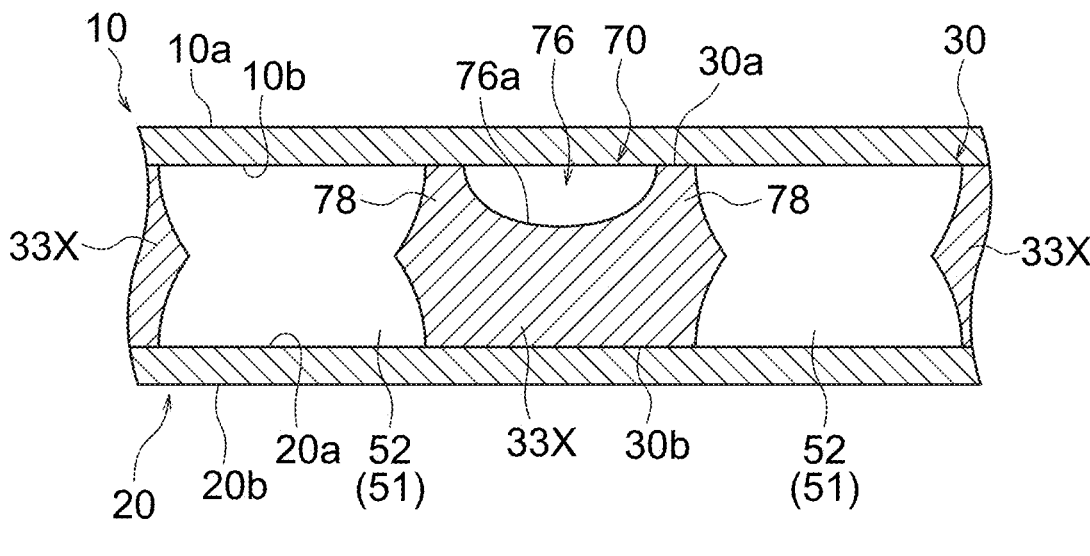
FIG. 95 is a sectional view of a modification to the storage flow path portion illustrated in FIG. 94.
Figure 95:
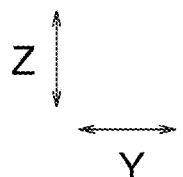

As illustrated in FIG. 95, the storage bottom surfaces 76a of the storage recessed portions 76 may not be flat but may curve. In this case, the flow path resistance for the working liquid 2b can be decreased. Also, in an example illustrated in FIG. 95, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 82 described above.

Figure 96:
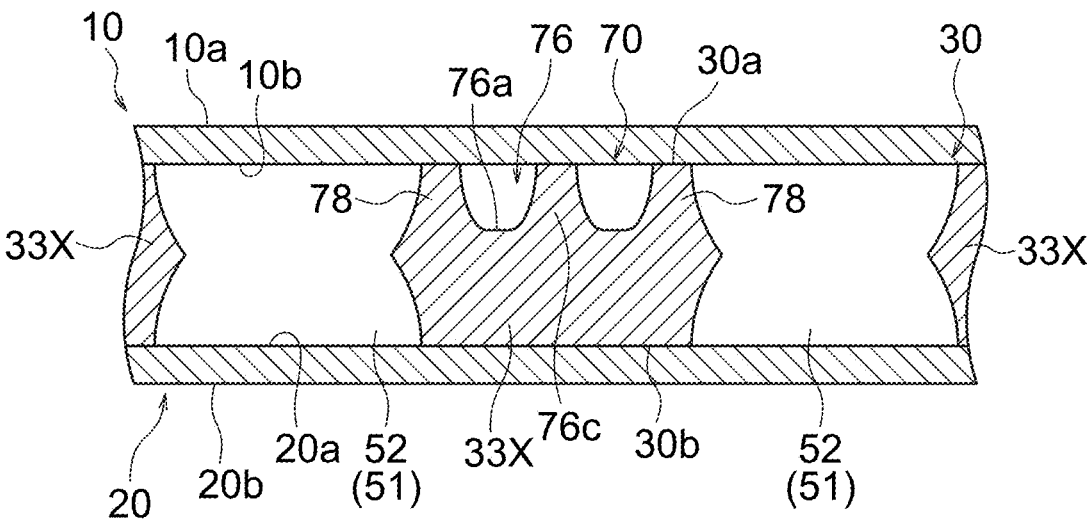
FIG. 96 is a sectional view of another modification to the storage flow path portion illustrated in FIG. 94.
Figure 96:
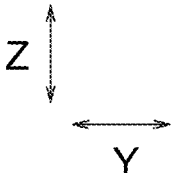

As illustrated in FIG. 96, protrusions 76*c* that extend to the first body surface 30*a* may be formed on the storage bottom surfaces 76*a* of the storage recessed portions 76. The protrusions 76*c* may be connected to the first sheet inner surface 10*b* of the first sheet 10. In this case, the mechanical strength of the vapor chamber 1 can be improved. Also, in an example illustrated in FIG. 96, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are equal to the maximum flow path sectional area of flow path sectional areas at freely determined positions in the X direction.

Also, in the examples illustrated in FIG. 93 to FIG. 96, the dimension LX in the X direction and the dimension LY in the Y direction for calculating the first surface residual ratio are obtained as in the example illustrated in FIG. 88 and FIG. 89.

A forty-second modification will be described.

Figure 97:
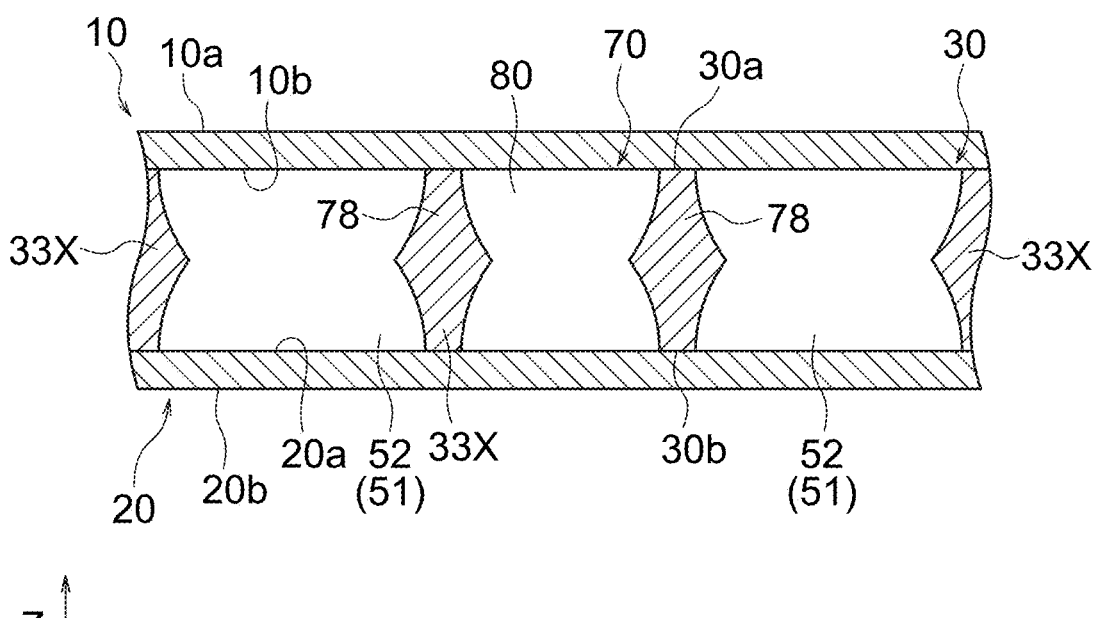
FIG. 97 is a sectional view of another modification to the storage flow path portion illustrated in FIG. 94.

In an example described according to the forty-second modification described above, the second partition walls 78 are located on both sides of the storage flow path portions 70 in the Y direction, and the storage flow path portions 70 include the storage recessed portions 76 at which the protrusions 76*b* are formed on the storage bottom surfaces 76*a*. The present disclosure, however, is not limited thereto. For example, as illustrated in FIG. 97, the storage flow path portions 70 may include through-spaces 80 that extend from the first body surface 30*a* to the second body surface 30*b*. The through-spaces 80 may be formed by being etched from the first body surface 30*a* and by being etched from the second body surface 30*b*. The sectional shapes of the through-spaces 80 may be the same as the sectional shapes of the vapor passages 51 and 52 but are freely determined. The second partition walls 78 that demarcate the through-spaces 80 from the vapor passages 51 and 52 may be located on the first body surface 30*a* at the first land portions 33X. The planar shapes of the through-spaces 80 may be the same as those of the storage recessed portions 76 illustrated in FIG. 93.

Also, in an example illustrated in FIG. 97, the flow path sectional areas of the storage flow path portions 70 perpendicular to the X direction may be larger than the flow path sectional areas of the first liquid flow path portions 60X perpendicular to the X direction. Also, in the example illustrated in FIG. 97, the flow path sectional areas of the storage flow path portions 70 perpendicular to the X direction are defined in the same manner as the flow path sectional areas of the storage flow path portions 70 perpendicular to the X direction in the example illustrated in FIG. 93 and FIG. 94 described above.

According to the modification illustrated in FIG. 97, the storage flow path portions 70 include the through-spaces 80, the volumes of the storage flow path portions 70 can be consequently increased, and the amount of the working liquid 2*b* that is stored at the storage flow path portions 70 can be increased.

A forty-third modification will be described.

Figures 98, 99:
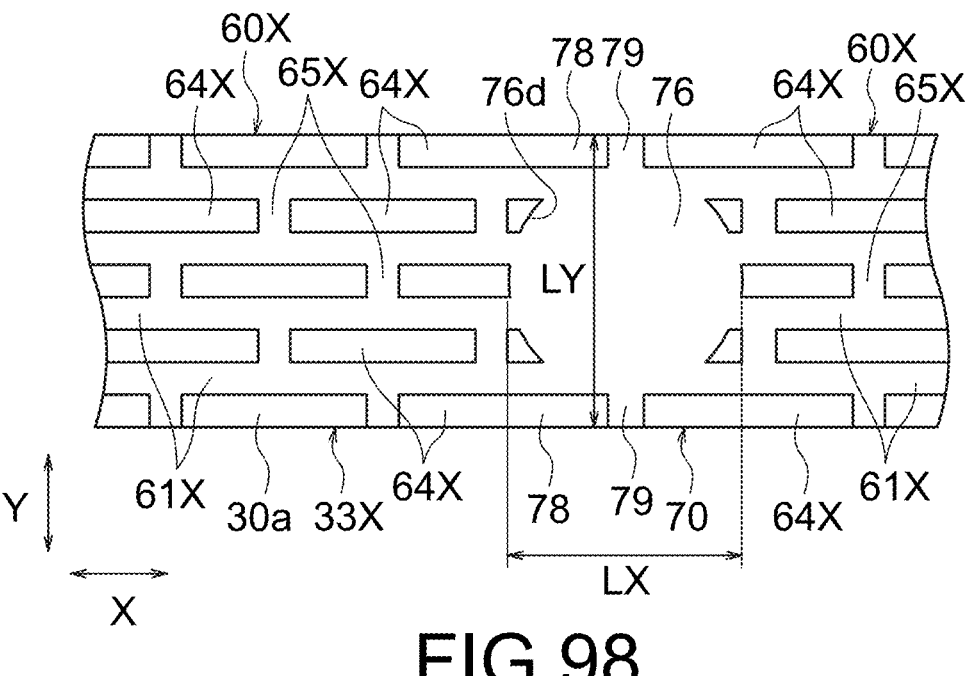
FIG. 98 is a partial enlarged plan view of another modification to the storage flow path portion illustrated in FIG. 75.
FIG. 99 is a partial enlarged plan view of another modification to the storage flow path portion illustrated in FIG. 75.

In an example described according to the forty-first modification described above, the storage recessed portions 76 are formed in a rectangular shape in the X direction and the Y direction in plan view. The present disclosure, however, is not limited thereto, and the planar shapes of the storage recessed portions 76 are freely determined. For example, as illustrated in FIG. 98, the storage recessed portions 76 may have outer edges 76*d* that curve in plan view. For example, the planar shapes of the storage recessed portions 76 may be circular shapes or may be elliptic shapes as schematically illustrated in FIG. 98. According to the modification illustrated in FIG. 98, the amount of the working liquid 2*b* transported from the storage recessed portions 76 to the first main flow grooves 61X can be uniform. In an example illustrated in FIG. 98, the partition wall grooves 79 are formed at the second partition walls 78.

Also, in the example illustrated in FIG. 98, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are equal to the maximum flow path sectional area of the flow path sectional areas of the storage recessed portions 76 at freely determined positions in the X direction other than the positions at which the partition wall grooves 79 are present.

Also, in the example illustrated in FIG. 98, the first surface residual ratio of the storage flow path portions 70 may be lower than the second surface residual ratio of the first liquid flow path portions 60X. As illustrated in FIG. 98, the dimension LX in the X direction for calculating the first surface residual ratio is obtained as the dimension in the X direction of each storage recessed portion 76. The dimension LY in the Y direction is obtained as in the example illustrated in FIG. 93 and FIG. 94.

As illustrated in FIG. 99, the first main flow grooves 61X may project into the storage recessed portions 76 in plan view. The first main flow grooves 61X project into the storage recessed portions 76 together with the first projecting portions 64X. In this case, even when the amount of the working liquid 2*b* that is stored at the storage recessed portions 76 is small, the working liquid 2*b* can be transported to the first main flow grooves 61X.

Also, in an example illustrated in FIG. 99, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are equal to the maximum flow path sectional area of the flow path sectional areas of the storage recessed portions 76 at freely determined positions in the X direction other than positions at which the first main flow grooves 61X that project are present.

Also, in the example illustrated in FIG. 99, the first surface residual ratio of the storage flow path portions 70 may be lower than the second surface residual ratio of the first liquid flow path portions 60X. The dimension LX in the X direction for calculating the first surface residual ratio is obtained as the dimension in the X direction of a portion of one of the storage recessed portions 76 at which the first main flow groove 61X does not project as illustrated in FIG. 99. More specifically, the dimension LX in the X direction is defined as a distance between a first edge portion of one of the first projecting portions 64X that is located on a first side in the X direction and a second edge portion of one of the first projecting portions 64X that are located on a second side in the X direction. The second side is opposite the first side. The first edge portion is an edge portion farthest from the second edge portion in the X direction among the multiple edge portions of the first projecting portion 64X that is located on the first side in the X direction. The second edge portion is an edge portion farthest from the first edge portion in the X direction among the multiple edge portions of the first projecting portion 64X that is located on the second side in the X direction. The first side described above may be a left-hand side in FIG. 99, and the second side described above may be a right-hand side in FIG. 99. The dimension LY in the Y direction is obtained as in the example illustrated in FIG. 93 and FIG. 94.

A forty-fourth modification will be described.

In an example described according to the second embodiment described above, the storage flow path portions 70 include the first storage main flow grooves 71 that have flow path sectional areas larger than those of the first main flow grooves 61X. The present disclosure, however, is not limited thereto. For example, as illustrated in FIG. 100 and FIG. 101, the storage flow path portions 70 may not include a groove having a flow path sectional area larger than the flow path sectional areas of the first main flow grooves 61X.

Figure 100:
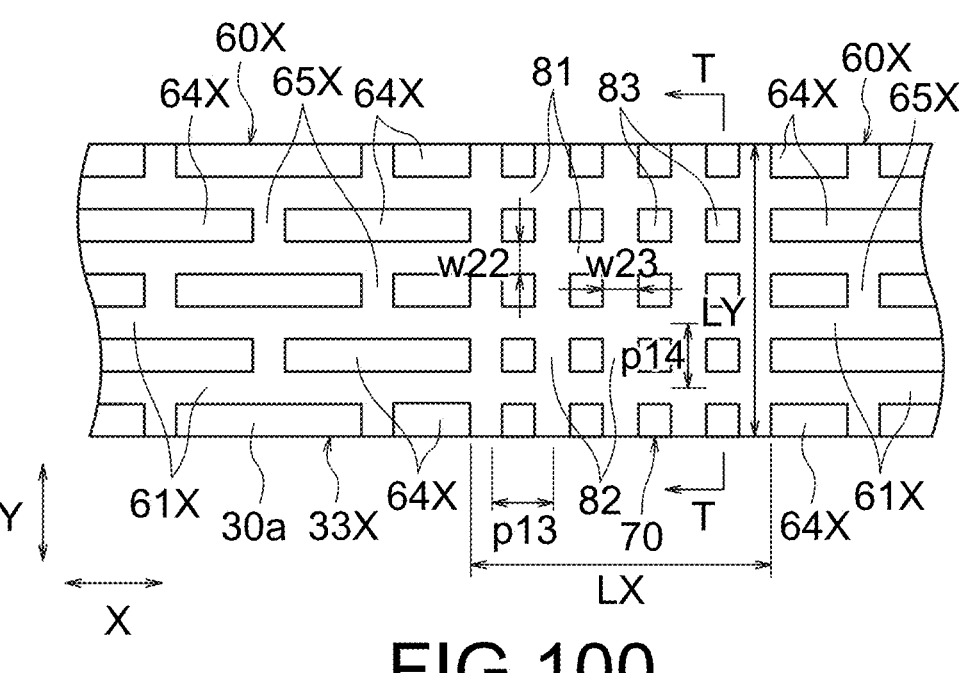
FIG. 100 is a partial enlarged plan view of another modification to the storage flow path portion illustrated in FIG. 75.
Figure 101:
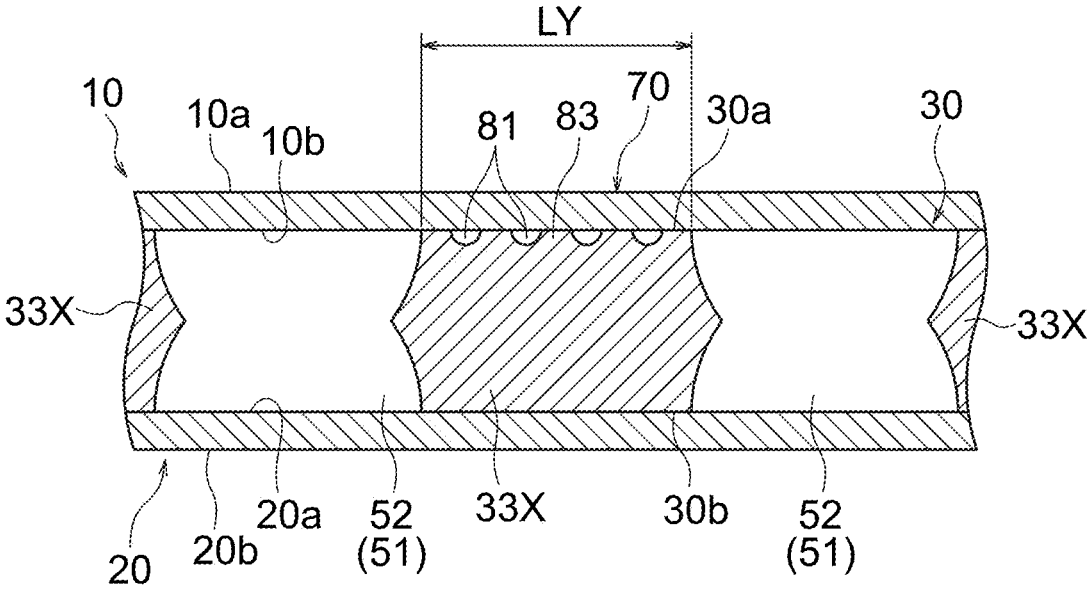
FIG. 101 is a sectional view of the storage flow path portion taken along a line T-T in FIG. 100.

More specifically, as illustrated in FIG. 100, the storage flow path portions 70 may include multiple storage main flow grooves 81 and multiple storage communication grooves 82. The storage main flow grooves 81 and the storage communication grooves 82 may be located on the first body surface 30a at the first land portions 33X. The storage main flow grooves 81 and the storage communication grooves 82 may have small flow path sectional areas such that the working liquid 2b mainly flows due to the capillary action. The width w22 of each storage main flow groove 81 may be equal to the width w7 of each first main flow groove 61X. The width w22 corresponds to a dimension in the Y direction at the first body surface 30a. The depth of each storage main flow groove 81 may be equal to the depth d5 of each first main flow groove 61X. The depth of each storage main flow groove 81 corresponds to the dimension in the Z direction of the storage main flow groove 81. The width w23 of each storage communication groove 82 may be equal to the width w8 of each first communication groove 65X. The width w23 corresponds to a dimension in the X direction at the first body surface 30a. The depth of each storage communication groove 82 may be equal to the depth d5 of each first main flow groove 61X. The depth of each storage communication groove 82 corresponds to the dimension in the Z direction of each storage communication groove 82. The storage main flow grooves 81 and the storage communication grooves 82 may be formed as in the first main flow grooves 61X and the first communication grooves 65X. The number of the storage main flow grooves 81 may be equal to the number of the first main flow grooves 61X. The number of the storage communication grooves 82 may be equal to the number of the first communication grooves 65X.

The storage main flow grooves 81 are connected to the first main flow grooves 61X corresponding thereto and extend in the X direction along extension lines from the first main flow grooves 61X corresponding thereto. The storage communication grooves 82 extend in the Y direction. The storage main flow grooves 81 are arranged in the Y direction, and the storage communication grooves 82 are arranged in the X direction. The storage communication grooves 82 may linearly extend over the entire width of each first land portion 33X. An interval p13 between the storage communication grooves 82 in the X direction may be shorter than the intervals p1 and p2 between the first communication grooves 65X. The interval p13 may be equal to or may differ from the interval p14 between the storage main flow grooves 81 in the Y direction.

The storage communication grooves 82 intersect with the storage main flow grooves 81 and extend in the Y direction across the storage main flow grooves 81. The storage main flow grooves 81 and the storage communication grooves 82 may intersect with each other in a cross shape. In this case, the multiple storage main flow grooves 81 and the multiple storage communication grooves 82 may be at least partly formed in a lattice pattern. The multiple storage main flow grooves 81 and the multiple storage communication grooves 82 may be entirely formed in a lattice pattern as illustrated in FIG. 100 or may be partly formed in a lattice pattern. The storage main flow grooves 81 and the storage communication grooves 82 are connected to each other such that the working liquid 2b can move forward and backward.

The storage flow path portions 70 may include multiple storage projecting portions 83 that are provided on the first body surface 30a at the first land portions 33X. Each storage projecting portion 83 is defined by the storage main flow grooves 81 and two storage communication grooves 82. The storage projecting portions 83 may be formed in a rectangular shape or a square shape in the X direction and the Y direction in plan view. Corner portions of the storage projecting portions 83 may be rounded. The storage projecting portions 83 are not etched, and the material of the wick sheet 30 remains at the portions. The storage projecting portions 83 may be bonded to the first sheet inner surface 10b of the first sheet 10. The storage projecting portions 83 may be arranged in the X direction and may be arranged in the Y direction.

Also, in an example illustrated in FIG. 100, the first surface residual ratio of the storage flow path portions 70 may be lower than the second surface residual ratio of the first liquid flow path portions 60X. The dimension LX for calculating the first surface residual ratio is defined as a distance from an edge portion of one of the first projecting portions 64X that are located on the first sides in the X direction in contact with the storage flow path portions 70 to an edge portion of one of the first projecting portions 64X that are located on the second sides in contact with the storage flow path portions 70. The dimension LY corresponds to the entire width of each first land portion 33X at the first body surface 30a and the width w1 described above.

According to the modification illustrated in FIG. 100 and FIG. 101, the first surface residual ratio of the storage flow path portions 70 is lower than the second surface residual ratio of the first liquid flow path portions 60X. This enables a ratio at which the first body surface 30a remains at the storage flow path portions 70 to be decreased. For this reason, the flow path volume for storing the working liquid 2b at the storage flow path portions 70 can be increased, and the working liquid 2b can be stored at the storage flow path portions 70. The storage communication grooves 82 intersect with the storage main flow grooves 81 and extend in the Y direction across the storage main flow grooves 81. This enables the flow path volume for storing the working liquid 2b at the storage flow path portions 70 to be increased and enables the working liquid 2b to be stored at the storage flow path portions 70. As a result, the working liquid 2b in the vaporization region SR can be inhibited from being lacking, and the heat dissipation performance of the vapor chamber 1 can be improved.

A forty-fifth modification will be described.

In an example described according to the second embodiment described above, the storage flow path portions 70 are located on the first body surface 30a of the wick sheet 30. The present disclosure, however, is not limited thereto. For example, as illustrated in FIG. 102, the storage flow path portions 70 may include first storage flow path portions 84 that are located on the first sheet inner surface 10b of the first sheet 10 and second storage flow path portions 85 that are located on the first body surface 30a of the wick sheet 30.

Figure 102:
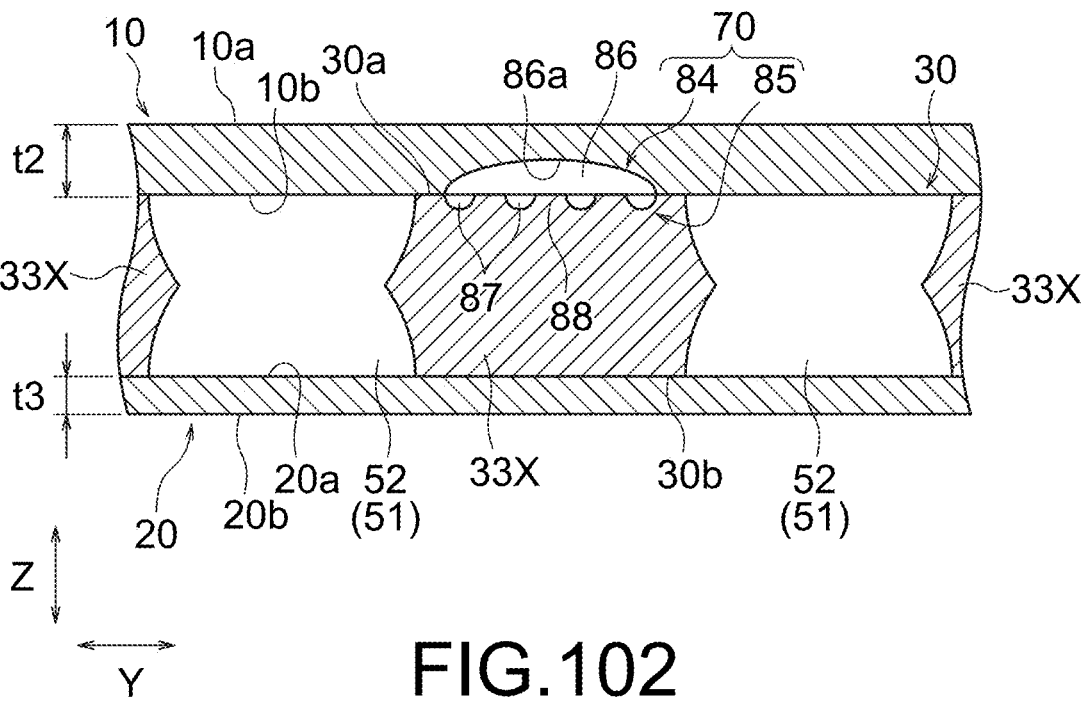
FIG. 102 is a sectional view of another modification to the storage flow path portion illustrated in FIG. 76.

More specifically, the first storage flow path portions 84 may include storage recessed portions 86 that are located on the first sheet inner surface 10b of the first sheet 10 as illustrated in FIG. 102. The storage recessed portions 86 may overlap storage main flow grooves 87 of the second storage flow path portions 85 described later in plan view.

The second storage flow path portions 85 may include the storage main flow grooves 87. The storage main flow grooves 87 may extend in the X direction. The storage main flow grooves 87 may be located on the first body surface 30a at the first land portions 33X. The storage main flow grooves 87 may be connected and in communication with the first main flow grooves 61X of the first liquid flow path portions 60X. The storage main flow grooves 87 may be formed by being etched from the first body surface 30a as in the first main flow grooves 61X. The flow path sectional areas of the storage main flow grooves 87 may be equal to or may differ from the flow path sectional areas of the first main flow grooves 61X. The width of each storage main flow groove 87 may be equal to or may differ from the width w7 of each first main flow groove 61X. The depth of each storage main flow groove 87 may be equal to or may differ from the depth d5 of each first main flow groove 61X.

The second storage flow path portions 85 may be in contact with the first liquid flow path portions 60X on both sides in the X direction as in, for example, the example illustrated in FIG. 86. More specifically, the second storage flow path portions 85 may be in contact with the first liquid flow path portions 60X on first sides in the X direction or may be in contact with the first liquid flow path portions 60X on second sides in the X direction. In this case, the storage main flow grooves 87 may be connected to the first main flow grooves 61X corresponding thereto and may extend in the X direction along extension lines from the first main flow grooves 61X corresponding thereto. The storage main flow grooves 87 and the first main flow grooves 61X corresponding thereto may be continuously formed. The second storage flow path portions 85 may not be in contact with the first liquid flow path portions 60X on the second sides in the X direction, provided that the second storage flow path portions 85 are in contact with the first liquid flow path portions 60X on the first sides in the X direction.

The second storage flow path portions 85 may include storage communication grooves (not illustrated) that extend in the Y direction and that are connected to the storage main flow grooves 87. The second storage flow path portions 85 may include storage projecting portions 88 that are provided on the first body surface 30a at the first land portions 33X. Each storage projecting portion 88 may be located between two storage main flow grooves 87 adjacent to each other in the Y direction. The storage projecting portions 88 are not etched, and the material of the wick sheet 30 remains at the portions. The storage projecting portions 88 may not be bonded to the first sheet inner surface 10b of the first sheet 10. The storage projecting portions 88 may be separated from storage bottom surfaces 86a of the storage recessed portions 86. The storage projecting portions 88 may contain the first body surface 30a.

The storage recessed portions 86 open toward the first body surface 30a of the wick sheet 30. The storage recessed portions 86 are in contact with the storage main flow grooves 87 that are located on the first body surface 30a in the Z direction and are in communication with the storage main flow grooves 87. The storage recessed portions 86 are formed across the multiple storage main flow grooves 87 in the Y direction. The storage recessed portions 86 may be formed over the entire width of each first land portion 33X or may not be formed over the entire width of each first land portion 33X as illustrated in FIG. 102. The storage bottom surfaces 86a of the storage recessed portions 86 may curve as illustrated in FIG. 102 or may be substantially flat. The storage recessed portions 86 may be formed as in the storage recessed portions 76 illustrated in FIG. 95. Protrusions (not illustrated) that project toward the first sheet inner surface 10b may be formed on the storage bottom surfaces 86a.

As illustrated in FIG. 102, the thickness t2 of the first sheet 10 may be more than the thickness t3 of the second sheet 20. This enables distances between the storage bottom surfaces 86a of the storage recessed portions 86 and the first sheet outer surface 10a of the first sheet 10 to be ensured and enables the mechanical strength of the first sheet 10 to be ensured.

Also, in an example illustrated in FIG. 102, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are equal to the total value of the flow path sectional areas of the first storage flow path portions 84 perpendicular to the X direction and the flow path sectional areas of the second storage flow path portions 85 perpendicular to the X direction. The flow path sectional areas of the first storage flow path portions 84 are defined in the same manner as the flow path sectional areas of the storage flow path portions 70 perpendicular to the X direction in the example illustrated in FIG. 93 and FIG. 94 described above. The flow path sectional areas of the second storage flow path portions 85 are defined as the total value of the flow path sectional areas of the storage main flow grooves 87 as in the flow path sectional areas of the storage flow path portions 70 perpendicular to the X direction in the example illustrated in FIG. 75 and FIG. 76.

According to the modification illustrated in FIG. 102, the storage flow path portions 70 include the first storage flow path portions 84 that are located on the first sheet inner surface 10b of the first sheet 10 and the second storage flow path portions 85 that are located on the first body surface 30a of the wick sheet 30. The flow path sectional areas of the storage flow path portions 70 perpendicular to the X direction are equal to the total value of the flow path sectional areas of the first storage flow path portions 84 perpendicular to the X direction and the flow path sectional areas of the second storage flow path portions 85 perpendicular to the X direction and are larger than the flow path sectional areas of the first liquid flow path portions 60X perpendicular to the X direction. This enables the flow path volume for storing the working liquid 2b at the storage flow path portions 70 to be increased and enables the working liquid 2b to be stored at the storage flow path portions 70. For this reason, the working liquid 2b in the vaporization region SR can be inhibited from being lacking, and the heat dissipation performance of the vapor chamber 1 can be improved. The first storage flow path portions 84 are located on the first sheet inner surface 10b of the first sheet 10, the second storage flow path portions 85 are located on the first body surface 30a of the wick sheet 30, and the disruption of transportation of the working liquid 2b to the vaporization region SR can be consequently reduced. For this reason, the transport efficiency of the working liquid 2b to the vaporization region SR can be improved, and the working liquid 2b in the vaporization region SR can be inhibited from being lacking.

A forty-sixth modification will be described.

In an example according to the second embodiment described above, the vapor chamber 1 includes the three layers. The present disclosure, however, is not limited thereto. For example, as illustrated in FIG. 103, the vapor chamber 1 may include four layers.

Figure 103:
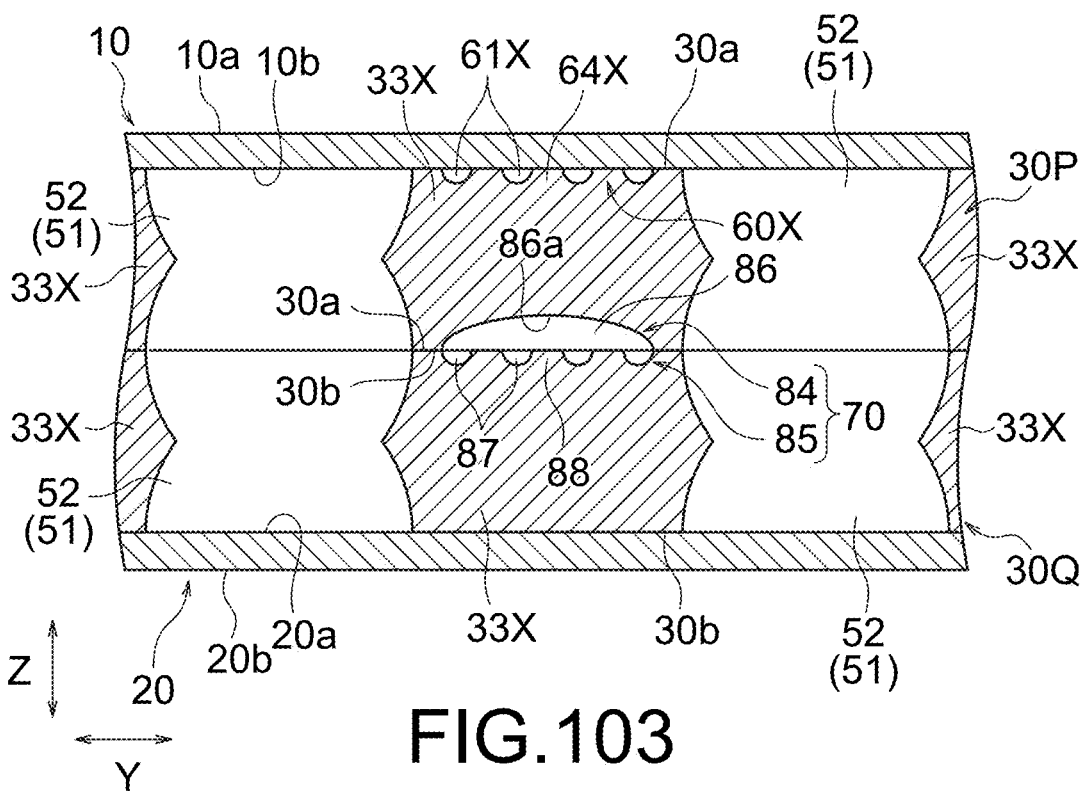
FIG. 103 is a sectional view of another modification to the storage flow path portion illustrated in FIG. 76.

More specifically, as illustrated in FIG. 103, two wick sheets may be located between the first sheet 10 and the second sheet 20. The two wick sheets include the first wick sheet 30P and the second wick sheet 30Q that are stacked. The first wick sheet 30P is an example of the first body sheet, and the second wick sheet 30Q is an example of the second body sheet. The second body surface 30b of the first wick sheet 30P is located on the first body surface 30a of the second wick sheet 30Q. The first sheet 10 is located on the first body surface 30a of the first wick sheet 30P. The second sheet 20 is located on the second body surface 30b of the second wick sheet 30Q.

The first sheet inner surface 10b of the first sheet 10 and the first body surface 30a of the first wick sheet 30P are bonded to each other. The second body surface 30b of the first wick sheet 30P is bond to the first body surface 30a of the second wick sheet 30Q. The second body surface 30b of the second wick sheet 30Q and the second sheet inner surface 20a of the second sheet 20 are bonded to each other.

The first liquid flow path portions 60X are located on the first body surfaces 30a at the first land portions 33X of the wick sheets 30P and 30Q. Components other than the storage flow path portions 70 may be the same as the first wick sheet 30P and the second wick sheet 30Q.

The storage flow path portions 70 may include the first storage flow path portions 84 that are located on the second body surface 30b of the first wick sheet 30P, and the second storage flow path portions 85 that are located on the second body surface 30b of the second wick sheet 30Q.

The first storage flow path portions 84 may include the storage recessed portions 86 that are located on the second body surface 30b of the first wick sheet 30P. The storage recessed portions 86 may overlap the storage main flow grooves 87 of the second storage flow path portions 85 described later in plan view.

The second storage flow path portions 85 may include the storage main flow grooves 87. The storage main flow grooves 87 may extend in the X direction. The storage main flow grooves 87 may be located on the first body surface 30a at the first land portions 33X of the second wick sheet 30Q. The storage main flow grooves 87 may be connected and in communication with the first main flow grooves 61X of the first liquid flow path portions 60X. The storage main flow grooves 87 may be formed by being etched from the first body surface 30a of the second wick sheet 30Q as in the first main flow grooves 61X. The flow path sectional areas of the storage main flow grooves 87 may be equal to or may differ from the flow path sectional areas of the first main flow grooves 61X. The width of each storage main flow groove 87 may be equal to or may differ from the width w7 of each first main flow groove 61X. The depth of each storage main flow groove 87 may be equal to or may differ from the depth d5 of each first main flow groove 61X.

The second storage flow path portions 85 may be in contact with the first liquid flow path portions 60X on both sides in the X direction as in the example illustrated in FIG. 86. More specifically, the second storage flow path portions 85 may be in contact with the first liquid flow path portions 60X on first sides in the X direction and may be in contact with the first liquid flow path portions 60X on second sides in the X direction. In this case, the storage main flow grooves 87 are connected to the first main flow grooves 61X corresponding thereto and may extend in the X direction along extension lines from the first main flow grooves 61X corresponding thereto. The storage main flow grooves 87 and the first main flow grooves 61X corresponding thereto may be continuously formed. The second storage flow path portions 85 may include storage communication grooves (not illustrated) that extend in the Y direction and that are connected to the storage main flow grooves 87. The second storage flow path portions 85 may not be in contact with the first liquid flow path portions 60X on the second sides in the X direction, provided that the second storage flow path portions 85 are in contact with the first liquid flow path portions 60X on the first sides in the X direction.

The second storage flow path portions 85 may include storage communication grooves (not illustrated) that extend in the Y direction and that are connected to the storage main flow grooves 87. The second storage flow path portions 85 may include the storage projecting portions 88 that are provided on the first body surface 30a at the first land portions 33X of the second wick sheet 30Q. Each storage projecting portion 88 may be located between two storage main flow grooves 87 adjacent to each other in the Y direction. The storage projecting portions 88 are not etched, and the material of the second wick sheet 30Q remains at the portions. The storage projecting portions 88 may not be bonded to the second body surface 30b of the first wick sheet 30P. The storage projecting portions 88 may be separated from the storage bottom surfaces 86a of the storage recessed portions 86. The storage projecting portions 88 may contain the first body surface 30a.

The storage recessed portions 86 open toward the first body surface 30a of the second wick sheet 30Q. The storage recessed portions 86 are in contact with the storage main flow grooves 87 that are located on the first body surface 30a of the second wick sheet 30Q in the Z direction and are in communication with the storage main flow grooves 87. The storage recessed portions 86 are formed across the multiple storage main flow grooves 87 in the Y direction. The storage recessed portions 86 may be formed over the entire width of each first land portion 33X of the first wick sheet 30P or may not be formed over the entire width of each first land portion 33X as illustrated in FIG. 103. The storage bottom surfaces 86a at the storage recessed portions 86 may curve as illustrated in FIG. 103 or may be substantially flat. The storage recessed portions 86 may be formed as in the storage recessed portions 76 illustrated in FIG. 95. Protrusions (not illustrated) that project toward the second body surface 30b of the first wick sheet 30P may be formed on the storage bottom surfaces 86a.

Also, in an example illustrated in FIG. 103, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 102 described above.

According to the modification illustrated in FIG. 103, the storage flow path portions 70 include the first storage flow path portions 84 that are located on the second body surface 30b of the first wick sheet 30P and the second storage flow path portions 85 that are located on the first body surface 30a of the wick sheet 30. The flow path sectional areas of the storage flow path portions 70 perpendicular to the X direction are equal to the total value of the flow path sectional areas of the first storage flow path portions 84 perpendicular to the X direction and the flow path sectional areas of the second storage flow path portions 85 perpendicular to the X direction. The flow path sectional areas of the storage flow path portions 70 perpendicular to the X direction are larger than the flow path sectional areas of the first liquid flow path portions 60X that are located on the first body surface 30*a* of the second wick sheet 30Q. This enables the flow path volume for storing the working liquid 2*b* at the storage flow path portions 70 to be increased and enables the working liquid 2*b* to be stored at the storage flow path portions 70. For this reason, the working liquid 2*b* in the vaporization region SR can be inhibited from being lacking, and the heat dissipation performance of the vapor chamber 1 can be improved. The first storage flow path portions 84 are located on the second body surface 30*b* of the first wick sheet 30P, the second storage flow path portions 85 are located on the first body surface 30*a* of the second wick sheet 30Q, and the disruption of transportation of the working liquid 2*b* to the vaporization region SR can be consequently reduced. For this reason, the transport efficiency of the working liquid 2*b* to the vaporization region SR can be improved, and the working liquid 2*b* in the vaporization region SR can be inhibited from being lacking. The storage flow path portions 70 are not in contact with the first sheet 10 and are located between the first wick sheet 30P and the second wick sheet 30Q. This enables the flow paths of the storage flow path portions 70 to be inhibited from collapsing and enables the performance of the vapor chamber 1 to be inhibited from declining.

A forty-seventh modification will be described.

In an example described according to the thirty-eighth modification described above, the vapor chamber 1 includes the three layers. The present disclosure, however, is not limited thereto. For example, as illustrated in FIG. 104, the vapor chamber 1 may include two layers.

Figure 104:
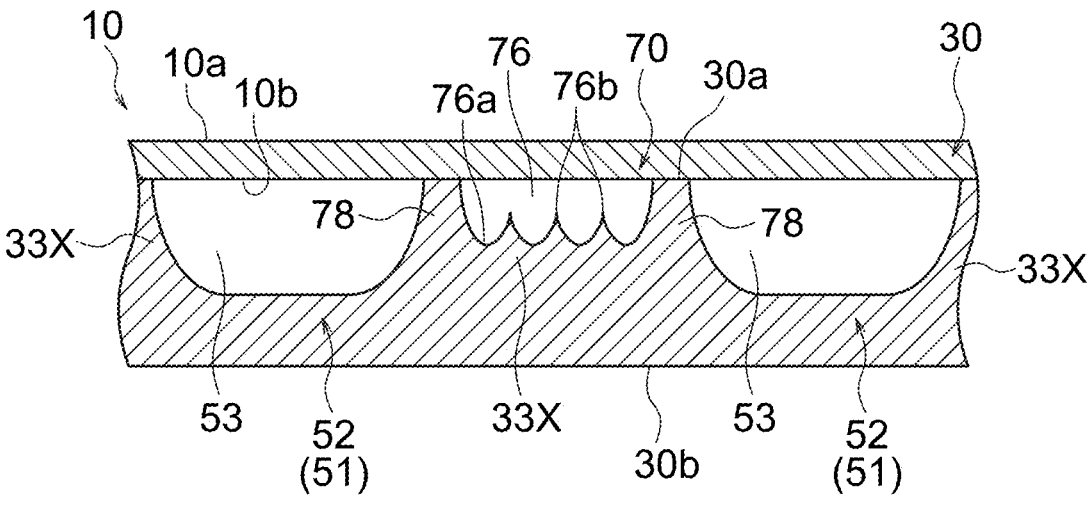
FIG. 104 is a sectional view of another modification to the storage flow path portion illustrated in FIG. 76.
Figure 104:
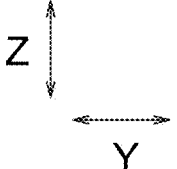

More specifically, the vapor chamber 1 illustrated in FIG. 104 may include the first sheet 10 and the wick sheet 30 and may not include the second sheet 20. In this case, the vapor flow path portion 50 does not extend through the wick sheet 30. The vapor flow path portion 50 may be located on the first body surface 30*a*, and the vapor passages 51 and 52 that form the vapor flow path portion 50 may be formed in a recessed shape at the first body surface 30*a*. For example, the vapor passages 51 and 52 include the first vapor flow path recessed portions 53 illustrated in FIG. 8 but may not include the second vapor flow path recessed portions 54 illustrated in FIG. 8. The first land portions 33X may contain the first body surface 30*a* and may project from the bottom surfaces of the first vapor flow path recessed portions 53 toward the first body surface 30*a*.

The storage flow path portions 70 include the storage recessed portions 76. In an example illustrated in FIG. 104, the protrusions 76*b* are formed on the storage bottom surfaces 76*a* of the storage recessed portions 76. The present disclosure, however, is not limited thereto, and the protrusions 76*b* may not be formed. The storage recessed portions 76 may be formed as in the storage recessed portions 76 illustrated in FIG. 89.

Also, in an example illustrated in FIG. 104, the flow path sectional areas of the storage flow path portions 70 perpendicular to the X direction may be larger than the flow path sectional areas of the first liquid flow path portions 60X perpendicular to the X direction. The flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above.

According to the modification illustrated in FIG. 104, the working liquid 2*b* can be stored at the storage flow path portions 70 also as for the vapor chamber 1 that includes two layers. For this reason, the working liquid 2*b* in the vaporization region SR can be inhibited from being lacking, and the heat dissipation performance of the vapor chamber 1 can be improved.

A forty-eighth modification will be described.

Figure 105:
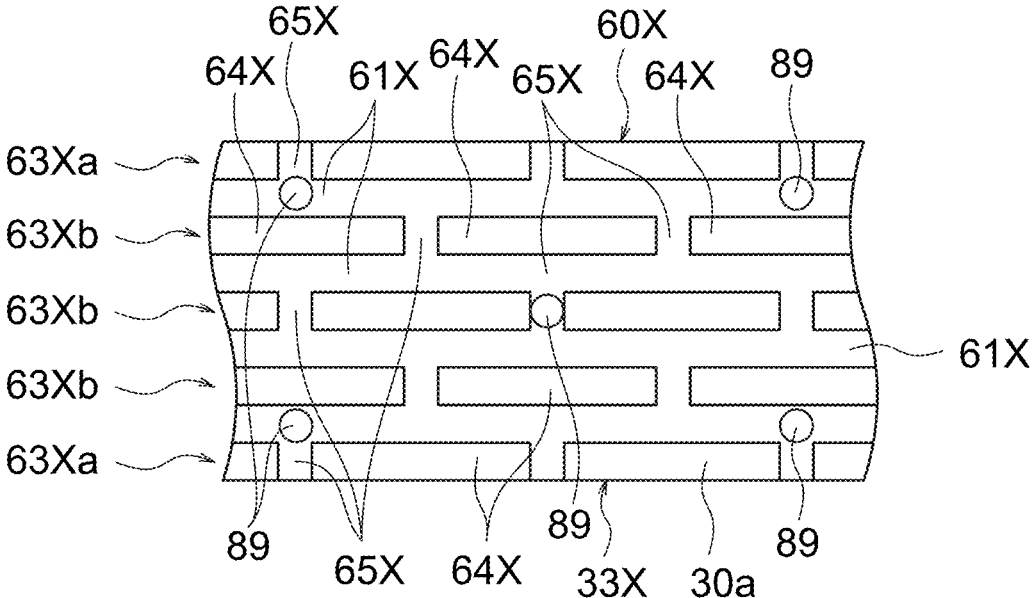
FIG. 105 is a partial enlarged plan view of another modification to the storage flow path portion illustrated in FIG. 75.
Figure 105:
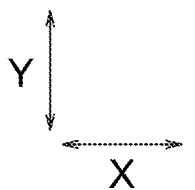
Figure 106:
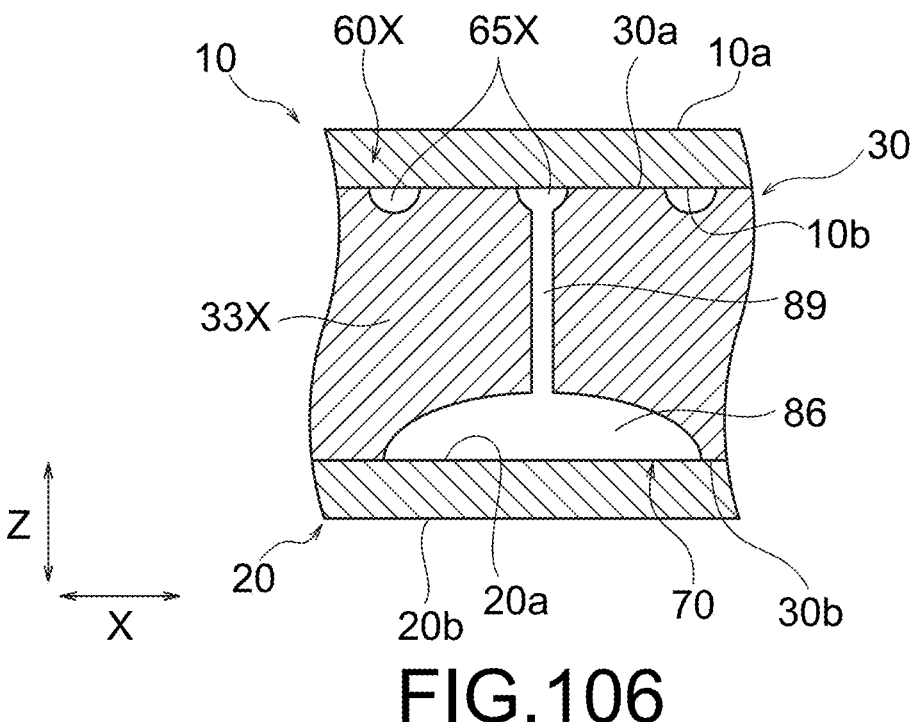
FIG. 106 is a sectional view of the storage flow path portion illustrated in FIG. 105 in an X direction.
Figure 107:
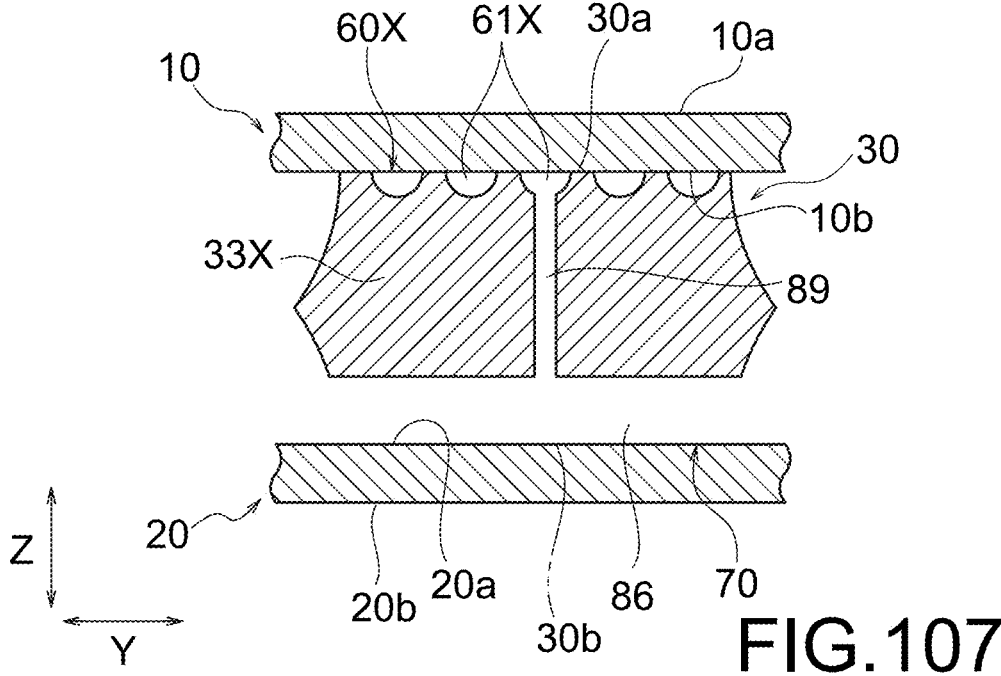
FIG. 107 is a sectional view of the storage flow path portion illustrated in FIG. 105 in a Y direction.

In an example described according to the second embodiment described above, the storage flow path portions 70 are located on the first body surface 30*a* of the wick sheet 30. The present disclosure, however, is not limited thereto. For example, as illustrated in FIG. 105 to FIG. 107, the storage flow path portions 70 may include the storage recessed portions 86 that are located on the second body surface 30*b* of the wick sheet 30 and through-holes 89 that extend through the wick sheet 30.

The storage recessed portions 86 may be formed as in the storage recessed portions 86 that are located on the second body surface 30*b* of the first wick sheet 30P illustrated in FIG. 103. As illustrated in FIG. 106 and FIG. 107, the storage recessed portions 86 may extend in the Y direction and may extend through the first land portions 33X in the Y direction.

The through-holes 89 may extend from the first body surface 30*a* to the storage recessed portions 86. The through-holes 89 may be in communication with the storage recessed portions 86. The through-holes 89 may be located at freely determined positions in plan view. For example, as illustrated in FIG. 105, the through-holes 89 may overlap the first main flow grooves 61X and may overlap the first communication grooves 65X. As illustrated in FIG. 105, the planar shapes of the through-holes 89 may have a circular shape. However, the planar shapes of the through-holes 89 may be rectangular shapes, rectangular shape having rounded corner portions, or elliptic shapes and are freely determined.

According to the forty-eighth modification, the storage recessed portions 86 are formed on the second body surface 30*b* of the wick sheet 30. This enables the working liquid 2*b* to be stored at the storage recessed portions 86 while the vapor chamber 1 is not operating. For this reason, the expansion force due to freezing can be weakened even in the case where the working liquid 2*b* is frozen and is expanded. While the vapor chamber 1 is operating, the flow paths for the working vapor 2*a* can function, and the flow path resistance of the working vapor 2*a* can be decreased.

According to the forty-eighth modification, the through-holes 89 extend from the first body surface 30*a* to the storage recessed portions 86. This enables the working liquid 2*b* to be stored at the storage recessed portions 86 and enables the amount of the working liquid 2*b* stored to be increased. In the case where the planar shapes of the through-holes 89 are smaller than the planar shapes of the storage recessed portions 86, the effect of storing the working liquid 2*b* at the storage recessed portions 86 can be improved.

According to the forty-eighth modification, the storage recessed portions 76 (see, for example, FIG. 81) may be formed on the first body surface 30*a* of the wick sheet 30 although this is not illustrated. That is, the storage flow path portions 70 may include the storage recessed portions 76, the storage recessed portions 86, and the through-holes 89. In this case, the amount of the working liquid 2*b* stored can be further increased. The storage recessed portions 76 and the storage recessed portions 86 may alternate in the X direction.

A forty-ninth modification will be described.

Figure 108:
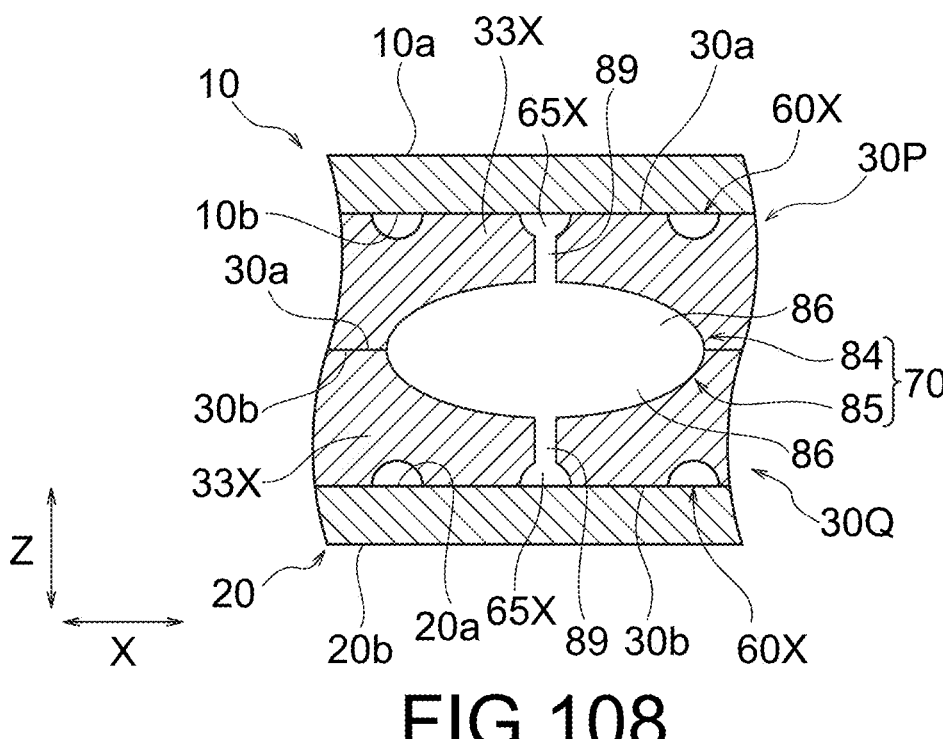
FIG. 108 is a sectional view of a modification to the storage flow path portion illustrated in FIG. 106 in the X direction.
Figure 109:
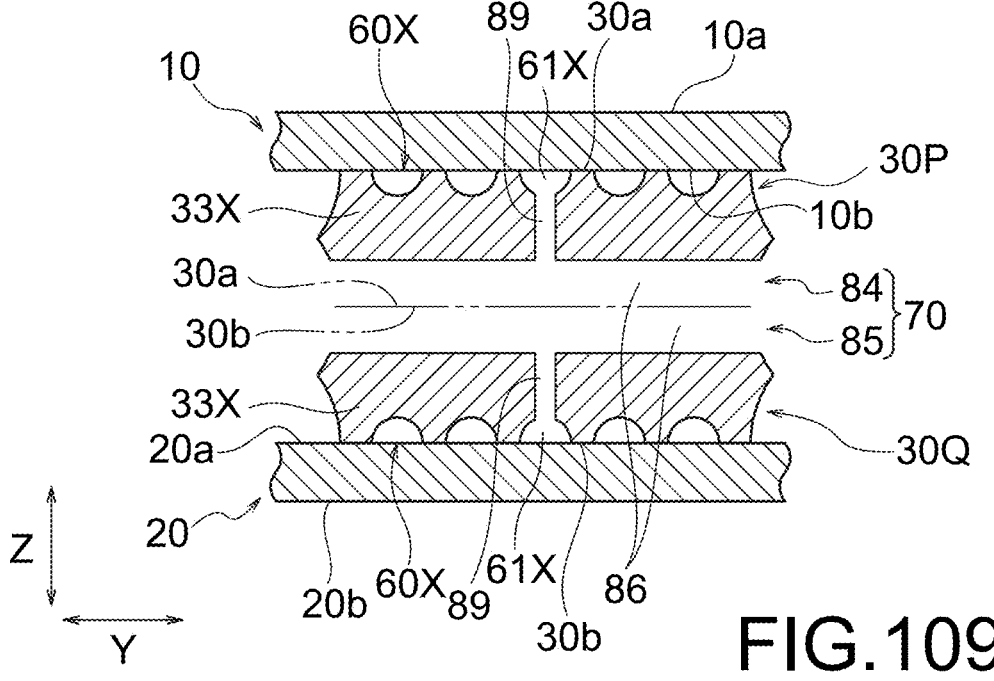
FIG. 109 is a sectional view of the storage flow path portion illustrated in FIG. 108 in the Y direction.

In an example described according to the forty-eighth modification described above, the vapor chamber 1 includes the three layers. The present disclosure, however, is not limited thereto. For example, as illustrated in FIG. 108 and FIG. 109, the vapor chamber 1 may include four layers. In this case, the four layers may be formed as in the vapor chamber 1 illustrated in FIG. 103. The first liquid flow path portions 60X of the second wick sheet 30Q may be located on the second body surface 30*b*.

The storage flow path portions 70 may include the first storage flow path portions 84 that are provided on the first wick sheet 30P and the second storage flow path portions 85 that are provided on the second wick sheet 30Q. The first storage flow path portions 84 include the storage recessed portions 86 that are located on the second body surface 30*b* of the first wick sheet 30P and the through-holes 89 that extend from the first body surface 30*a* of the first wick sheet 30P to the storage recessed portions 86. The second storage flow path portions 85 include the storage recessed portions 86 that are located on the first body surface 30*a* of the second wick sheet 30Q and the through-holes 89 that extend from the second body surface 30*b* of the second wick sheet 30Q to the storage recessed portions 86.

The storage recessed portions 86 of the first wick sheet 30P and the storage recessed portions 86 of the second wick sheet 30Q face each other, and spaces continuous in the Z direction are formed. This enables the amount of the working liquid 2*b* stored to be increased.

As for the storage flow path portion 70 illustrated in FIG. 108 and FIG. 109, the storage recessed portions 86 of the first storage flow path portions 84 or the storage recessed portions 86 of the second storage flow path portions 85 may not be formed. In this case, the through-holes 89 of the first storage flow path portions 84 may be in communication with the storage recessed portions 86, and the through-holes 89 of the second storage flow path portions 85 may be in communication with the storage recessed portions 86.

According to the forty-ninth modification, the amount of the working liquid 2*b* stored can be increased.

Figure 110:
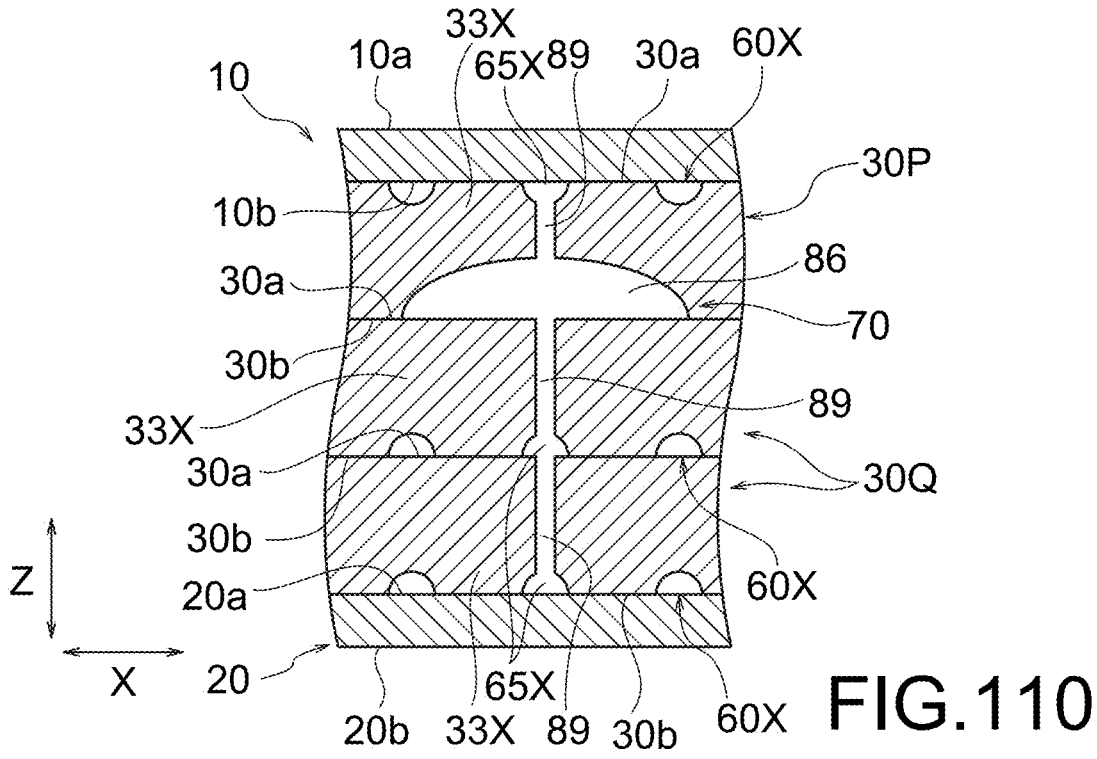
FIG. 110 is a sectional view of another modification to the storage flow path portion illustrated in FIG. 106 in the X direction.
Figure 111:
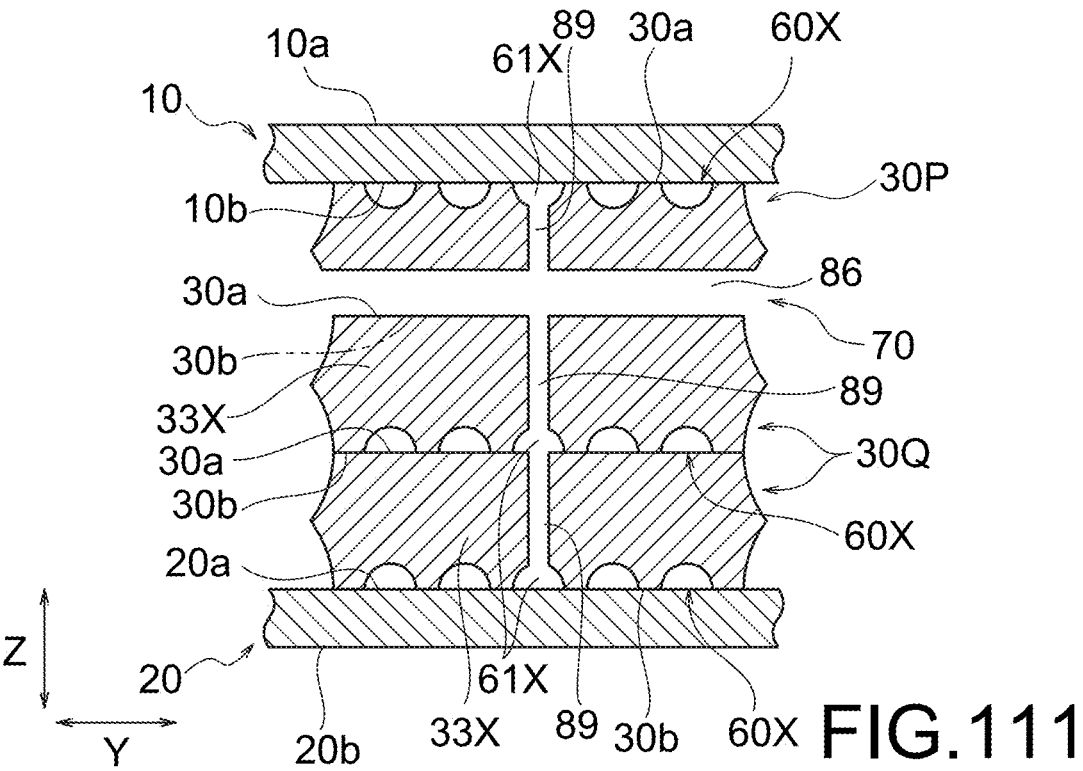
FIG. 111 is a sectional view of the storage flow path portion illustrated in FIG. 110 in the Y direction.

The vapor chamber 1 may include five layers as illustrated in FIG. 110 and FIG. 111. For example, the first wick sheet 30P described above and two second wick sheets 30Q may be located between the first sheet 10 and the second sheet 20. The second storage flow path portions 85 of the second wick sheet 30Q illustrated in FIG. 110 and FIG. 111 may not include the storage recessed portions 86. The through-holes 89 of one of the second wick sheet 30Q and the through-holes 89 of the other second wick sheet 30Q may be in communication with each other. The storage recessed portions 86 of the first wick sheet 30P may be in communication with the through-holes 89 of the second wick sheet 30Q.

As for the vapor chamber 1 illustrated in FIG. 110 and FIG. 111, the storage recessed portions 86 are located on the second body surface 30*b* of the first wick sheet 30P, but the positions of the storage recessed portions 86 are freely determined. For example, the storage recessed portions 86 may be located on the first body surface 30*a* of the second wick sheet 30Q.

Figure 112:
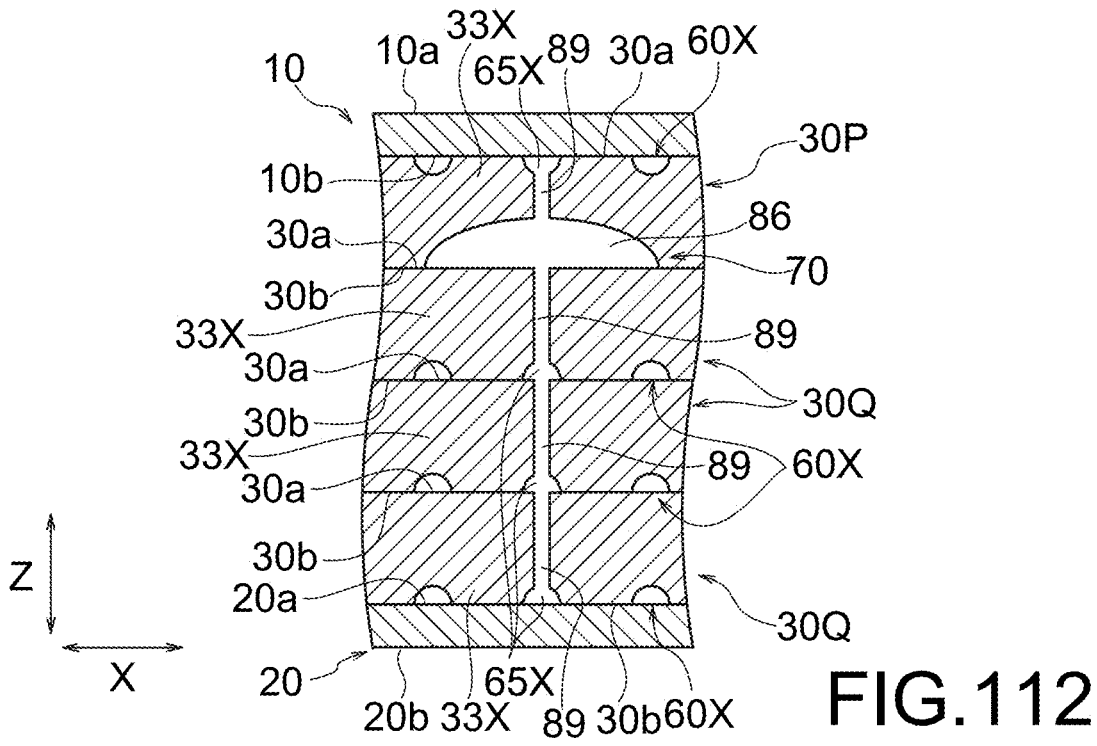
FIG. 112 is a sectional view of another modification to the storage flow path portion illustrated in FIG. 106 in the X direction.
Figure 113:
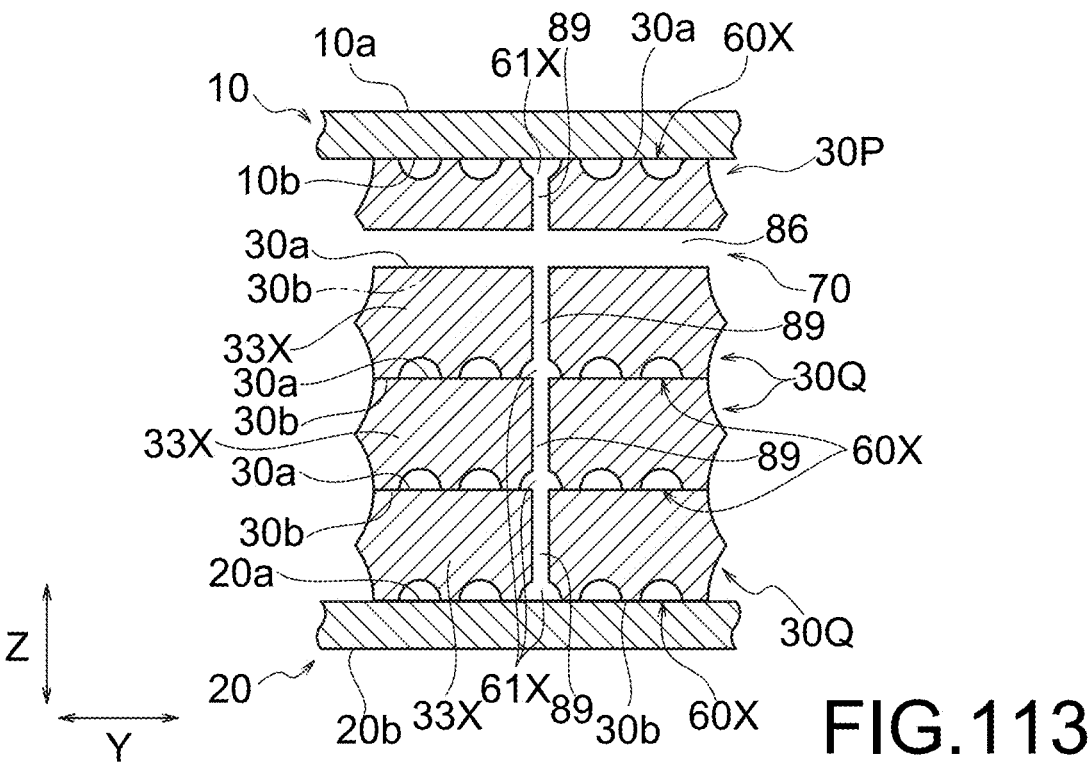

The vapor chamber 1 may include six layers as illustrated in FIG. 112 and FIG. 113. For example, the first wick sheet 30P described above and three second wick sheets 30Q may be located between the first sheet 10 and the second sheet 20. Three second wick sheets 30Q each of which is illustrated in FIG. 110 and FIG. 111 may be stacked. The through-holes 89 of the second wick sheet 30Q may be in communication with each other.

As for the vapor chamber 1 illustrated in FIG. 112 and FIG. 113, the storage recessed portions 86 are located on the second body surface 30*b* of the first wick sheet 30P, but the positions of the storage recessed portions 86 are freely determined. For example, the storage recessed portions 86 may be located on the first body surface 30*a* of the second wick sheet 30Q.

Third Embodiment

A vapor chamber body sheet, a vapor chamber, and an electronic apparatus according to a third embodiment of the present disclosure will now be described with reference to FIG. 114 to FIG. 119.

The third embodiment illustrated in FIG. 114 to FIG. 119 differs mainly in that storage flow path portions are located at land intersection portions at which the first land portions and second land portions intersect with each other. The other structure is substantially the same as that according to the second embodiment illustrated in FIG. 64 to FIG. 106. In FIG. 114 to FIG. 119, portions like to those according to the second embodiment illustrated in FIG. 64 to FIG. 106 are designated by like reference signs, and a detailed description is omitted. In an example described according to the present embodiment, the single wick sheet 30 is located between the first sheet 10 and the second sheet 20. However, multiple wick sheets 30 may be located between the first sheet 10 and the second sheet 20.

Figure 114:
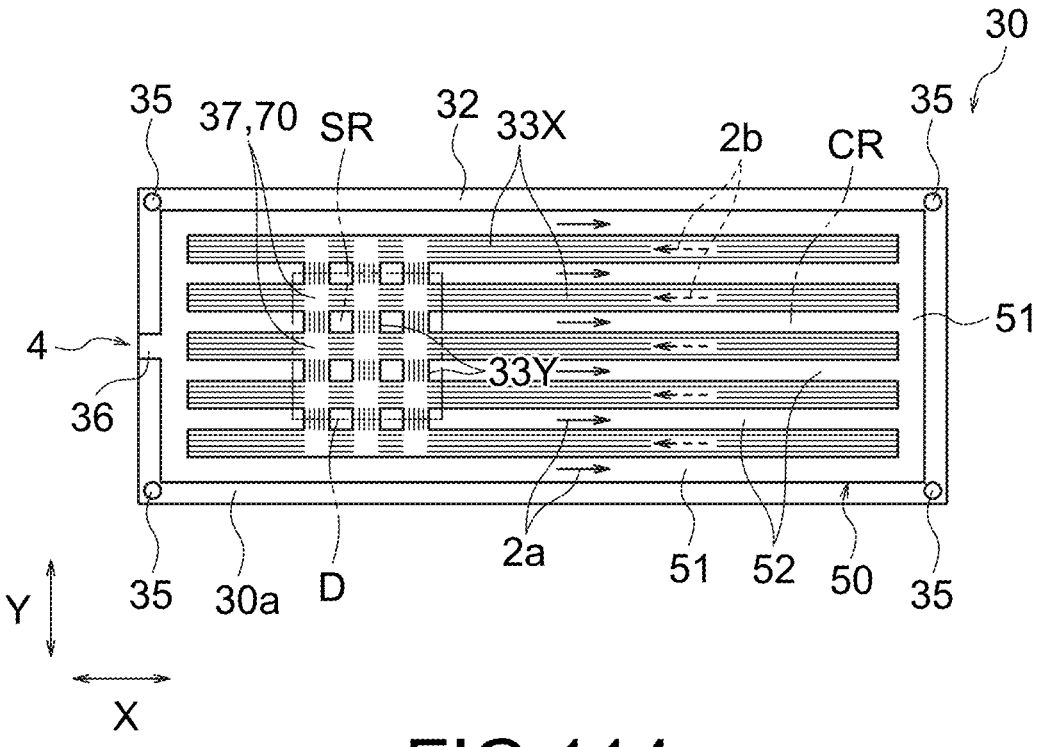

According to the present embodiment, as illustrated in FIG. 114, the wick sheet 30 further includes the multiple second land portions 33Y The second land portions 33Y are located inside the frame portion 32 in plan view. The vapor flow path portion 50 is located around the second land portions 33Y The second land portions 33Y are not etched, and the material of the wick sheet 30 remains at the portions. The second land portions 33Y extend from the first body surface 30*a* to the second body surface 30*b*.

The second land portions 33Y may be elongated such that the Y direction is the longitudinal direction in plan view. The planar shapes of the second land portions 33Y may be elongated rectangular shapes. The second land portions 33Y may be parallel with each other. The second land portions 33Y may be separated from the frame portion 32 as illustrated in FIG. 114 or may be connected to the frame portion 32. The width w2 of each second land portion 33Y may be equal to or may differ from the width w1 of each first land portion 33X. The width w2 of each second land portion 33Y is the dimension in the X direction of the second land portion 33Y The width w2 is the dimension of each second land portion 33Y at the first body surface 30*a* and the second body surface 30*b*. The second land portions 33Y may be bonded to the first sheet 10 or may be bonded to the second sheet 20. The first body surface 30*a* and the second body surface 30*b* of the wick sheet 30 may be flat over the whole of the frame portion 32 and the land portions 33X and 33Y.

As illustrated in FIG. 114, the first land portions 33X extend in the X direction, and the second land portions 33Y extend in the Y direction that differs from the X direction in plan view. The first land portions 33X are arranged in the Y direction, and the second land portions 33Y are arranged in the X direction. The first land portions 33X and the second land portions 33Y may intersect with each other at the land intersection portions 37. More specifically, the first land portions 33X and the second land portions 33Y may intersect with each other, and the multiple land intersection portions 37 may be formed. At one of the land intersection portions 37, one of the first land portions 33X and one of the second land portions 33Y intersect with each other. The multiple first land portions 33X and the multiple second land portions 33Y are at least partly formed in a lattice pattern. As illustrated in FIG. 114, the multiple first land portions 33X and the second land portions 33Y may be formed in a lattice pattern in a region of the vapor flow path portion 50. In this case, as illustrated in FIG. 114, the multiple land intersection portions 37 may be located in the vaporization region SR described above. Alternatively, the multiple first land portions 33X and the second land portions 33Y may be formed in a lattice pattern over the whole of the vapor flow path portion 50.

As illustrated in FIG. 114, the first land portions 33X extend in the X direction across the land intersection portions 37, and the second land portions 33Y may extend in the Y direction across the land intersection portions 37. In this case, the first land portions 33X and the second land portions 33Y may intersect with each other in a cross shape. At all of the land intersection portions 37, the first land portions 33X and the second land portions 33Y may intersect with each other in a cross shape. As illustrated in FIG. 114, at some of the land intersection portions 37, the first land portions 33X and the second land portions 33Y may intersect with each other in a T-shape.

The land intersection portions 37 may extend from the first body surface 30a to the second body surface 30b. The first body surface 30a at the land intersection portions 37 may be bonded to the first sheet inner surface 10b of the first sheet 10. The second body surface 30b at the land intersection portions 37 may be bonded to the second sheet inner surface 20a of the second sheet 20.

The second liquid flow path portions 60Y may be located on the first body surface 30a at the second land portions 33Y The second liquid flow path portions 60Y are examples of a second groove flow path portion. The second liquid flow path portions 60Y may be flow paths through which the working liquid 2b mainly passes. The working vapor 2a described above may pass through the second liquid flow path portions 60Y The second liquid flow path portions 60Y form a portion of the enclosure space 3 described above and are in communication with the vapor flow path portion 50. The second liquid flow path portions 60Y are formed as the capillary structure for transporting the working liquid 2b to the vaporization region SR. The second liquid flow path portions 60Y are referred to as a wick in some cases.

Figure 115:
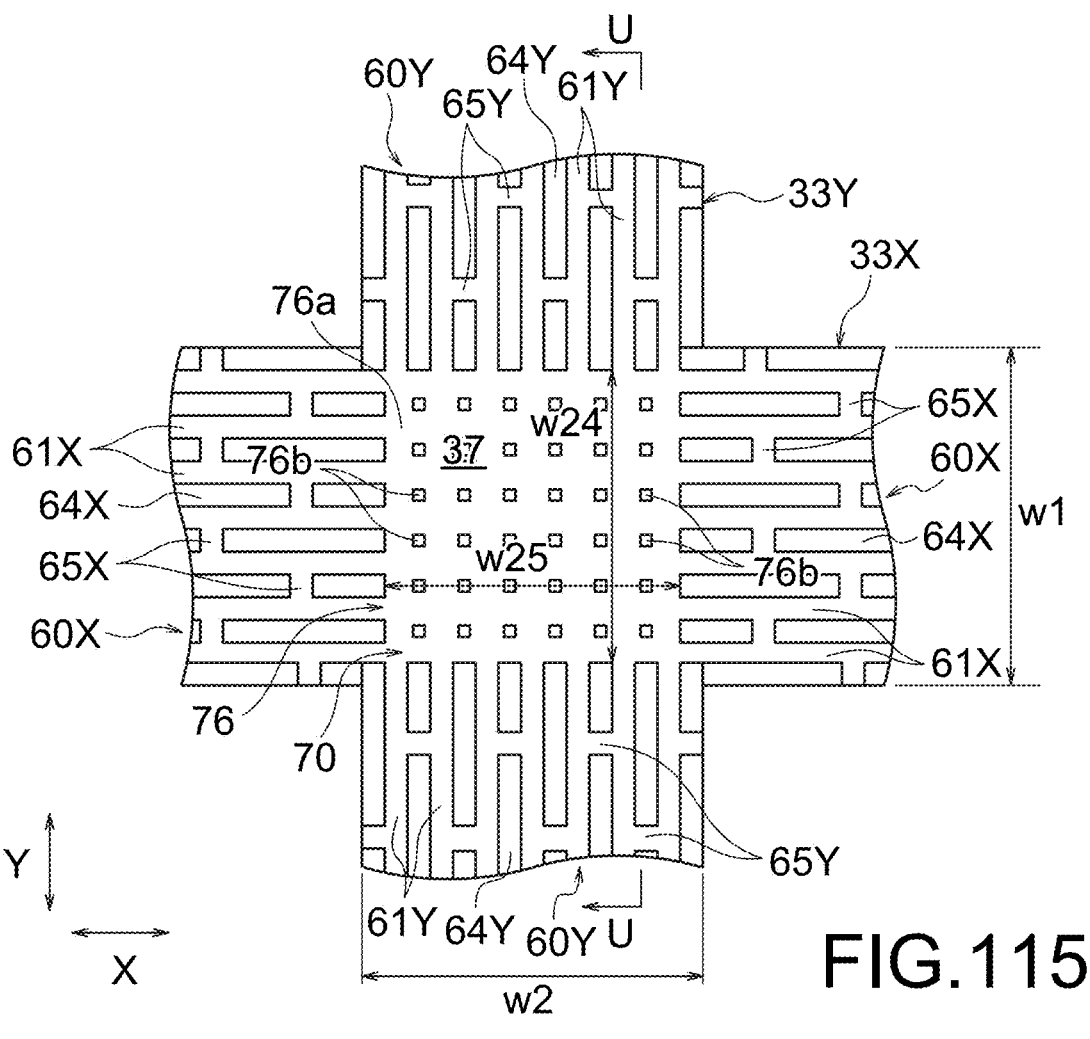

As illustrated in FIG. 115, the second liquid flow path portions 60Y may include the multiple second main flow grooves 61Y and the multiple second communication grooves 65Y The working liquid 2b passes through the second main flow grooves 61Y and the second communication grooves 65Y The second communication grooves 65Y are connected and in communication with the second main flow grooves 61Y.

The second main flow grooves 61Y and the second communication grooves 65Y may be located on the first body surface 30a at the second land portions 33Y The second main flow grooves 61Y and the second communication grooves 65Y may be in communication with the vapor flow path portion 50.

As illustrated in FIG. 115, the second main flow grooves 61Y extend in the Y direction. The second main flow grooves 61Y are arranged in the X direction. The second communication grooves 65Y extend in the X direction. The width of each second main flow groove 61Y may be equal to the width w7 of each first main flow groove 61X. The present disclosure, however, is not limited thereto, and the width of each second main flow groove 61Y may be less than the width w7 of each first main flow groove 61X. In this case, the capillary action of the second main flow grooves 61Y can be enhanced, and the transport efficiency of the working liquid 2b in the Y direction can be improved. The second main flow grooves 61Y and the second communication grooves 65Y may be formed as in the first main flow grooves 61X and the first communication grooves 65X.

The second liquid flow path portions 60Y may include the multiple second projecting portions 64Y that are located on the first body surface 30a at the second land portions 33Y The second projecting portions 64Y may be defined by the second main flow grooves 61Y and the second communication grooves 65Y or may be defined by the second main flow grooves 61Y, the second communication grooves 65Y, and the vapor passages 51 and 52. The second projecting portions 64Y may be formed as in the first projecting portions 64X. The second projecting portions 64Y may be bonded to the first sheet inner surface 10b of the first sheet 10.

The storage flow path portions 70 according to the present embodiment may be located on the first body surface 30a at the land intersection portions 37 described above. The storage flow path portions 70 may be in contact with the first liquid flow path portions 60X on both sides in the X direction and may be in contact with the second liquid flow path portions 60Y on both sides in the Y direction.

Figure 116:
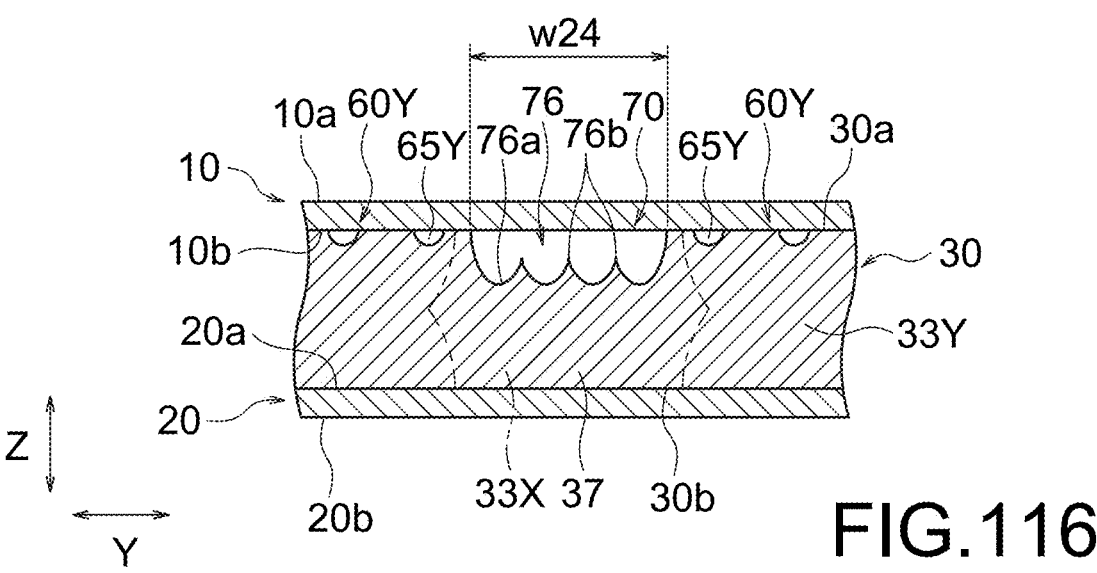

As illustrated in FIG. 115 and FIG. 116, the storage flow path portions 70 may include the storage recessed portions 76. The storage recessed portions 76 may be located on the first body surface 30a at the land intersection portions 37. The storage recessed portions 76 are connected to the first main flow grooves 61X and are connected to the second main flow grooves 61Y This enables the working liquid 2b to be received by the storage recessed portions 76 from the first main flow grooves 61X that are located on a first side in the X direction. The working liquid 2b in the storage recessed portions 76 can move to the first main flow grooves 61X that are located on a second side in the X direction and can move to the second main flow grooves 61Y that are located on both sides in the Y direction. For this reason, the working liquid 2b transported to the main flow grooves 61X and 61Y can be uniform.

The storage recessed portions 76 are formed across the multiple first main flow grooves 61X that are located at the first land portions 33X in the Y direction. The storage recessed portions 76 are formed across the multiple second main flow grooves 61Y that are located at the second land portions 33Y in the X direction. This enables the working liquid 2b transported to the first main flow grooves 61X to be uniform and enables the working liquid 2b transported to the second main flow grooves 61Y to be uniform. The flow path sectional areas of the storage flow path portions 70 perpendicular to the X direction may be larger than the flow path sectional areas of the first liquid flow path portions 60X perpendicular to the X direction. The flow path sectional areas of the storage recessed portions 76 in the X direction can be larger than the sum of the flow path sectional areas of the second main flow grooves 61Y This enables the volumes of the storage recessed portions 76 to be increased and enables the amount of the working liquid 2b stored to be increased. The width w24 of each storage recessed portion 76 in the Y direction may be less than the width w1 (see FIG. 8) of each first land portion 33X. In this case, the first body surface 30a remains at the land intersection portions 37 and can be bonded to the first sheet 10. The present disclosure, however, is not limited thereto, and the width w24 may be equal to the width w1. Similarly, the width w25 of each storage recessed portion 76 in the X direction may be less than or may be equal to the width w2 of each second land portion 33Y.

The storage recessed portions 76 may contain the storage bottom surfaces 76*a*. The multiple protrusions 76*b* that project toward the first body surface 30*a* may be located on the storage bottom surfaces 76*a*. The protrusions 76*b* may be arranged in the X direction and may be arranged in the Y direction. The protrusions 76*b* may be formed so as to taper and project toward the first body surface 30*a* when viewed in the X direction and the Y direction. The protrusions 76*b* may be separated inward from the extension surface of the first body surface 30*a*. In this case, the protrusions 76*b* may be separated from the first sheet inner surface 10*b* of the first sheet 10. The sectional shapes of the protrusions 76*b* are freely determined. The protrusions 76*b* may be formed by being etched from the first body surface 30*a*. The protrusions 76*b* may not be formed on the storage bottom surfaces 76*a*. In this case, the storage bottom surfaces 76*a* may be substantially flat or may curve.

The flow path sectional area of the storage flow path portion 70 perpendicular to the X direction illustrated in FIG. 115 and FIG. 116 may be larger than the flow path sectional areas of the first liquid flow path portions 60X perpendicular to the X direction. Also, in an example illustrated in FIG. 115 and FIG. 116, the flow path sectional areas of the storage flow path portions 70 perpendicular to the X direction are defined in the same manner as the flow path sectional areas of the storage flow path portions 70 perpendicular to the X direction in the example illustrated in FIG. 80 and FIG. 81 described above. The flow path sectional areas of the storage flow path portions 70 perpendicular to the Y direction may be larger than the flow path sectional areas of the second liquid flow path portions 60Y perpendicular to the Y direction. The flow path sectional areas of the storage flow path portions 70 perpendicular to the Y direction are defined in the same manner as the flow path sectional areas of the storage flow path portions 70 perpendicular to the X direction.

The first surface residual ratio of the storage flow path portions 70 may be lower than the second surface residual ratio of the first liquid flow path portions 60X. The dimension LX in the X direction for calculating the first surface residual ratio corresponds to the width w24 of each storage recessed portion 76 described above. The dimension LY in the Y direction corresponds to the width w25 of each storage recessed portion 76 described above. The first surface residual ratio of the storage flow path portions 70 may be lower than the second surface residual ratio of the second liquid flow path portions 60Y. The first surface residual ratio of the storage flow path portions 70 may be zero. The second surface residual ratio of the second liquid flow path portions 60Y is obtained as in the second surface residual ratio of the first liquid flow path portions 60X. The second surface residual ratio of the second liquid flow path portions 60Y may be equal to or may differ from the second surface residual ratio of the first liquid flow path portions 60X.

According to the present embodiment, the storage flow path portions 70 that are connected to the first main flow grooves 61X are thus located on the first body surface 30*a* at the land intersection portions 37. The flow path sectional areas of the storage flow path portions 70 perpendicular to the X direction are larger than the flow path sectional areas of the first liquid flow path portions 60X perpendicular to the X direction. This enables the flow path volume for storing the working liquid 2*b* at the storage flow path portions 70 to be increased and enables the working liquid 2*b* to be stored at the storage flow path portions 70. For this reason, in the case where the amount of vaporization of the working liquid 2*b* in the vaporization region SR is small, the working liquid 2*b* can be stored at the storage flow path portions 70. In the case where the amount of vaporization of the working liquid 2*b* in the vaporization region SR is large, the working liquid 2*b* that is stored at the storage flow path portions 70 can be transported to the vaporization region SR. As a result, the working liquid 2*b* in the vaporization region SR can be inhibited from being lacking, and the heat dissipation performance of the vapor chamber 1 can be improved.

According to the present embodiment, the storage flow path portions 70 are located on the first body surface 30*a* at the land intersection portions 37 at which the first land portions 33X that extend in the X direction and the second land portions 33Y that extend in the Y direction intersect with each other. The first main flow grooves 61X that are located on the first body surface 30*a* at the first land portions 33X are connected to the storage flow path portions 70, and the second main flow grooves 61Y that are located on the first body surface 30*a* at the second land portions 33Y are connected to the storage flow path portions 70. This enables the working liquid 2*b* that flows through the first main flow grooves 61X that are located on the first side in the X direction to be received by the storage recessed portions 76. The working liquid 2*b* in the storage recessed portions 76 can move to the first main flow grooves 61X that are located on the second side in the X direction and can move to the second main flow grooves 61Y that are located on both sides in the Y direction. For this reason, the working liquid 2*b* transported to the main flow grooves 61X and 61Y can be uniform.

According to the present embodiment, the flow path sectional areas of the storage flow path portions 70 perpendicular to the Y direction are larger than the flow path sectional areas of the second liquid flow path portions 60Y perpendicular to the Y direction. This enables the flow path volume for storing the working liquid 2*b* at the storage flow path portions 70 to be increased and enables the working liquid 2*b* to be stored at the storage flow path portions 70. For this reason, the amount of the working liquid 2*b* that is stored at the storage flow path portions 70 can be increased.

Modifications to the third embodiment described above will now be described.

A fiftieth modification will be described.

In an example described according to the third embodiment described above, the storage flow path portions 70 include the storage recessed portions 76 at which the protrusions 76*b* are formed on the storage bottom surfaces 76*a*. The present disclosure, however, is not limited thereto. For example, the protrusions 76*b* may not be formed (see FIG. 93 and FIG. 94) on the storage bottom surfaces 76*a* of the storage recessed portions 76. In this case, the flow path sectional areas of the storage recessed portions 76 can be increased, and the amount of the working liquid 2*b* stored can be increased. The storage bottom surfaces 76*a* may be substantially flat. The storage recessed portions 76 may be formed in a rectangular shape in the X direction and the Y direction in plan view.

A fifty-first modification will be described.

In an example described according to the third embodiment described above, the storage flow path portions 70 include the storage recessed portions 76 at which the protrusions 76*b* are formed on the storage bottom surfaces 76*a*.

Figure 117:
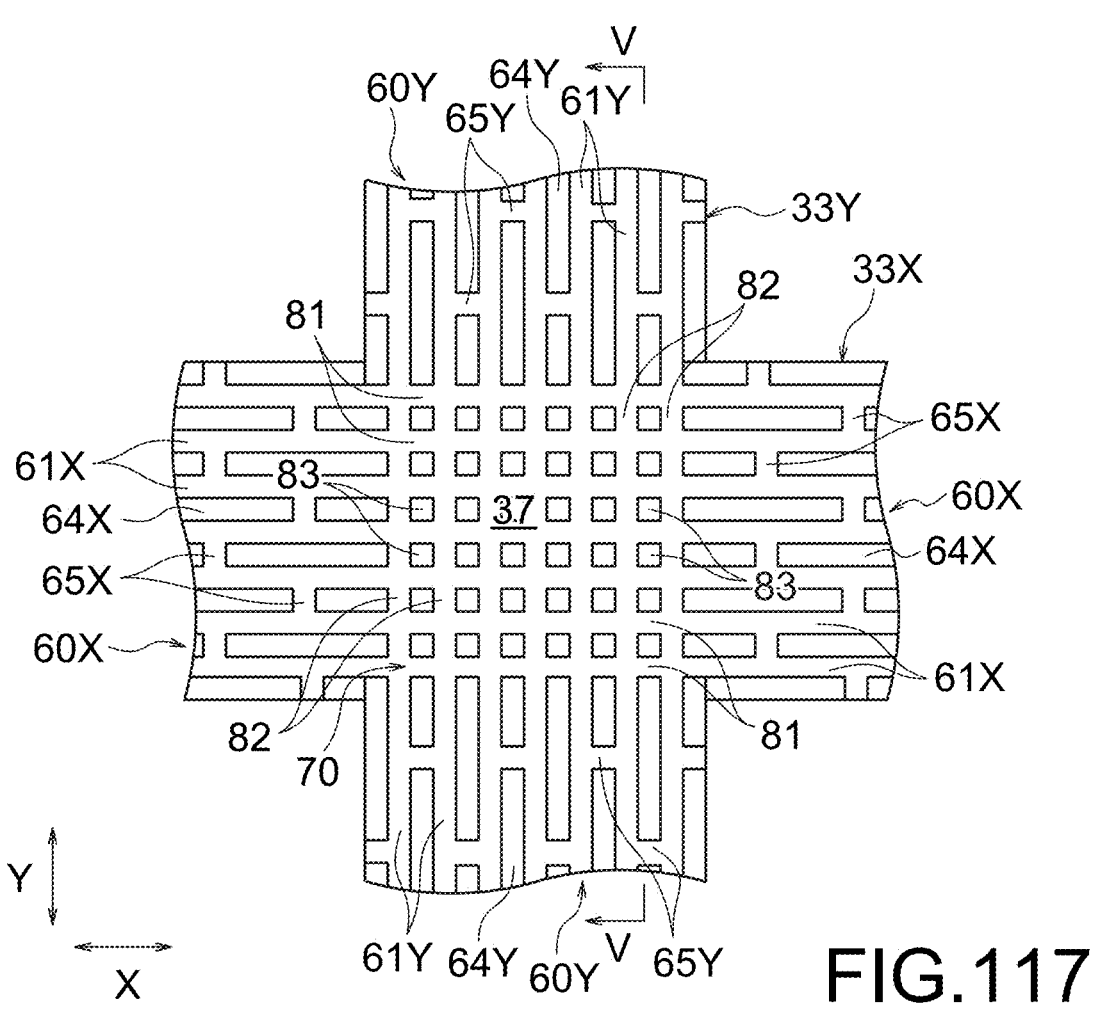
Figure 118:
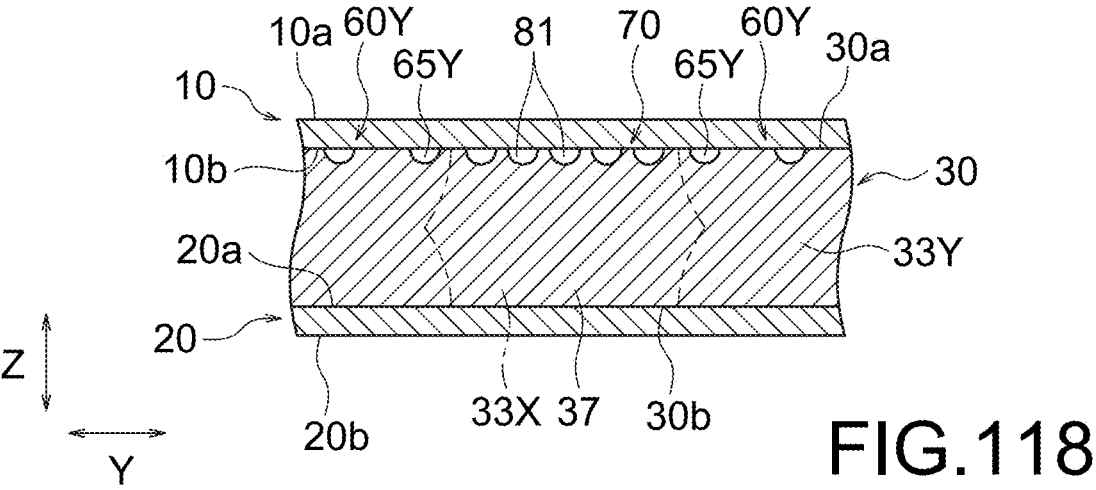

The present disclosure, however, is not limited thereto. For example, as illustrated in FIG. 117 and FIG. 118, the storage flow path portions 70 may include the multiple storage main flow grooves 81 and the multiple storage communication grooves 82. The storage main flow grooves 81 and the storage communication grooves 82 may be formed as in the storage main flow grooves 81 and the storage communication grooves 82 illustrated in FIG. 100.

According to the modification illustrated in FIG. 117 and FIG. 118, the first surface residual ratio of the storage flow path portions 70 is lower than the second surface residual ratio of the first liquid flow path portions 60X and is lower than the second surface residual ratio of the second liquid flow path portions 60Y in the example illustrated in FIG. 100. This enables the ratio at which the first body surface 30*a* remains at the storage flow path portions 70 to be decreased. For this reason, the flow path volume for storing the working liquid 2*b* at the storage flow path portions 70 can be increased, and the working liquid 2*b* can be stored at the storage flow path portions 70. The storage communication grooves 82 intersect with the storage main flow grooves 81 and extend in the Y direction across the storage main flow grooves 81. This enables the flow path volume for storing the working liquid 2*b* at the storage flow path portions 70 to be increased and enables the working liquid 2*b* to be stored at the storage flow path portions 70. As a result, the working liquid 2*b* in the vaporization region SR can be inhibited from being lacking, and the heat dissipation performance of the vapor chamber 1 can be improved.

A fifty-second modification will be described.

Figure 119:
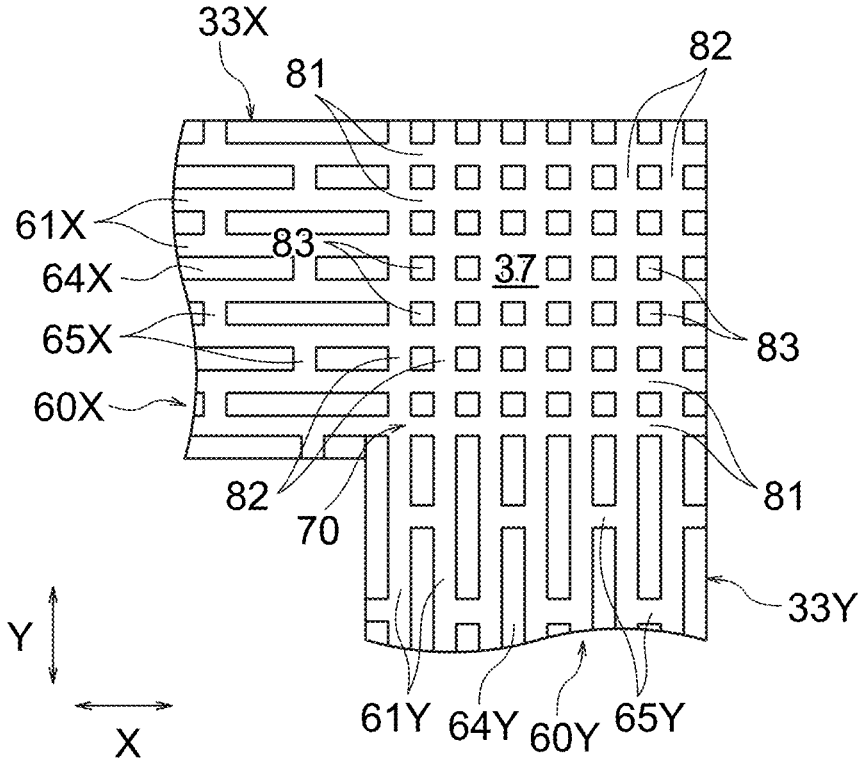

In an example described according to the fifty-first modification described above, the first land portions 33X extend in the X direction across the land intersection portions 37, and the second land portions 33Y extend in the Y direction across the land intersection portions 37. The present disclosure, however, is not limited thereto. For example, as illustrated in FIG. 119, the first land portions 33X may terminate at the land intersection portions 37 without crossing the land intersection portions 37. The second land portions 33Y may terminate at the land intersection portions 37 without crossing the land intersection portions 37. The first land portions 33X and the second land portions 33Y may intersect with each other in an L-shape.

According to the modification illustrated in FIG. 119, the first surface residual ratio of the storage flow path portions 70 is lower than the second surface residual ratio of the first liquid flow path portions 60X and is lower than the second surface residual ratio of the second liquid flow path portions 60Y This enables the ratio at which the first body surface 30*a* remains at the storage flow path portions 70 to be decreased. For this reason, the flow path volume for storing the working liquid 2*b* at the storage flow path portions 70 can be increased, and the working liquid 2*b* can be stored at the storage flow path portions 70. The storage communication grooves 82 intersect with the storage main flow grooves 81 and extend in the Y direction across the storage main flow grooves 81. This enables the flow path volume for storing the working liquid 2*b* at the storage flow path portions 70 to be increased and enables the working liquid 2*b* to be stored at the storage flow path portions 70. As a result, the working liquid 2*b* in the vaporization region SR can be inhibited from being lacking, and the heat dissipation performance of the vapor chamber 1 can be improved.

The present disclosure is not limited to the embodiments and the modifications described above, and components can be modified and materialized without departing from the spirit thereof when carried out. Appropriate combinations of multiple components disclosed according to the embodiments and the modifications described above enable various inventions to be embodied. Some components may be removed from all of the components disclosed according to the embodiments and the modifications.

The invention claimed is:

1. A vapor chamber wick sheet comprising:
   a first surface;
   a second surface opposite the first surface;
   a space portion that extends from the first surface toward the second surface;
   multiple first land portions around which the space portion is located, the first land portions being elongated in plan view and extending from the first surface toward the second surface;
   a land connector extending from the first surface toward the second surface, the land connector being connected to the multiple first land portions;
   a first main flow groove that is located on the first surface at the first land portions and extends along the first land portions;
   multiple through-holes that extend through the land connector from the first surface toward the second surface;
   multiple grooves that are located on the first surface at the land connector and are in communication with the first main flow grooves;
   a land connector space that is located on a side of the second surface at the land connector; and
   multiple pillar portions that extend from the land connector to the second surface, wherein
   the through-holes are in communication with the land connection space,
   no groove forming the multiple grooves is on the side of the second surface at the land connector,
   the multiple grooves are connected to one of the through-holes, and
   a plane area of one of the through-holes is equal to or larger than a total value of flow path sectional areas of the multiple grooves that are connected to the one of the through-holes.

2. The vapor chamber wick sheet according to claim 1, wherein the grooves are connected to the through-holes.

3. The vapor chamber wick sheet according to claim 1, wherein the grooves are at least partly formed in a lattice pattern.

4. The vapor chamber wick sheet according to claim 1, wherein the multiple through-holes are at least partly in lattice pattern arrangement.

5. The vapor chamber wick sheet according to claim 1, wherein in plan view, a plane area of each of at least one of the multiple through-holes is smaller than a plane area of each of the pillar portions.

6. The vapor chamber wick sheet according to claim 1, wherein in plan view, the through-holes have projecting portions and recessed portions alternated in a circumferential direction of the through-holes.

7. The vapor chamber wick sheet according to claim 1, wherein the land connector includes a first hole region that includes some of the multiple through-holes that are formed with a first unit circumferential length and a second hole region that includes some of the multiple through-holes that are formed with a second unit circumferential length,
   wherein the first unit circumferential length is equal to a total value of circumferential lengths of the through-holes that are located in the first hole region per unit area, wherein the second unit circumferential length is equal to a total value of circumferential lengths of the through-holes that are located in the second hole region per unit area, and wherein the second unit circumferential length is more than the first unit circumferential length.

8. The vapor chamber wick sheet according to claim 1, wherein a total value of plane areas of the through-holes is 3% to 30% of a plane area of the land connector.

9. The vapor chamber wick sheet according to claim 1, wherein a total value of plane areas of the through-holes that overlap a region in which a device to be cooled by the vapor chamber comes into contact is 3% to 30% of a plane area of the region in which the device comes into contact.

10. A vapor chamber comprising multiple sheets including the vapor chamber wick sheet according to claim 1.

11. An electronic apparatus comprising the vapor chamber according to claim 10.

12. A vapor chamber wick sheet comprising:
a first surface;
a second surface opposite the first surface;
a space portion that extends from the first surface toward the second surface;
multiple first land portions around which the space portion is located, the first land portions being elongated in plan view and extending from the first surface toward the second surface;
a land connector extending from the first surface toward the second surface, the land connector being connected to the multiple first land portions;
a first main flow groove that is located on the first surface at the first land portions and extends along the first land portions;
multiple through-holes that extend through the land connector from the first surface toward the second surface;
multiple grooves that are located on the first surface at the land connector and are in communication with the first main flow grooves;
a land connector space that is located on a side of the second surface at the land connector; and
multiple pillar portions that extend from the land connector to the second surface,
wherein the through-holes are in communication with the land connection space, and
no groove forming the multiple grooves is on the side of the second surface at the land connector,
the land connector includes a first hole region that includes some of the multiple through-holes that are formed with a first unit circumferential length and a second hole region that includes some of the multiple through-holes that are formed with a second unit circumferential length,
the first unit circumferential length is equal to a total value of circumferential lengths of the through-holes that are located in the first hole region per unit area,
the second unit circumferential length is equal to a total value of circumferential lengths of the through-holes that are located in the second hole region per unit area, and
the second unit circumferential length is more than the first unit circumferential length.

13. A vapor chamber comprising multiple sheets including the vapor chamber wick sheet according to claim 12.

14. An electronic apparatus comprising the vapor chamber according to claim 13.

15. A vapor chamber wick sheet comprising:
a first surface;
a second surface opposite the first surface;
a space portion that extends from the first surface toward the second surface;
multiple first land portions around which the space portion is located, the first land portions being elongated in plan view and extending from the first surface toward the second surface;
a land connector extending from the first surface toward the second surface, the land connector being connected to the multiple first land portions;
a first main flow groove that is located on the first surface at the first land portions and extends along the first land portions;
multiple through-holes that extend through the land connector from the first surface toward the second surface;
multiple grooves that are located on the first surface at the land connector and are in communication with the first main flow grooves;
a land connector space that is located on a side of the second surface at the land connector; and
multiple pillar portions that extend from the land connector to the second surface,
wherein the through-holes are in communication with the land connection space, and
no groove forming the multiple grooves is on the side of the second surface at the land connector, and
a total value of plane areas of the through-holes is 3% to 30% of a plane area of the land connector.

16. A vapor chamber comprising multiple sheets including the vapor chamber wick sheet according to claim 15.

17. An electronic apparatus comprising the vapor chamber according to claim 16.

18. A vapor chamber wick sheet comprising:
a first surface;
a second surface opposite the first surface;
a space portion that extends from the first surface toward the second surface;
multiple first land portions around which the space portion is located, the first land portions being elongated in plan view and extending from the first surface toward the second surface;
a land connector extending from the first surface toward the second surface, the land connector being connected to the multiple first land portions;
a first main flow groove that is located on the first surface at the first land portions and extends along the first land portions;
multiple through-holes that extend through the land connector from the first surface toward the second surface;
multiple grooves that are located on the first surface at the land connector and are in communication with the first main flow grooves;
a land connector space that is located on a side of the second surface at the land connector; and
multiple pillar portions that extend from the land connector to the second surface,
wherein the through-holes are in communication with the land connection space, and
no groove forming the multiple grooves is on the side of the second surface at the land connector, and
a total value of plane areas of the through-holes that overlap a region in which a device to be cooled by the vapor chamber comes into contact is 3% to 30% of a plane area of the region in which the device comes into contact.

19. A vapor chamber comprising multiple sheets including the vapor chamber wick sheet according to claim 18.

20. An electronic apparatus comprising the vapor chamber according to claim 19.

\* \* \* \* \*